US007796801B2

(12) United States Patent
Kitamura et al.

(10) Patent No.: US 7,796,801 B2
(45) Date of Patent: *Sep. 14, 2010

(54) PATTERN INSPECTION APPARATUS AND METHOD

(75) Inventors: Tadashi Kitamura, Tokyo (JP); Kazufumi Kubota, Tokyo (JP); Shinichi Nakazawa, Tokyo (JP); Neeti Vohra, Tokyo (JP); Masahiro Yamamoto, Tokyo (JP); Toshiaki Hasebe, Tokyo (JP)

(73) Assignee: NanoGeometry Research Inc., Tokyo (JP)

( * ) Notice: Subject to any disclaimer, the term of this patent is extended or adjusted under 35 U.S.C. 154(b) by 1074 days.

This patent is subject to a terminal disclaimer.

(21) Appl. No.: 11/434,797
(22) Filed: May 17, 2006
(65) Prior Publication Data

US 2006/0245636 A1    Nov. 2, 2006

Related U.S. Application Data

(63) Continuation-in-part of application No. 11/058,616, filed on Feb. 16, 2005, which is a continuation-in-part of application No. 10/689,021, filed on Oct. 21, 2003, now abandoned, which is a continuation-in-part of application No. 09/648,372, filed on Aug. 25, 2000, now Pat. No. 6,868,175.

(30) Foreign Application Priority Data

| Aug. 26, 1999 | (JP) | ................................. 11-239586 |
| Mar. 21, 2000 | (JP) | ............................. 2000-078847 |
| Oct. 22, 2002 | (JP) | ............................. 2002-307406 |
| Feb. 23, 2004 | (JP) | ............................. 2004-047098 |
| May 19, 2005 | (JP) | ............................. 2005-147379 |
| Nov. 7, 2005 | (JP) | ............................. 2005-322035 |

(51) Int. Cl.
*G06K 9/00* (2006.01)
*G06K 9/48* (2006.01)
*G06K 9/62* (2006.01)

(52) U.S. Cl. ........................ 382/141; 382/199; 382/209; 348/86; 348/125; 356/237.1

(58) Field of Classification Search ......... 382/141–152, 382/199, 203, 209–223; 348/86–95, 125–134; 356/237.1–237.6
See application file for complete search history.

(56) References Cited

U.S. PATENT DOCUMENTS 4,583,854 A * 4/1986 Lozar ...................... 356/237.1
(Continued)

FOREIGN PATENT DOCUMENTS

DE    19803021 A1    7/1998
(Continued)

OTHER PUBLICATIONS

"Automatic Failure Part Tracing Method for a Logic LSI Using an Electron Beam Tester", NEC Technical Report, vol. 50, No. 6, 1997, pp. 20-31 (partial English translation).
(Continued)

*Primary Examiner*—Aaron W Carter
(74) *Attorney, Agent, or Firm*—Lathrop & Gage LLP

(57) ABSTRACT

A fine pattern, such as a semiconductor integrated circuit (LSI), a liquid crystal panel, and a photomask (reticle) for the semiconductor or the liquid crystal panel, which are fabricated based on data for fabricating the fine pattern such as design data is inspected by a pattern inspection apparatus. The pattern inspection apparatus for inspecting a pattern to-be-inspected uses an image of the pattern to-be-inspected and data for fabricating the pattern to-be-inspected. The pattern inspection apparatus includes a reference pattern generation device configured to generate a reference pattern represented by one or more lines from the data, an image generation device configured to generate the image of the pattern to-be-inspected, a detecting device configured to detect an edge of the image of the pattern to-be-inspected, and an inspection device configured to inspect the pattern to-be-inspected by comparing the edge of the image of the pattern to-be-inspected with the one or more lines of the reference pattern.

18 Claims, 147 Drawing Sheets

U.S. PATENT DOCUMENTS

| | | | |
|---|---|---|---|
| 4,589,139 A * | 5/1986 | Hada et al. ................ | 382/144 |
| 4,805,123 A | 2/1989 | Specht et al. | |
| 5,046,109 A * | 9/1991 | Fujimori et al. ............ | 382/144 |
| 5,046,113 A * | 9/1991 | Hoki .......................... | 382/147 |
| 5,051,585 A * | 9/1991 | Koshishiba et al. ........... | 850/9 |
| 5,129,009 A | 7/1992 | LeBeau | |
| 5,137,362 A | 8/1992 | LeBeau | |
| 5,270,796 A * | 12/1993 | Tokui et al. ................ | 356/394 |
| 5,379,350 A | 1/1995 | Shimazu et al. | |
| 5,398,292 A | 3/1995 | Aoyama | |
| 5,479,537 A | 12/1995 | Hamashima et al. | |
| 5,533,144 A * | 7/1996 | Fan ........................... | 382/135 |
| 5,563,702 A | 10/1996 | Emery et al. | |
| 5,574,800 A * | 11/1996 | Inoue et al. ................ | 382/149 |
| 5,600,734 A * | 2/1997 | Okubo et al. ............... | 382/147 |
| 5,764,793 A * | 6/1998 | Omae et al. ................ | 382/149 |
| 5,796,868 A * | 8/1998 | Dutta-Choudhury ........ | 382/199 |
| 5,801,965 A * | 9/1998 | Takagi et al. ................ | 702/35 |
| 6,023,530 A | 2/2000 | Wilson | |
| 6,040,911 A * | 3/2000 | Nozaki et al. ............... | 356/394 |
| 6,047,083 A | 4/2000 | Mizuno | |
| 6,049,895 A * | 4/2000 | Sugimoto .................... | 714/46 |
| 6,222,935 B1* | 4/2001 | Okamoto .................... | 382/149 |
| 6,356,300 B1* | 3/2002 | Shiba ......................... | 348/130 |
| 6,399,953 B1* | 6/2002 | Kitamura .................. | 250/491.1 |
| 6,400,839 B1* | 6/2002 | Takayama ................... | 382/145 |
| 6,504,947 B1* | 1/2003 | Nozaki et al. ............... | 382/148 |
| 6,535,621 B1* | 3/2003 | Fujita ......................... | 382/112 |
| 6,539,106 B1* | 3/2003 | Gallarda et al. ............. | 382/149 |
| 6,546,308 B2* | 4/2003 | Takagi et al. ................ | 700/121 |
| 6,868,175 B1 | 3/2005 | Yamamoto et al. | |
| 7,181,059 B2 | 2/2007 | Duvdevani et al. | |
| 7,206,443 B1 | 4/2007 | Duvdevani et al. | |
| 7,388,978 B2 | 6/2008 | Duvdevani et al. | |
| 2004/0120571 A1 | 6/2004 | Duvdevani et al. | |
| 2004/0126005 A1 | 7/2004 | Duvdevani et al. | |

FOREIGN PATENT DOCUMENTS

| | | |
|---|---|---|
| EP | 0930499 | 7/1999 |
| JP | 63-88682 | 4/1988 |
| JP | 63088682 | 4/1988 |
| JP | 4-194702 | 7/1992 |
| JP | 02299481 | 9/1992 |
| JP | 8-76359 | 3/1996 |
| JP | 08110305 | 4/1996 |
| JP | 10307917 | 11/1998 |
| JP | 10312461 | 11/1998 |
| JP | 10037364 | 8/1999 |
| JP | 2001-338304 | 12/2001 |

OTHER PUBLICATIONS

Robert M. Haralick et al., "Digital Step Edges from Zero Crossing of Second Directional Derivatives", IEEE Transactions on Pattern Analysis and Machine Intelligence, vol. PAMI-6, No. 1, Jan. 1984, pp. 58-68.

Carsten Steger et al., "An Unbiased Detector of Curvilinear Structures", IEEE Transactions on Pattern Analysis and Machine Intelligence, vol. 20, No. 2, Feb. 1998, pp. 113-125.

Theodosios Pavlidis et al., "Segmentation of Plane Curves", IEEE Transactions on Computers, vol. C-23, No. 8, Aug. 1974, pp. 860-870.

M. Hashimoto et al., "High-Speed Template Matching Algorithm Using Information of Contour Points," Systems and Computers in Japan, Vo. 23, No. 9, pp. 78-87, 1992.

Official Notice of Rejection, Japanese Patent Office, dated Feb. 21, 2003, for Patent Appln. No. 2000-258234, with English Translation.

U.S. Appl. No. 11/044,159, Notice of Allowance dated Sep. 25, 2009, 9 pages.

U.S. Appl. No. 11/044,159, Terminal Disclaimer dated Aug. 11, 2009, 3 pages.

U.S. Appl. No. 11/044,159, Response to Office Action dated Jul. 31, 2009, 13 pages.

U.S. Appl. No. 11/044,159, Office Action dated Jun. 12, 2009, 22 pages.

U.S. Appl. No. 11/044,159, Response to Office Action dated Mar. 25, 2009, 16 pages.

U.S. Appl. No. 11/044,159, Office Action dated Dec. 11, 2008, 20 pages.

U.S. Appl. No. 11/044,159, Response to Office Action dated Aug. 29, 2008, 16 pages.

U.S. Appl. No. 11/044,159, Office Action dated Apr. 30, 2008, 11 pages.

U.S. Appl. No. 09/648,372, Notice of Allowance dated Oct. 28, 2004, 7 pages.

U.S. Appl. No. 09/648,372, Response and Amendment dated Sep. 3, 2004, 14 pages.

U.S. Appl. No. 09/648,372, Office Action dated Jun. 3, 2004, 7 pages.

U.S. Appl. No. 09/648,372, Preliminary Amendment and Response to Restriction Requirement dated Mar. 18, 2004, 15 pages.

U.S. Appl. No. 09/648,372, Restriction Requirement dated Feb. 19, 2004, 5 pages.

U.S. Appl. No. 09/648,372, Response to Office Action dated Dec. 12, 2003, 31 pages.

U.S. Appl. No. 09/648,372, Office Action dated Aug. 13, 2003, 7 pages.

U.S. Appl. No. 11/058,616, Office Action mailed Aug. 14, 2009, 22 pages.

U.S. Appl. No. 11/058,616, Response to Office Action filed Nov. 9, 2009, 28 pages.

U.S. Appl. No. 11/987,766, Office Action mailed Jan. 15, 2010, 12 pages.

U.S. Appl. No. 11/987,766, Response to Office Action filed Apr. 14, 2010 23 pages.

U.S. Appl. No. 11/058,616 Notice of Allowance mailed Jun. 14, 2010, 6 pages.

U.S. Appl. No. 11/058,616 Response to Office Action filed Apr. 26, 2010, 26 pages.

U.S. Appl. No. 11/987,766 Restriction Requirement mailed May 20, 2010, 9 pages.

U.S. Appl. No. 11/987,766 Response to Restriction Requirement filed Jun. 20, 2010, 21 pages.

* cited by examiner

F I G. 4
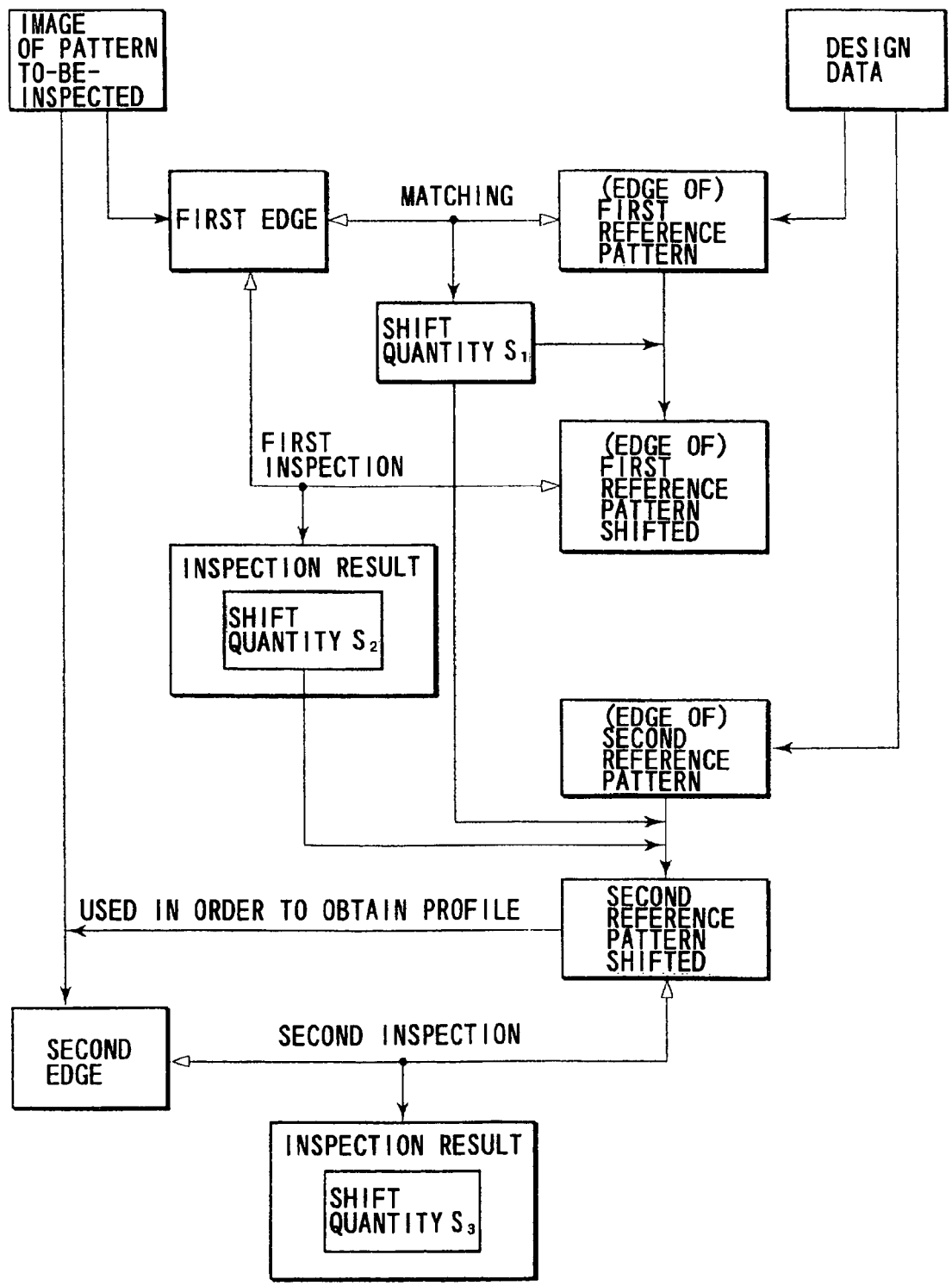

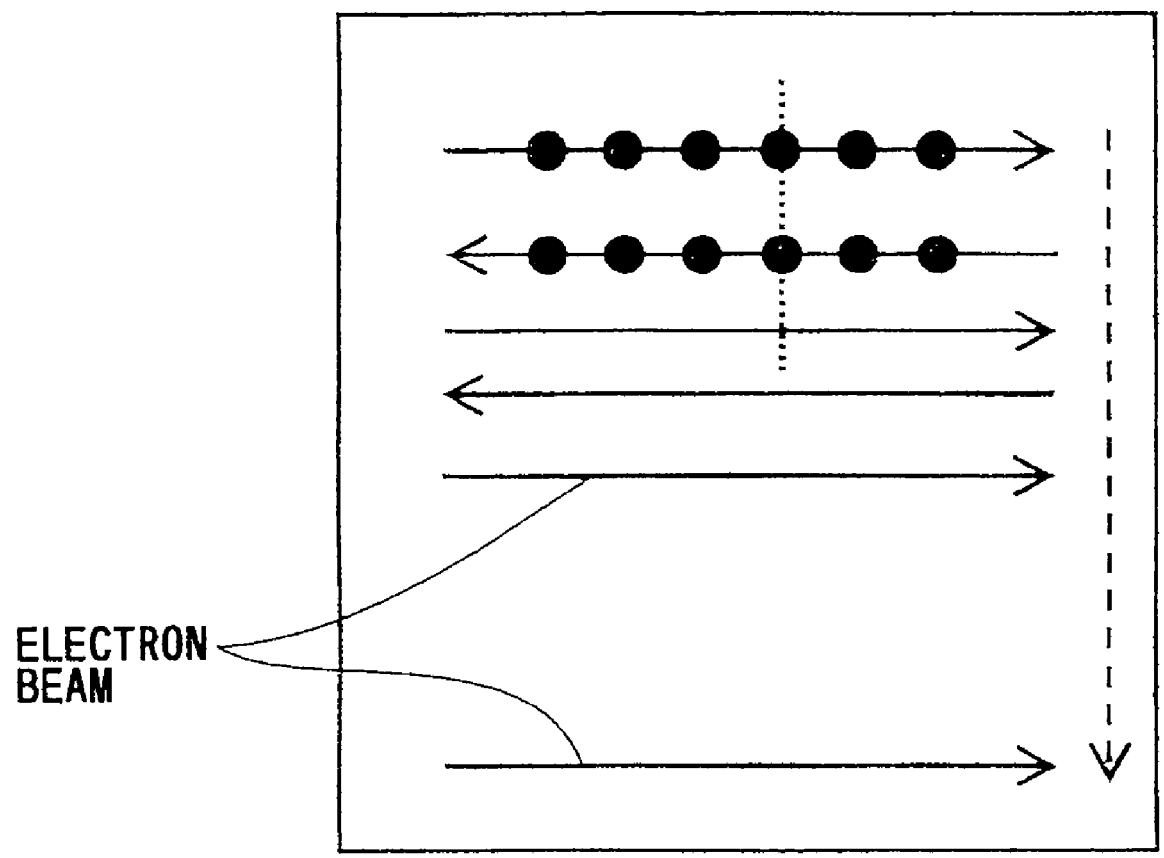
F I G. 1 0
ELECTRON BEAM

F I G. 1 3
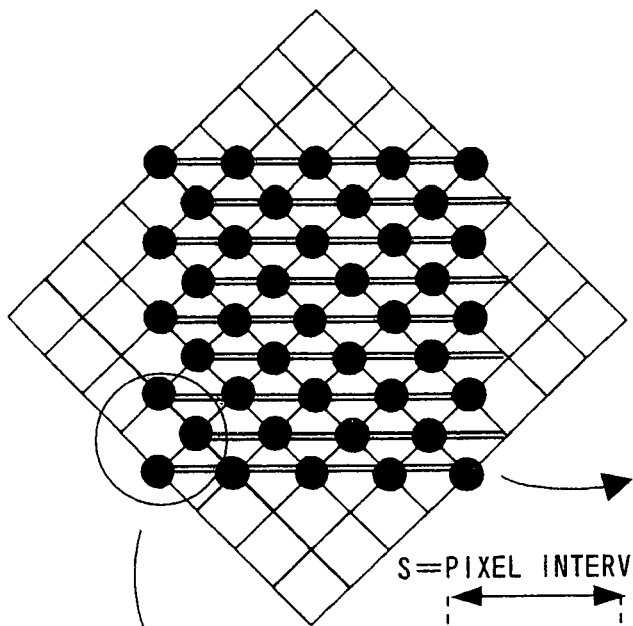
45 DEGREE INCLINATION SCANNING METHOD
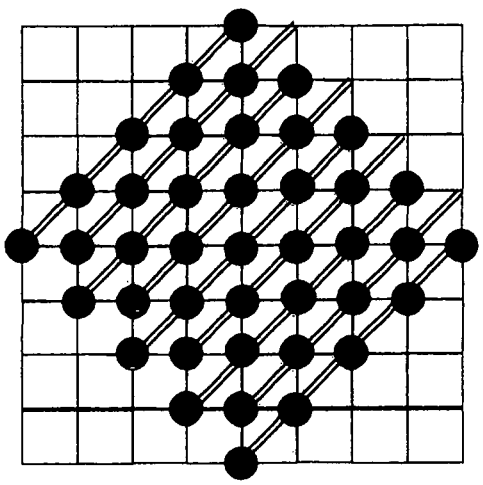
45 DEGREE INCLINATION IMAGE
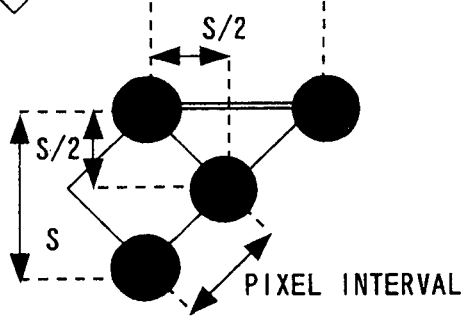
$S = $ PIXEL INTERVAL $\times \sqrt{2}$

FIG. 14
ARCTANGENT(2)
INCLINATION
SCANNING METHOD
ARCTANGENT(2)
ROTATED IMAGE
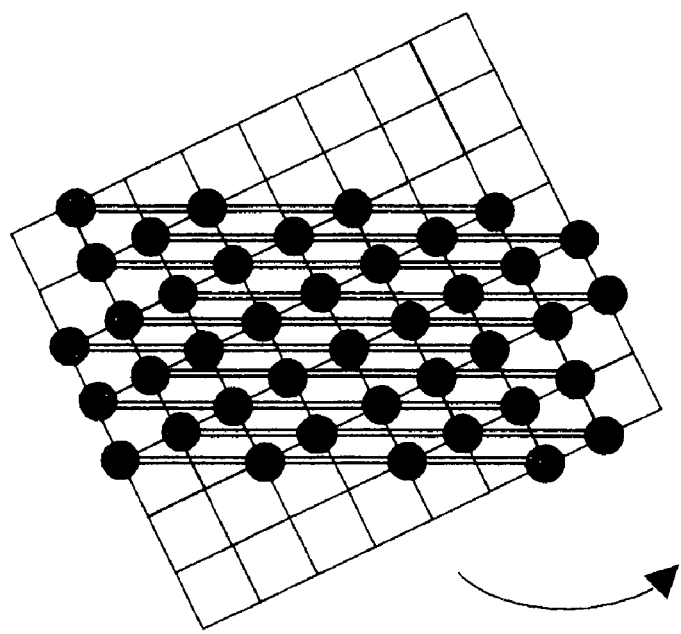
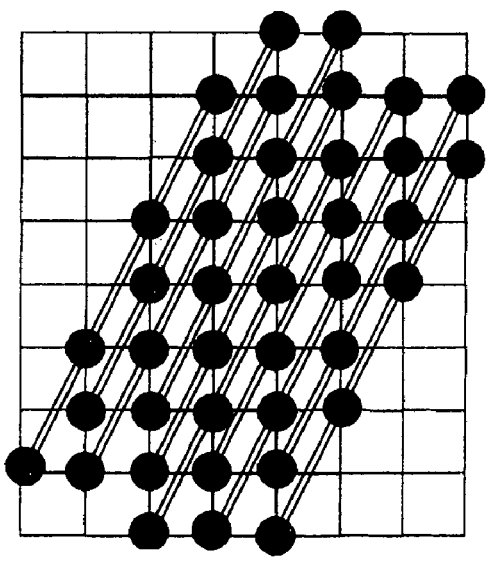

F I G. 1 5
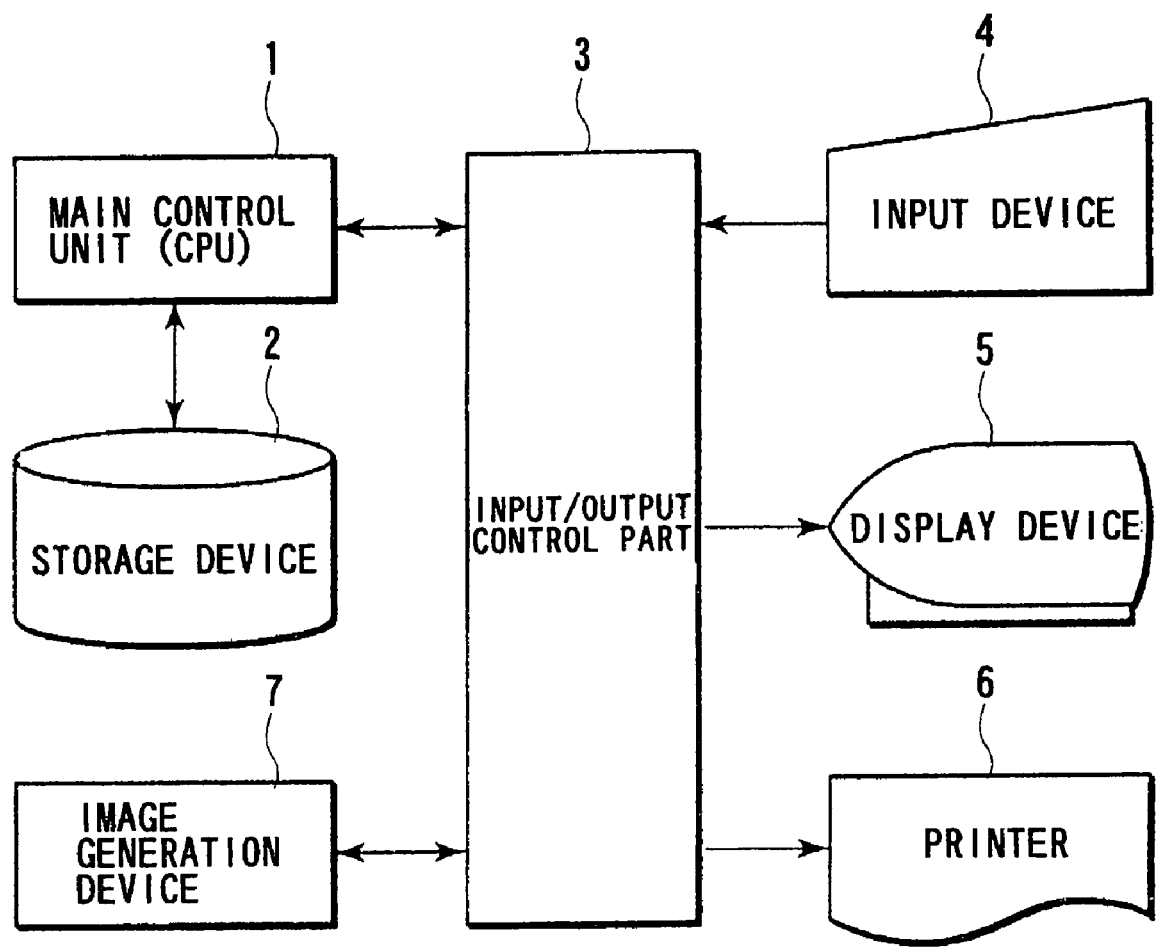

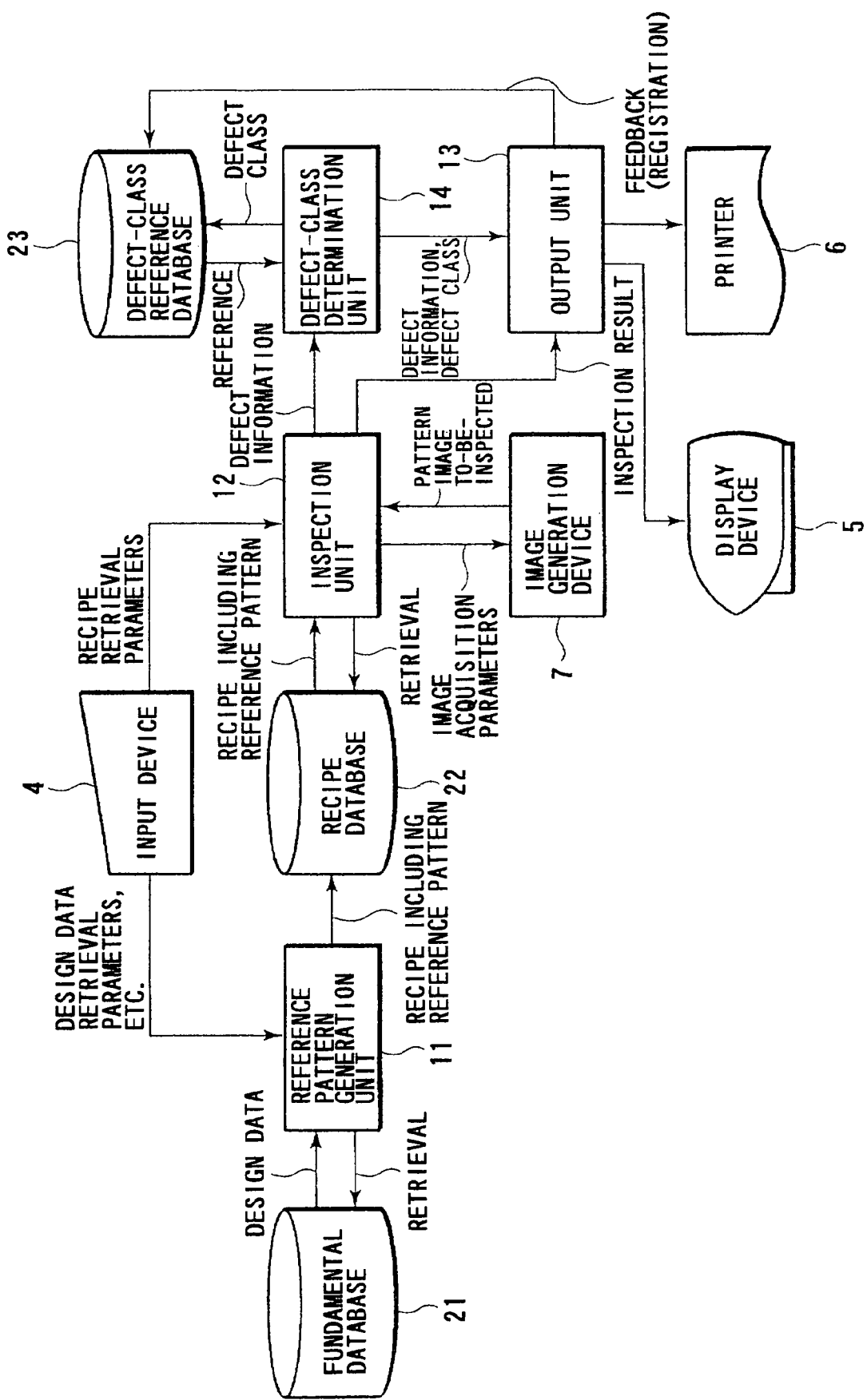

REFERENCE PATTERN S

F I G. 2 1
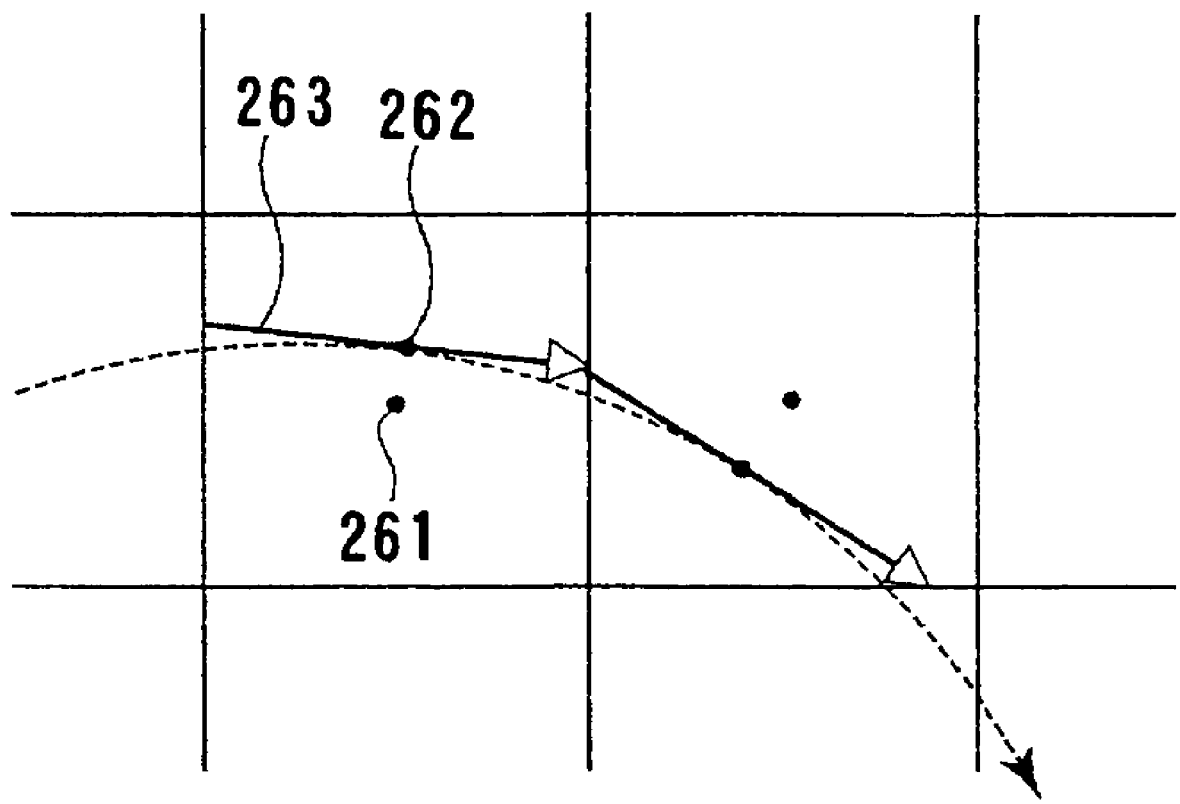

FIG. 28

| 0 | 0 | 0 | 0 | 0 | 0 | 0 | 0 |
|---|---|---|---|---|---|---|---|
| 0 | 0 | 0 | 0 | 0 | 0 | 0 | 0 |
| 0 | 0 | 0 | 0 | 0 | 0 | 0 | 0 |
| 80 | 60 | 40 | 20 | 0 | 0 | 0 | 0 |
| 100 | 100 | 100 | 80 | 60 | 40 | 20 | 0 |
| 100 | 100 | 100 | 100 | 100 | 100 | 80 | 60 |
| 100 | 100 | 100 | 100 | 100 | 100 | 100 | 100 |
| 100 | 100 | 100 | 100 | 100 | 100 | 100 | 100 |

FIG. 30

| 0 | 0 | 0 | 0 | 0 | 0 | 0 | 0 |
|---|---|---|---|---|---|---|---|
| 15 | 0 | 0 | 0 | 0 | 0 | 0 | 0 |
| 85 | 55 | 45 | 15 | 0 | 0 | 0 | 0 |
| 85 | 100 | 100 | 85 | 55 | 40 | 20 | 0 |
| 15 | 45 | 55 | 85 | 100 | 100 | 60 | 50 |
| 0 | 0 | 0 | 15 | 45 | 60 | 90 | 100 |
| 0 | 0 | 0 | 0 | 0 | 0 | 30 | 50 |
| 0 | 0 | 0 | 0 | 0 | 0 | 0 | 0 |

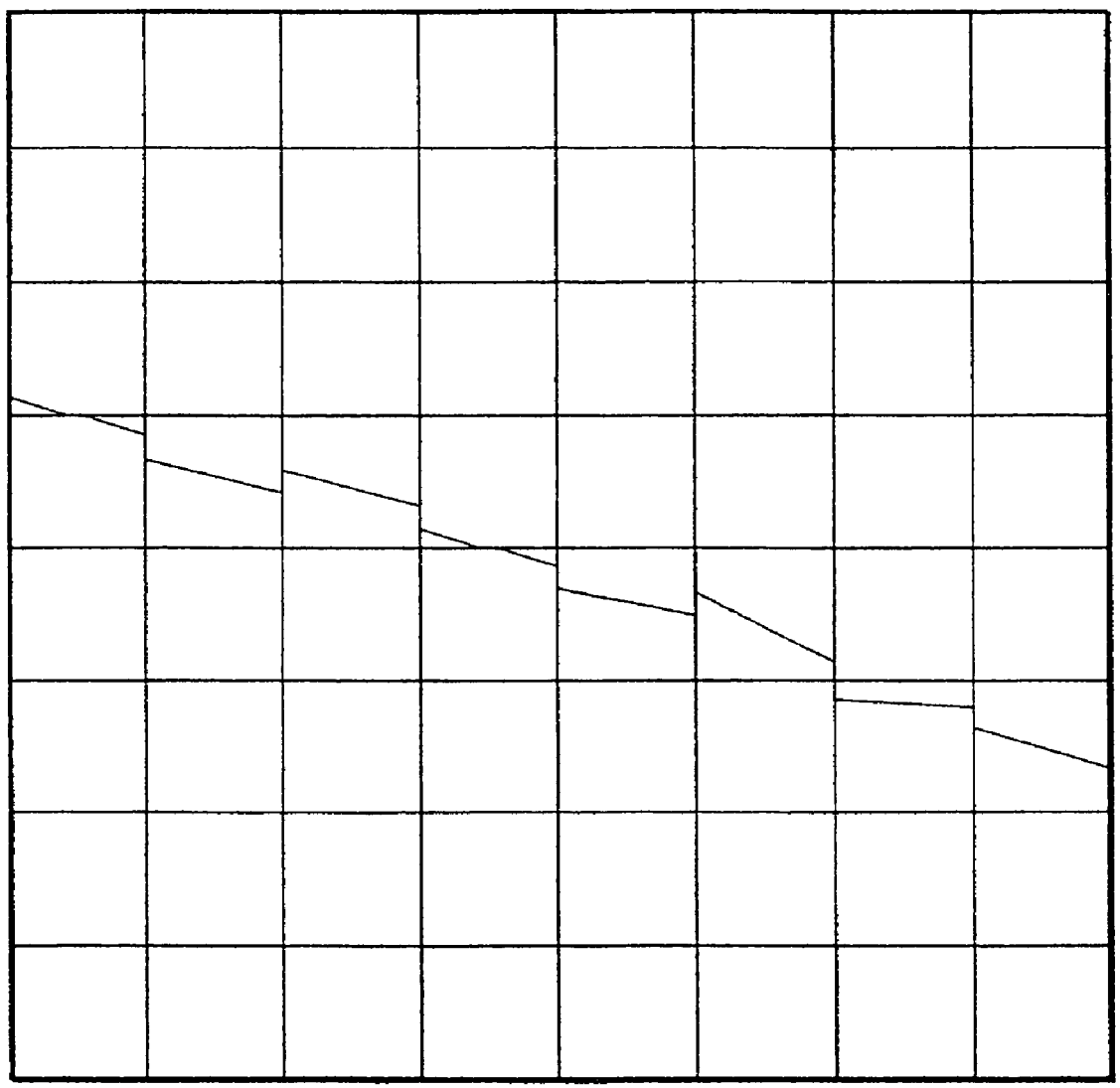
F I G. 3 1

FIG. 32

| 0 | 0 | 0 | 20 | 0 | 0 | 0 | 0 | 0 | 0 | 20 | 0 | 0 | 0 | 0 |
|---|---|---|----|---|---|---|---|---|---|----|---|---|---|---|

FIG. 33

| 0 | 20 | 20 | 20 | 20 | 20 | 0 | 0 | 20 | 20 | 20 | 20 | 20 | 0 | 0 |
|---|----|----|----|----|----|---|---|----|----|----|----|----|---|---|

FIG. 34

| 0 | 0 | 0 | 1 | 0 | 0 | 0 | 0 | 0 | 0 | 1 | 0 | 0 | 0 | 0 |
|---|---|---|---|---|---|---|---|---|---|---|---|---|---|---|

FIG. 35

| 0 | 10 | 15 | 20 | 15 | 10 | 0 | 0 | 10 | 15 | 20 | 15 | 10 | 0 | 0 |
|---|----|----|----|----|----|---|---|----|----|----|----|----|---|---|

FIG. 36

| 0 | 0 | 1 | 0 | 0 | 0 | 0 | 0 | 0 | 0 | 0 | 1 | 0 | 0 | 0 |
|---|---|---|---|---|---|---|---|---|---|---|---|---|---|---|

FIG. 37

| 0 | 10 | 18 | 20 | 18 | 10 | 0 | 0 | 10 | 18 | 20 | 18 | 10 | 0 | 0 |
|---|----|----|----|----|----|---|---|----|----|----|----|----|---|---|

FIG. 38

| 0.5 | 0.9 | 1.0 | 0.9 | 0.5 |
|-----|-----|-----|-----|-----|

| (0,0) | (0,0) | (0,0) | (20,0) | (0,0) | (0,0) | (0,0) |
|---|---|---|---|---|---|---|
| (0,0) | (0,0) | (0,0) | (20,0) | (0,0) | (0,0) | (0,0) |
| (0,0) | (0,0) | (0,0) | (20,0) | (0,0) | (0,0) | (0,0) |
| (0,0) | (0,0) | (0,0) | (0,0) | (14,14) | (0,20) | (0,20) |
| (0,0) | (0,0) | (0,0) | (0,0) | (0,0) | (0,0) | (0,0) |
| (0,0) | (0,0) | (0,0) | (0,0) | (0,0) | (0,0) | (0,0) |
| (0,0) | (0,0) | (0,0) | (0,0) | (0,0) | (0,0) | (0,0) |

| (0,0) | (10,0) | (18,0) | (20,0) | (18,0) | (10,0) | (0,0) |
|---|---|---|---|---|---|---|
| (0,0) | (9,0) | (17,1) | (19,3) | (18,6) | (10,8) | (1,10) |
| (0,0) | (6,0) | (13,2) | (16,5) | (15,10) | (9,14) | (2,17) |
| (0,0) | (4,0) | (9,2) | (11,6) | (10,11) | (7,16) | (2,19) |
| (0,0) | (1,0) | (4,2) | (6,5) | (6,10) | (4,14) | (2,17) |
| (0,0) | (0,0) | (1,1) | (2,3) | (2,6) | (2,8) | (1,10) |
| (0,0) | (0,0) | (0,0) | (0,0) | (0,0) | (0,0) | (0,0) |

F I G. 4 5
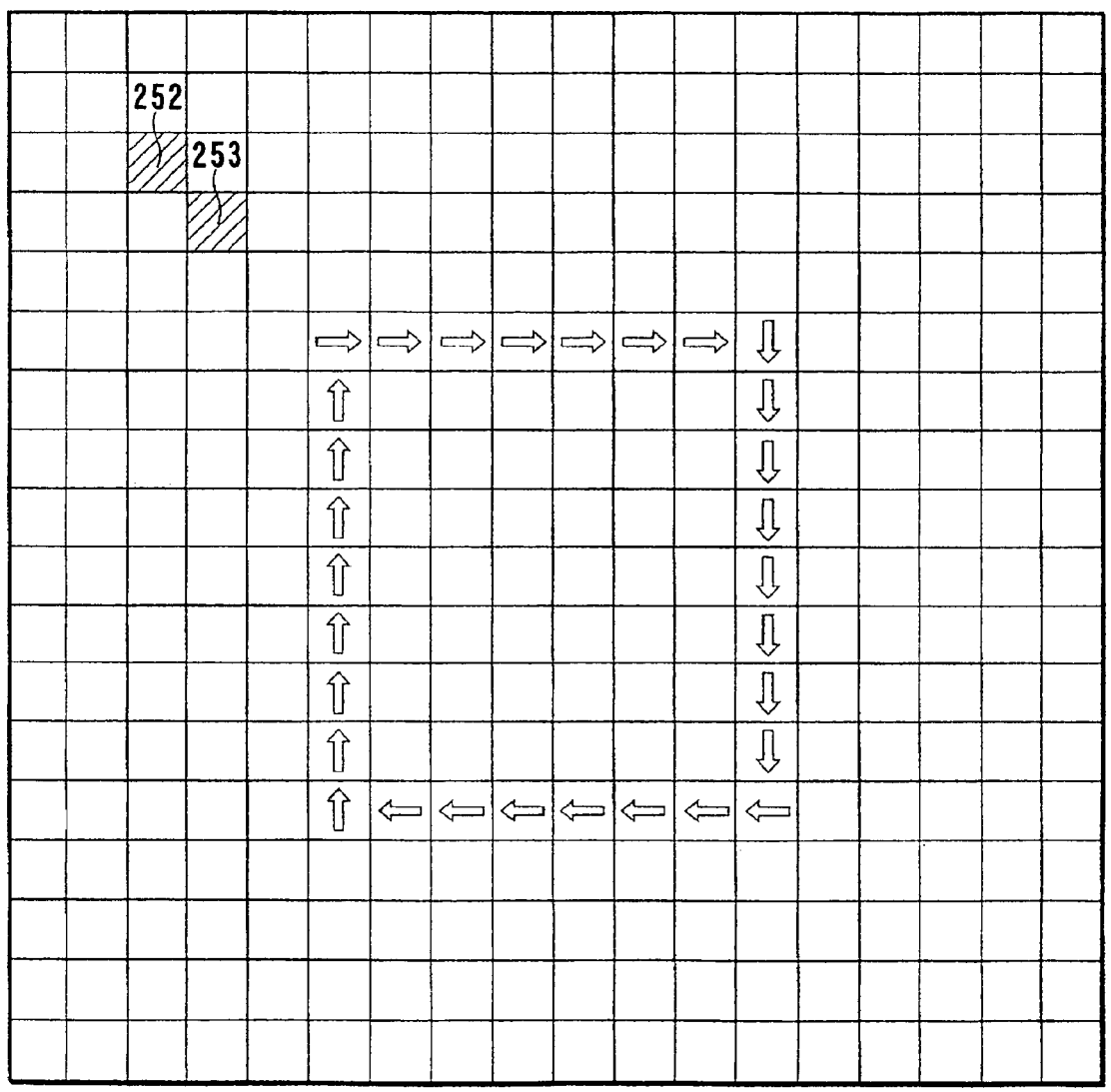

F I G. 47
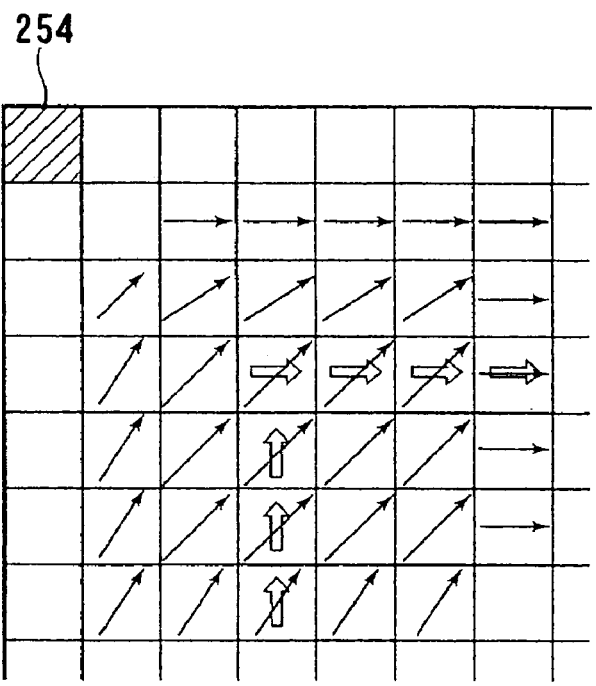
F I G. 48
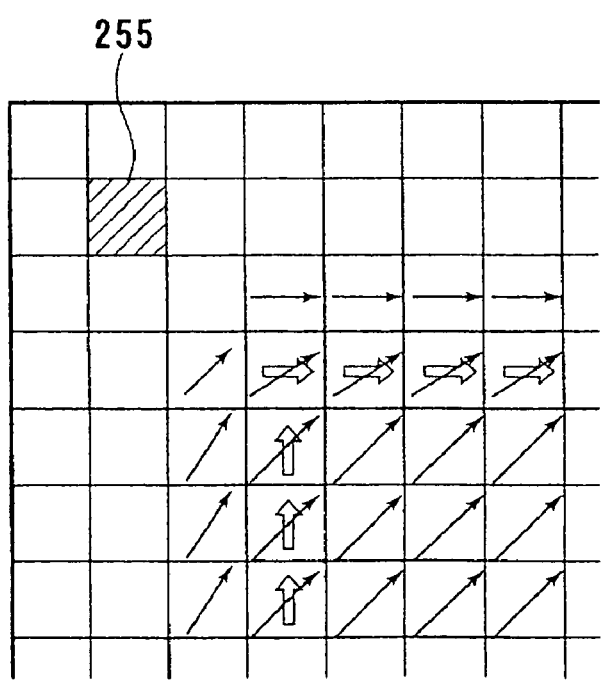

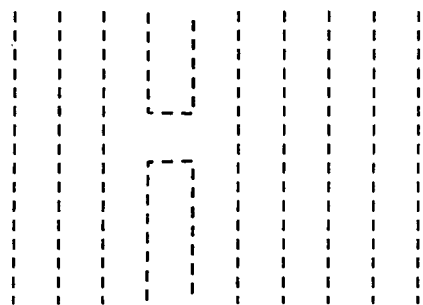
F I G. 51A
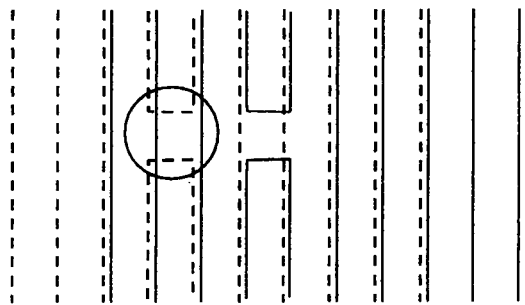
F I G. 51B

F I G. 5 3 A
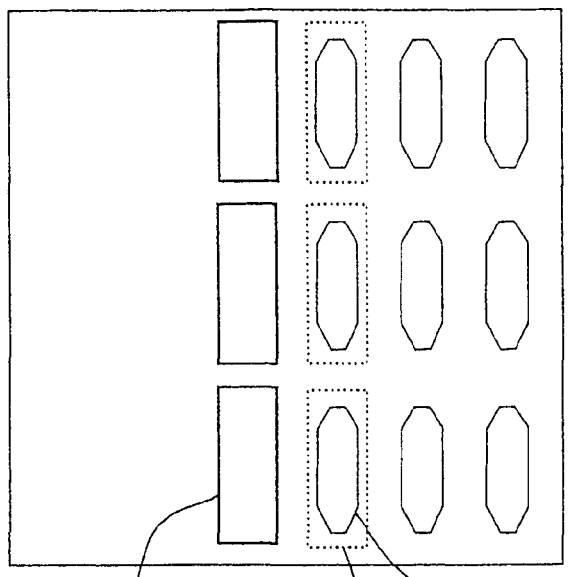
NEGATIVE PATTERN  IMAGE OF PATTERN TO-BE-INSPECTED
UNIQUE PATTERN
F I G. 5 3 B
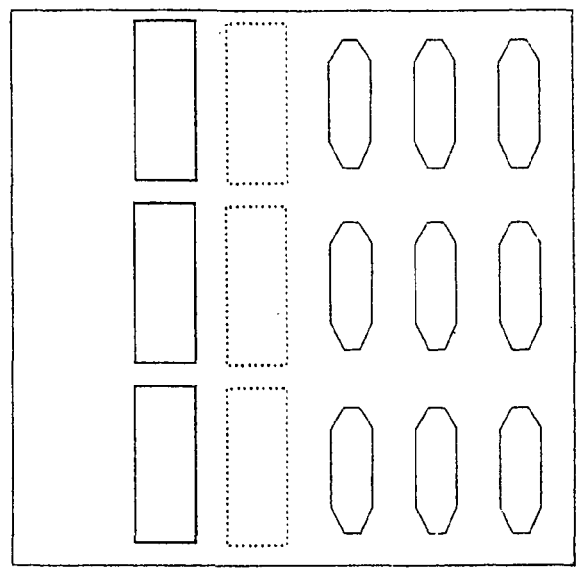
F I G. 5 3 C
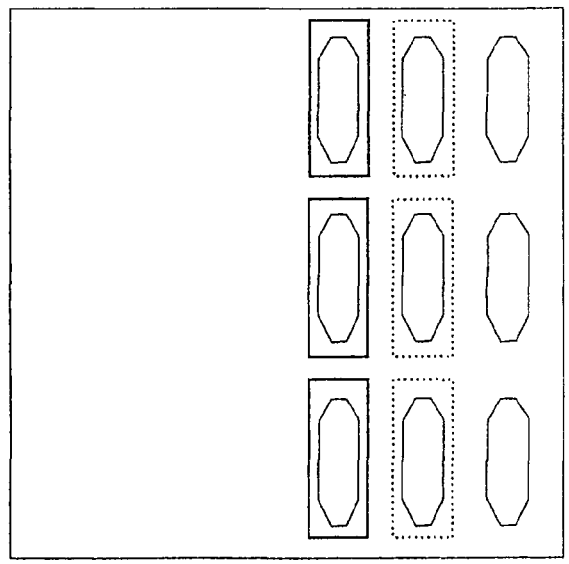

PROJECTION DATA OF UPWARD LINE SEGMENTS ONTO THE VERTICAL AXIS

PROJECTION DATA OF UPWARD LINE SEGMENTS ONTO THE HORIZONTAL AXIS

PROJECTION DATA OF UPWARD EDGE VECTORS ONTO THE VERTICAL AXIS

PROJECTION DATA OF UPWARD EDGE VECTORS ONTO THE HORIZONTAL AXIS

F I G. 5 5
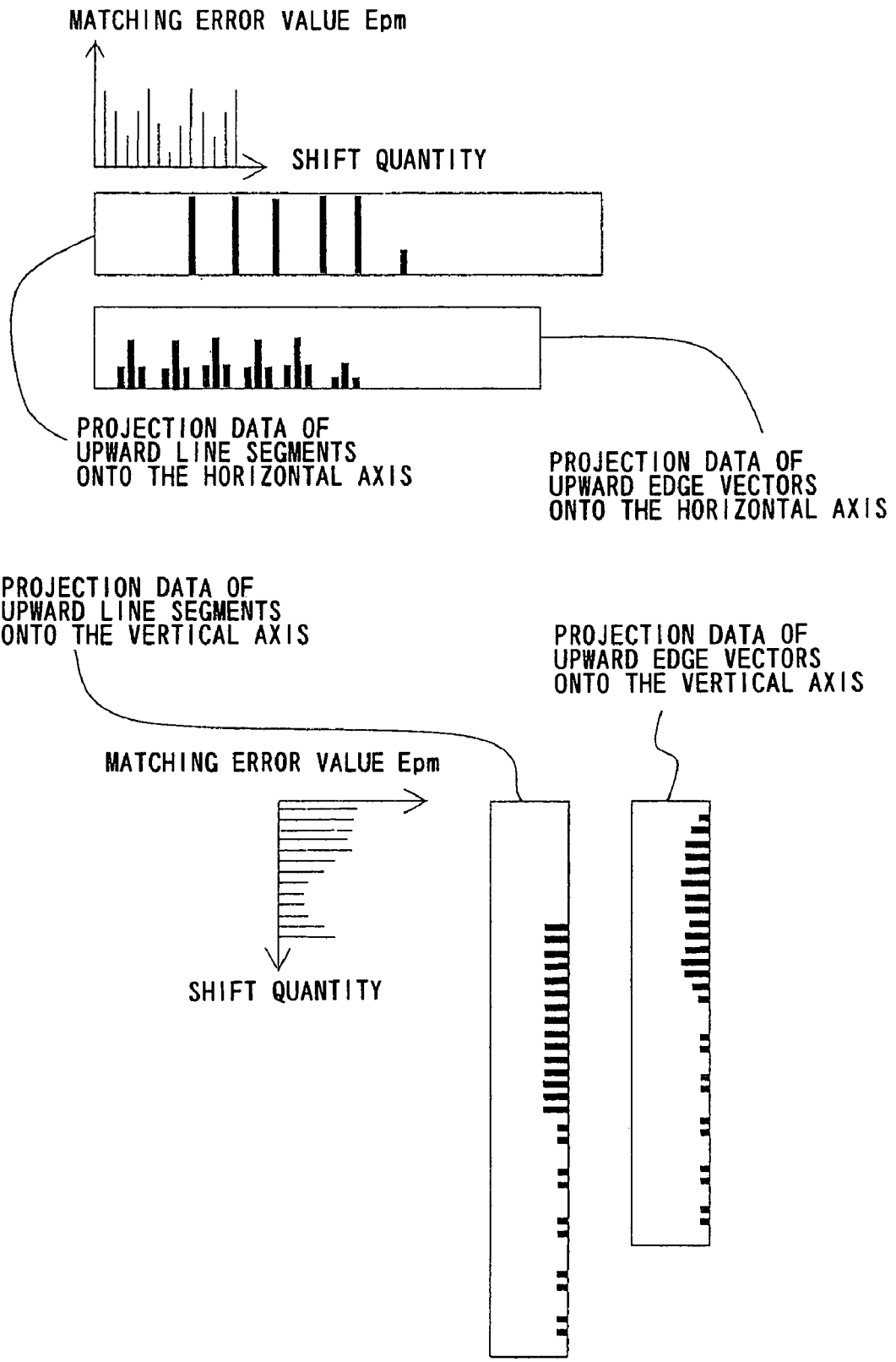

IMAGE OF PATTERN TO-BE-INSPECTED

EVALUATION VALUE

F I G. 6 5
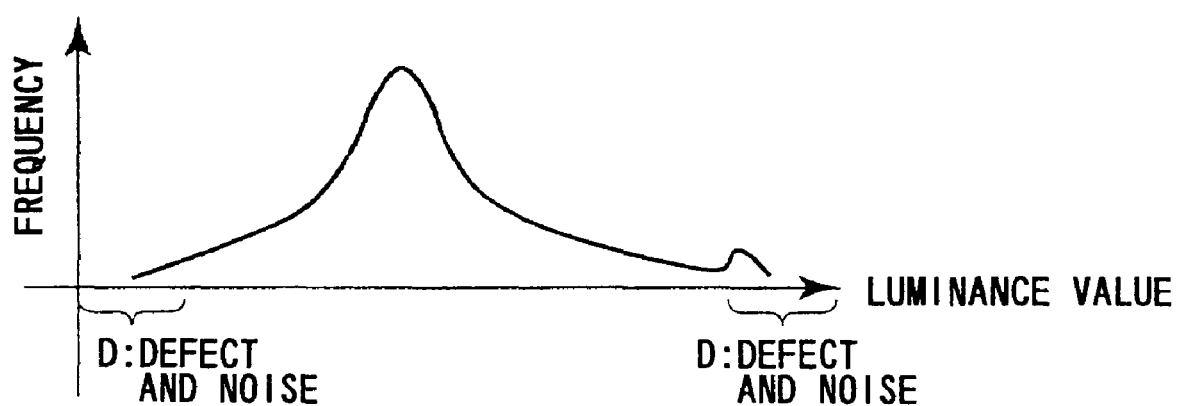

B

F I G. 74
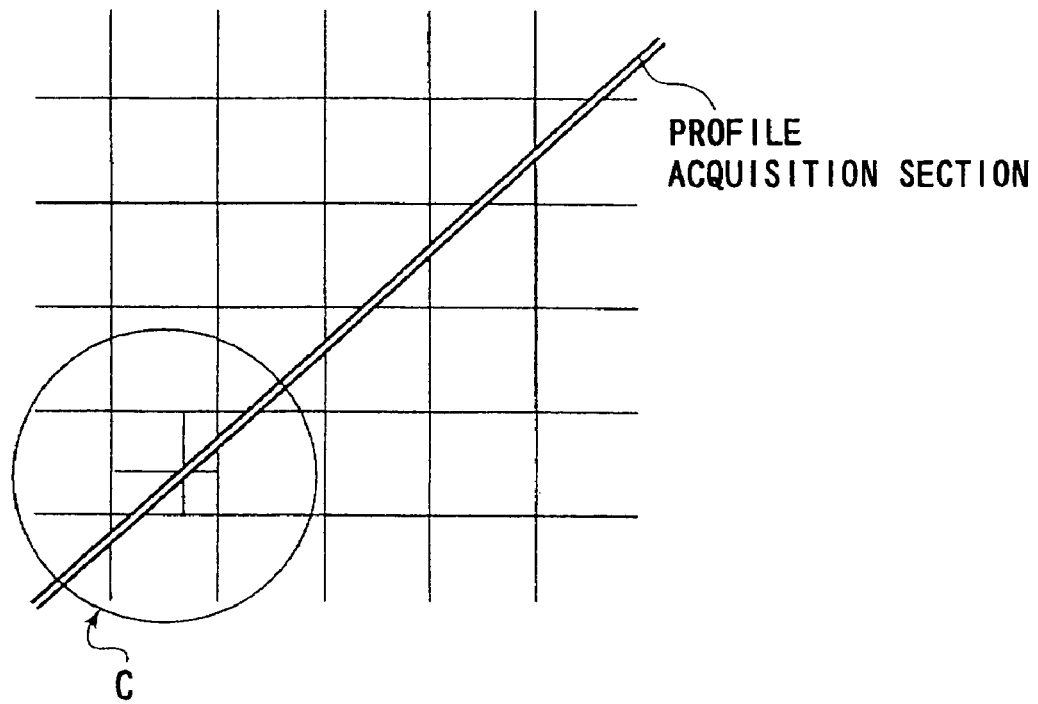
F I G. 75
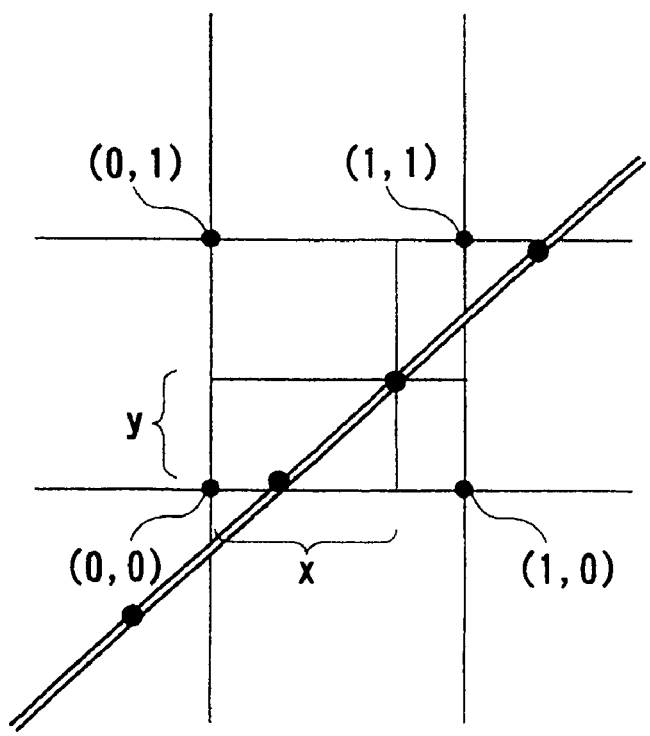

F I G. 77A
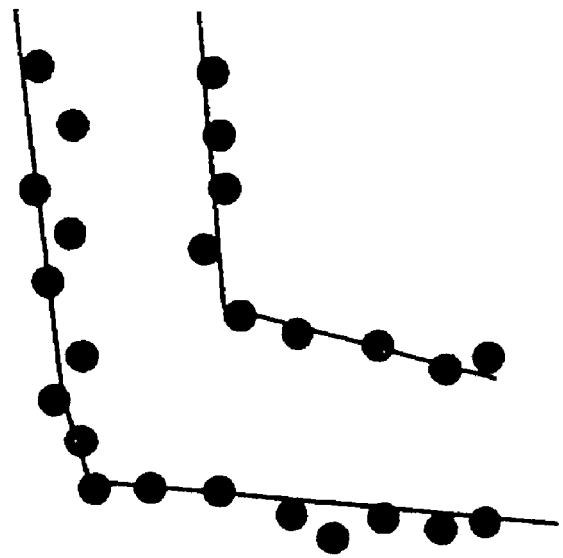
F I G. 77B
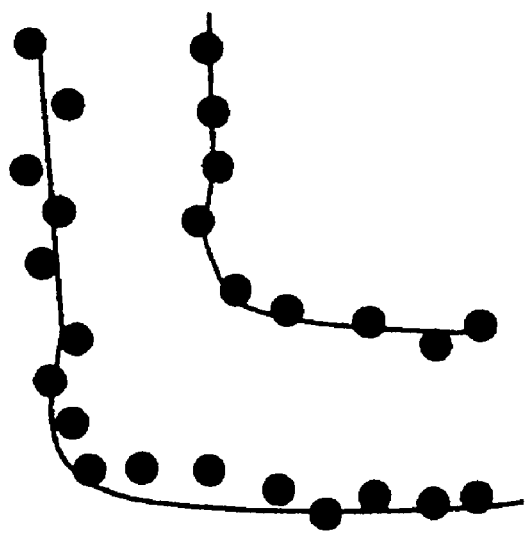

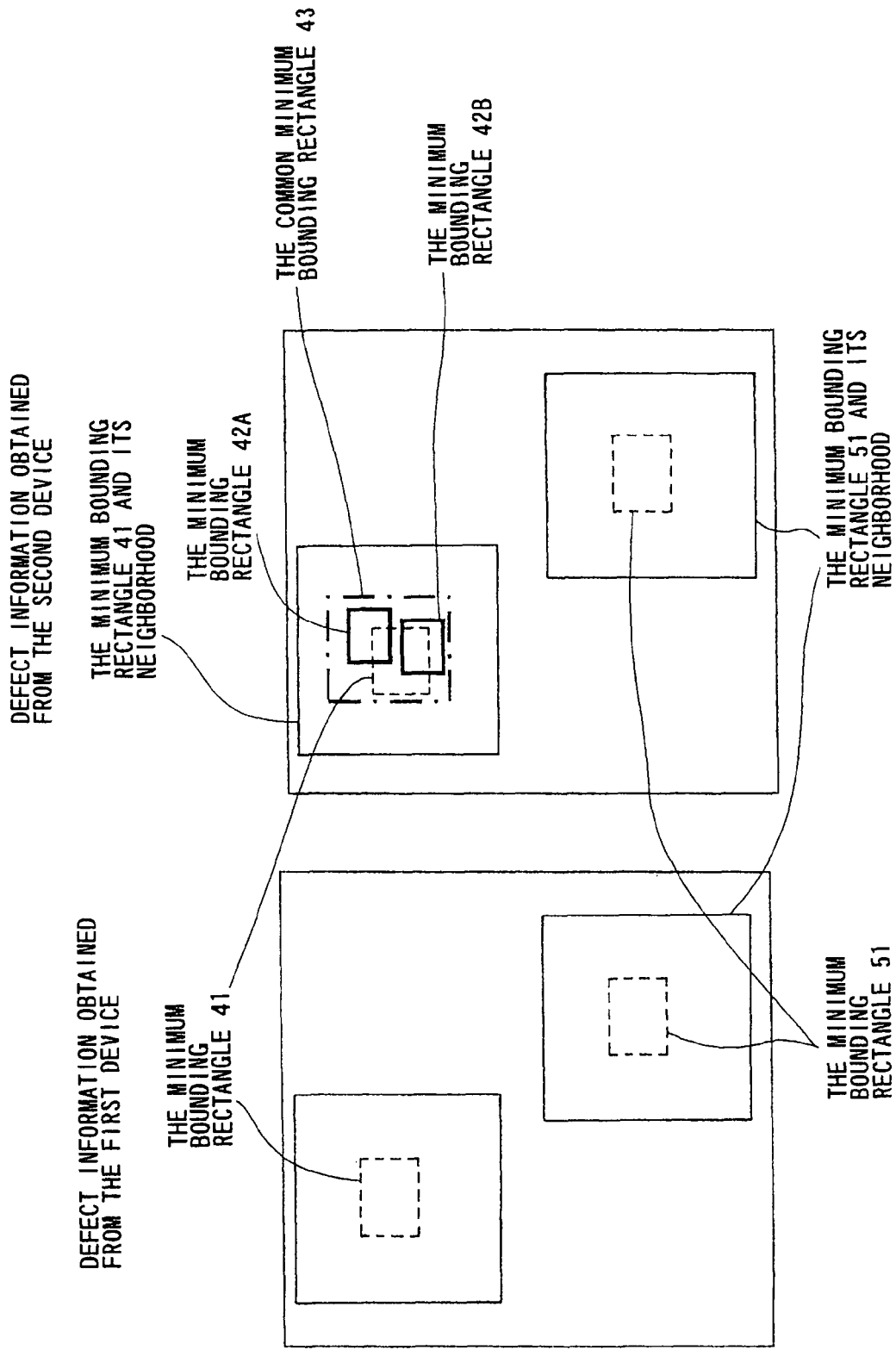

F I G. 8 2
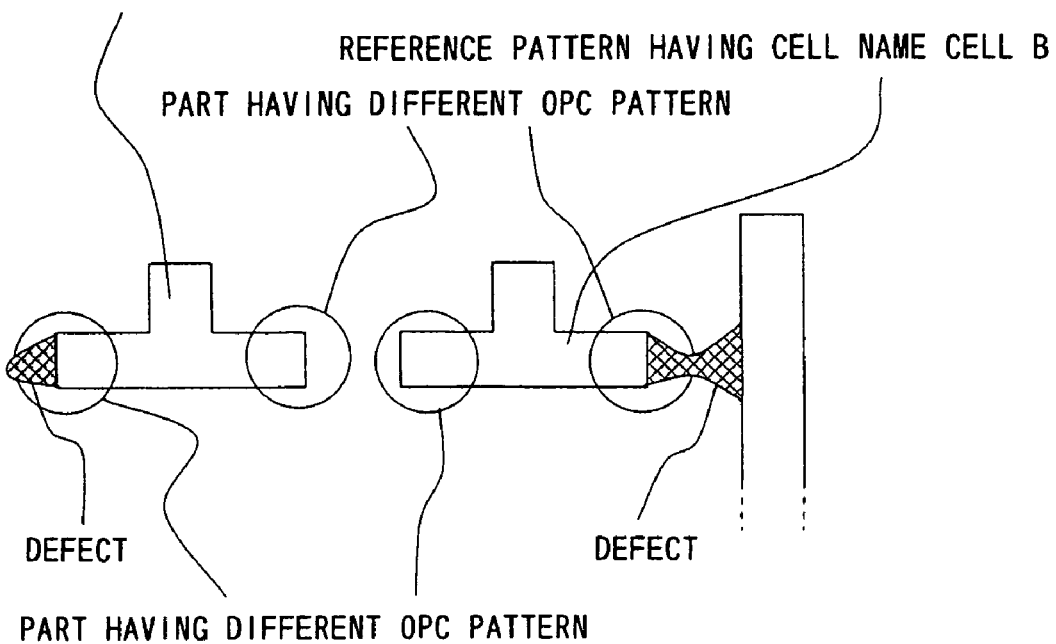

F I G. 8 3
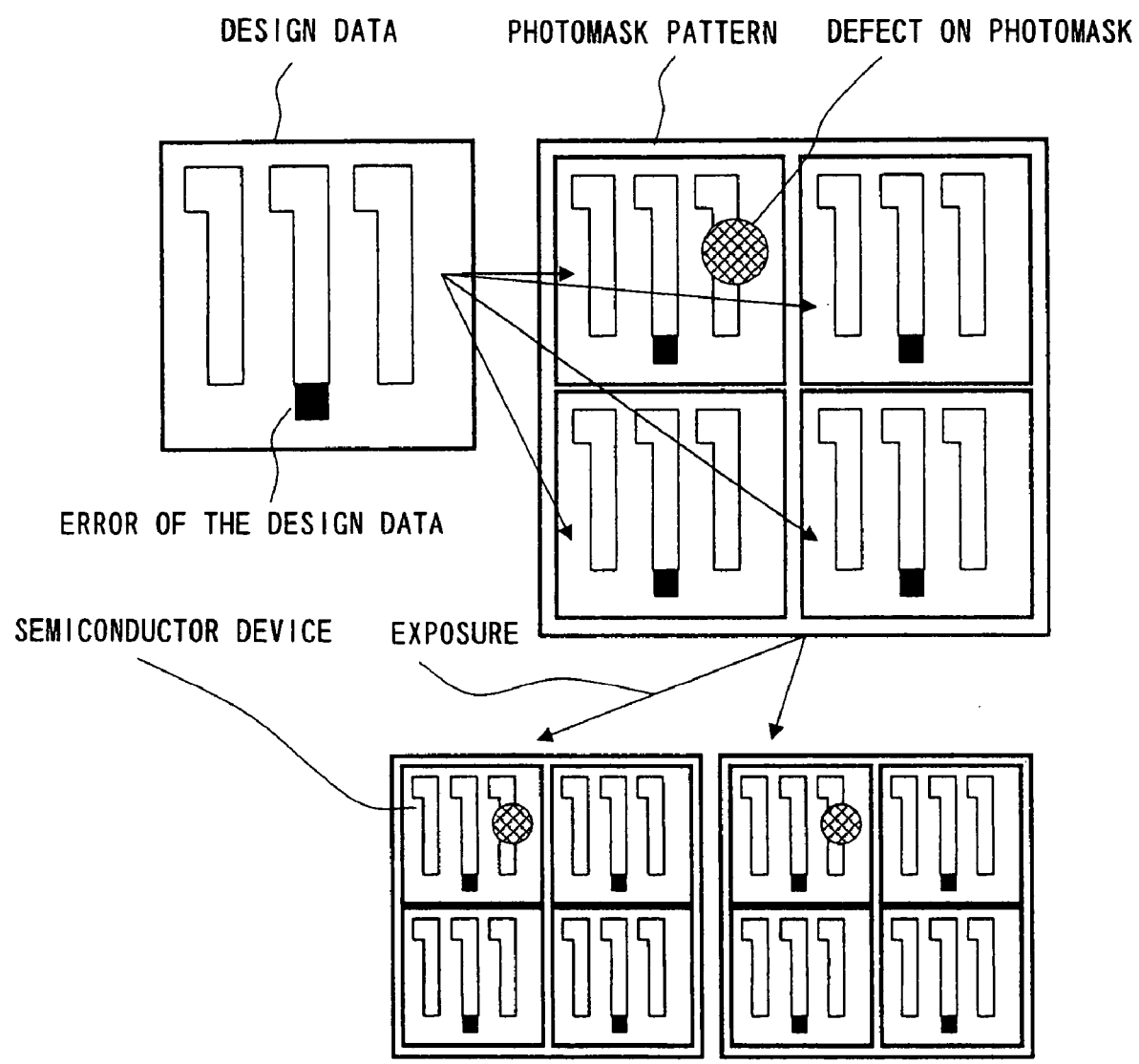

L-SHAPED PATTERN

F I G. 94
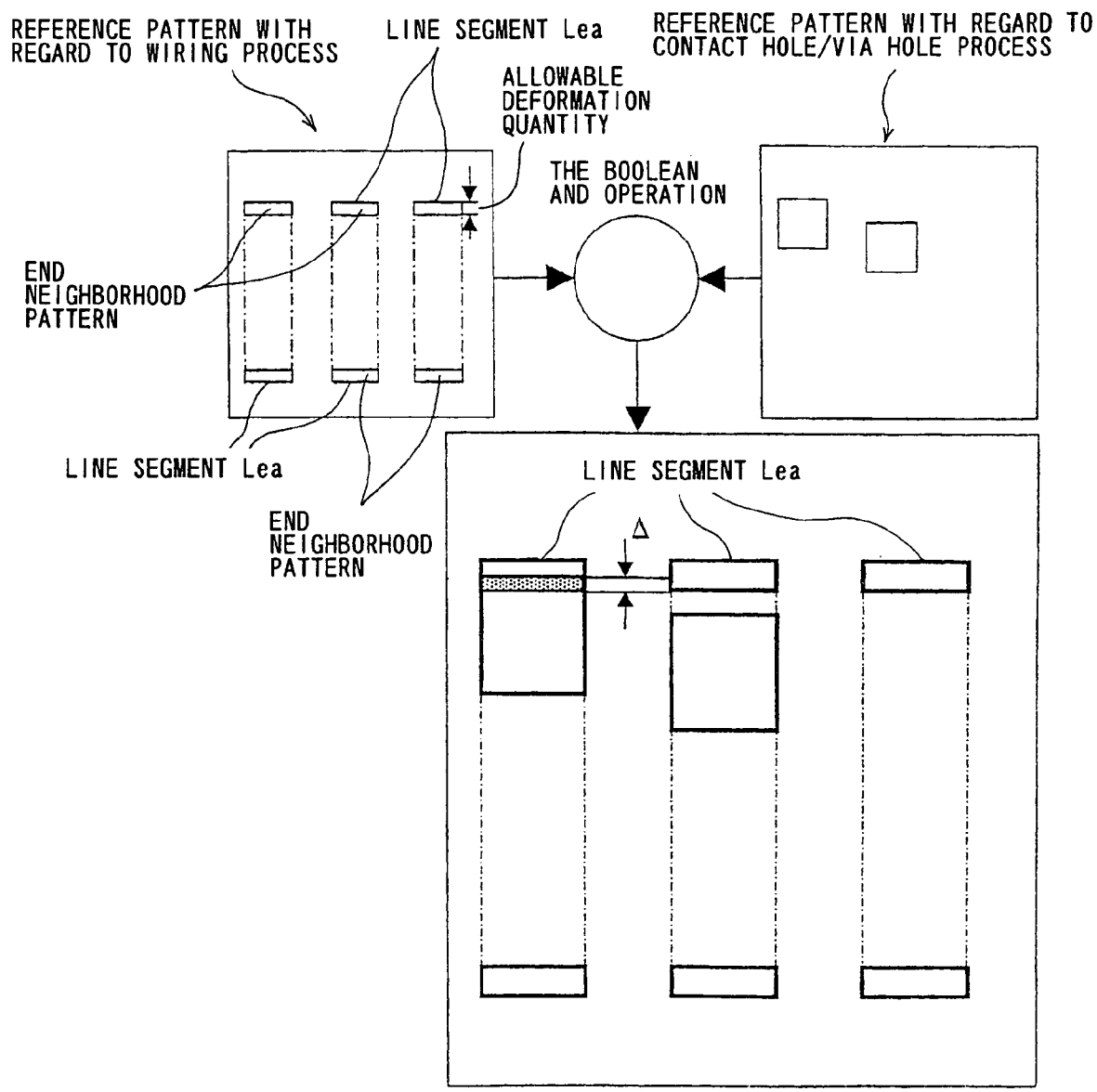

F I G. 95A
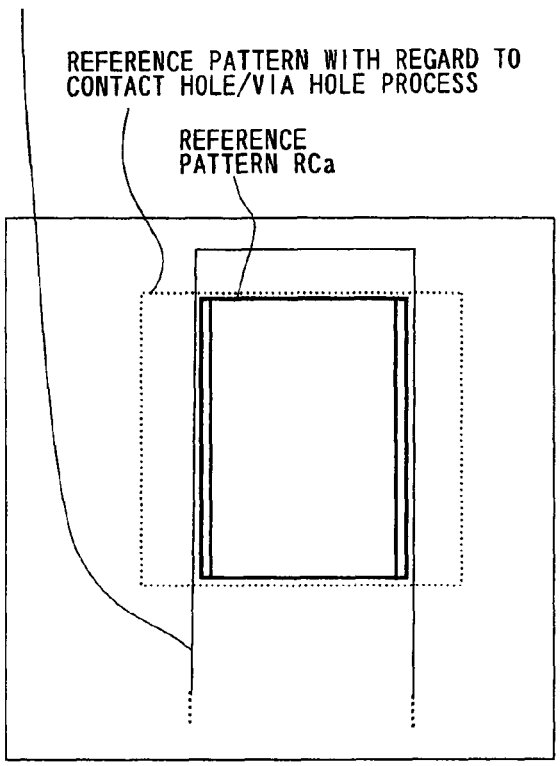
REFERENCE PATTERN WITH REGARD TO
WIRING PROCESS
REFERENCE PATTERN WITH REGARD TO
CONTACT HOLE/VIA HOLE PROCESS
REFERENCE
PATTERN RCa
F I G. 95B
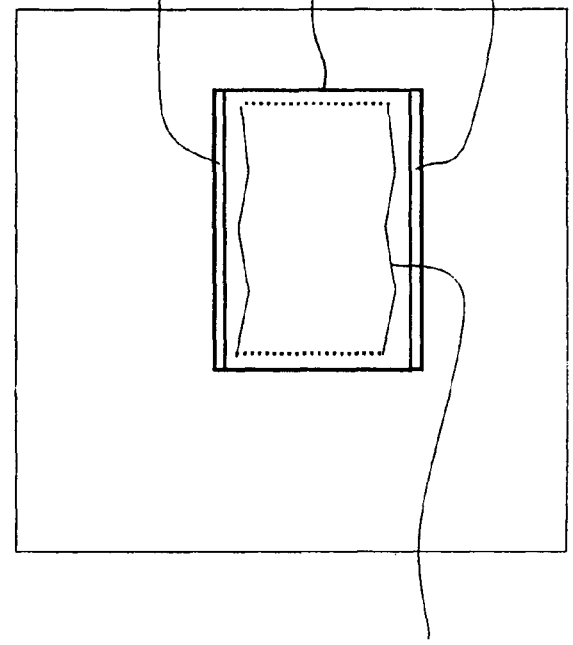
LINE SEGMENT Ld
WHICH HAD EXISTED
IN THE DESIGN DATA
REFERENCE
PATTERN RCa
POLYGON Pca OBTAINED BY
CONNECTING DETECTED EDGES FIG.99
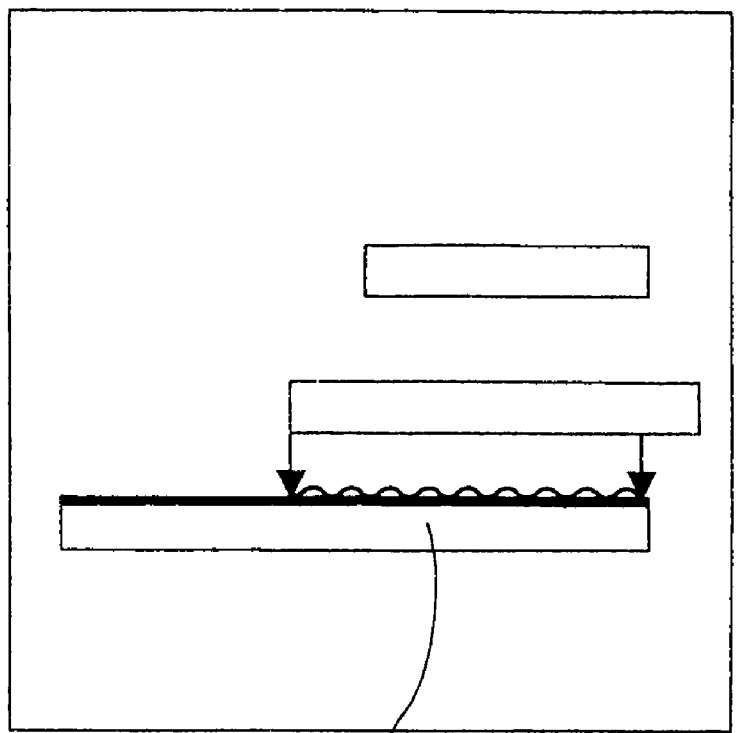
PROXIMATE LINE SEGMENT
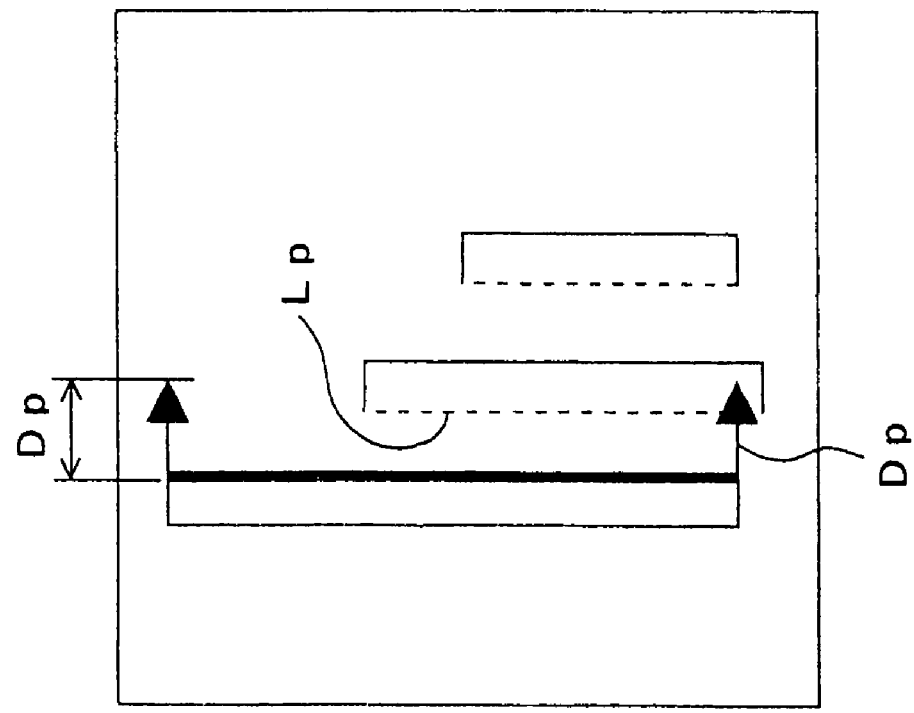

FIG.100
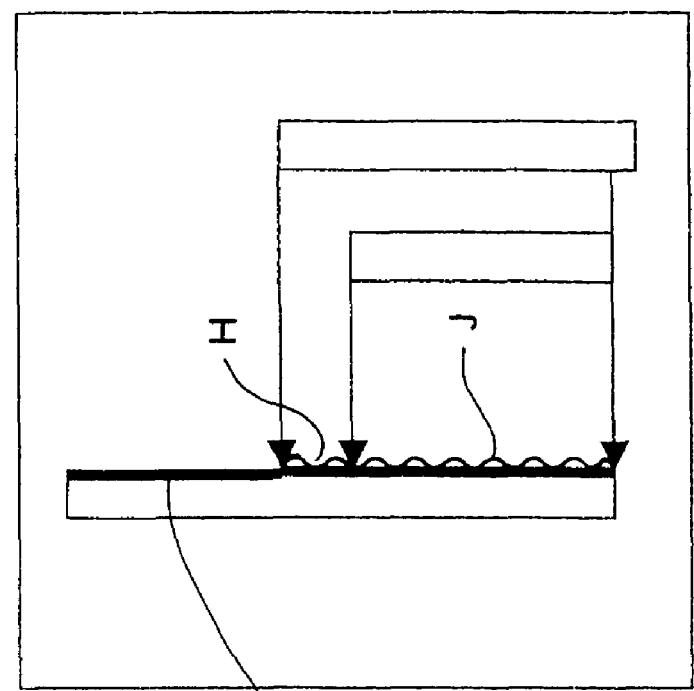
REMOTE LINE SEGMENT
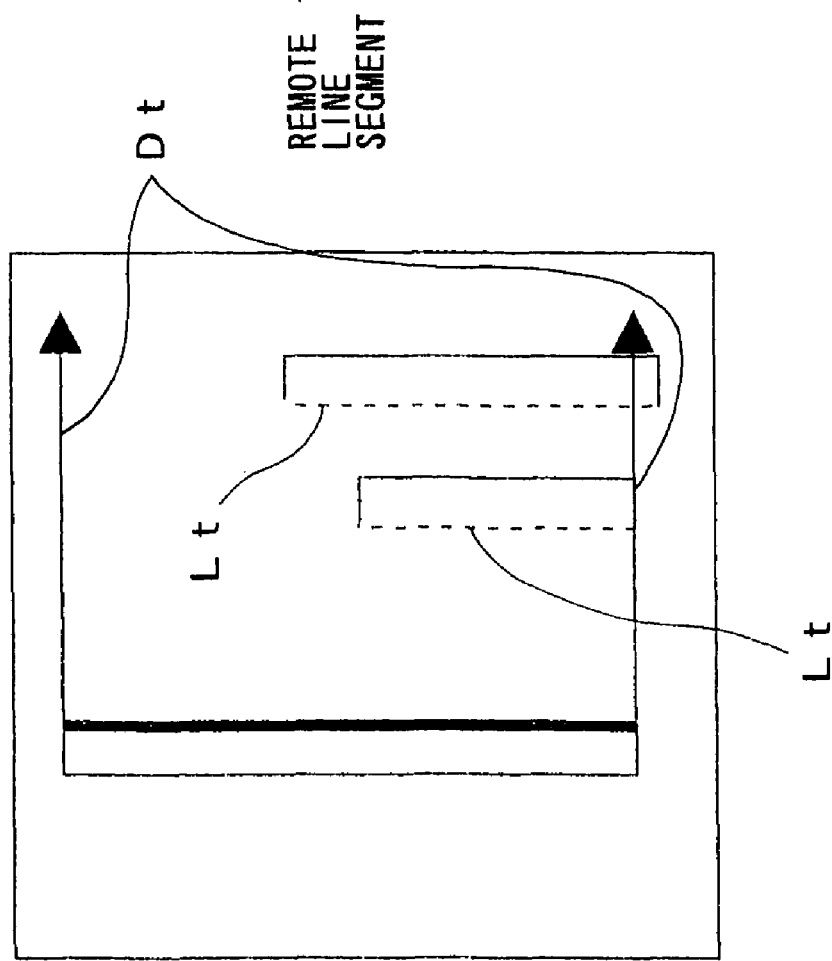
Dt
Lt
Lt

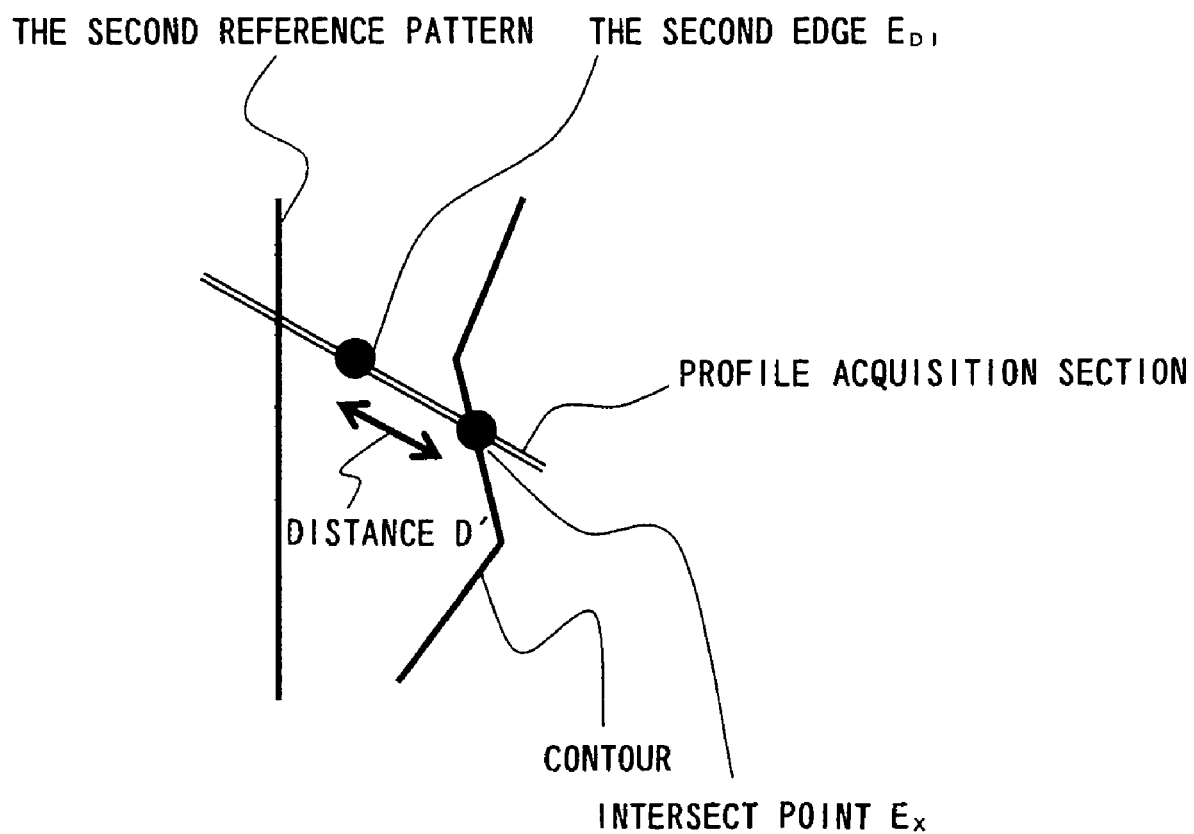
F I G. 1 0 6

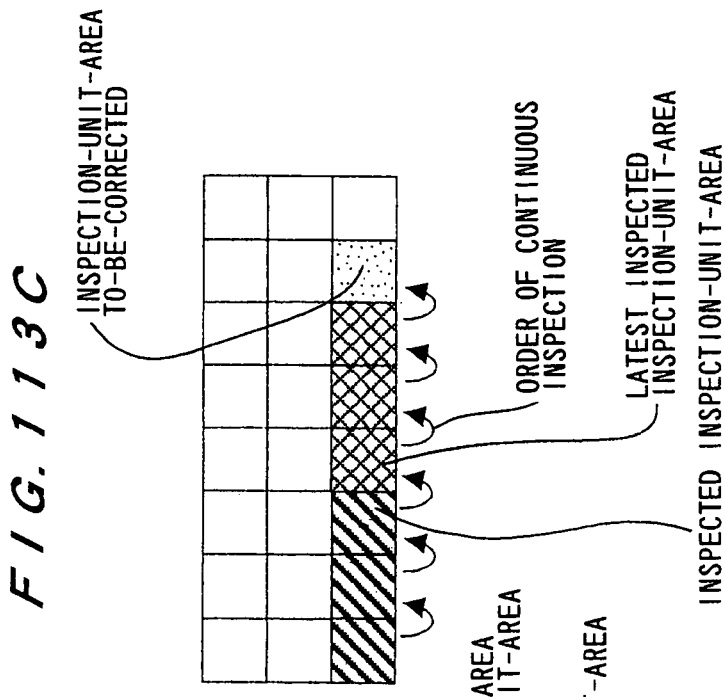
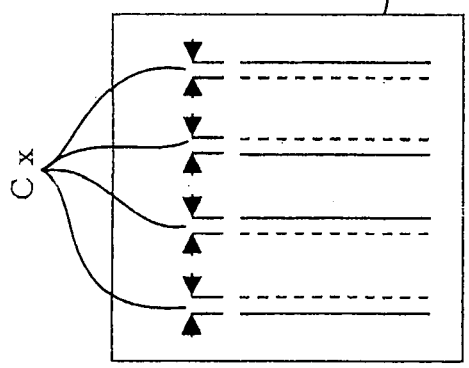
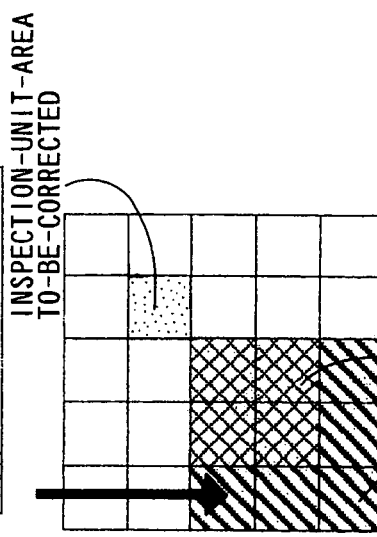

F I G. 1 1 6
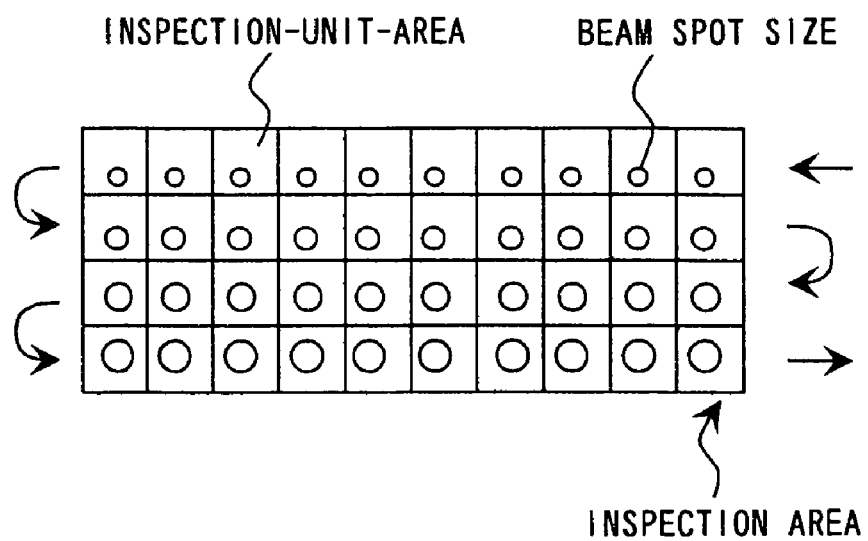
F I G. 1 1 7
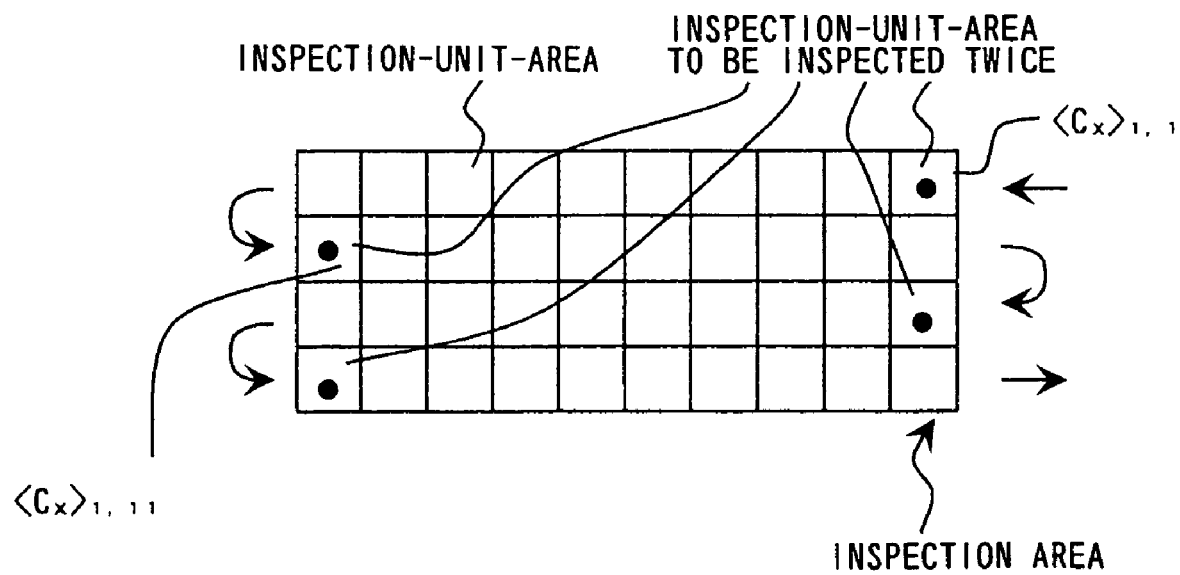

F I G. 1 1 8
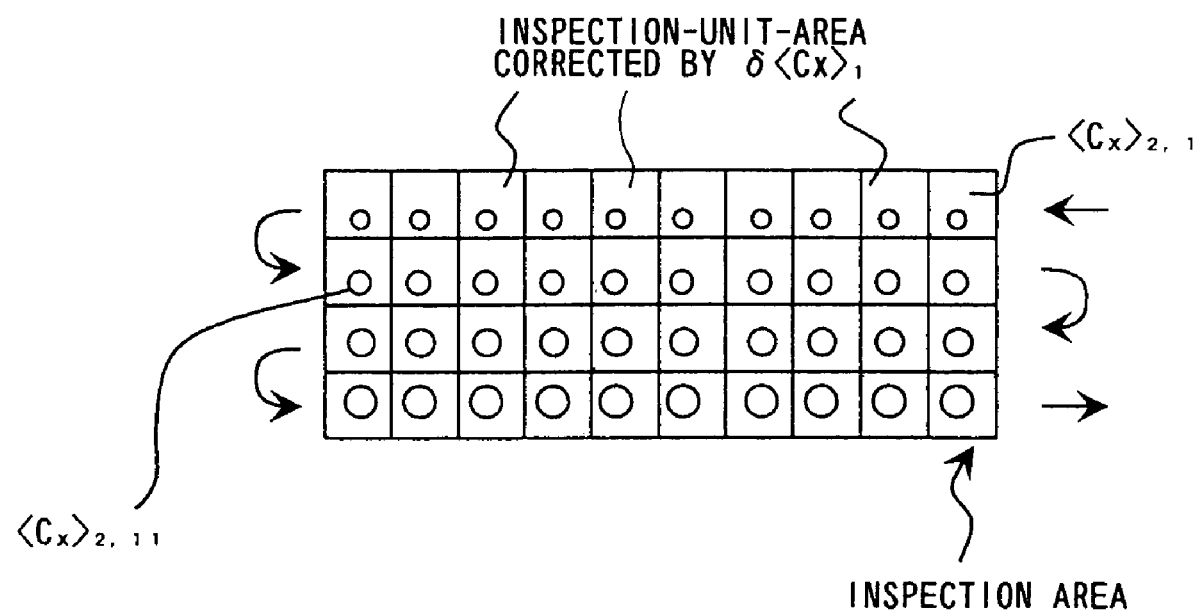

F I G. 1 2 0
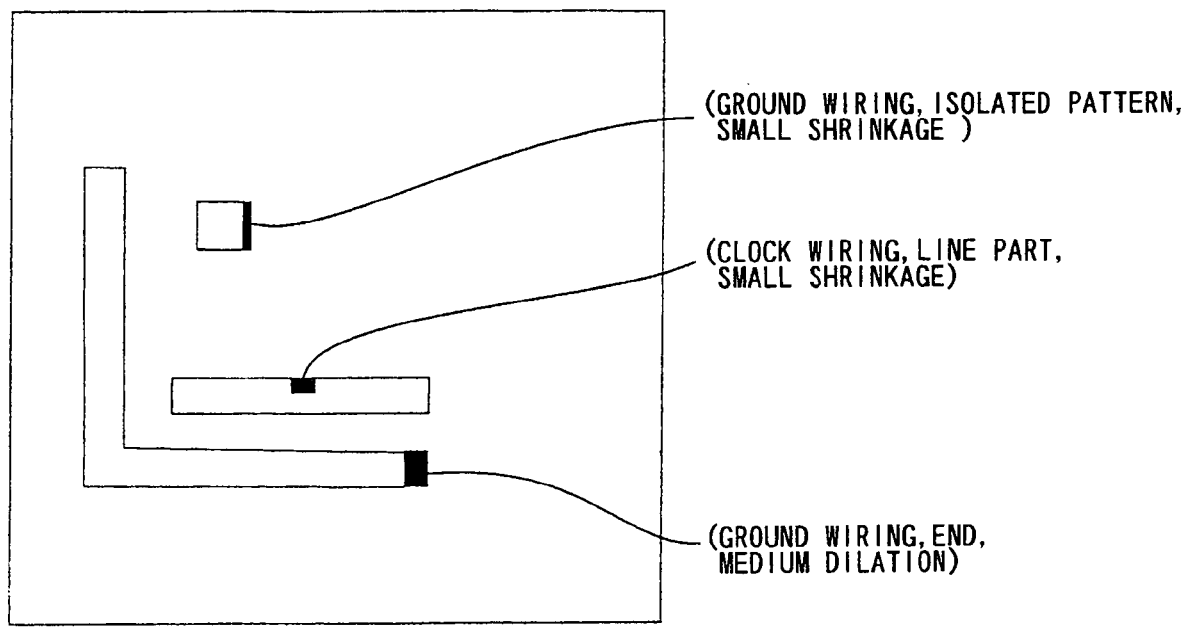

FIG. 123
TWO 100nm UPWARD
LINE-SHAPED POLYGONS
ONE 100nm SHORT
HORIZONTAL
LINE-SHAPED POLYGON
ONE 100nm UPWARD
LINE-SHAPED POLYGON
ONE 100nm DOWNWARD
LINE-SHAPED POLYGON
ONE 100nm SHORT
HORIZONTAL
LINE-SHAPED POLYGON
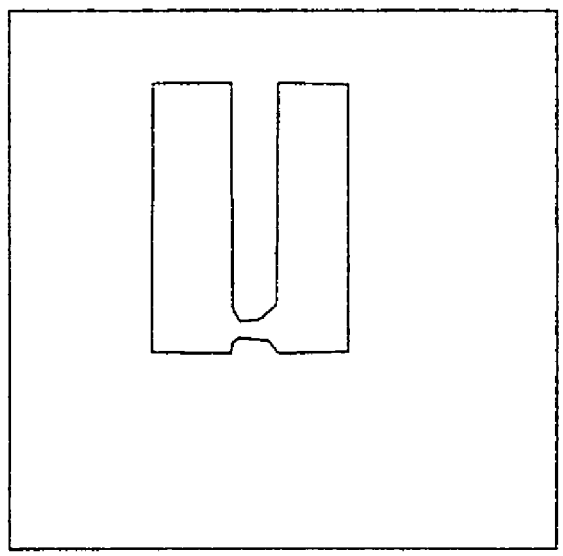
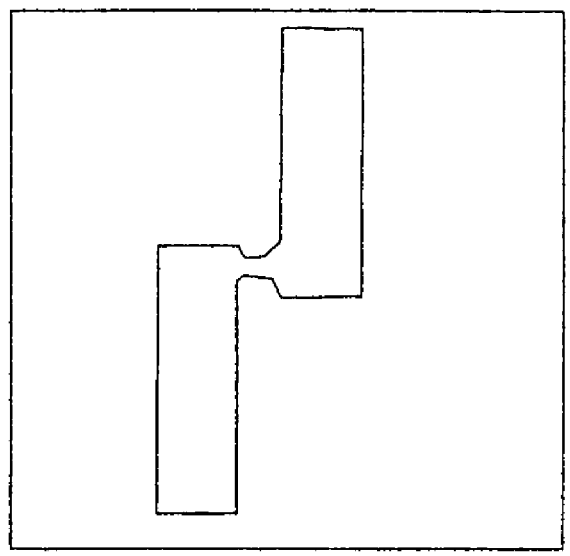

DEFECT
DISTRIBUTION DIAGRAM

F I G. 1 2 5
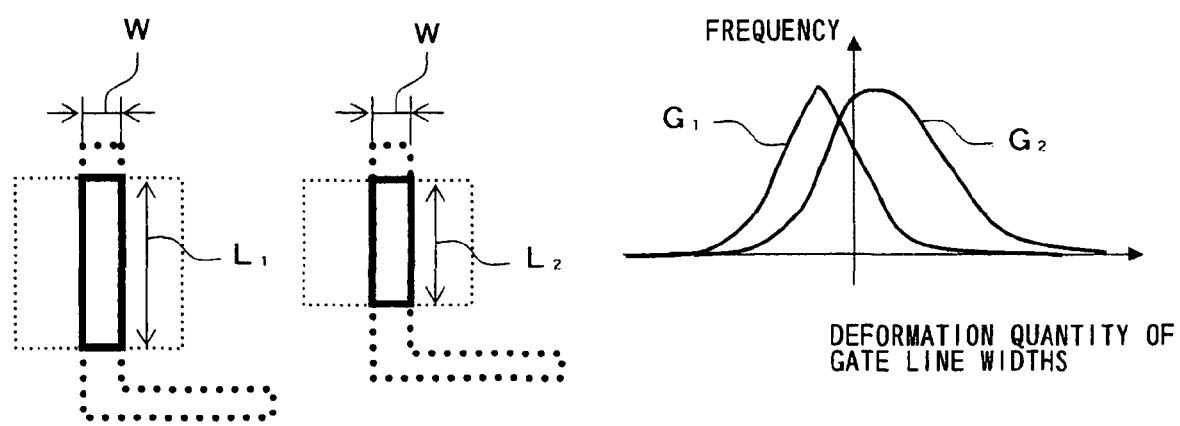

ELECTRON
BEAM

F I G. 1 3 2
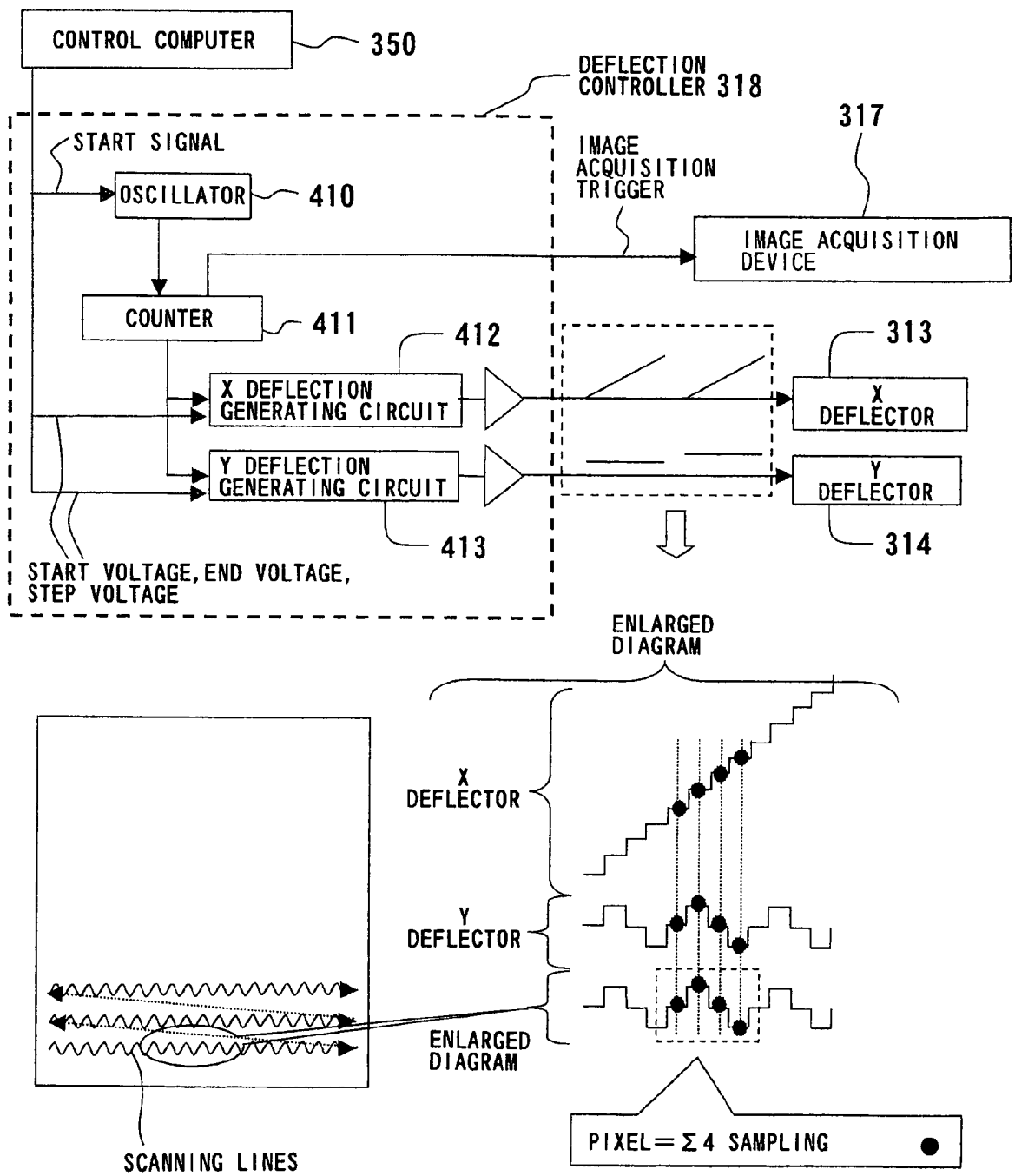

F I G. 1 3 4
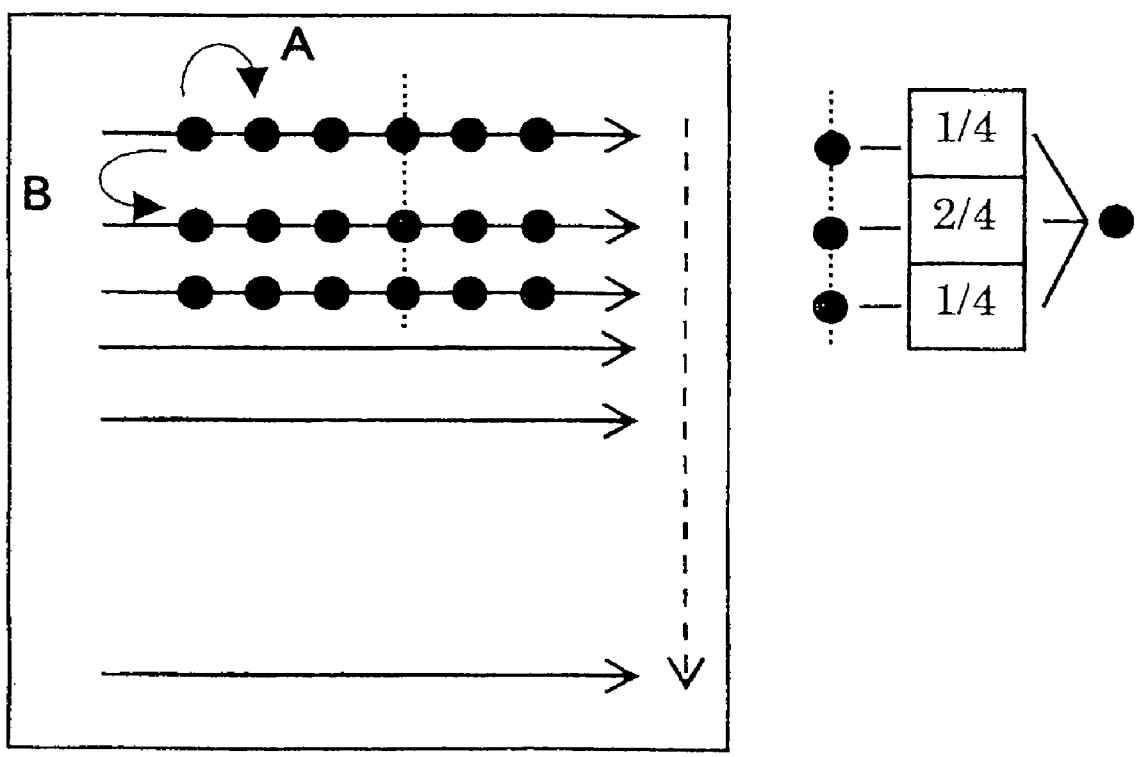

FIG. 135
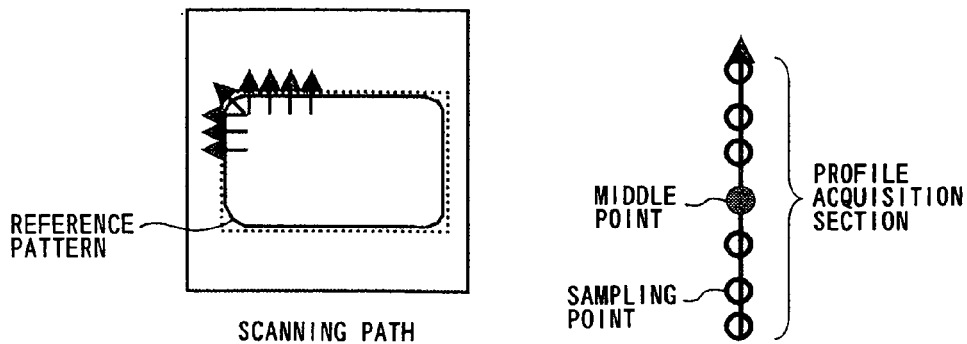
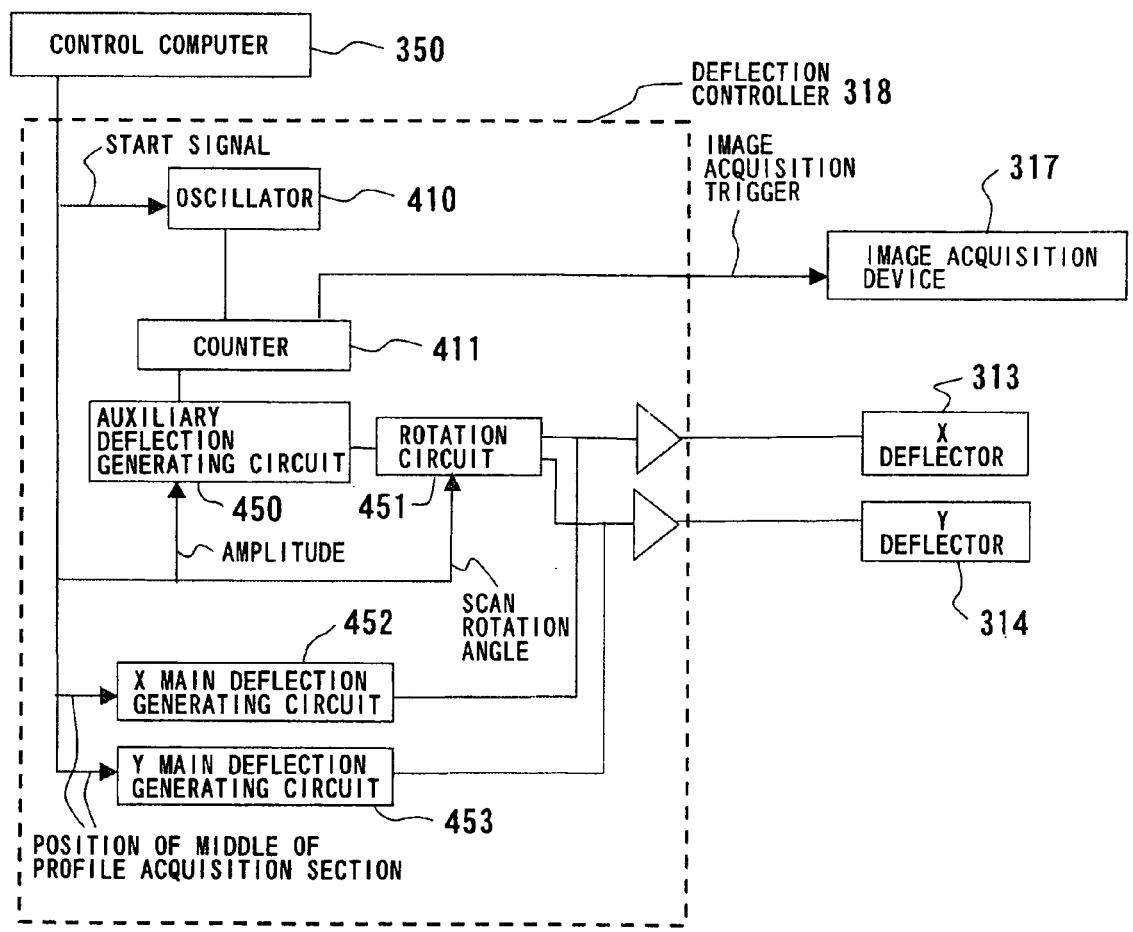

SKIPPING 2

RANDOM NUMBERS

REFERENCE PATTERN K SUITABLE FOR LINE WIDTH INSPECTION

THE MINIMUM RECTANGULAR R INCLUDING REFERENCE PATTERN K
PARTIAL REGION Sa
PARTIAL REGION Sb
LENGTH L OF PROFILE ACQUISITION SECTION

THE MINIMUM RECTANGULAR R INCLUDING REFERENCE PATTERN K
PARTIAL REGION Sc
LENGTH L OF PROFILE ACQUISITION SECTION

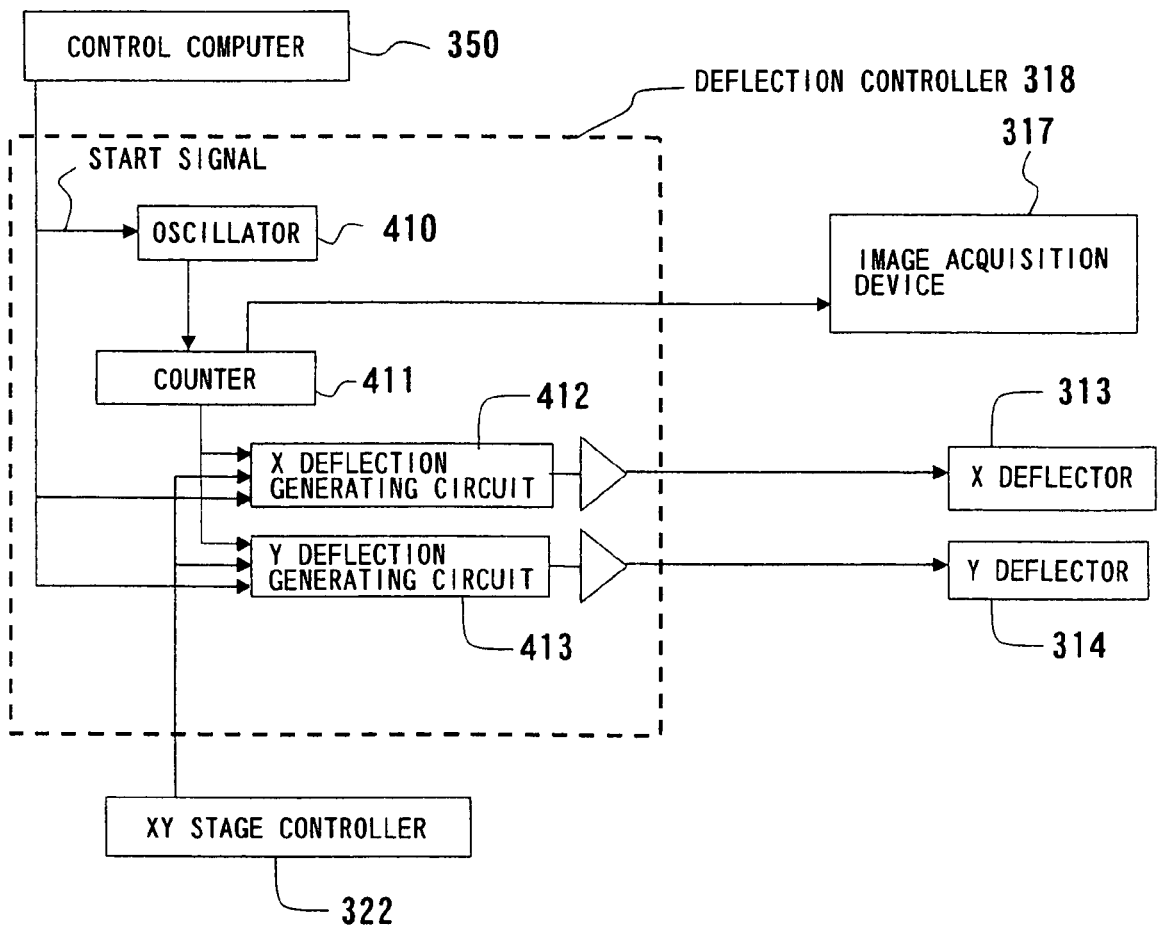
F I G. 1 3 9

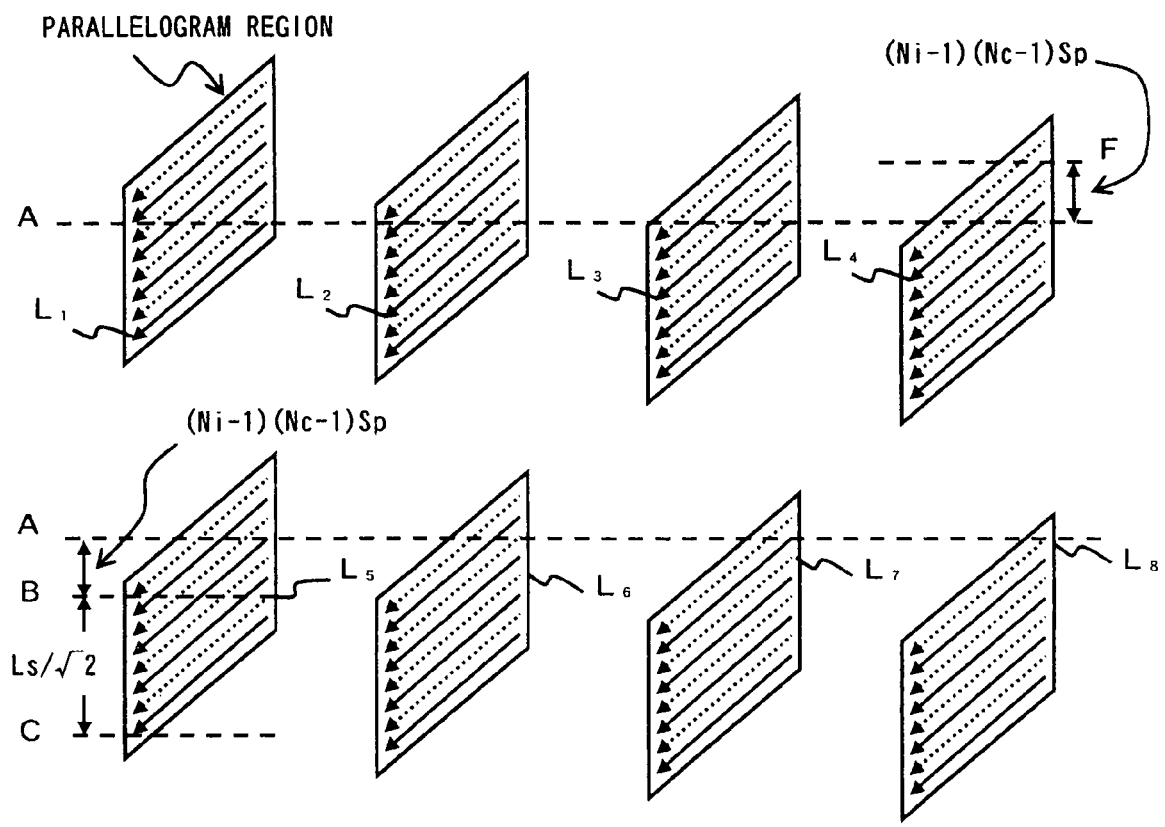
F I G. 1 4 1

F I G. 142
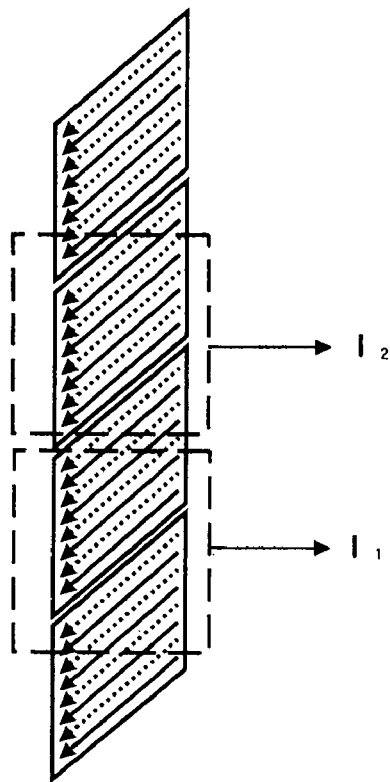
F I G. 143
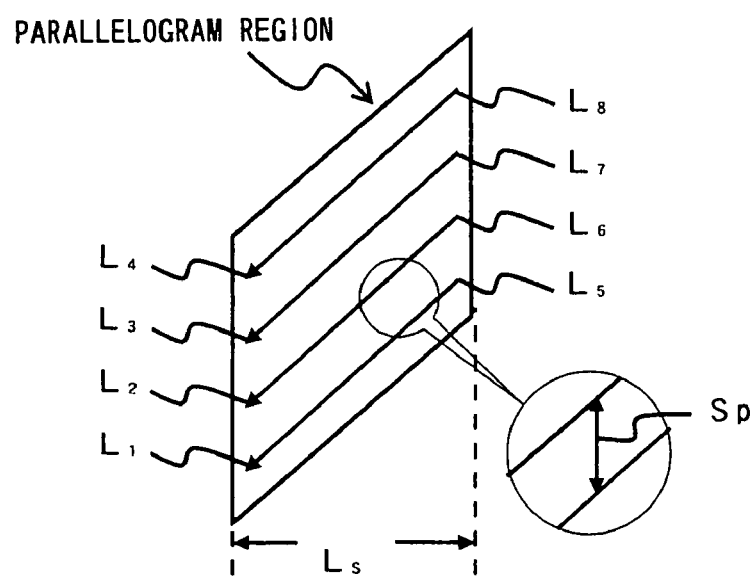

F I G. 1 4 6
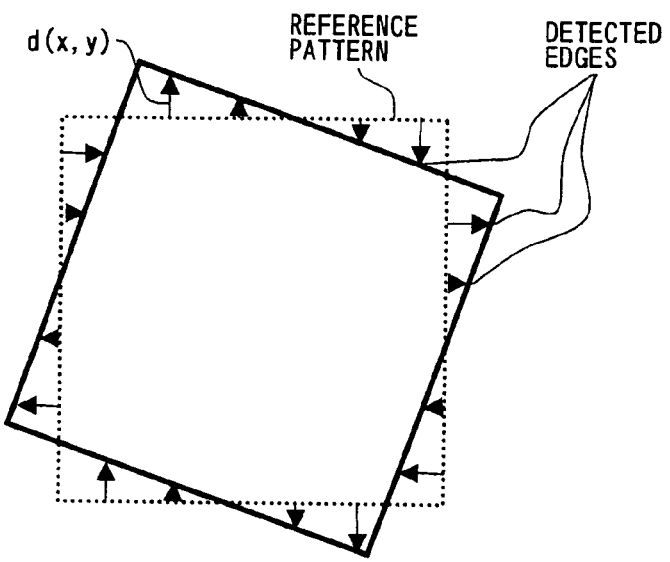
F I G. 1 4 7
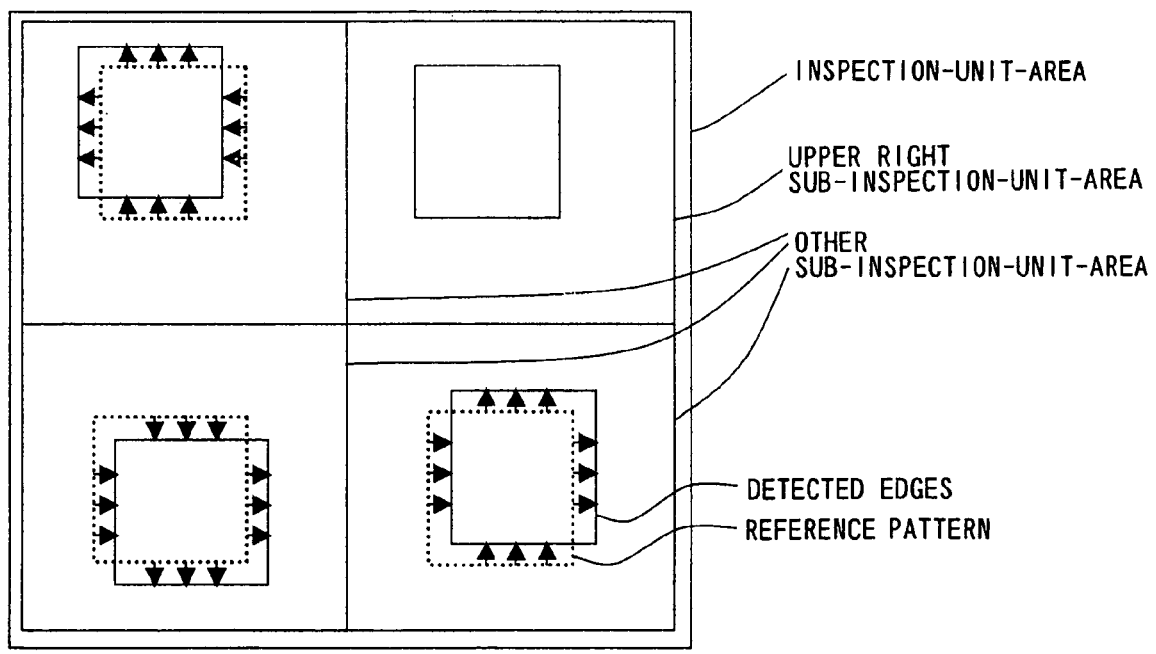

F I G. 1 4 8
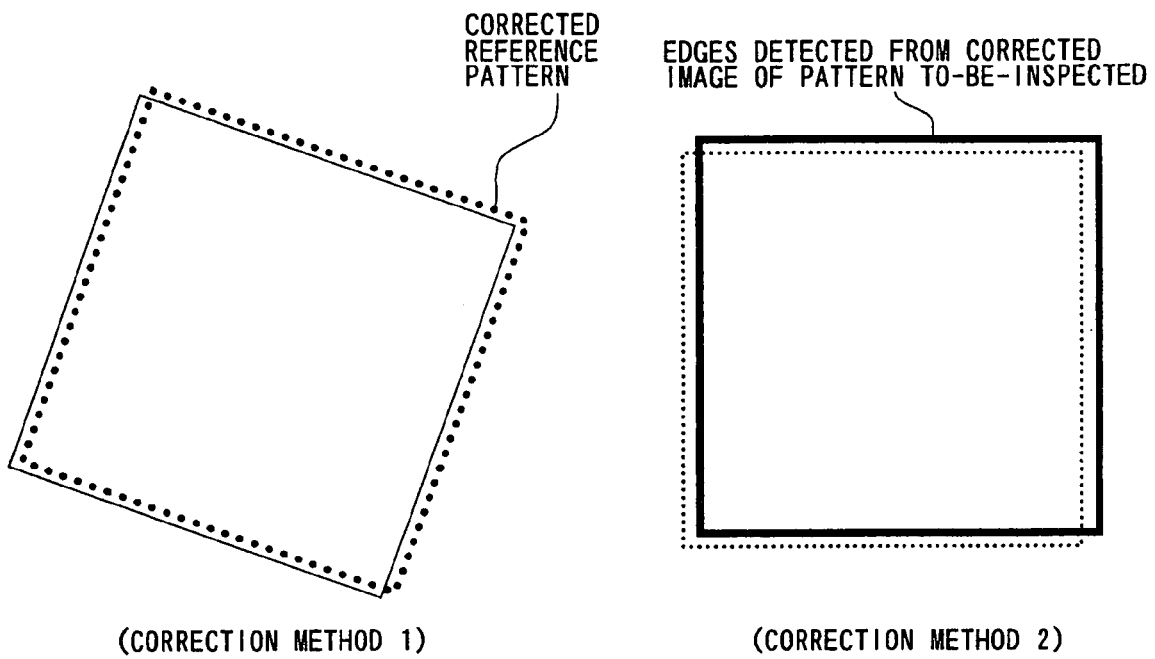
(CORRECTION METHOD 1)
(CORRECTION METHOD 2)
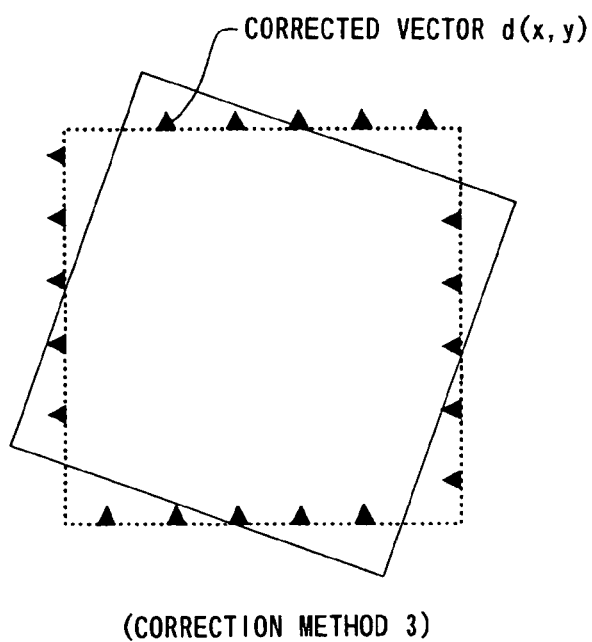
(CORRECTION METHOD 3)

FIG. 153A
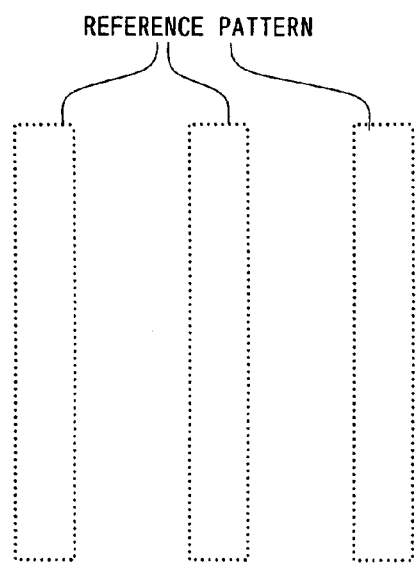
REFERENCE PATTERN
PROJECTION DATA OF
VERTICAL LINE SEGMENTS
FIG. 153B
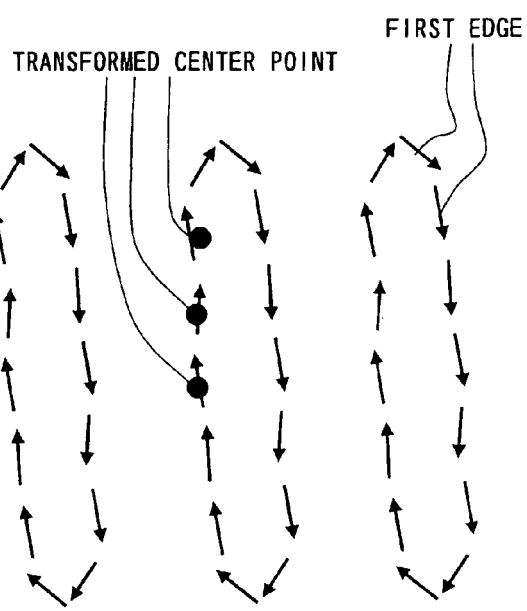
TRANSFORMED CENTER POINT    FIRST EDGE
PROJECTION DATA OF EDGES
FIG. 153C
PROJECTION DATA OF EDGES
PROJECTION DATA OF EDGES MAGNIFIED
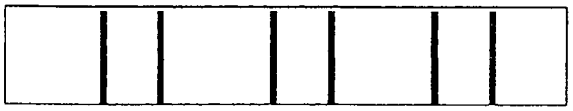
PROJECTION DATA OF
VERTICAL LINE SEGMENTS F I G. 154
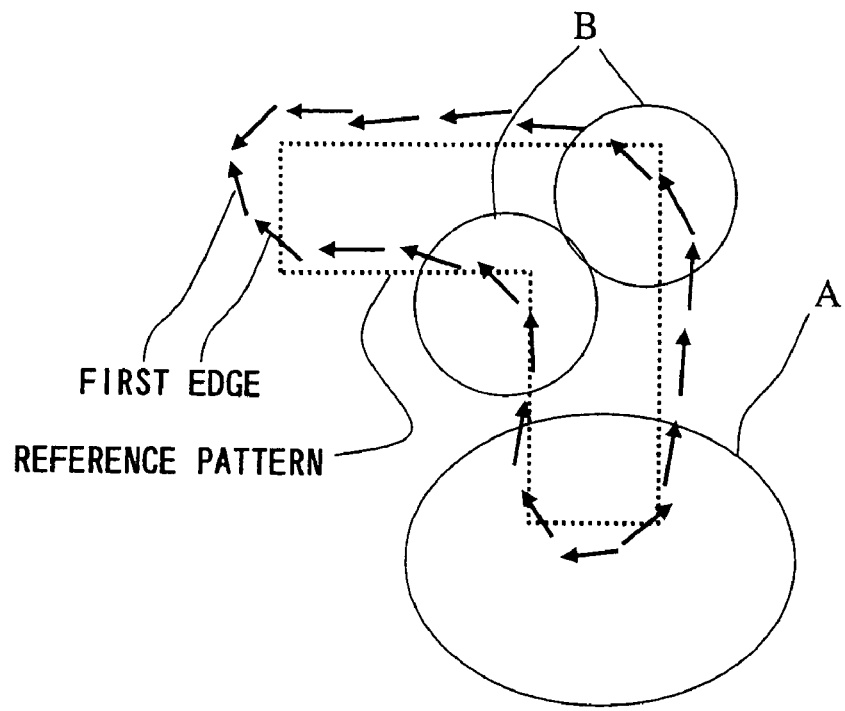
F I G. 155
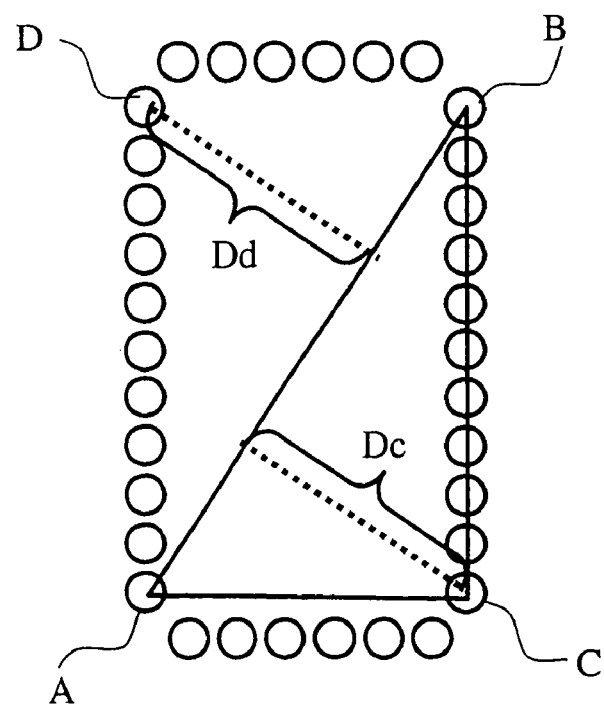

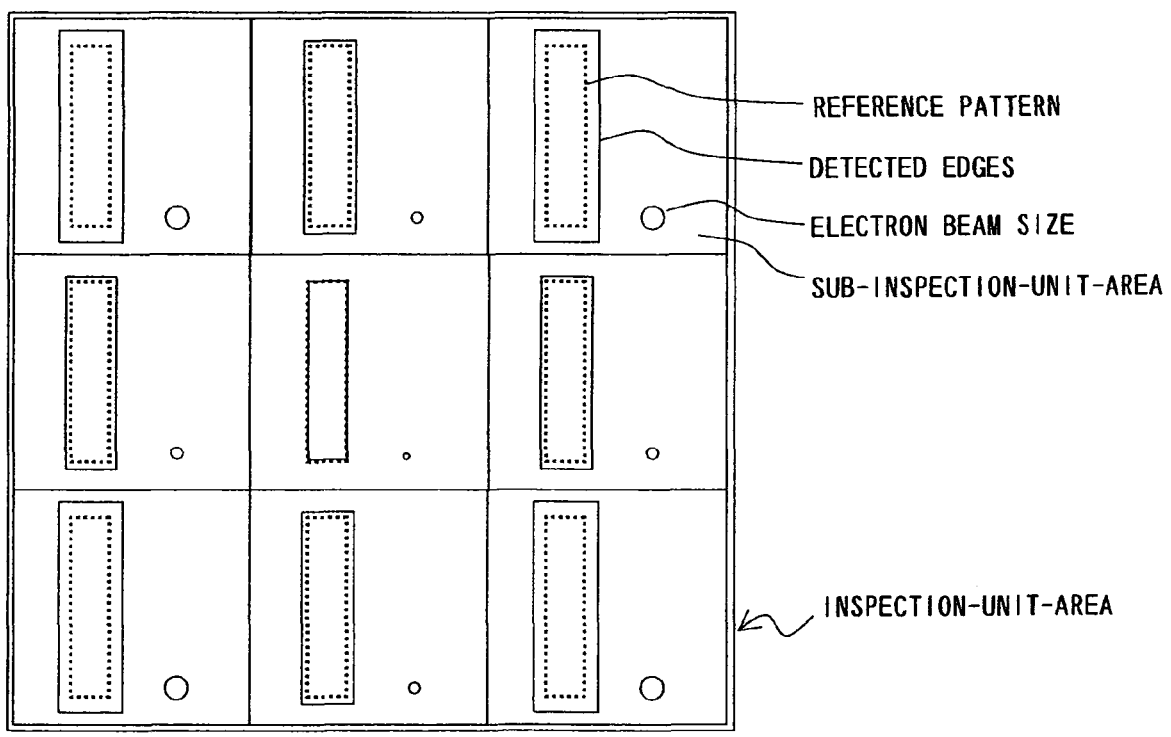
F I G. 163

F/G. 165
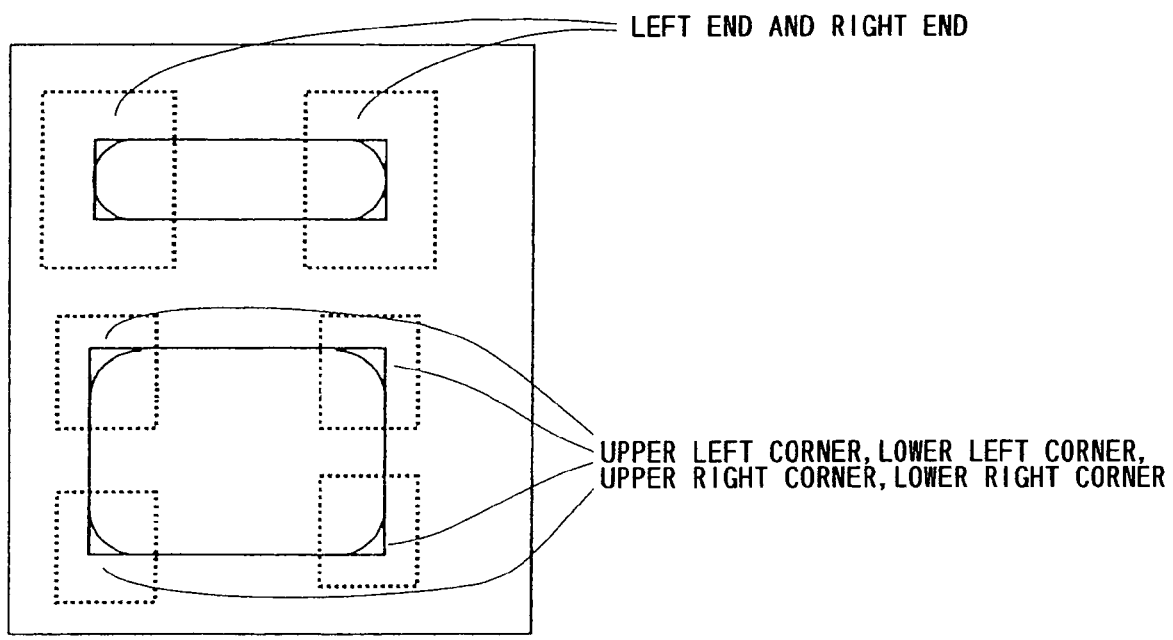

F I G. 1 6 6
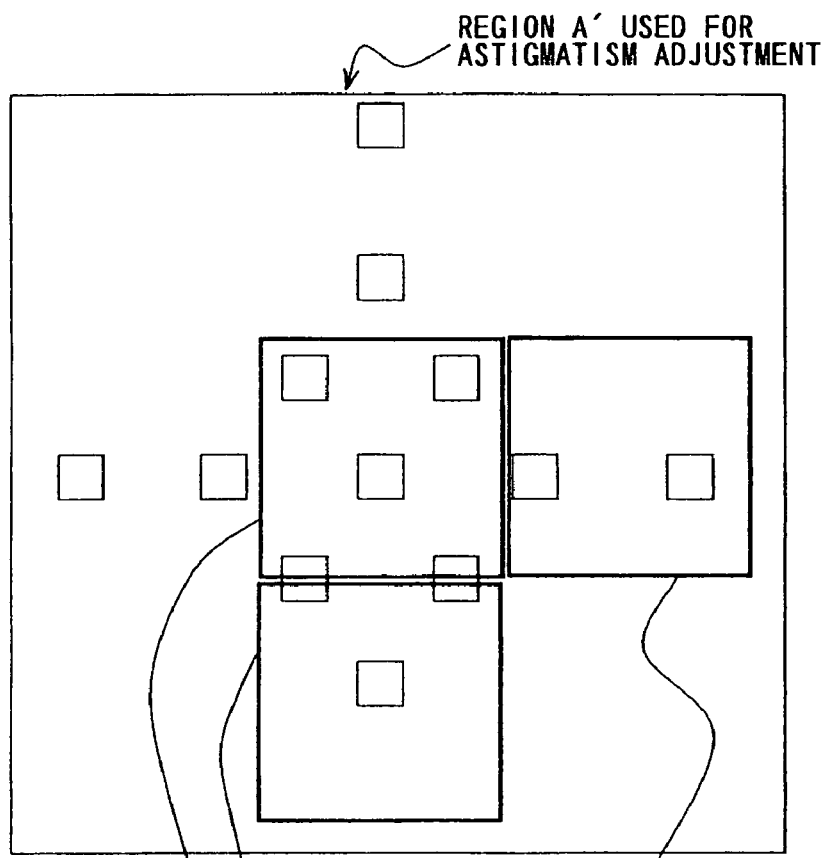
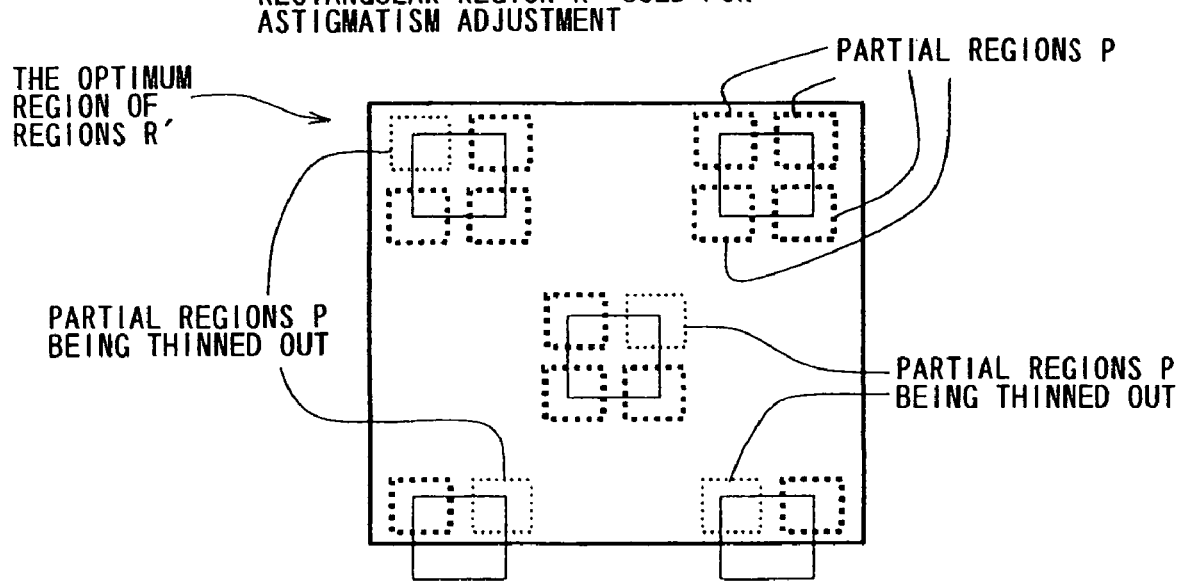

F I G. 175
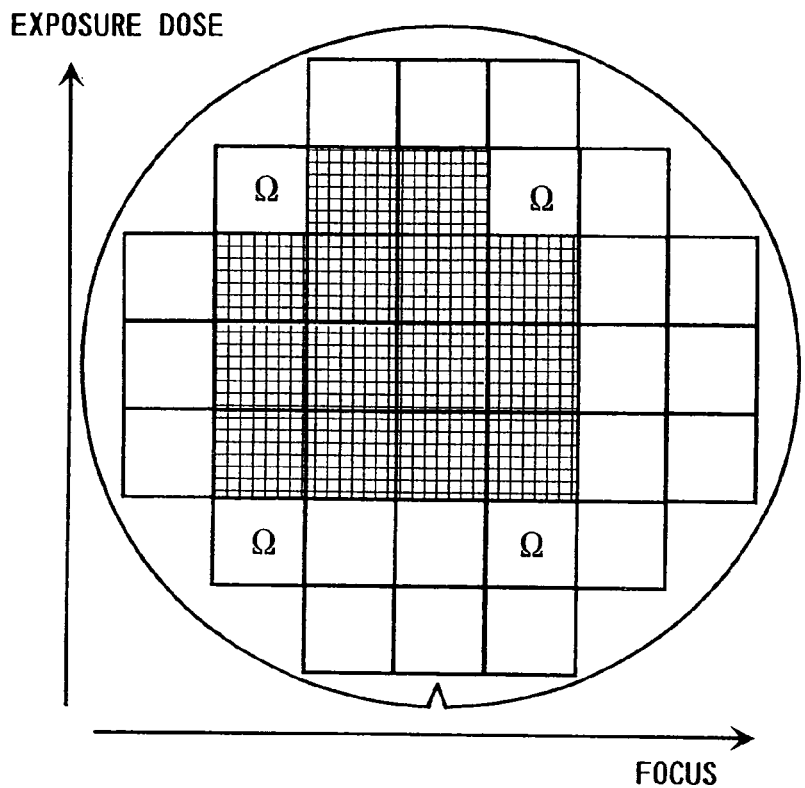
F I G. 176
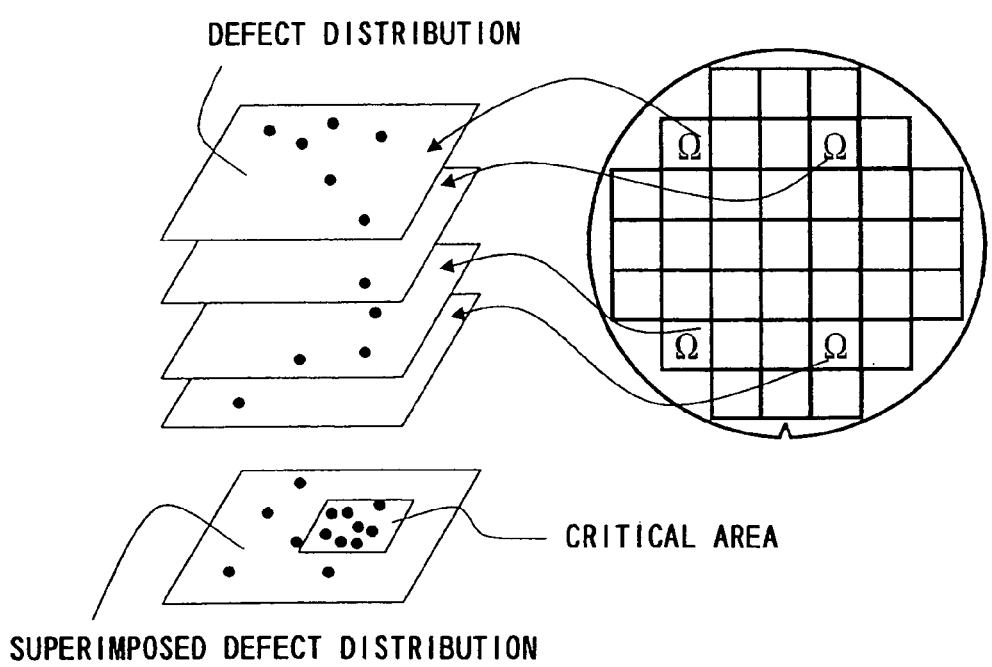

ially large. Actually, pattern deformation occurs due
PATTERN INSPECTION APPARATUS AND METHOD This is a continuation-in-part application of U.S. application Ser. No. 11/058,616 filed Feb. 16, 2005, which is a continuation-in-part application of U.S. application Ser. No. 10/689,021 filed Oct. 21, 2003 now abandoned, which is a continuation-in-part application of U.S. application Ser. No. 09/648,372 filed Aug. 25, 2000, now U.S. Pat. No. 6,868,175.

BACKGROUND OF THE INVENTION

1. Field of the Invention

The present invention relates to a pattern inspection apparatus and method, and more particularly to an apparatus and a method for inspecting a fine pattern, such as a semiconductor integrated circuit (LSI), a liquid crystal panel, and a photomask (reticle) for the semiconductor or the liquid crystal panel, which are fabricated based on data for fabricating the fine pattern such as design data.

2. Description of the Related Art

For the pattern inspection of a wafer in a fabricating process of semiconductor integrated circuit or the pattern inspection of a photomask for pattern formation of a wafer, an optical pattern inspection apparatus that uses the die-to-die comparison method has been used. In the die-to-die comparison method, a defect is detected by comparing an image obtained from a die to-be-inspected and an image obtained from the equivalent position of a die adjacent to the die to-be-inspected. In this case, the die means a semiconductor device.

On the other hand, for the inspection of a photomask (reticle) having no adjacent die, the die-to-database comparison method has been used. In the die-to-database comparison method, mask data is converted into an image. Then the image is used for a substitution of the image of the adjacent die used in the die-to-die comparison method, and inspection is performed in the same manner as the above. Here, the mask data is data obtained by applying photomask correction to design data. The technology concerned is disclosed, for example, in U.S. Pat. No. 5,563,702, "Automated photomask inspection apparatus and method."

However, by using the die-to-database comparison method for wafer inspection, corner roundness of a pattern formed on a wafer is likely to be detected as a defect. In the inspection of a photomask, a pretreatment, which adds corner roundness to the image converted from the mask data by applying a smoothing filter, prevents the corner roundness of the pattern from being detected as the defect. However, in the inspection of a wafer, because the corner roundness added by the pretreatment may be different from corner roundness of each pattern actually formed on the wafer, the pretreatment may not perfectly prevent the corner roundness of the pattern from being detected as the defect. Therefore, an allowable pattern deformation quantity should be set in order to ignore the above difference. As a result, a problem in which a fine defect existing in a place except a corner cannot be detected has happened.

The above problem is not severe for the die-to-database comparison photomask inspection, because the photomask should correspond to the mask data as much as possible. Therefore, currently, the die-to-database comparison photomask inspection has been put into practical use. However, the above problem is severe for the die-to-database comparison wafer inspection, because a pattern formed on the wafer is allowed to be deformed as long as an electrical property is guaranteed. This allowable pattern deformation quantity is considerably large. Actually, pattern deformation occurs due to a difference in stepper exposure conditions, or the like. Therefore, the die-to-database comparison wafer inspection has not been put into practical use.

From a viewpoint of problems in semiconductor integrated circuit fabrication, repeated defects (systematic defects) are more important issue than a random defect caused by a particle or the like. The repeated defects are defined as defects that occur repeatedly over all dies on a wafer caused by photomask failure, or the like. Because the repeated defects occur in a die to-be-inspected and in adjacent dies that are to be compared with the die to-be-inspected, the die-to-die comparison wafer inspection cannot detect the repeated defects. Therefore, the die-to-database comparison wafer inspection has been demanded.

Although the die-to-die comparison wafer inspection has not been put into practical use because of calculation cost or the like, there have been proposed inspection methods in which design data and a wafer image are used. These inspection methods are disclosed in, for example, a literature: "Automatic failure part tracing method of a logic LSI using an electron beam tester," NEC Technical Report, vol. 50, No. 6, 1997. In this literature, the following methods are disclosed: a method in which projections of wiring edges on the X- and Y-axes are used; a method in which wiring corners are focused on; and a method in which a genetic algorithm is applied. Moreover, as a method used in this literature, a matching method in which after edges are approximated by straight lines, closed areas are extracted, and the closed areas are used for matching is described. However, these methods fail to realize an inspection speed that is usable in high-speed inspection, and fail to perform matching while detecting a pattern deformation quantity.

Further, currently, the automatic defect classification (ADC) method in which an image of a die having a defect is used has been used. However, the method cannot classify whether the defect is a killer defect or not, because the method cannot recognize which part of a circuit the defect destroys.

Moreover, a position of a defect detected by the die-to-die comparison inspection has an error caused by precision of a stage and an optical system of an inspection apparatus, and such error is approximately ten or more times larger than a line width of a pattern to-be-inspected. Due to the error, even if a defect position is related with design data, relationship between the defect position and the design data cannot be recognized.

Currently, a line width of semiconductor integrated circuits is far shorter than wavelength used in a lithography process. In the lithography process, a method of adding an OPC (Optical Proximity Correction) pattern has been used. In the method, by using a photomask fabricated by mask data that is generated by adding an OPC pattern to design data, a pattern formed on a wafer fabricated by the photomask can be consistent with the design data as much as possible. Adding an OPC pattern is one of the most important techniques for photomask correction.

If the OPC pattern does not effectively correct a pattern formed on a wafer, repeated defects occur. However, the die-to-die comparison wafer inspection cannot detect the repeated defects. In order to solve this problem, it is necessary to provide a method in which a pattern formed on the wafer is inspected based on design data in consideration of an allowable pattern deformation quantity.

In addition, in a multi-product/small-volume fabricating process, e.g. a system-on-a-chip (SoC) fabricating process, a short delivery time is required. In the fabricating process, when repeated defects are detected in electric inspection as a final inspection, a short delivery time cannot be achieved. In order to solve this problem, it is necessary to provide an inspection method that inspects a difference between a pattern formed on a wafer and design data for each lithography process. In the inspection method, it is necessary for an allowable pattern deformation quantity that does not affect an electrical property to be set, and a deformation quantity that exceeds the allowable pattern deformation quantity should be detected.

Further, a lithography simulator inspects a simulation pattern, which is obtained from mask data to which an OPC pattern is added, by comparing the simulation pattern with design data in order to evaluate the OPC pattern. Although the entire device can be verified by the lithography simulator, the simulation pattern cannot be necessarily the same as an actual pattern. Moreover, a defect except for a defect caused by the OPC pattern cannot be detected by the lithography simulator. A random defect existing on a photomask, a stepper aberration, or the like is an example of such defect.

Moreover, for verifying the simulation, it is necessary to provide a method in which a simulation pattern outputted from the lithography simulator is verified with an image of a pattern actually formed on a wafer. Moreover, it becomes increasingly important to improve the technology for circuit design by setting an allowable pattern deformation quantity to design data precisely and in detail.

A CD-SEM (Critical Dimension Scanning Electron Microscope) has been used for controlling a line width in a fabricating process of semiconductor integrated circuits. The CD-SEM automatically measures a line width of a line-shaped pattern in a specified position using a line profile. Several positions in several shots on several pieces of wafers for each lot are measured in order to control stepper exposure condition by using the CD-SEM.

As control items in a fabricating process of semiconductor integrated circuits, end shrinkage of a wiring, a position of an isolated pattern, and the like are also important besides the line width, but the automatic measuring function of the CD-SEM allows only one-dimensional measurement. Specifically, the CD-SEM can measure only a length such as a line width. Therefore, those two-dimensional shapes are inspected by an operator manually using an image acquired from the CD-SEM or other microscopes.

The isolated pattern includes a hole pattern or an island pattern. The island pattern may be a negative pattern of the hole pattern. The hole pattern includes a contact hole/via hole or a test pattern.

Generally, an OPC pattern plays an important role not only to guarantee a gate line width, but also to form shapes of a corner and an isolated pattern. Furthermore, because of improvement of a processor frequency, control of a shape of an end of a gate pattern, which is called an end-cap, or a base of a gate pattern, which is called a field extension, also becomes important in addition to the gate line width.

The above inspections of two-dimensional patterns are essential both in sampling inspection in a fabricating process, and in an R&D fabricating process. Especially, in the R&D fabricating process, it is necessary to inspect all patterns formed on a wafer. However, currently, the control of the two-dimensional shape is performed by a human work, and is not perfectly performed. In order to solve this problem, automated die-to-database comparison wafer inspection is required.

As concrete subjects for automatization, the following subjects are enumerated:

1. In order to detect repeated defects in each semiconductor device, it is practically difficult to check whether there are defects at the same location by checking huge defect information.

2. An end except for an end-cap and an end of a wiring pattern to be connected to a contact hole/via hole may not be corrected by an OPC pattern correctly. Even if the end is shrunken by more than an allowable pattern deformation quantity for an end-cap or an end of a wiring pattern to be connected to a contact hole/via hole, it is not necessary to recognize the shrunken end as a defect.

3. Conventionally, an overlay error is controlled by measuring limited areas in a semiconductor device. Therefore, the overlay error caused locally by a stepper aberration or the like cannot be controlled.

4. The conventional die-to-die comparison method is performed by comparing corresponding two images. In this method, because the corresponding two images to be compared have different relationship between a pattern to-be-inspected and pixel boundaries, it is necessary for luminance values of pixels to be interpolated so that the two images have the same relationship between the pattern to-be-inspected and the pixel boundaries. A problem in which inspection accuracy becomes low by the interpolation arises.

5. A contour obtained from the second edges can be used for input data of a lithography simulator or the like. In this case, it is necessary to input the contour indirectly, because lithography simulator processing is slower than contour output processing.

6. The optimal allowable pattern deformation quantity depends on a desirable electrical property. Therefore, it is necessary to provide a method of obtaining an optimal allowable pattern deformation quantity by inspecting a standard specimen, which is judged as a semiconductor device having good quality.

7. For improving quality of semiconductor device, it is necessary for all gate widths in a semiconductor device to be measured, the measured gate widths are classified based on gate lengths, the minimum distances to the nearest pattern, or the like, and the gate widths are analyzed. However, by using a conventional CD-SEM, only a limited number of gate widths in a semiconductor device can be measured and classified practically.

8. As a method of improving quality of an image of a pattern to-be-inspected, the image-accumulation method is well known. However, in the case where images of a pattern to-be-inspected on a specimen liable to cause the electrification phenomenon are acquired successively, a sharp accumulated image cannot be obtained by accumulating the acquired images simply, because the acquired images are distorted gradually.

9. In the case of large distortion quantities of the image of the pattern to-be-inspected, vectors between a reference pattern and edges of an image of a pattern to-be-inspected that exceed an allowable deformation quantity cannot be obtained, and therefore the distortion quantities of the image of the pattern to-be-inspected may not necessarily be obtained accurately.

10. In order to improve inspection speed, a method in which an image of a pattern to-be-inspected is acquired by using a continuously moving stage and a line-sensor is used. However, by using the method, an image of a pattern to-be-inspected cannot be acquired by performing interlace scan or image-accumulation scan. The image accumulation scan means scan, in which the same scanning line is scanned two or more times in order to acquire an accumulated image.

11. In the case where the conventional automatic focus adjustment used in a CD-SEM is used for the image generation device with a large field of view, it takes a long time to acquire images of a pattern to-be-inspected. In addition, because a large area is scanned repeatedly, a specimen is drastically damaged by an electron beam scanning.

12. In order to measure an FEM wafer, conventionally, several points in all semiconductor devices on a wafer are measured by a CD-SEM. The points to be measured are points suitable for measuring line widths of line parts of patterns to-be-inspected. However, a tendency for pattern deformation quantities with regard to line widths of line parts of patterns to-be-inspected, and a tendency for pattern deformation quantities with regard to space widths of the line parts or a tendency for edge placement errors of ends of the patterns to-be-inspected may be different. In such case, if a process window is obtained from the results of measurement with regard to the line widths of the line parts of the patterns to-be-inspected, a semiconductor fabricated by exposure under conditions in the process window may have a defect.

13. In order to write a photomask pattern by using an electron beam mask writer or a laser beam mask writer, there is a method in which a shaped beam such as a rectangle beam is used for exposure. The shaped beam is deformed and exposed, so that a photomask pattern may be deformed more than an allowable pattern deformation quantity. Conventionally, the shaped beam is controlled by exposing a test pattern before writing a photomask pattern of a product. However, there has not been a method in which the shaped beam, which is deformed during the exposure of the photomask pattern of the product, is controlled.

SUMMARY OF THE INVENTION

In view of the above, it is therefore to provide a pattern inspection apparatus and method for inspecting a pattern to-be-inspected by using an image of the pattern to-be-inspected and data for fabricating the pattern to-be-inspected such as design data.

To achieve the above object, according to a first aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate a reference pattern represented by one or more lines from the data, each of the one or more lines comprising one of a line segment and a curve; an image generation device configured to generate the image of the pattern to-be-inspected; a detecting device configured to detect an edge of the image of the pattern to-be-inspected; an inspection device configured to inspect the pattern to-be-inspected by comparing the edge of the image of the pattern to-be-inspected with the one or more lines of the reference pattern; and a repeated defect recognition device configured to recognize repeated defects, which relate to the same geometric information of the data, from defect information obtained by the inspection device from semiconductor devices that are fabricated based on the data.

According to a second aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate a reference pattern represented by one or more lines from the data, each of the one or more lines comprising one of a line segment and a curve; an image generation device configured to generate the image of the pattern to-be-inspected; a detecting device configured to detect an edge of the image of the pattern to-be-inspected; an inspection device configured to obtain defect information from the same inspection areas with regard to a plurality of semiconductor devices, which are fabricated based on a photomask having a plurality of the same photomask patterns, which correspond to the semiconductor device and are fabricated based on the data, by inspecting the pattern to-be-inspected by comparing the edge of the image of the pattern to-be-inspected with the one or more lines of the reference pattern; and a repeated defect recognition device configured to recognize repeated defects from the defect information with regard to the semiconductor devices fabricated by one-time exposure using the photomask; wherein the repeated defect recognition device recognizes an unrepeated defect by removing the repeated defects from all the defects in the defect information, and the repeated defect recognition device judges whether a defect, which is in defect information with regard to semiconductor devices fabricated by another one-time exposure using the photomask, exists on the same location of the photomask coordinates of the unrepeated defect and its neighborhood.

According to a third aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate reference patterns represented by one or more lines from the data, each of the one or more lines comprising one of a line segment and a curve; an image generation device configured to generate the image of the pattern to-be-inspected; a detecting device configured to detect an edge of the image of the pattern to-be-inspected; and an inspection device configured to inspect the pattern to-be-inspected by comparing the edge of the image of the pattern to-be-inspected with the one or more lines of the reference patterns; wherein the inspection device inspects the pattern to-be-inspected by using inspection result, which has been obtained from a pattern to-be-inspected of a specimen that is judged to have a good quality, in order to ignore nuisance defect.

According to a fourth aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate reference patterns represented by one or more lines from the data, each of the one or more lines comprising one of a line segment and a curve; an image generation device configured to generate the image of the pattern to-be-inspected; a detecting device configured to detect an edge of the image of the pattern to-be-inspected; and an inspection device configured to inspect the pattern to-be-inspected by comparing the edge of the image of the pattern to-be-inspected with the one or more lines of the reference patterns; wherein the inspection device inspects relationship between a location of a pattern formed in a process at the time of the inspection and a location of a pattern formed in the preceding process of the process at the time of the inspection, by performing matching between the image of the pattern to-be-inspected and the reference pattern with regard to the process at the time of the inspection, and performing matching between the image of the pattern to-be-inspected and the reference pattern with regard to the preceding process of the process at the time of the inspection.

According to a fifth aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate reference patterns represented by one or more lines from the data, each of the one or more lines comprising one of a line segment and a curve; an image generation device configured to generate the image of the pattern to-be-inspected; a detecting device configured to detect an edge of the image of the pattern to-be-inspected; an extracting device configured to extract a contour by establishing correspondence between the edge of the image of the pattern to-be-inspected and the one or more lines of the reference patterns; and an inspection device configured to inspect the pattern to-be-inspected by comparing the contour, which is extracted by the extracting device, and one of a contour, which is extracted by the extracting device from an image of another pattern to-be-inspected fabricated by the data, and a contour, which is obtained by a simulator using the data.

In preferred aspect of the present invention, the inspection device performs at least one of correction of the contour and reduction of noise on the contour by shifting the edge of the image of the pattern to-be-inspected.

In preferred aspect of the present invention, the inspection device reduces noise on the contour by using distances between the reference patterns represented by the one or more lines and the edges of the image of the pattern to-be-inspected.

According to a sixth aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate reference patterns represented by one or more lines from the data, each of the one or more lines comprising one of a line segment and a curve; an image generation device configured to generate the image of the pattern to-be-inspected; a detecting device configured to detect an edge of the image of the pattern to-be-inspected; an extracting device configured to extract a contour by establishing correspondence between the edge of the image of the pattern to-be-inspected and the one or more lines of the reference patterns; an output device configured to output the contour extracted by the extracting device; and an inspection device configured to inspect the pattern to-be-inspected by using the outputted contour.

In a preferred aspect of the present invention, the output device outputs the contour by using additional information of the data.

According to a seventh aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate reference patterns represented by one or more lines from the data, each of the one or more lines comprising one of a line segment and a curve; an image generation device configured to generate the image of the pattern to-be-inspected; a detecting device configured to detect an edge of the image of the pattern to-be-inspected; and an inspection device configured to inspect the pattern to-be-inspected by comparing the edge of the image of the pattern to-be-inspected with the one or more lines of the reference patterns; wherein the inspection device inspects repeatedly the same pattern to-be-inspected of a specimen, which is judged to have a good quality, in order to obtain inspection results, while altering an allowable pattern deformation quantity successively, and the inspection device obtains an optimal quantity of the allowable pattern deformation quantity from the inspection results.

According to an eighth aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate reference patterns represented by one or more lines from the data, each of the one or more lines comprising one of a line segment and a curve; an image generation device configured to generate the image of the pattern to-be-inspected; a detecting device configured to detect an edge of the image of the pattern to-be-inspected; and an inspection device configured to inspect the pattern to-be-inspected by comparing the edge of the image of the pattern to-be-inspected with the one or more lines of the reference patterns; wherein inspection results obtained by the inspection device are classified based on at least one of geometrical information of the reference pattern, information of the data, and information of data related to the data.

According to a ninth aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate reference patterns represented by one or more lines from the data, each of the one or more lines comprising one of a line segment and a curve; an image generation device configured to generate a plurality of the images of the pattern to-be-inspected; a detecting device configured to detect edges of the plurality of the images of the pattern to-be-inspected; and an inspection device configured to obtain distortion quantities of the image of the pattern to-be-inspected by comparing the edges of the images of the pattern to-be-inspected with the one or more lines of the reference patterns, correct the plurality of images of the pattern to-be-inspected by using the obtained distortion quantities of the image of the pattern to-be-inspected, and inspect the pattern to-be-inspected by using the plurality of corrected images of the pattern to-be-inspected.

According to a tenth aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate a reference pattern represented by one or more lines from the data, each of the one or more lines comprising one of a line segment and a curve; an image generation device configured to generate the image of the pattern to-be-inspected; a detecting device configured to detect an edge of the image of the pattern to-be-inspected; and an inspection device configured to inspect the pattern to-be-inspected by comparing the edge of the image of the pattern to-be-inspected with the one or more lines of the reference pattern; wherein the inspection device obtains a distortion quantity of the image of the pattern to-be-inspected from distribution of the edges of the image of the pattern to-be-inspected.

In a preferred aspect of the present invention, the inspection device obtains at least one of an image rotation quantity and an image magnification quantity as the distortion quantity of the image of the pattern to-be-inspected.

In a preferred aspect of the present invention, the inspection device obtains the distribution of the edges of the image of the pattern to-be-inspected from the edges of the image of the pattern to-be-inspected, which exist in a line part of the pattern to-be-inspected.

According to an eleventh aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate a reference pattern represented by one or more lines from the data, each of the one or more lines comprising one of a line segment and a curve; an image generation device configured to scan the pattern to-be-inspected with a charged particle beam to generate the image of the pattern to-be-inspected; a detecting device configured to detect an edge of the image of the pattern to-be-inspected; and an inspection device configured to inspect the pattern to-be-inspected by comparing the edge of the image of the pattern to-be-inspected with the one or more lines of the reference pattern; wherein the image generation device continuously moves a specimen, on which the pattern to-be-inspected exists, and acquires the image of the pattern to-be-inspected by at least one of interlace scan and image-accumulation scan.

According to a twelfth aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate a reference pattern represented by one or more lines from the data, each of the one or more lines comprising one of a line segment and a curve; an image generation device configured to scan the pattern to-be-inspected with a charged particle beam to generate the image of the pattern to-be-inspected; a detecting device configured to detect an edge of the image of the pattern to-be-inspected; and an inspection device configured to inspect the pattern to-be-inspected by comparing the edge of the image of the pattern to-be-inspected with the one or more lines of the reference pattern; wherein the image generation device scans a specimen, on which the pattern to-be-inspected exists, while altering an image adjustment value, and the inspection device obtains an evaluation value corresponding to the image adjustment value from a result of the inspection.

According to a thirteenth aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate reference patterns represented by one or more lines from the data, each of the one or more lines comprising one of a line segment and a curve; an image generation device configured to generate the image of the pattern to-be-inspected; a detecting device configured to detect an edge of the image of the pattern to-be-inspected; and an inspection device configured to inspect the pattern to-be-inspected by comparing the edge of the image of the pattern to-be-inspected with the one or more lines of the reference patterns; wherein the inspection device obtains a critical area by inspecting the patterns to-be-inspected in semiconductor devices, which are fabricated by exposure under a focus condition and an exposure dose condition altered, and by detecting at least one of a defect of at least one of a line part, a corner, and an end, having edge placement errors; an isolated pattern having placement error; a defect of a corner having abnormal curvature; a defect detected by inspecting correction pattern that should not be formed on wafer; a defect detected by inspecting at least one of a line width, an average line width, a space width, and an average space width of a line-shaped pattern; a defect detected by inspecting at least one of a line width, an average line width, a space width, and an average space width of a curvilinear-shaped pattern; and a defect detected by inspecting a gate line width.

According to a fourteenth aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate reference patterns represented by one or more lines from the data, each of the one or more lines comprising one of a line segment and a curve; an image generation device configured to generate the image of the pattern to-be-inspected; a detecting device configured to detect an edge of the image of the pattern to-be-inspected; and an inspection device configured to inspect the pattern to-be-inspected by comparing the edge of the image of the pattern to-be-inspected with the one or more lines of the reference patterns; wherein the inspection device obtains a process window by inspecting the patterns to-be-inspected in semiconductor devices, which are fabricated by exposure under a focus condition and an exposure dose condition altered, and by detecting at least one of a defect of at least one of a line part, a corner, and an end, having edge placement errors; an isolated pattern having placement error; a defect of a corner having abnormal curvature; a defect detected by inspecting correction pattern that should not be formed on wafer; a defect detected by inspecting at least one of a line width, an average line width, a space width, and an average space width of a line-shaped pattern; a defect detected by inspecting at least one of a line width, an average line width, a space width, and an average space width of a curvilinear-shaped pattern; and a defect detected by inspecting a gate line width.

According to a fifteenth aspect of the present invention, there is provided a pattern inspection apparatus for inspecting a pattern to-be-inspected by using an image of the pattern to-be-inspected and data for fabricating the pattern to-be-inspected, the pattern inspection apparatus comprising: a reference pattern generation device configured to generate a reference pattern represented by one or more lines from the data, each of the one or more lines comprising one of a line segment and a curve; an image generation device configured to generate the image of the pattern to-be-inspected; a detecting device configured to detect an edge of the image of the pattern to-be-inspected; and an inspection device configured to inspect the pattern to-be-inspected by comparing the edge of the image of the pattern to-be-inspected with the one or more lines of the reference pattern; wherein the inspection device inspects the pattern to-be-inspected using part of the reference pattern corresponding to a fabrication pattern, which is used for fabricating the pattern to-be-inspected partially, to obtain deformation quantity of the fabrication pattern.

According to a sixteenth aspect of the present invention, there is provided a method of inspecting a pattern to-be-inspected by using an image of the pattern to-be-inspected and data for fabricating the pattern to-be-inspected, method comprising: generating reference patterns represented by one or more lines from the data, each of the one or more lines comprising one of a line segment and a curve; generating the image of the pattern to-be-inspected; detecting an edge of the image of the pattern to-be-inspected; and inspecting the pattern to-be-inspected by comparing the edge of the image of the pattern to-be-inspected with the one or more lines of the reference patterns; wherein relationship between a location of a pattern formed in a process at the time of the inspection and a location of a pattern formed in the preceding process of the process at the time of the inspection is inspected, by performing matching between the image of the pattern to-be-inspected and the reference pattern with regard to the process at the time of the inspection, and performing matching between the image of the pattern to-be-inspected and the reference pattern with regard to the preceding process of the process at the time of the inspection.

According to a seventeenth aspect of the present invention, there is provided a method of inspecting a pattern to-be-inspected by using an image of the pattern to-be-inspected and data for fabricating the pattern to-be-inspected, method comprising: generating reference patterns represented by one or more lines from the data, each of the one or more lines comprising one of a line segment and a curve; generating the image of the pattern to-be-inspected; detecting an edge of the image of the pattern to-be-inspected; extracting a contour by establishing correspondence between the edge of the image of the pattern to-be-inspected and the one or more lines of the reference patterns; and inspecting the pattern to-be-inspected by comparing the contour and one of a contour, which is extracted from an image of another pattern to-be-inspected fabricated by the data, and a contour, which is obtained by a simulator using the data.

According to an eighteenth aspect of the present invention, there is provided a method of inspecting a pattern to-be-inspected by using an image of the pattern to-be-inspected and data for fabricating the pattern to-be-inspected, method comprising: generating reference patterns represented by one or more lines from the data, each of the one or more lines comprising one of a line segment and a curve; generating a plurality of the images of the pattern to-be-inspected; detecting edges of the plurality of the images of the pattern to-be-inspected; obtaining distortion quantities of the image of the pattern to-be-inspected by comparing the edges of the images of the pattern to-be-inspected with the one or more lines of the reference patterns; correcting the plurality of images of the pattern to-be-inspected by using the obtained distortion quantities of the image of the pattern to-be-inspected; and inspecting the pattern to-be-inspected by using the plurality of corrected images of the pattern to-be-inspected.

According to a nineteenth aspect of the present invention, there is provided a method of inspecting a pattern to-be-inspected by using an image of the pattern to-be-inspected and data for fabricating the pattern to-be-inspected, method comprising: generating reference patterns represented by one or more lines from the data, each of the one or more lines comprising one of a line segment and a curve; generating the image of the pattern to-be-inspected; detecting an edge of the image of the pattern to-be-inspected; and inspecting the pattern to-be-inspected by comparing the edge of the image of the pattern to-be-inspected with the one or more lines of the reference patterns; wherein a critical area is obtained by inspecting the patterns to-be-inspected in semiconductor devices, which are fabricated by exposure under a focus condition and an exposure dose condition altered, and by detecting at least one of a defect of at least one of a line part, a corner, and an end, having edge placement errors; an isolated pattern having placement error; a defect of a corner having abnormal curvature; a defect detected by inspecting correction pattern that should not be formed on wafer; a defect detected by inspecting at least one of a line width, an average line width, a space width, and an average space width of a line-shaped pattern; a defect detected by inspecting at least one of a line width, an average line width, a space width, and an average space width of a curvilinear-shaped pattern; and a defect detected by inspecting a gate line width.

According to a twentieth aspect of the present invention, there is provided a method of inspecting a pattern to-be-inspected by using an image of the pattern to-be-inspected and data for fabricating the pattern to-be-inspected, method comprising: generating reference patterns represented by one or more lines from the data, each of the one or more lines comprising one of a line segment and a curve; generating the image of the pattern to-be-inspected; detecting an edge of the image of the pattern to-be-inspected; and inspecting the pattern to-be-inspected by comparing the edge of the image of the pattern to-be-inspected with the one or more lines of the reference patterns; wherein a process window is obtained by inspecting the patterns to-be-inspected in semiconductor devices, which are fabricated by exposure under a focus condition and an exposure dose condition altered, and by detecting at least one of a defect of at least one of a line part, a corner, and an end, having edge placement errors; an isolated pattern having placement error; a defect of a corner having abnormal curvature; a defect detected by inspecting correction pattern that should not be formed on wafer; a defect detected by inspecting at least one of a line width, an average line width, a space width, and an average space width of a line-shaped pattern; a defect detected by inspecting at least one of a line width, an average line width, a space width, and an average space width of a curvilinear-shaped pattern; and a defect detected by inspecting a gate line width.

BRIEF DESCRIPTION OF THE DRAWINGS

FIG. 4 is a diagram showing an outline of inspection processing that the pattern inspection apparatus according to the embodiment of the present performs;

FIG. 10 is a schematic view showing a method in which a pattern is scanned bidirectionally;

FIG. 13 is a schematic view showing a method in which a rotated image of a pattern to-be-inspected is obtained by replacing positions of pixels;

FIG. 14 is a schematic view showing an alternative method in which a rotated image of a pattern to-be-inspected is obtained by replacing positions of pixels;

FIG. 15 is a diagram showing an example of basic arrangement of the pattern inspection apparatus according to the embodiment of the present invention;

FIG. 16 is a functional block diagram of the pattern inspection apparatus according to the embodiment of the present invention;

FIG. 21 is a diagram showing an example in which the reference pattern including a curve is converted into edge vectors;

FIG. 28 is a diagram showing an example of an image of a pattern to-be-inspected having a contrast between the inside of the pattern and the ground;

FIG. 30 is a diagram showing an example of an image of a pattern to-be-inspected having bright edges and having no contrast between the inside of the pattern and the ground;

FIG. 31 is a diagram showing edges detected from the image of FIG. 30;

FIG. 32 is a diagram showing an example of magnitudes of edges of a one-dimensional image of a pattern to-be-inspected;

FIG. 33 is a diagram showing an example in which the edges of FIG. 32 are dilated, FIG. 34 is a diagram showing an example of edges of a one-dimensional reference pattern;

FIG. 35 is a diagram showing another example in which the edges of FIG. 32 are dilated;

FIG. 36 is a diagram showing another example of edges of the one-dimensional reference pattern;

FIG. 37 is a diagram showing another example in which the edges of FIG. 32 are dilated, FIG. 38 is a diagram showing an example of a smoothing filter;

FIG. 45 is another diagram of FIG. 20 in which the reference pattern in FIG. 19 is expressed with the edge vectors for respective pixels;

FIG. 47 is a diagram made by superimposing FIG. 43 on FIG. 45;

FIG. 48 is another diagram made by superimposing FIG. 43 on FIG. 45;

FIG. 51A is a diagram showing an example of reference patterns;

FIG. 51B is a diagram showing an example of the relation between the reference pattern in FIG. 51A and the image of the pattern to-be-inspected;

FIGS. 53A, 53B and 53C are schematic views showing a method of calculating a matching evaluation value in which negative patterns paired with unique patterns are used;

FIG. 55 is a schematic view showing calculated matching error values $E_{pm}$;

FIG. 65 is a diagram showing an example of frequency distribution of luminance values;

FIG. 74 is a diagram showing an enlarged part of FIG. 72 (portion of B);

FIG. 75 is a diagram showing an enlarged part of FIG. 74 (portion of C);

FIGS. 77A and 77B are diagrams showing examples in which the detected second edges are approximated by curves (including the polygon approximation) to connect the detected second edges;

FIG. 81 is a schematic view showing defect information obtained from the first semiconductor device and defect information obtained from limited areas of the second semiconductor device;

FIG. 82 is a schematic view showing an example of patterns which are the same pattern as feature of the design data, and which have different OPC patterns;

FIG. 83 is a schematic view showing an example of a plurality of semiconductor devices which are fabricated based on a photomask having a plurality of the same photomask patterns fabricated based on the design data;

FIG. 94 is a schematic view showing a method in which an allowable pattern deformation quantity of end of wiring pattern to be connected to contact hole/via hole is adaptively set;

FIGS. 95A and 95B are schematic views showing a method of inspecting a contact-area;

FIG. 99 is a schematic view showing a method of extracting proximate line segments, which are defined as line segments which face each other closest together with a distance between them shorter than a predetermined distance, from reference patterns;

FIG. 100 is a schematic view showing a method of extracting remote line segments, which are defined as line segments which face each other closest together with a distance between them longer than a predetermined distance, from reference patterns;

FIG. 106 is another schematic view showing a method of comparing a contour with the second edge;

FIGS. 113A, 113B and 113C are views showing an example of the first method that obtains a global deformation quantity of an average line width using inspected inspection-unit-areas;

FIG. 115 is a view showing an example of a method of calculating a deformation quantity of a line width in 30 degree direction;

FIG. 116 is a schematic view showing a variation in electron beam spot size on the modified figure drawn from FIG. 23;

FIG. 117 is a schematic view showing a method of determining inspection-unit-areas to be inspected twice;

FIG. 118 is a schematic view showing a method of inspecting inspection-unit-areas twice;

FIG. 119 is a schematic view showing sub-indexes of defect-class, which are determined by classification according to each line segment in the case of periodical patterns such as patterns in a memory;

FIG. 120 is a schematic view showing sub-indexes of defect-class that are used in combination;

FIG. 121 is a schematic view showing a defect location, clipped reference patterns, and the minimum bounding rectangle;

FIG. 122 is a schematic view showing an example of a feature quantity space;

FIG. 123 is a schematic view showing an example of other feature quantities used in the feature quantity space of FIG. 122;

FIG. 124 is a schematic view showing an example of a distribution diagram that is created by transforming deformation quantities of the line widths, which are one of the pattern deformation quantities obtained from the whole inspection-unit-area, into a gray-scale bitmap, and by superimposing defects;

FIG. 125 is a schematic view showing a method of classifying gate line widths based on gate lengths;

FIG. 126 is a schematic view showing rectangles, which are used in a writer, obtained by dividing a photomask pattern;

Figure 127:
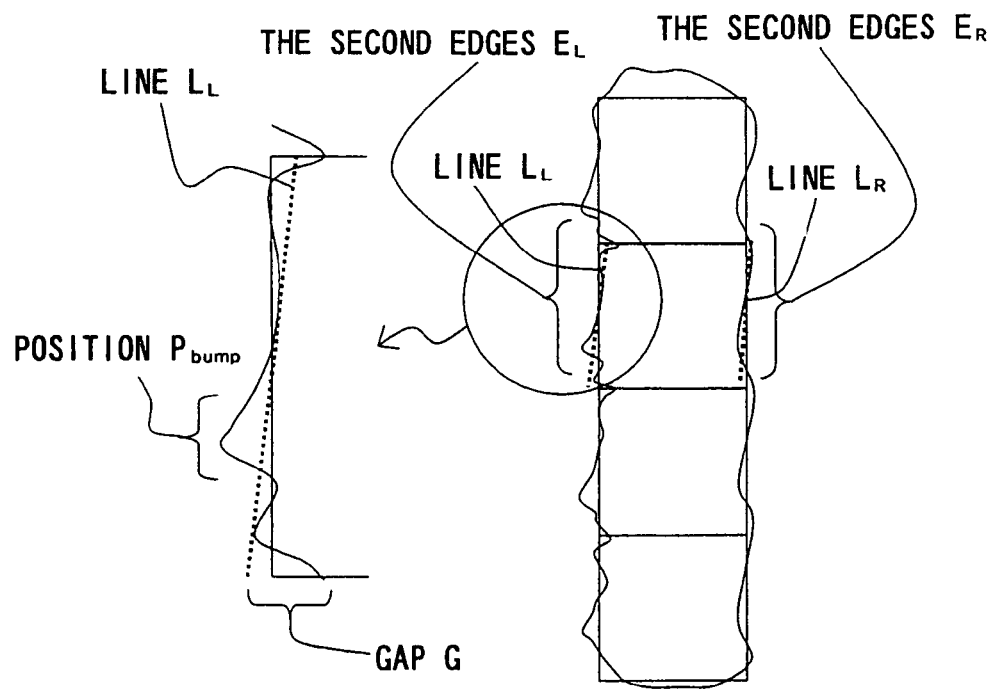
Figure 128:
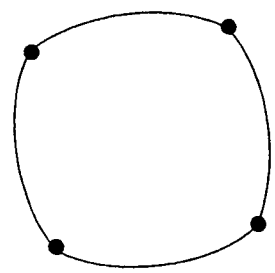
Figure 129A:
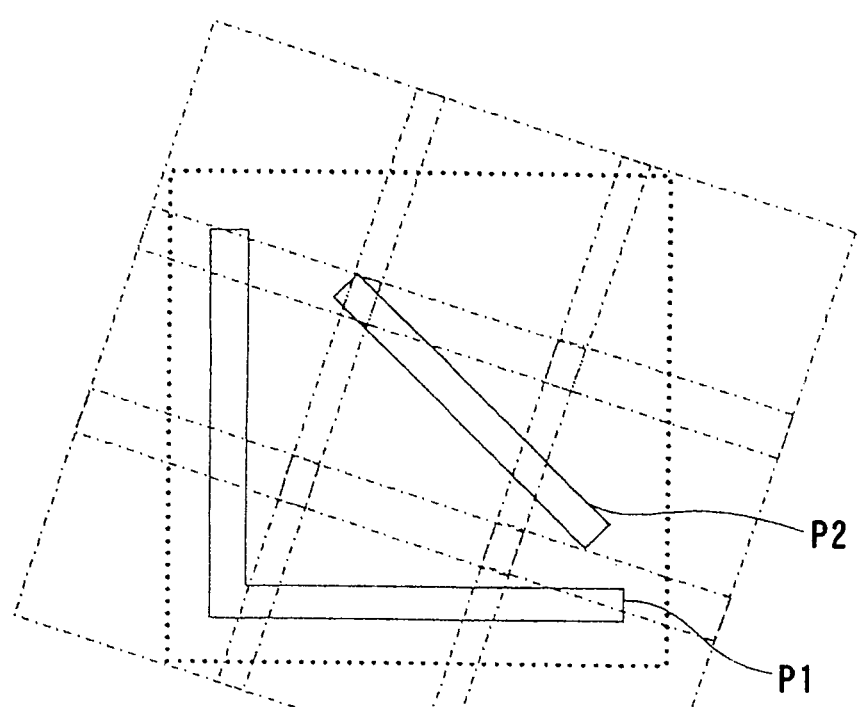
Figure 129B:
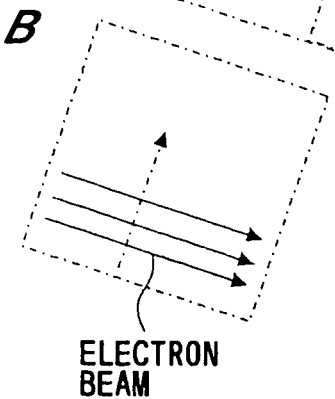
Figure 131:
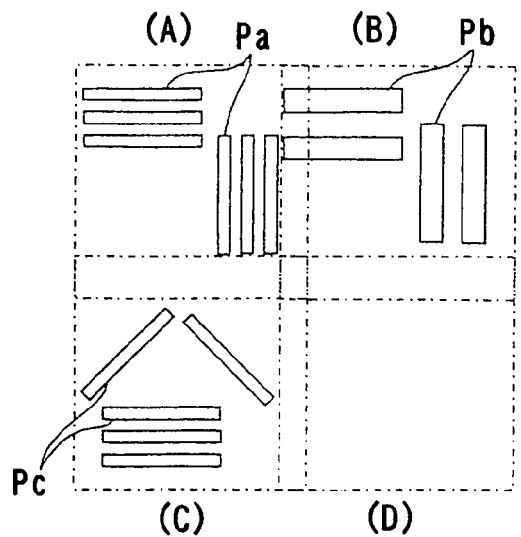
Figure 133:
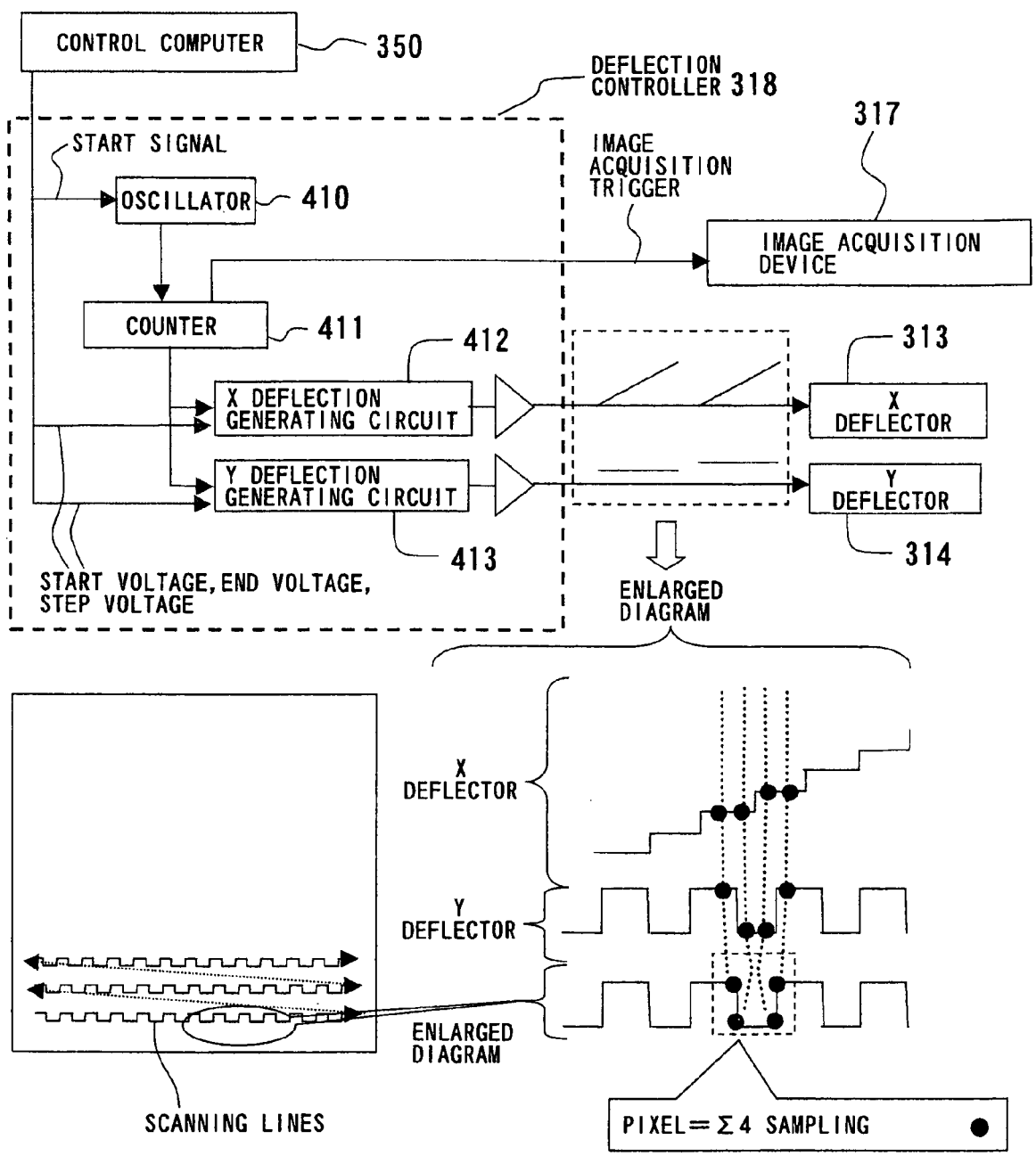
Figure 136:
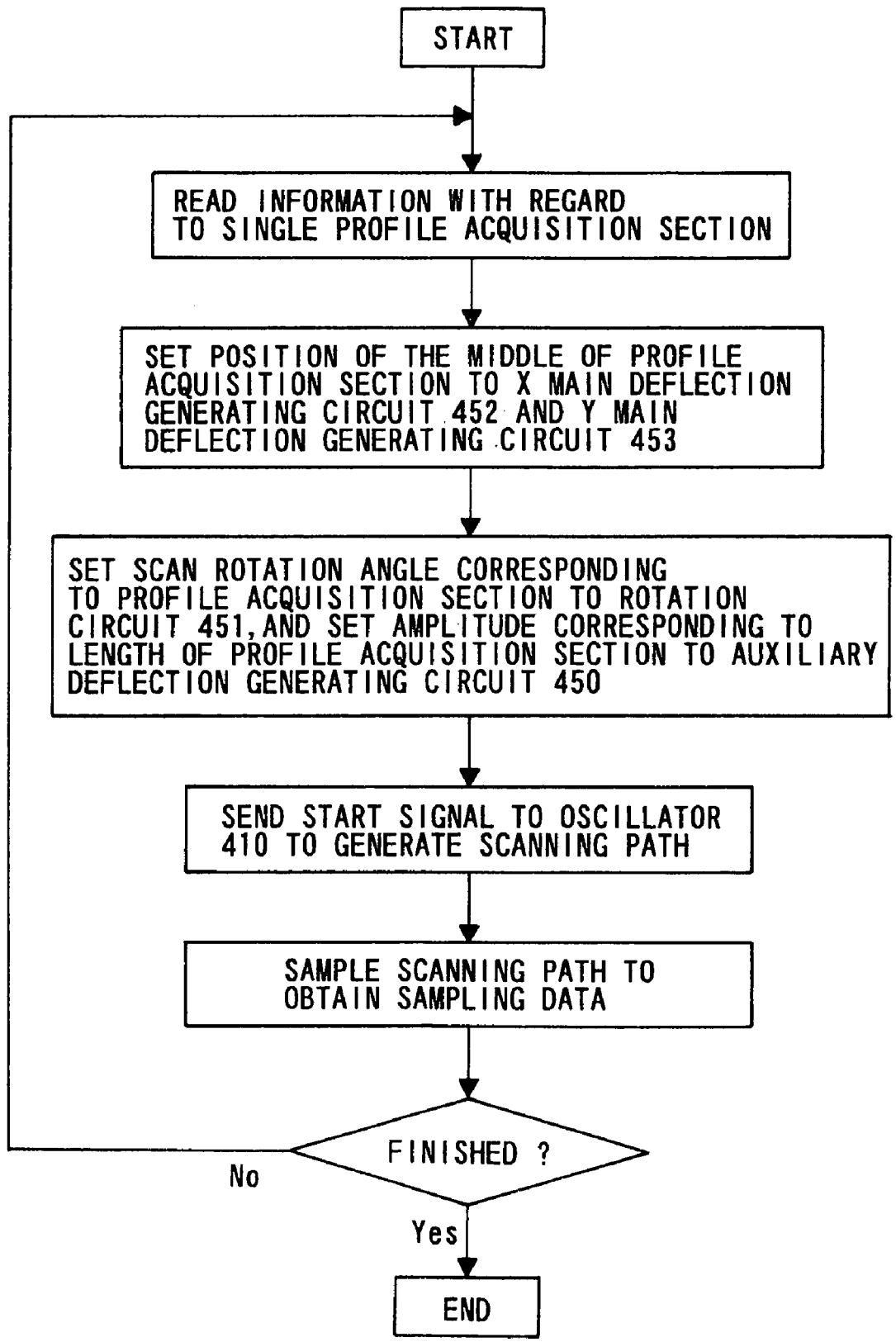
Figure 137A:
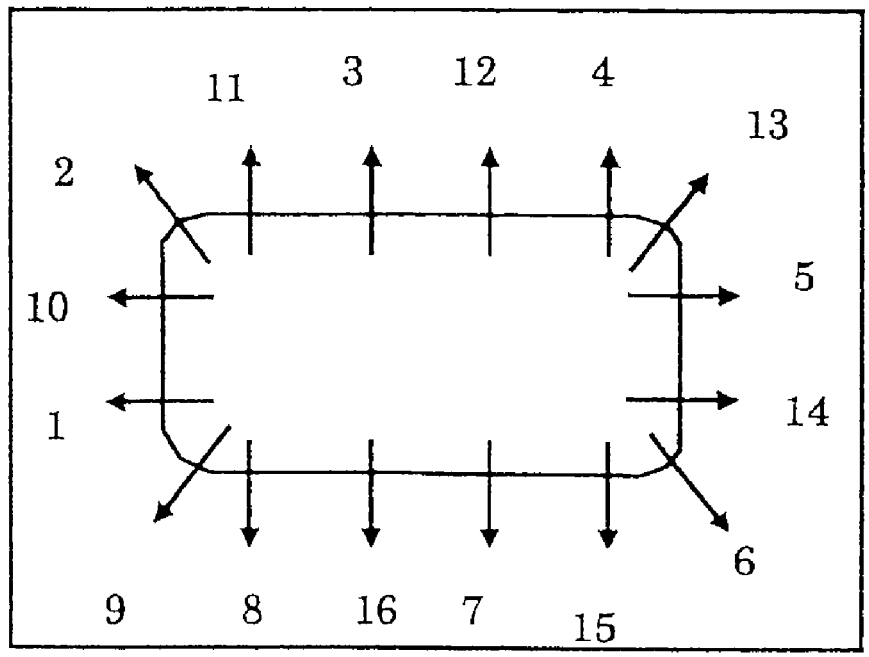
Figure 137B:
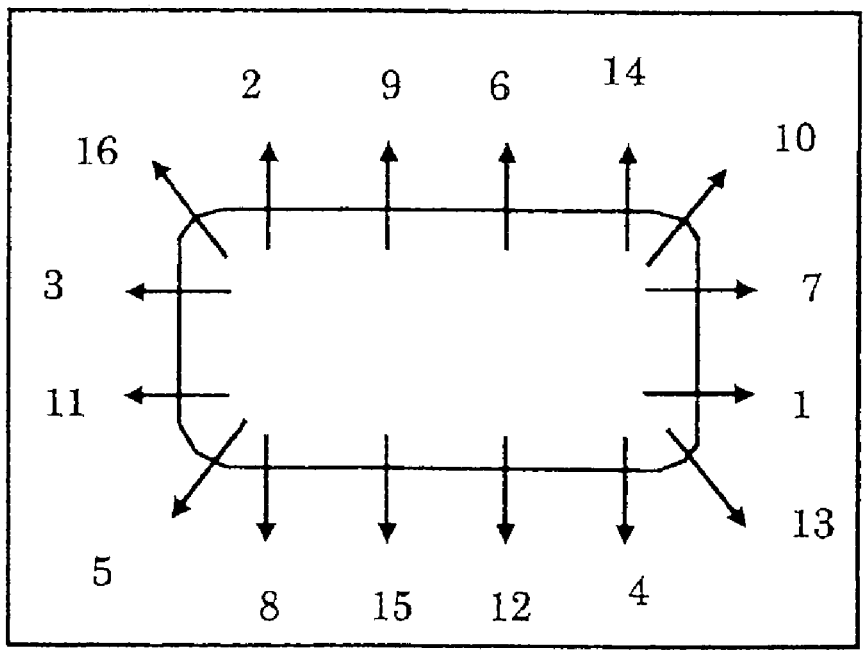
Figure 138A:
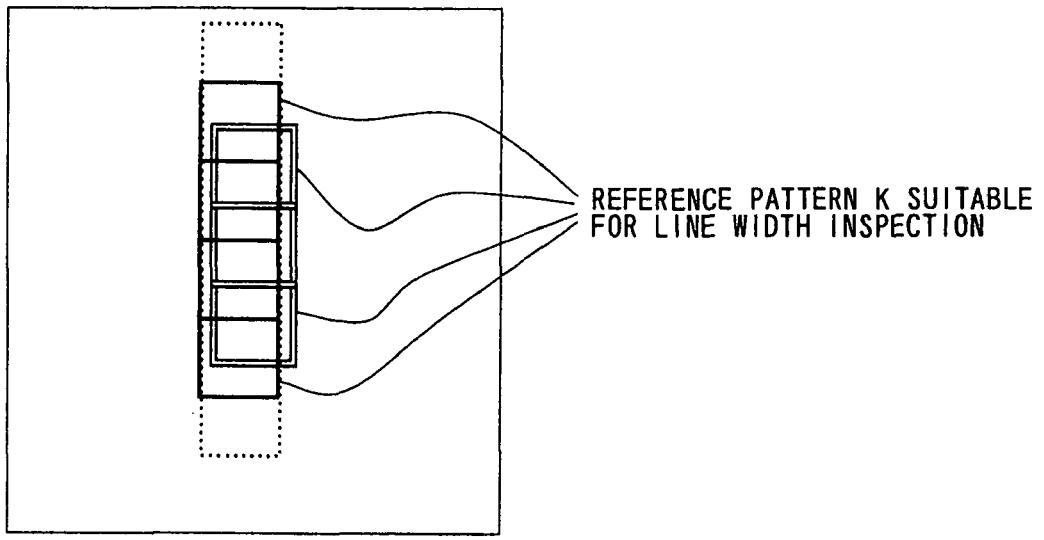
Figure 138B:
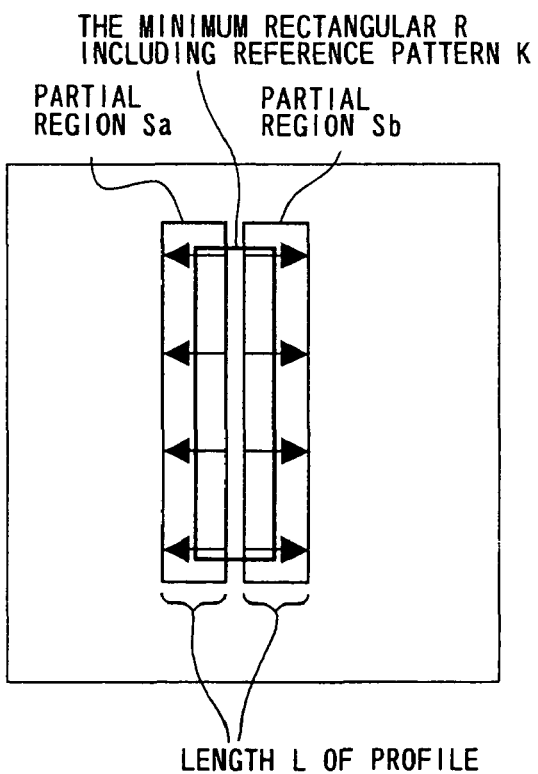
Figure 138C:
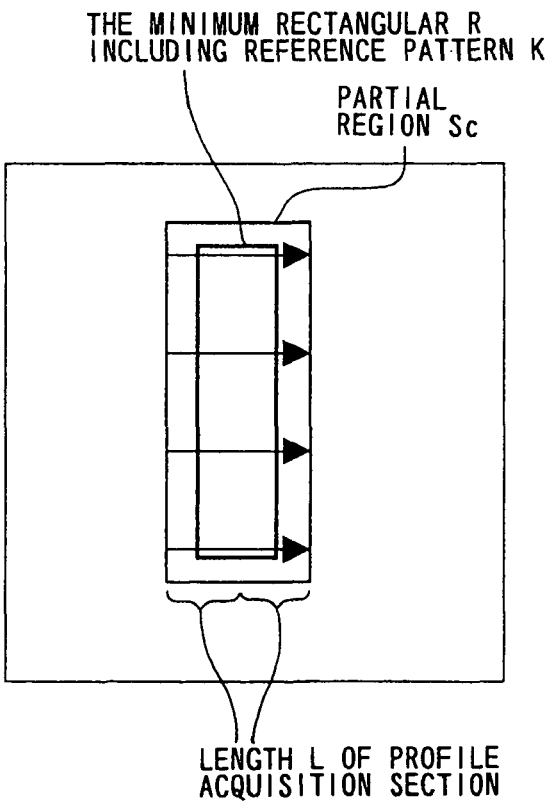
Figure 140:
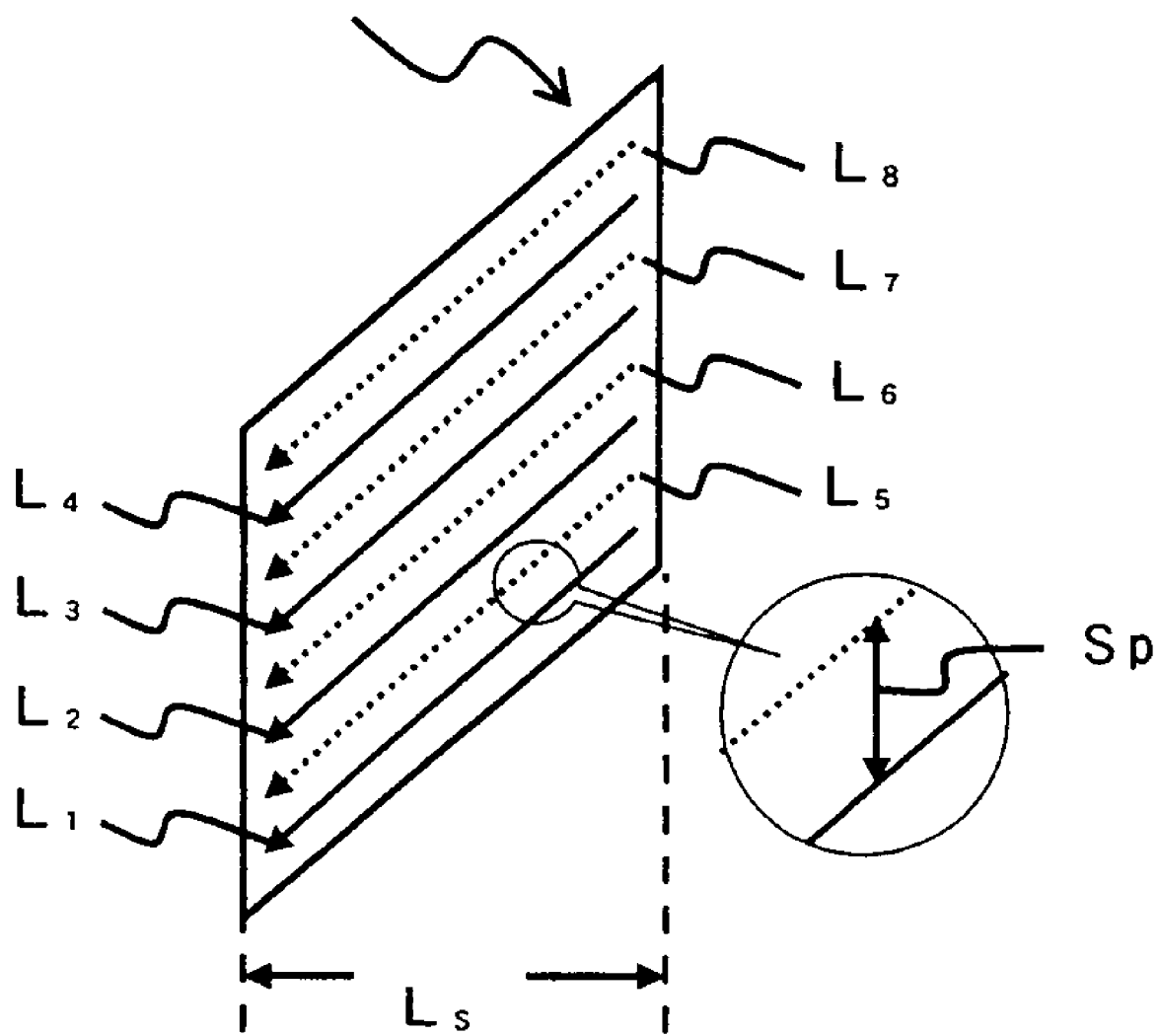
Figure 144:
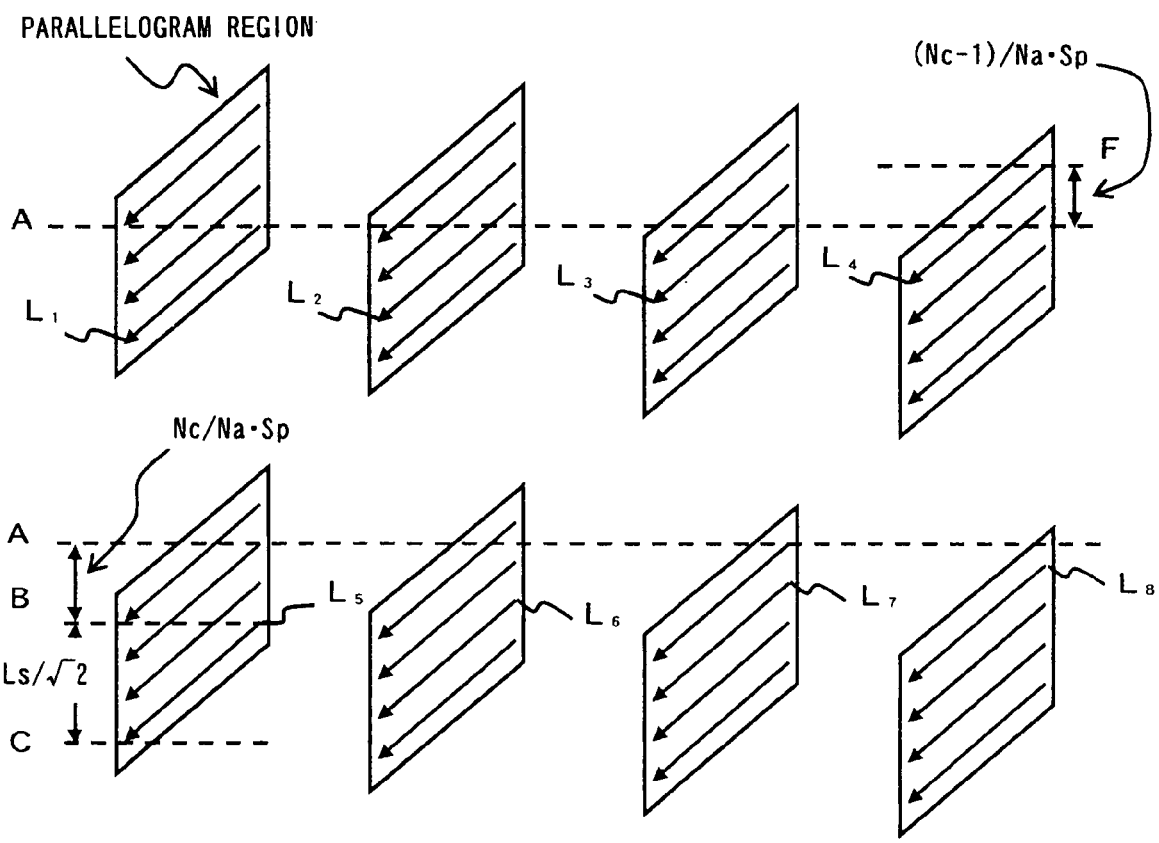
Figure 145:
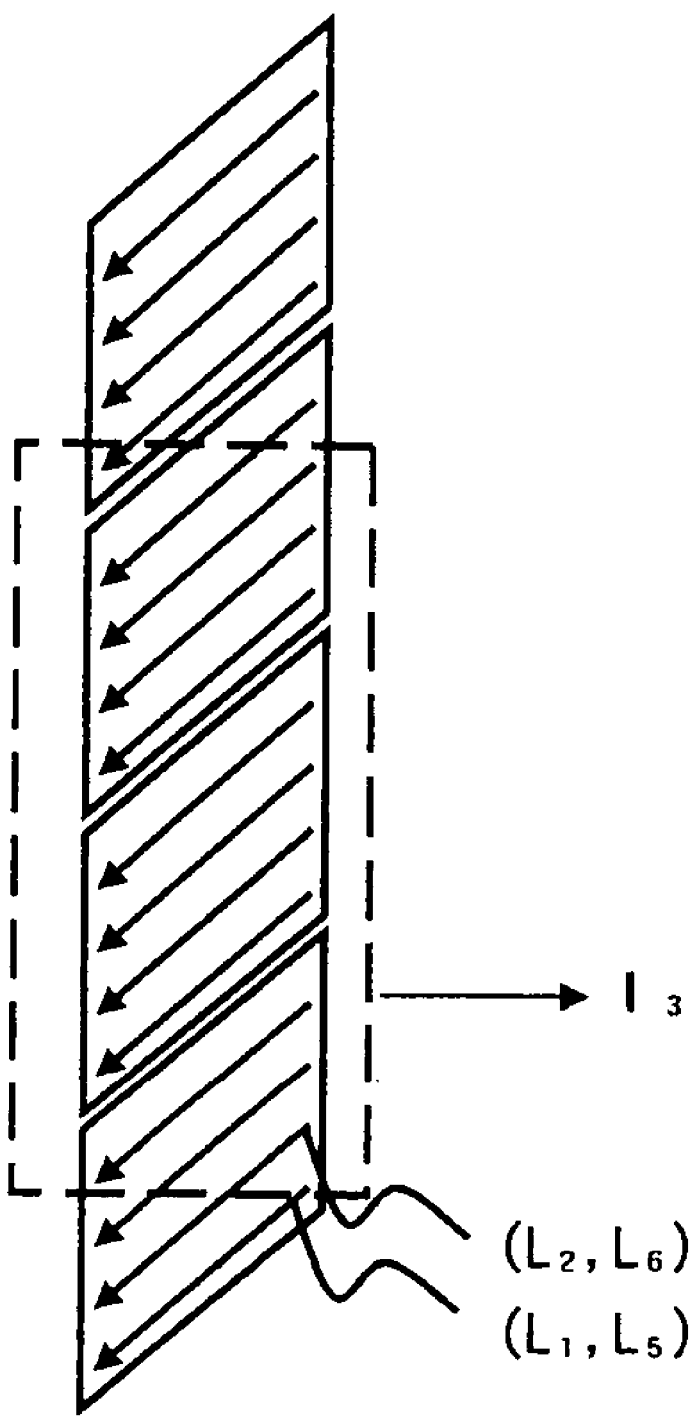
Figure 149:
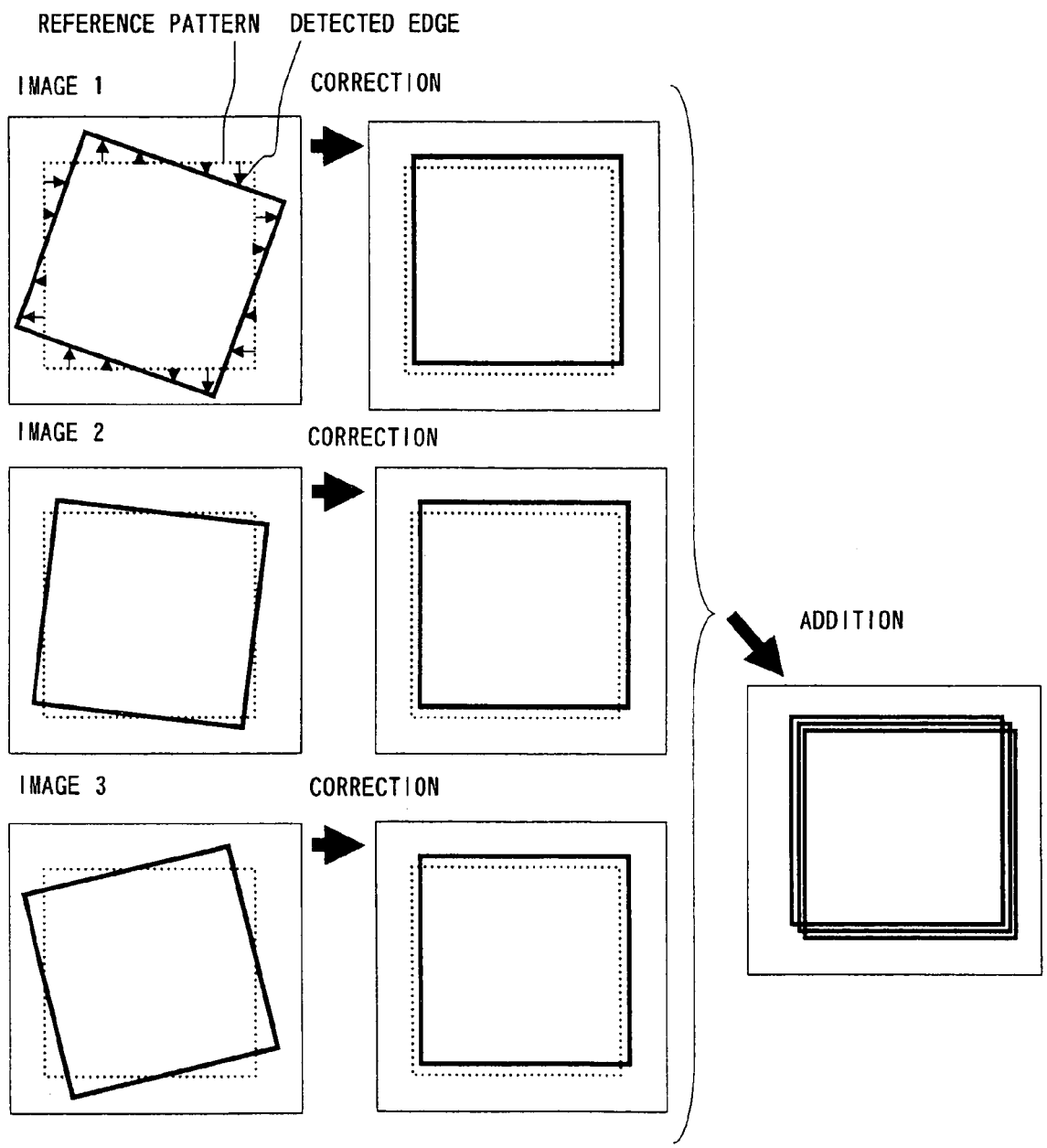
Figure 150:
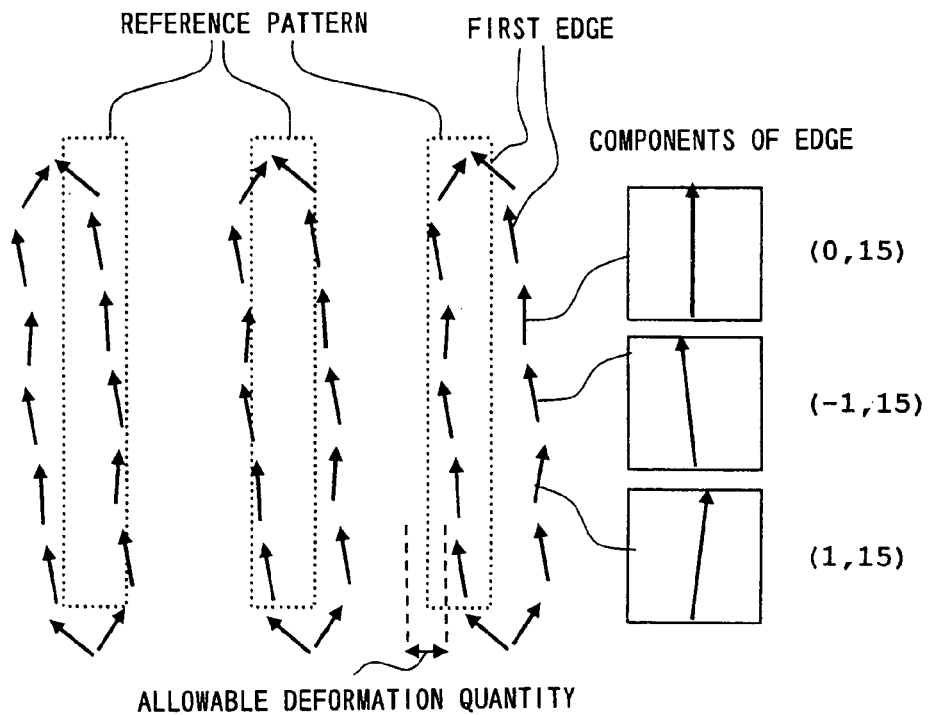
Figure 151:
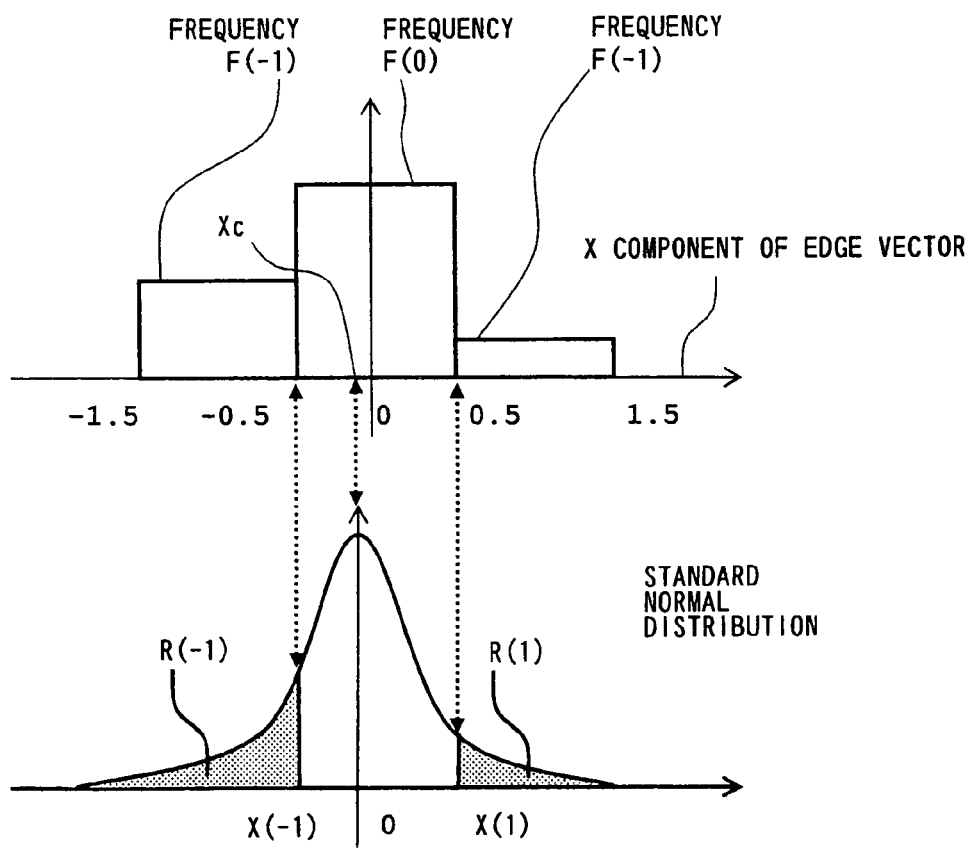
Figure 152:
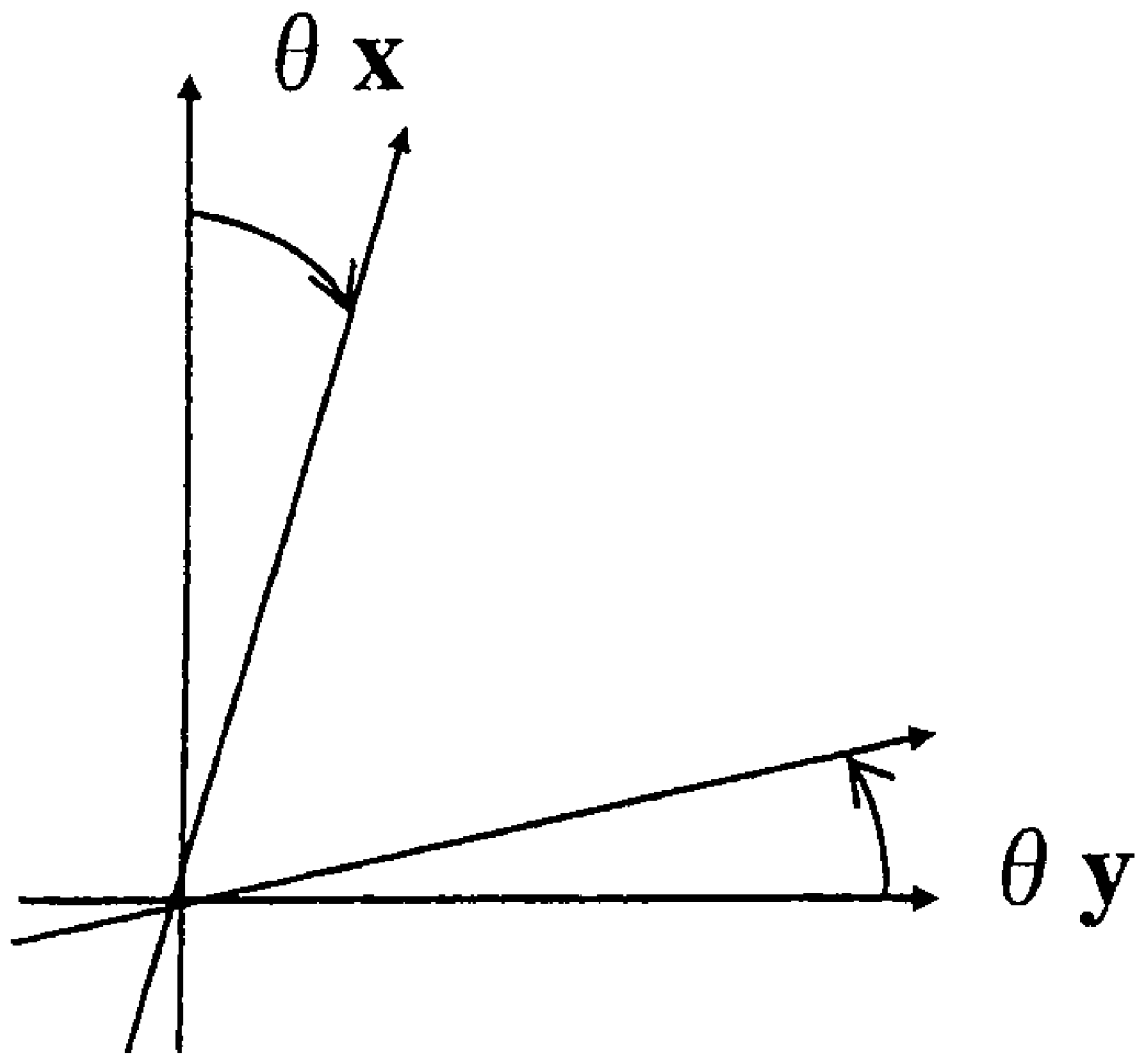
Figure 156:
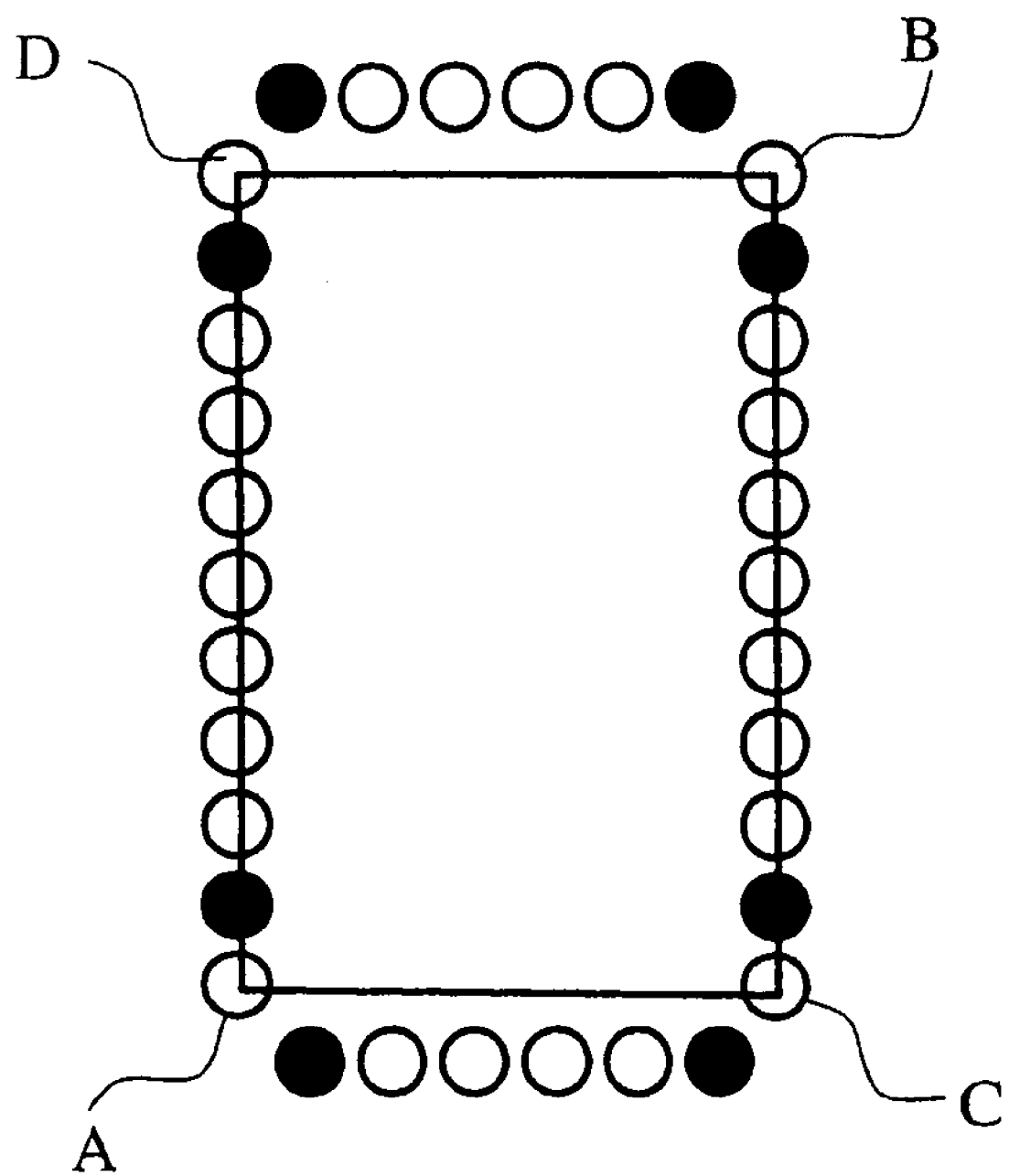
Figure 157:
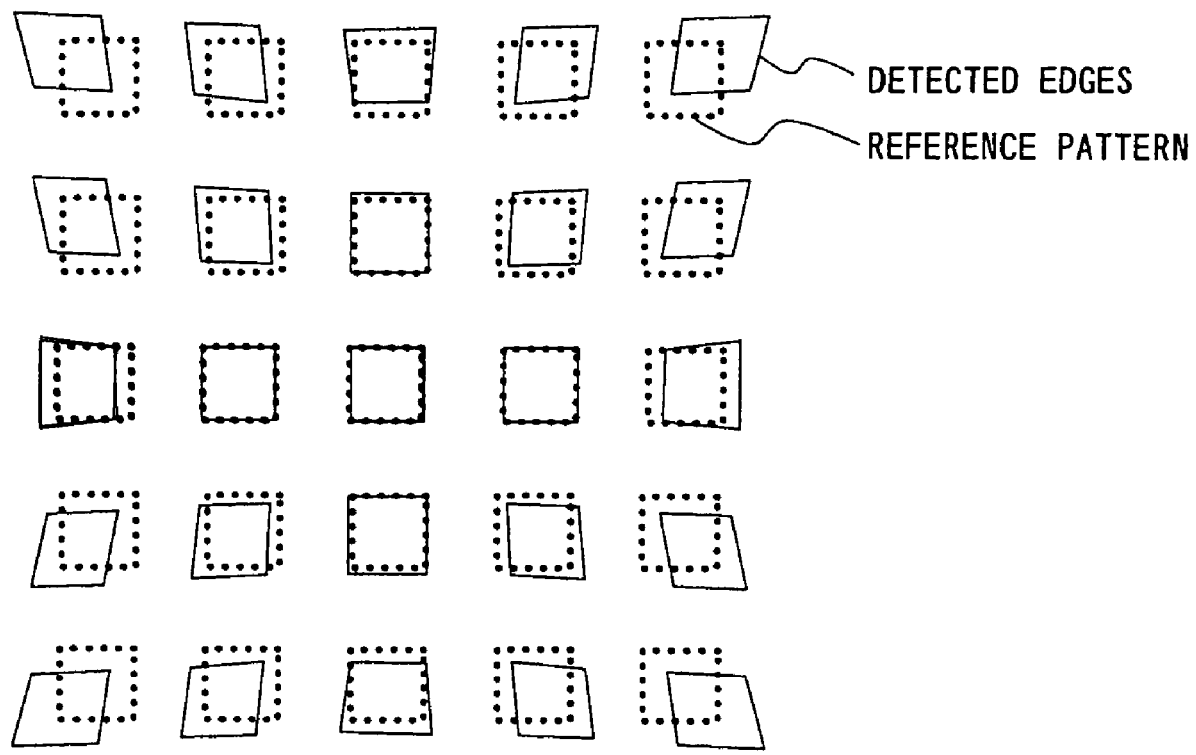
Figure 158:
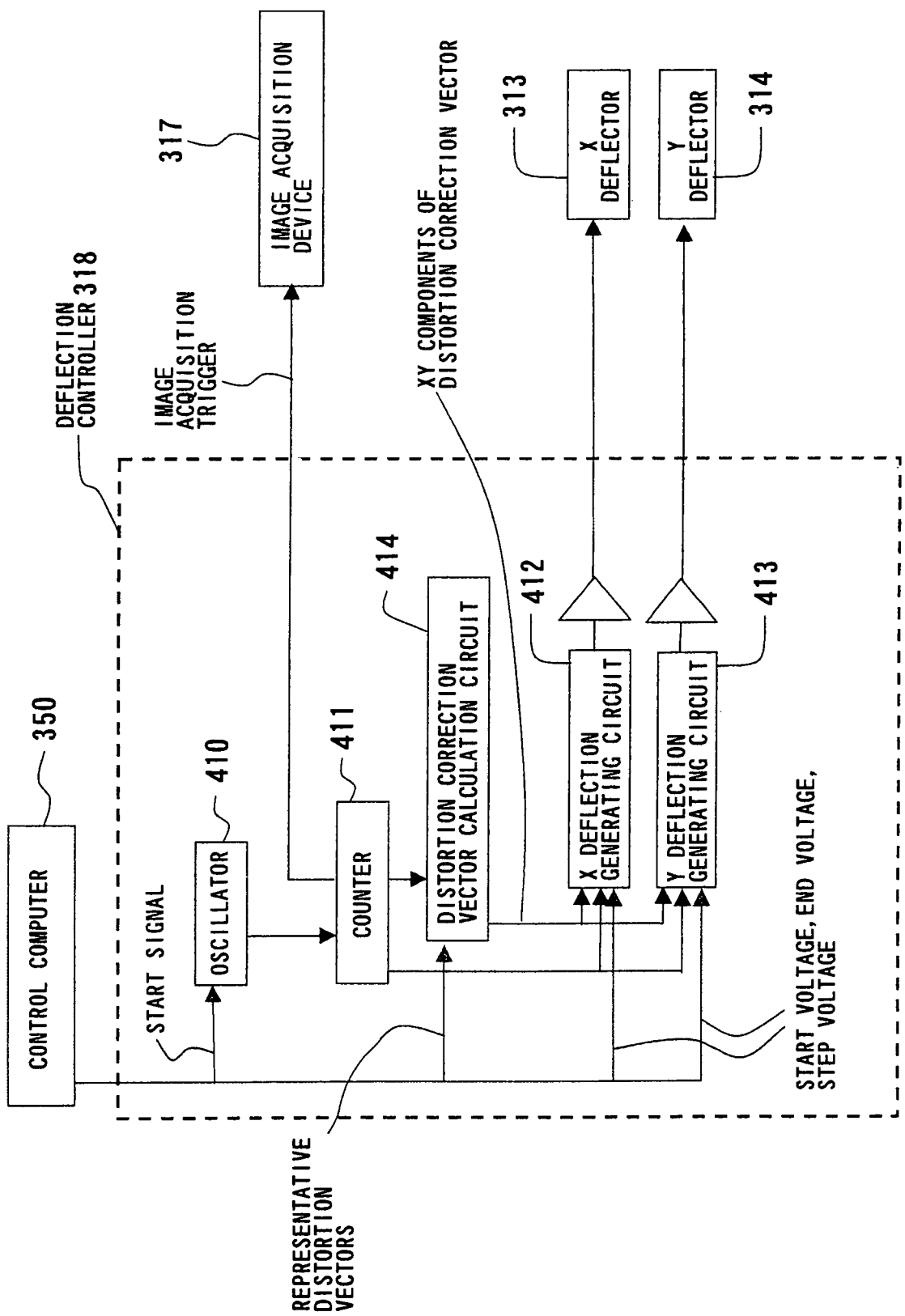
Figure 159:
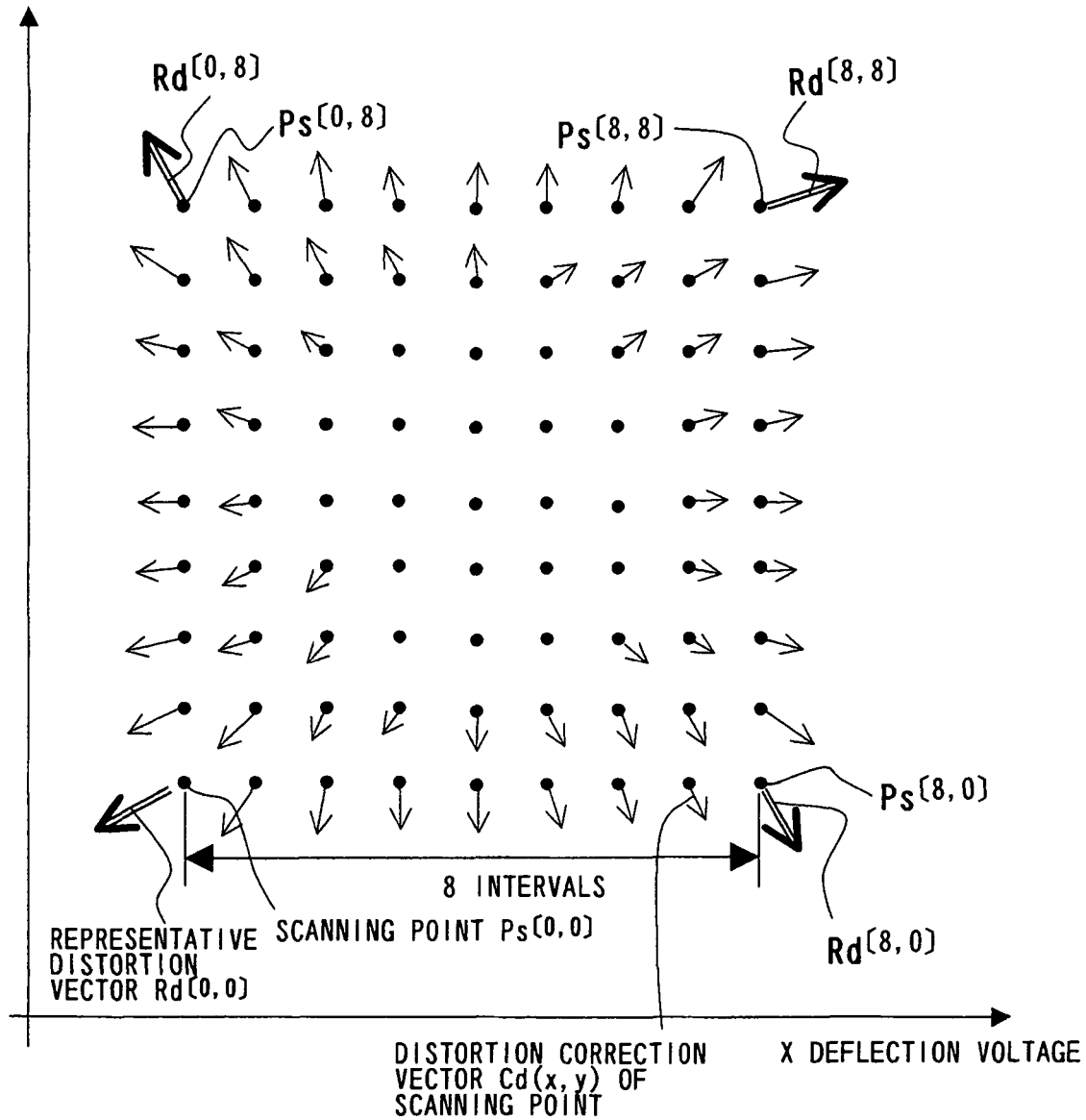
Figure 160A:
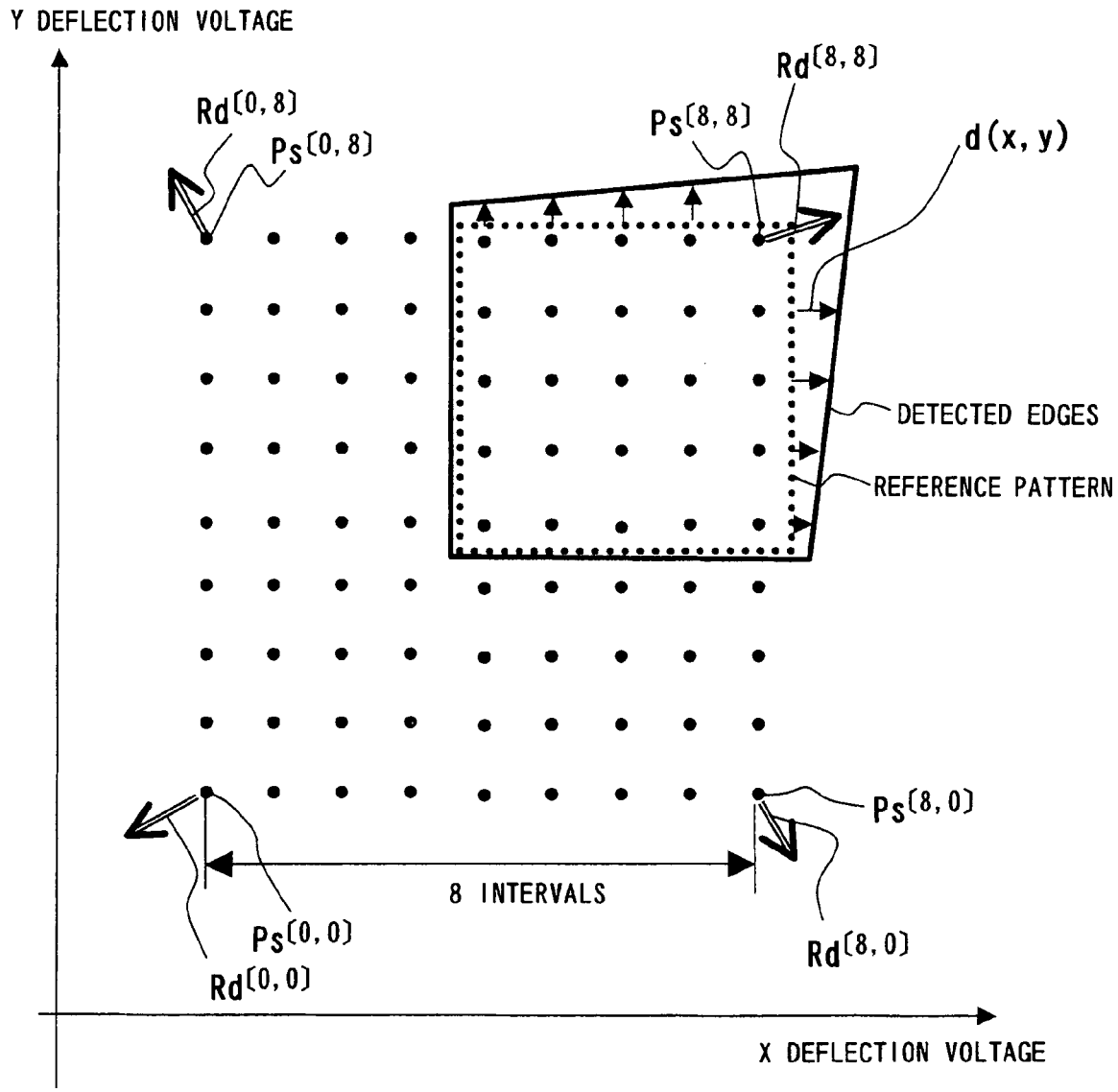
Figure 160B:
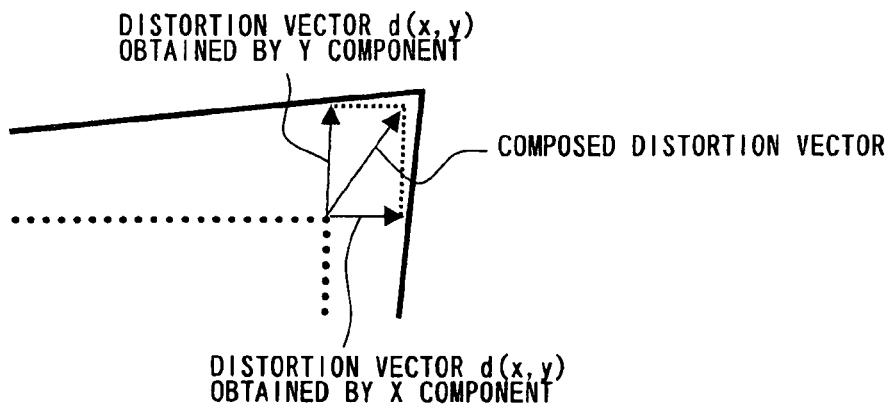
Figure 161:
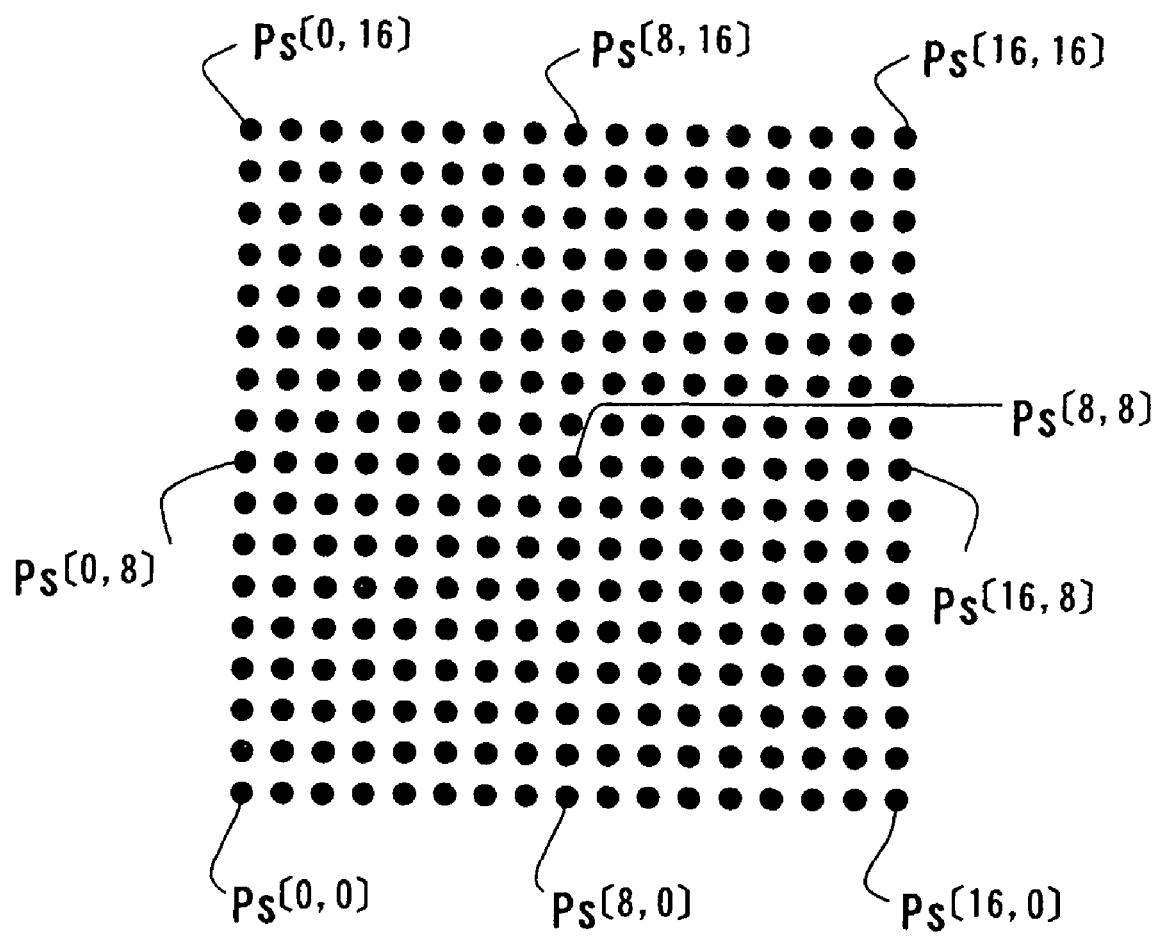
Figure 162A:
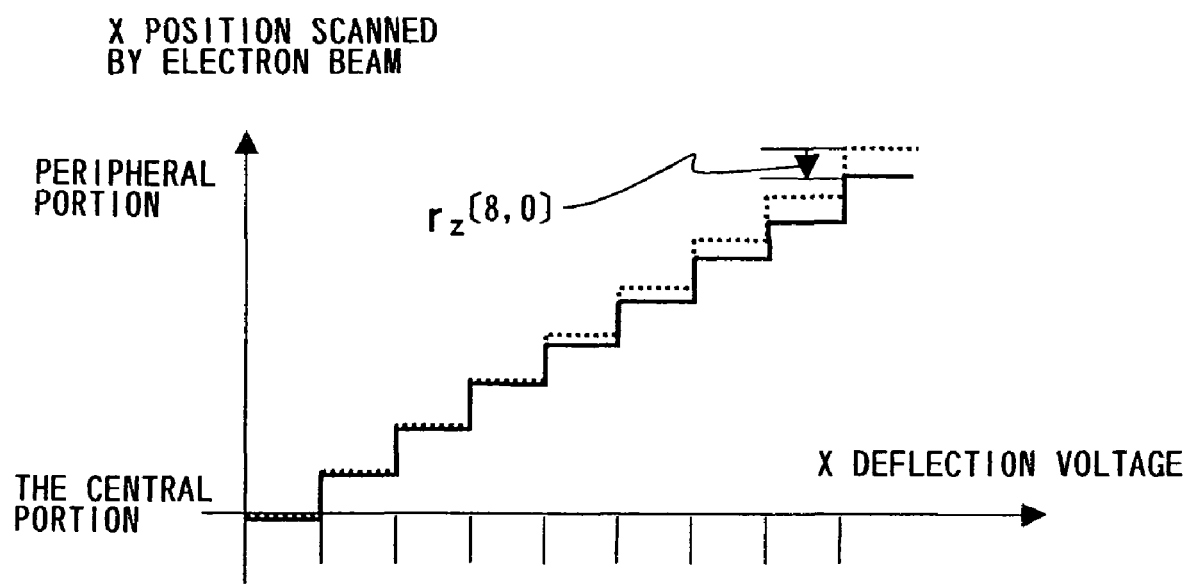
Figure 162B:
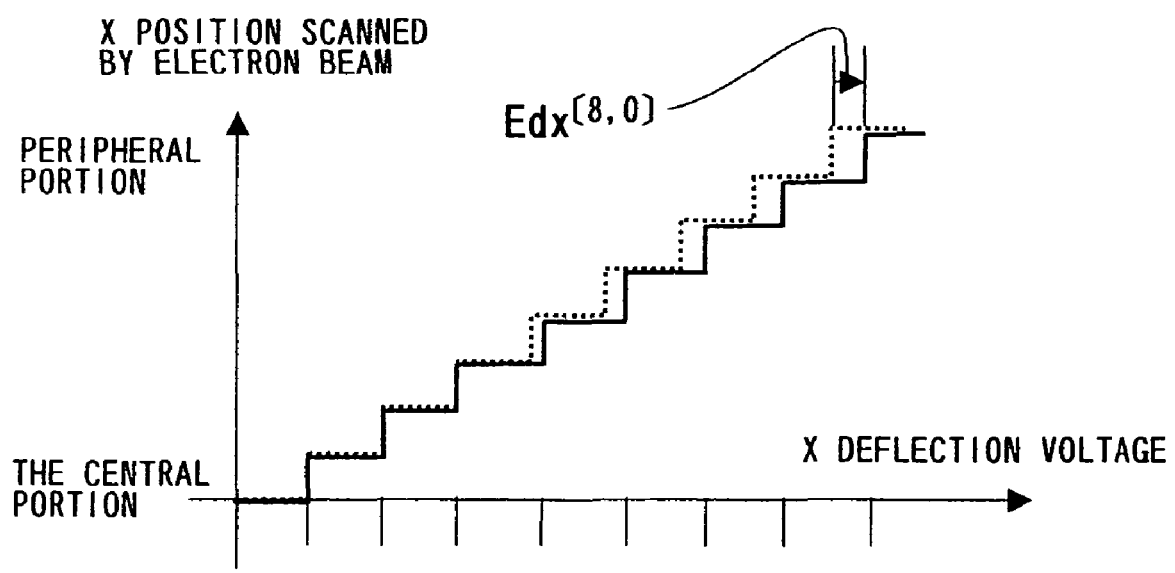
Figure 164:
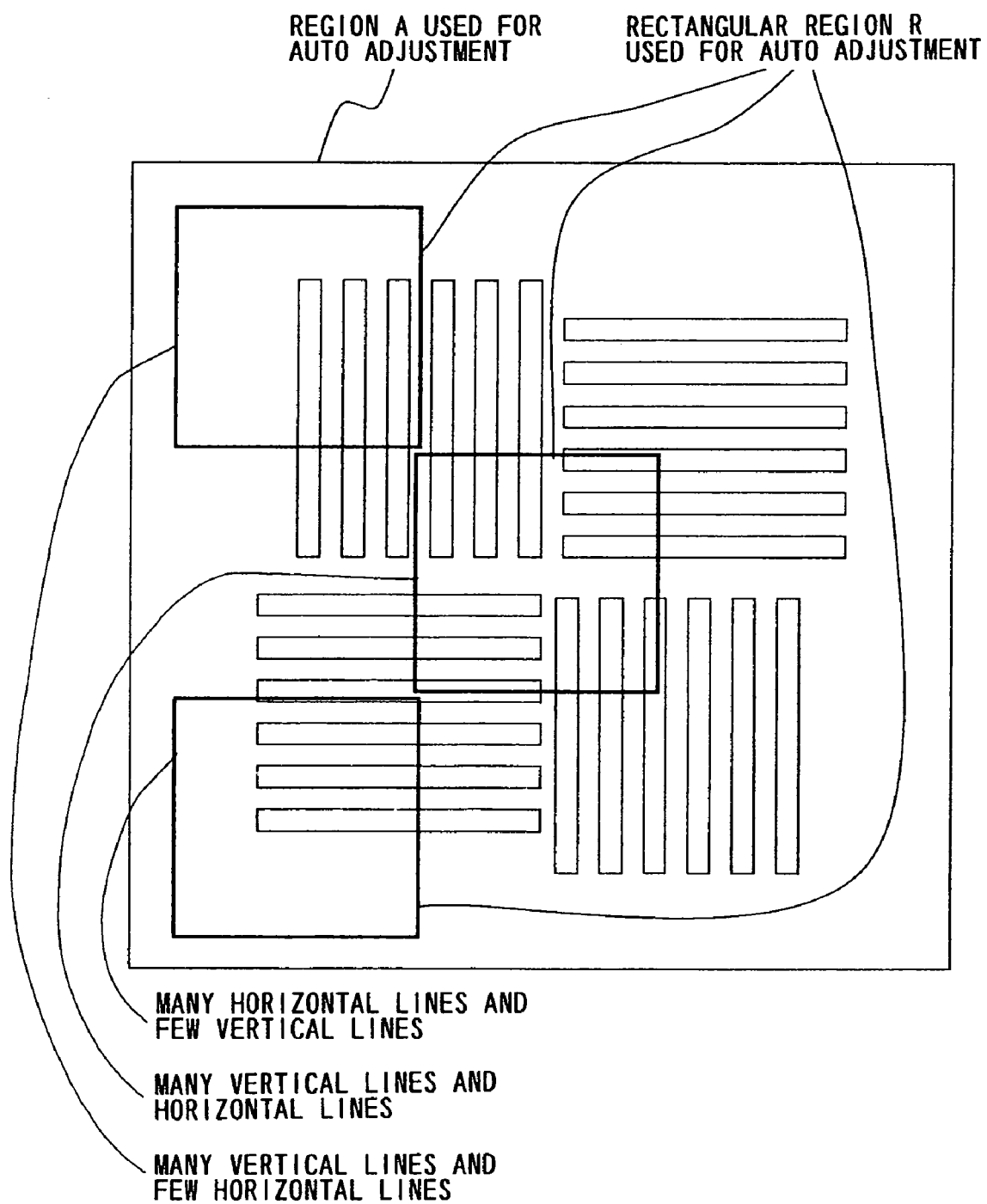
Figure 167:
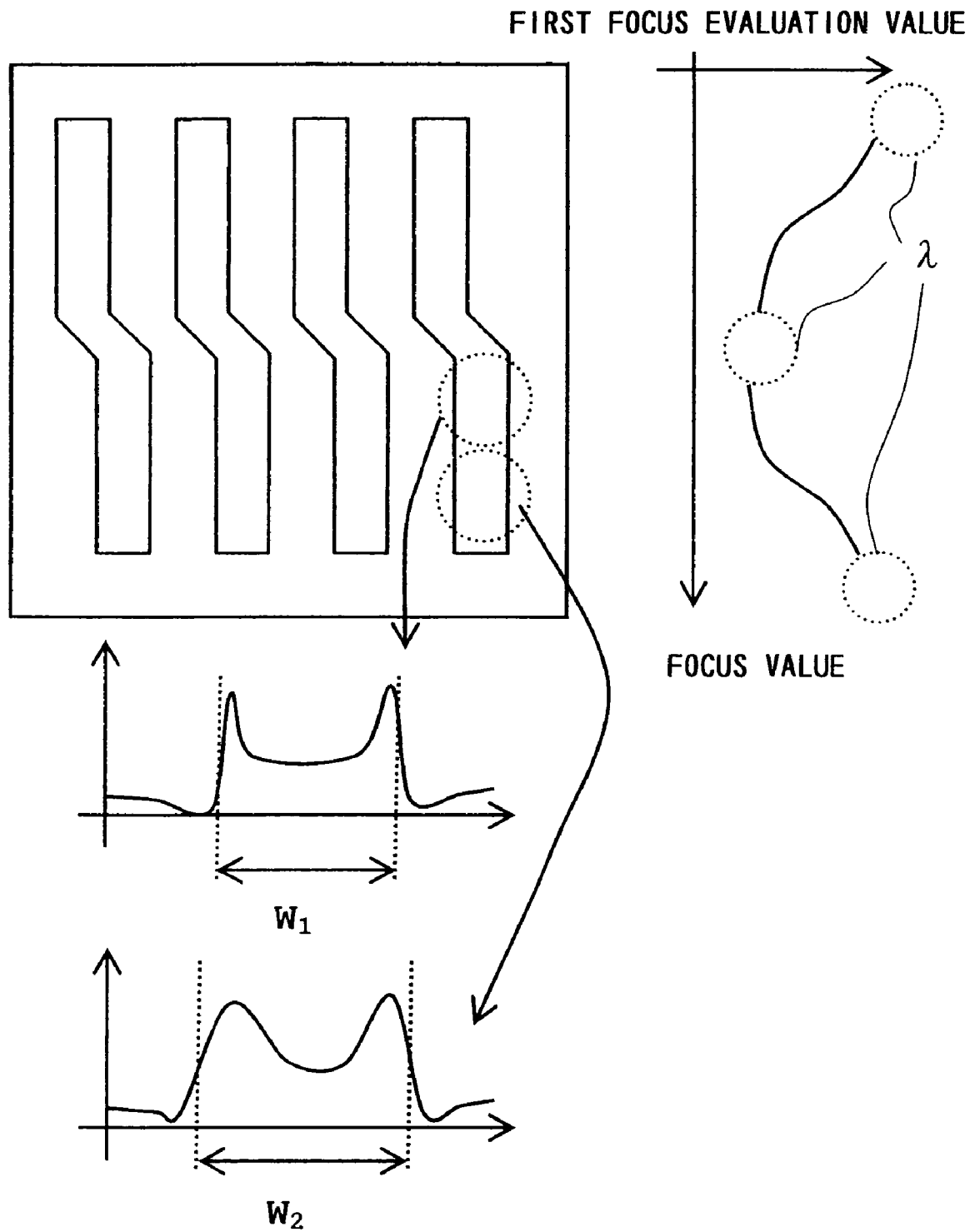
Figure 168:
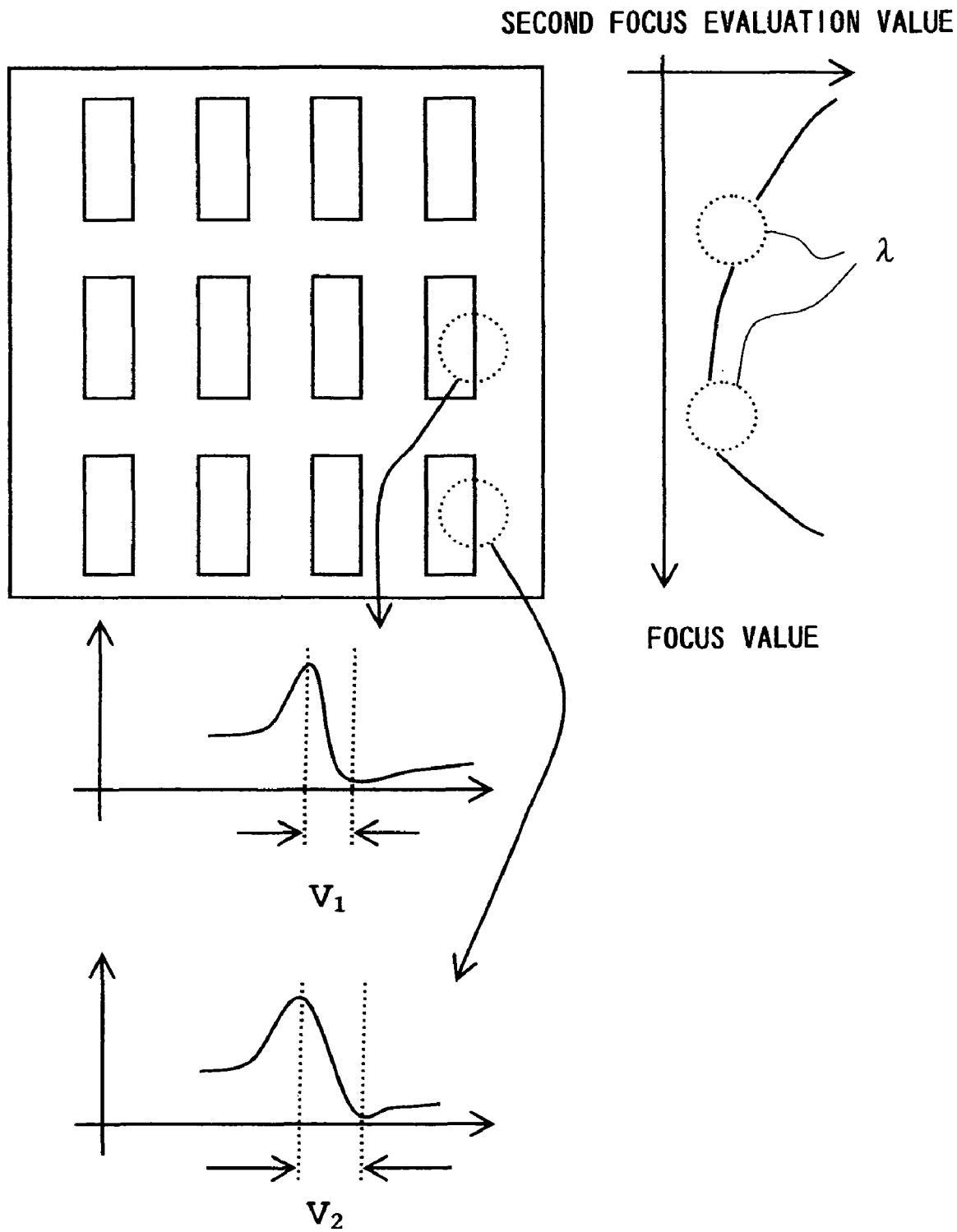
Figure 169:
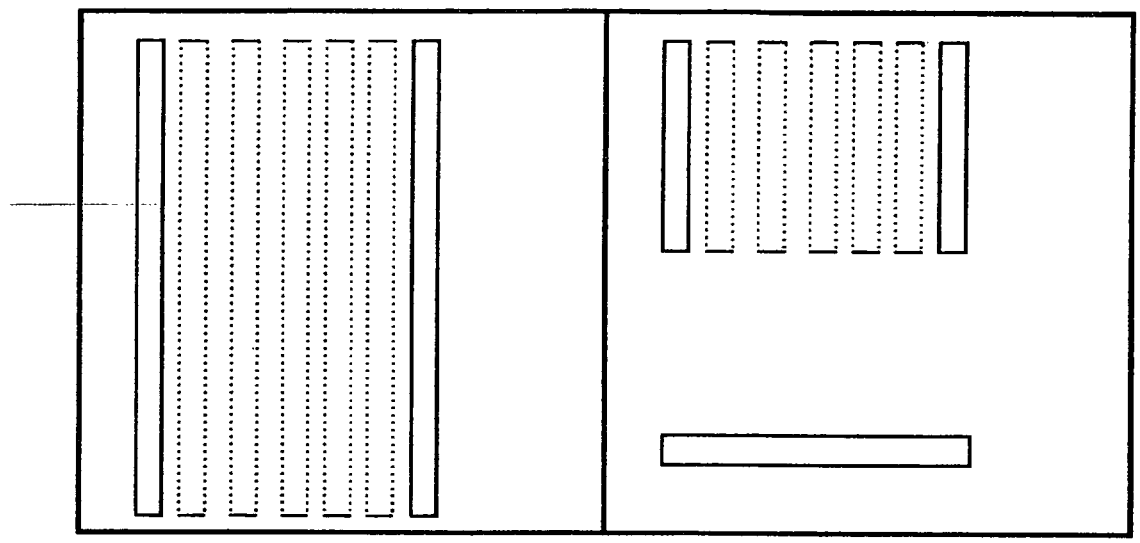
Figure 170:
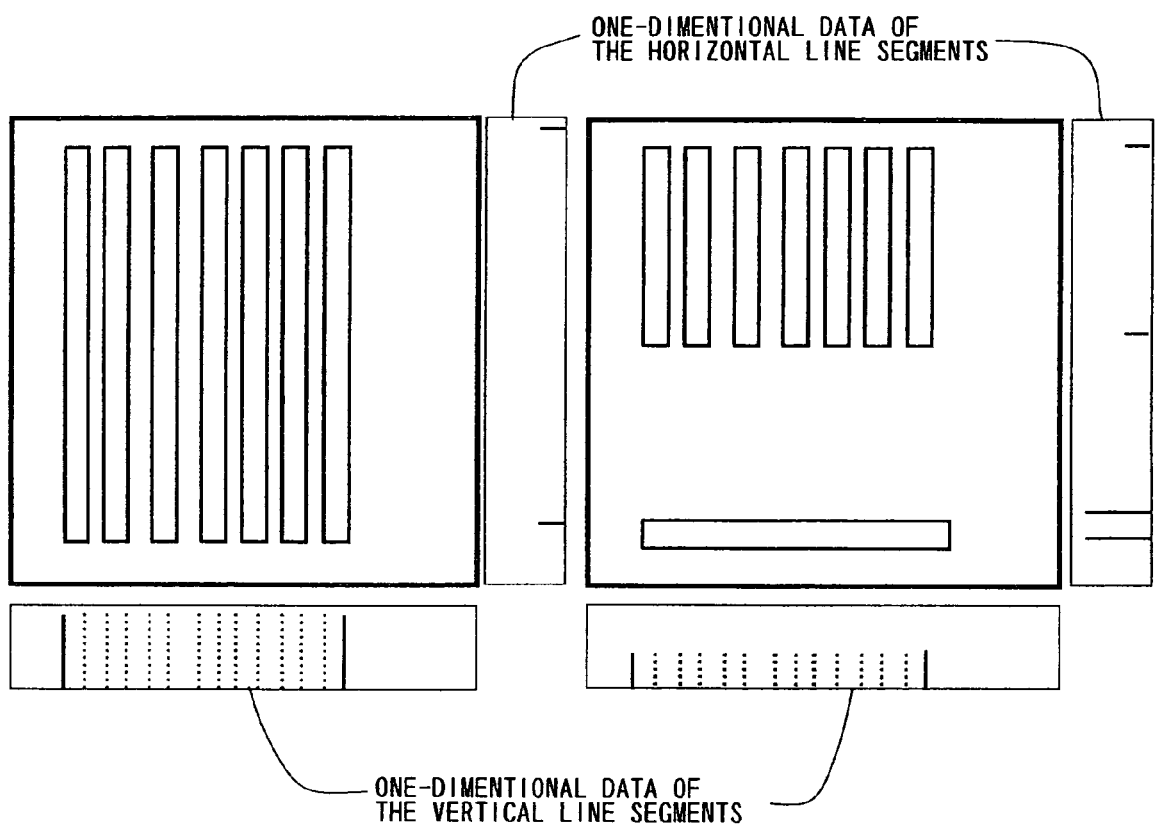
Figure 171:
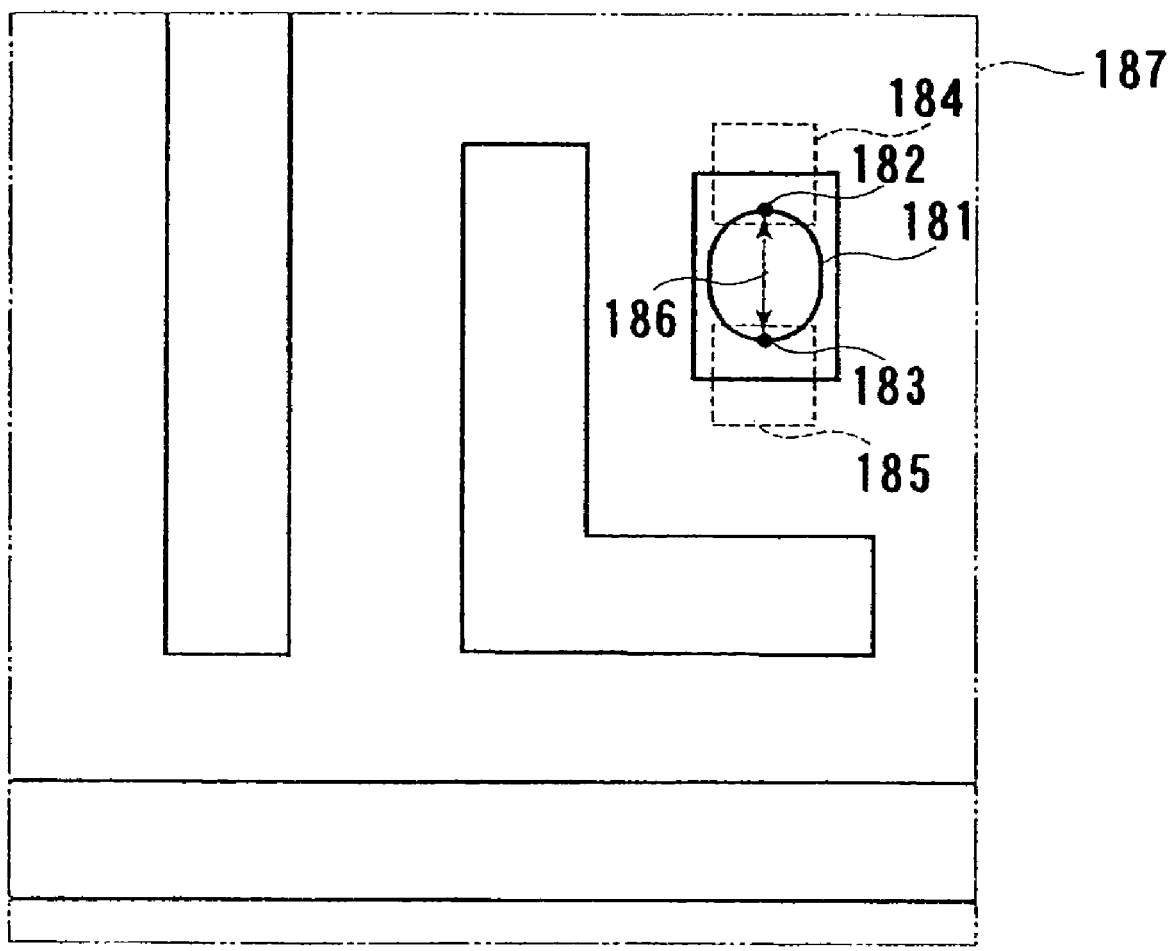
Figure 172:
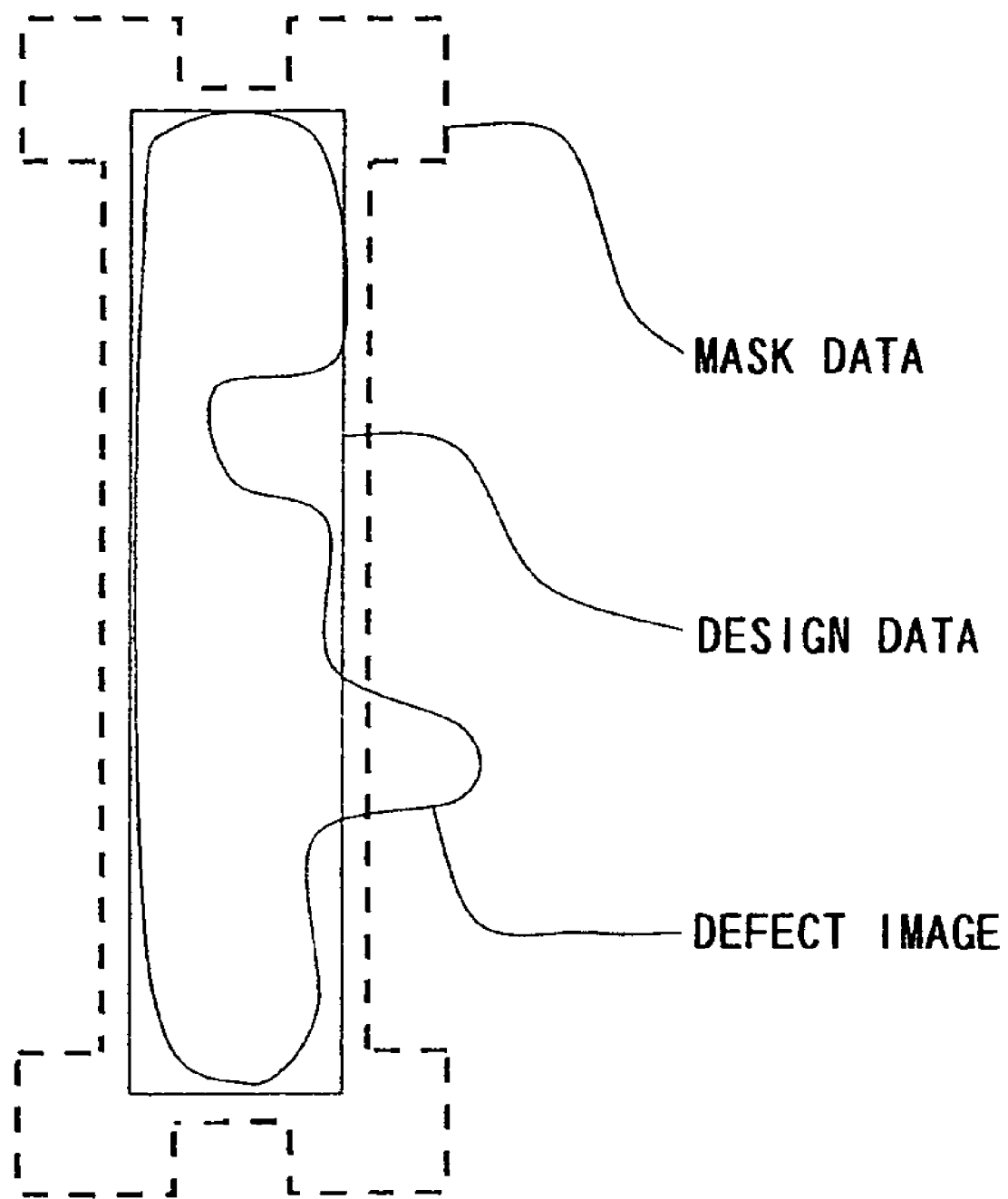
Figure 174:
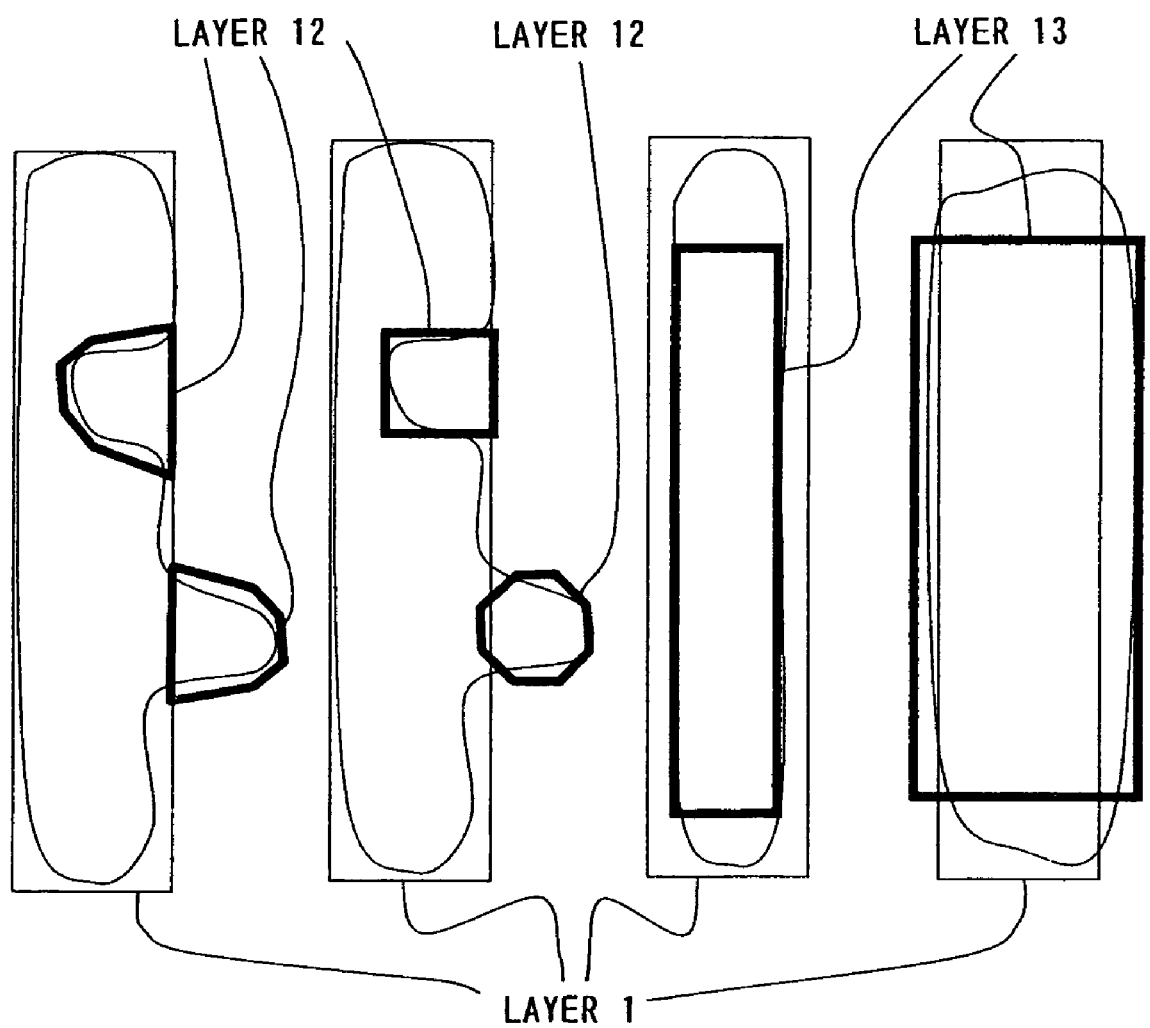

FIG. 127 is a schematic view showing the second edges of an image of a pattern to-be-inspected corresponding to the rectangle used in a writer;

FIG. 128 is a schematic view showing four connected circular arcs;

FIGS. 129A and 129B are schematic views showing a method in which a scanning direction for an electron beam is 18 degrees;

FIGS. 130A through 130D are schematic views showing a method of scanning a hexagonal area;

FIG. 131 is a schematic view showing methods of automatically setting scanning conditions based on a reference pattern;

FIG. 132 is a schematic view showing a scanning path for an electron beam;

FIG. 133 is a schematic view showing another scanning path for an electron beam;

FIG. 134 is a schematic view showing the filtering of a vertical scan;

FIG. 135 is a schematic view showing a method of scanning only a neighboring portion of edges of a pattern to-be-inspected;

FIG. 136 is a flowchart showing procedure in the method of scanning only a neighboring portion of edges of a pattern to-be-inspected;

FIGS. 137A and 137B are schematic views showing methods of sequencing acquisition of sampling data when only a neighboring portion of edges of a pattern to-be-inspected is scanned;

FIGS. 138A, 138B and 138C are schematic views showing a method of obtaining neighboring portions corresponding to regions for the line width inspection method;

FIG. 139 is a schematic view showing a method of performing interlace scan and image-accumulation scan using a continuously moving stage and feedback of a stage position to deflectors;

FIG. 140 is a schematic view showing interlace scan at 45 degrees in the lower left direction by using the configuration shown in FIG. 139;

FIG. 141 is a schematic view showing scanning waveforms generated by the X deflector and the Y deflector, the XY stage continuously moving a specimen downward, in the case of performing the interlace scan shown in FIG. 140;

FIG. 142 is a schematic view showing a frame buffer as a memory, in which intensities of secondary electrons detected by the secondary electron detector are stored;

FIG. 143 is a schematic view showing an image-accumulation scan at 45 degrees in the lower left direction by using the configuration shown in FIG. 139;

FIG. 144 is a schematic view showing scanning waveforms generated by the X deflector and the Y deflector, the XY stage continuously moving a specimen downward, in the case of performing the image-accumulation scan shown in FIG. 143;

FIG. 145 is a schematic view showing a frame buffer as a memory, in which intensities of secondary electrons detected by the secondary electron detector are added and stored;

FIG. 146 is a schematic view showing an image of a pattern to-be-inspected having distortion;

FIG. 147 is a schematic view showing a matching method performed by using a sub-inspection-unit-area;

FIG. 148 is a schematic view showing methods of correcting distortion quantities of an image of a pattern to-be-inspected;

FIG. 149 is a schematic view showing a method of accumulating images by using a method of correcting images of a pattern to-be-inspected;

FIG. 150 is a schematic view showing the case of large distortion quantities of the image of the pattern to-be-inspected;

FIG. 151 is a schematic view showing a method of obtaining a center of the standard distribution;

FIG. 152 is a view showing the image rotation angle θx and θy;

FIGS. 153A, 153B, and 153C are schematic views showing a method of obtaining distortion quantities of the image of the pattern to-be-inspected by using distribution of the first edges of an image of a pattern to-be-inspected;

FIG. 154 is a schematic view showing an example in which distribution of edges of corner parts of an image of a pattern to-be-inspected is asymmetry;

FIG. 155 is a schematic view showing a method of recognizing the first edges that exist in corner parts of an image of a pattern to-be-inspected;

FIG. 156 is a schematic view showing a method of recognizing the first edges that exist in line parts of the image of the pattern to-be-inspected;

FIG. 157 is a schematic view showing an example of a nonlinear distortion of an image;

FIG. 158 is a schematic view showing an example of construction of a deflection controller;

FIG. 159 is a schematic view showing a method in which the distortion correction vector calculation circuit calculates a distortion correction vector using representative distortion vectors;

FIG. 160A is a schematic view showing a method in which representative distortion vectors are calculated from distortion vectors in a rectangle;

FIG. 160B is a schematic view showing a composed distortion vector;

FIG. 161 is a schematic view showing a method in which the representative distortion vectors are calculated from distortion vectors in a plurality of rectangular regions;

FIGS. 162A and 162B are schematic views showing a method in which the distortion correction vector calculation circuit converts the distortion correction vector into a deflection voltage;

FIG. 163 is a schematic view showing a method of correcting variation in line widths depending on positions of an image of a pattern to-be-inspected;

FIG. 164 is a schematic view showing a method of obtaining a region suitable for automatic contrast brightness adjustment and automatic focus adjustment;

FIG. 165 is a schematic view showing examples of a region suitable for automatic astigmatism adjustment;

FIG. 166 is a schematic view showing a method of obtaining a region suitable for automatic astigmatism adjustment;

FIG. 167 is a schematic view showing an automatic focus adjustment method in which the second edge detection method is used;

FIG. 168 is a schematic view showing another automatic focus adjustment method in which the second edge detection method is used;

FIG. 169 is a schematic view showing two sub-inspection-unit-areas;

FIG. 170 is a schematic view showing a method of selecting the most suitable sub-inspection-unit-area for matching;

FIG. 171 is a diagram showing an example of inspection using a high-magnification image and a low-magnification image;

FIG. 172 is a schematic view showing an example of a display of superimposing design data and mask data on a defect image;

FIGS. 173A, 173B, 173C, and 173D are schematic views showing examples of displaying detected defects as diagrams;

FIG. 174 is a schematic view showing a method in which defects are converted into design data, and are displayed;

FIG. 175 is a schematic view showing an example of an FEM wafer;

FIG. 176 is a schematic view showing an example of a critical area; and

Figure 177:
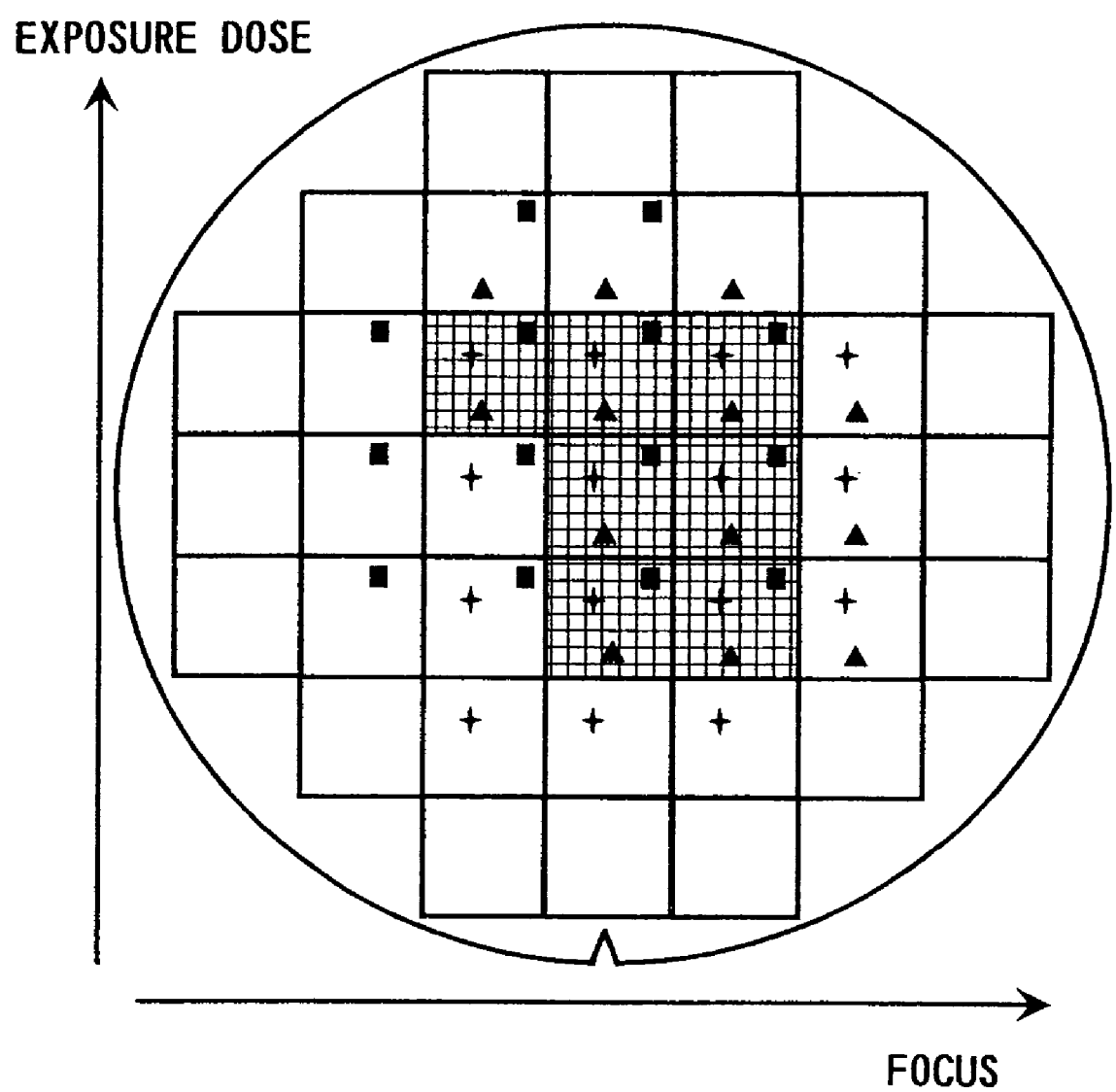

FIG. 177 is a schematic view showing an example of a process window obtained by the embodiment of the present invention.

DETAILED DESCRIPTION OF THE PREFERRED EMBODIMENTS

Contents
1. Overview
2. Hardware configuration
2.1 Basic arrangement of image generation device
2.2 Scan methods of image generation device
2.2.1 Scan method 1
2.2.2 Scan method 2
2.2.3 Scan method 3
2.3 Basic arrangement of pattern inspection apparatus
2.4 Functional block diagram
3. Explanations of terms
3.1 Edge
3.2 Reference pattern
3.3 Recipe data
3.4 Inspection-unit-area
3.5 Inspection results
4. Basic Inspection processing
4.1 The first edge detection
4.1.1 The first edge detection method 1
4.1.2 The first edge detection method 2
4.2 Line-shaped pattern matching method
4.2.1 Matching method in which unique pattern is used
4.2.2 Matching method in which negative pattern is used
4.2.3 Matching method in which projection data obtained by projecting edge on the horizontal and vertical axes are used
4.3 Matching method in which geometrical information for isolated pattern is used
4.4 Matching method in which statistic values for isolated pattern are used
4.5 Post-matching processing
4.6 The first inspection
4.6.1 Method of recognizing defect having abnormal pattern deformation quantity
4.6.2 Method of recognizing defect using luminance distribution of pixels
4.7 Method of determining defect-classes based on feature quantity obtained from image
4.8 Pattern deformation quantities obtained from the whole inspection-unit-area
4.9 Extraction rules for attributes of reference pattern
4.10 Method of detecting defect using attributes of reference pattern
4.10.1 Defect of end having edge placement error
4.10.2 Defects of line part and corner having edge placement error
4.10.3 Defects of isolated pattern having placement error
4.10.4 Other defects of isolated pattern
4.10.5 Defect of corner having abnormal curvature
4.11 The second edge detection
4.12 The second inspection 5. Application inspection processing
5.1 Method of recognizing repeated defects
5.1.1 The first method of recognizing repeated defects
5.1.2 The second method of recognizing repeated defects
5.1.3 The third method of recognizing repeated defects
5.1.4 The fourth method of recognizing repeated defects
5.2 Region inspection method
5.2.1 Methods of inspecting line width, average line width, space width, and average space width of line-shaped pattern
5.2.2 Methods of inspecting line width, average line width, space width, and average space width of curvilinear-shaped pattern
5.2.3 Method of inspecting part that is liable to cause open or bridge defect
5.3 Inspection methods in which result of the Boolean operation on reference patterns is used
5.3.1 Method of inspecting gate line width
5.3.2 Method of inspecting end-cap
5.3.3 Method in which allowable pattern deformation quantity of end of wiring pattern to be connected to contact hole/via hole is adaptively set
5.3.4 Method of inspecting contact-area
5.4 Method of inspecting correction pattern that should not be formed on wafer
5.5 Inspection method in which inspection result of pattern to-be-inspected of standard semiconductor device is used
5.6 Method of obtaining optimal allowable pattern deformation quantity by inspecting standard specimen
5.7 Method of inspecting patterns requiring signal intensity correction
5.8 Method of inspecting pattern to-be-inspected affected by pattern of preceding process
5.9 Method of inspecting relationship between location of pattern to-be-inspected and location of pattern of preceding process
5.10 Inspection method in which contours are used
5.10.1 Die-to-die comparison method in which contours are used
5.10.2 Method of correcting contour and Methods of reducing noise on contour
5.10.3 Method of outputting contour to external inspection device
5.11 Method of separating pattern deformation quantities into global pattern deformation quantities and local pattern deformation quantities
5.12 Method of correcting time-dependence variation in measurement values of line widths
5.13 Defect-classes based on geometrical information of reference pattern, information of design data, or information of data related to design data
5.14 Method of grouping defects based on feature of reference patterns
5.15 Method of selecting defect image to-be-registered
5.16 Method of selecting defect to-be-reinspected
5.17 Method of displaying distribution diagram of pattern deformation quantities obtained from the whole inspection-unit-area
5.18 Method of classifying measurement values based on geometrical information of reference pattern, information of design data, or information of data related to design data
5.19 Deformation quantity of pattern exposed by shaped beam
6. Other scan methods of image generation device
6.1 Method of scanning electron beam in 18 degrees, Method of scanning hexagonal area, and Method of automatically determining scanning conditions based on reference pattern
6.2 Scanning paths of electron beam in image generation device
6.3 Method of scanning only neighboring portion of edges of pattern to-be-inspected
6.4 Method of scanning only neighboring portions corresponding to region for region inspection method
6.5 Method of performing interlace scan and image-accumulation scan using continuously moving stage
6.5.1 Method of performing interlace scan using continuously moving stage
6.5.2 Method of performing image-accumulation scan using continuously moving stage
7. Method of correcting image of pattern to-be-inspected
7.1 Method of correcting at least one of reference pattern and image of pattern to-be-inspected by detecting distortion quantities of image of pattern to-be-inspected
7.2 Method of accumulating images by using method of correcting images of pattern to-be-inspected
7.3 Method of obtaining distortion quantities of image of pattern to-be-inspected by using distribution of the first edges of image of pattern to-be-inspected
7.3.1 Method of obtaining distribution of the first edges of line part of image of pattern to-be-inspected
7.4 Method of correcting nonlinear distortion of image
7.5 Method of correcting variation in line widths depending on positions of image of pattern to-be-inspected 8. Other methods
8.1 Method of extracting region suitable for automatic image adjustments
8.2 Automatic focus adjustment method in which the second edge detection method is used
8.3 Method of selecting the most suitable sub-inspection-unit-area for matching
8.4 Inspection method in which high-magnification image and low-magnification image are used
8.5 Display method of superimposing defect information on information corresponding to the defect
8.6 Method of measuring FEM wafer
9. Setting values
9.1 Setting values of parameters of image generation device
9.2 Setting values of pixel interval
10. Modifications of embodiments of present invention
1. Overview A pattern inspection apparatus according to an embodiment of the present invention performs inspection by comparing an image of a pattern to-be-inspected obtained from an image generation device 7 shown in FIG. 1 with a reference pattern.

Figure 2:
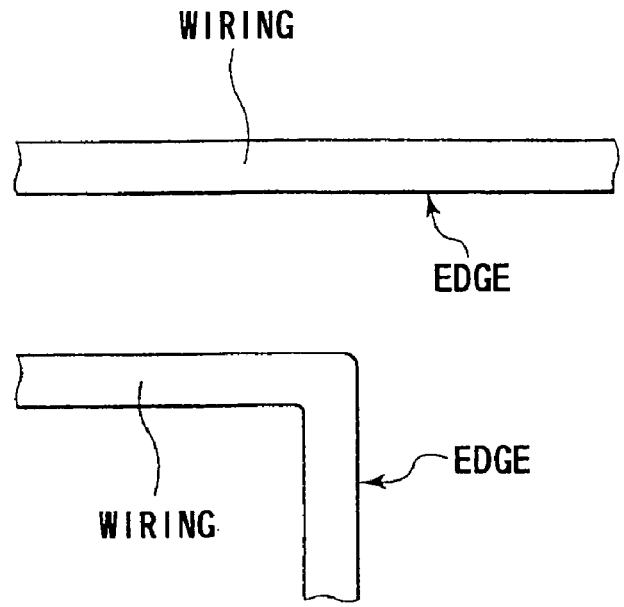
FIG. 2 is a diagram showing an example of reference patterns obtained from design data.
Figure 3:
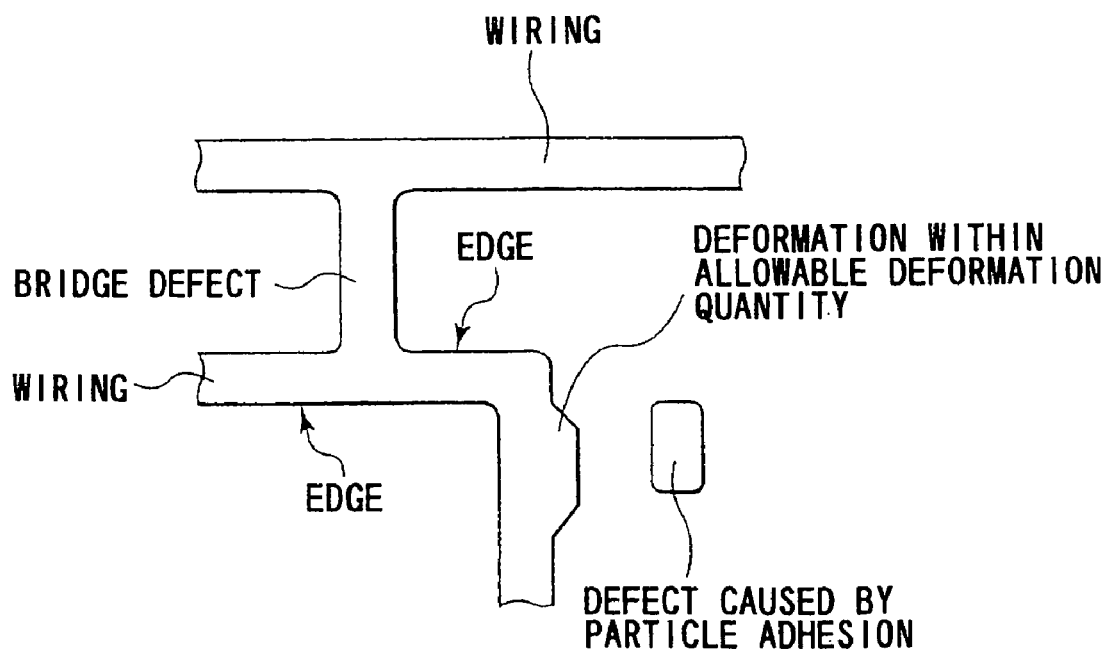
FIG. 3 is a diagram showing an example of an image of a pattern to-be-inspected fabricated based on the design data.

FIG. 2 is a diagram showing an example of reference patterns obtained from design data, and FIG. 3 is a diagram showing an example of an image of a pattern to-be-inspected fabricated based on the design data. As shown in FIG. 3, the image of the pattern to-be-inspected may have a bridge defect, a defect caused by particle adhesion, and a deformation within an allowable pattern deformation quantity. Especially, corners have big corner roundness. Therefore, the image of the pattern to-be-inspected is rather different from the reference patterns.

FIG. 4 is a diagram showing an outline of inspection processing that the pattern inspection apparatus according to the embodiment of the present invention performs. In the first inspection processing, the first edges are detected from the image of the pattern to-be-inspected. Then, by comparing the detected first edges with edges of the first reference pattern, matching between the image of the pattern to-be-inspected and the reference pattern is performed. As a result of the matching, a shift quantity $S_1$ is obtained, and the first reference pattern is shifted by the shift quantity $S_1$. Next, by comparing the detected first edges with the edges of the first reference pattern shifted, the pattern to-be-inspected is inspected. In the first inspection, pattern deformation quantities are obtained by comparing the detected first edges with the edges of the first reference pattern, and then a defect is detected from the pattern deformation quantities. A shift quantity $S_2$ is obtained as one of the pattern deformation quantities.

Then, in order to detect the second edges from the image of the pattern to-be-inspected, the second reference pattern is shifted by the shift quantity $S_1+S_2$. Using the second reference pattern shifted, profiles are obtained from the image of the pattern to-be-inspected and the second edges are detected. Then, by comparing the detected second edges with the edges of the second reference pattern shifted, the pattern to-be-inspected is inspected. Also in the second inspection, pattern deformation quantities are obtained by comparing the detected second edges with the edges of the second reference pattern, and then a defect is detected from the pattern deformation quantities. A shift quantity $S_3$ is obtained as one of the pattern deformation quantities.

By using the above method, the bridge defect, the defect caused by particle adhesion, and the pattern deformation quantities can be detected from the image of the pattern to-be-inspected, and the defects or the pattern deformation quantities can be classified from attributes that the design data has.

2. Hardware Configuration 2.1 Basic Arrangement of Image Generation Device

Figure 1:
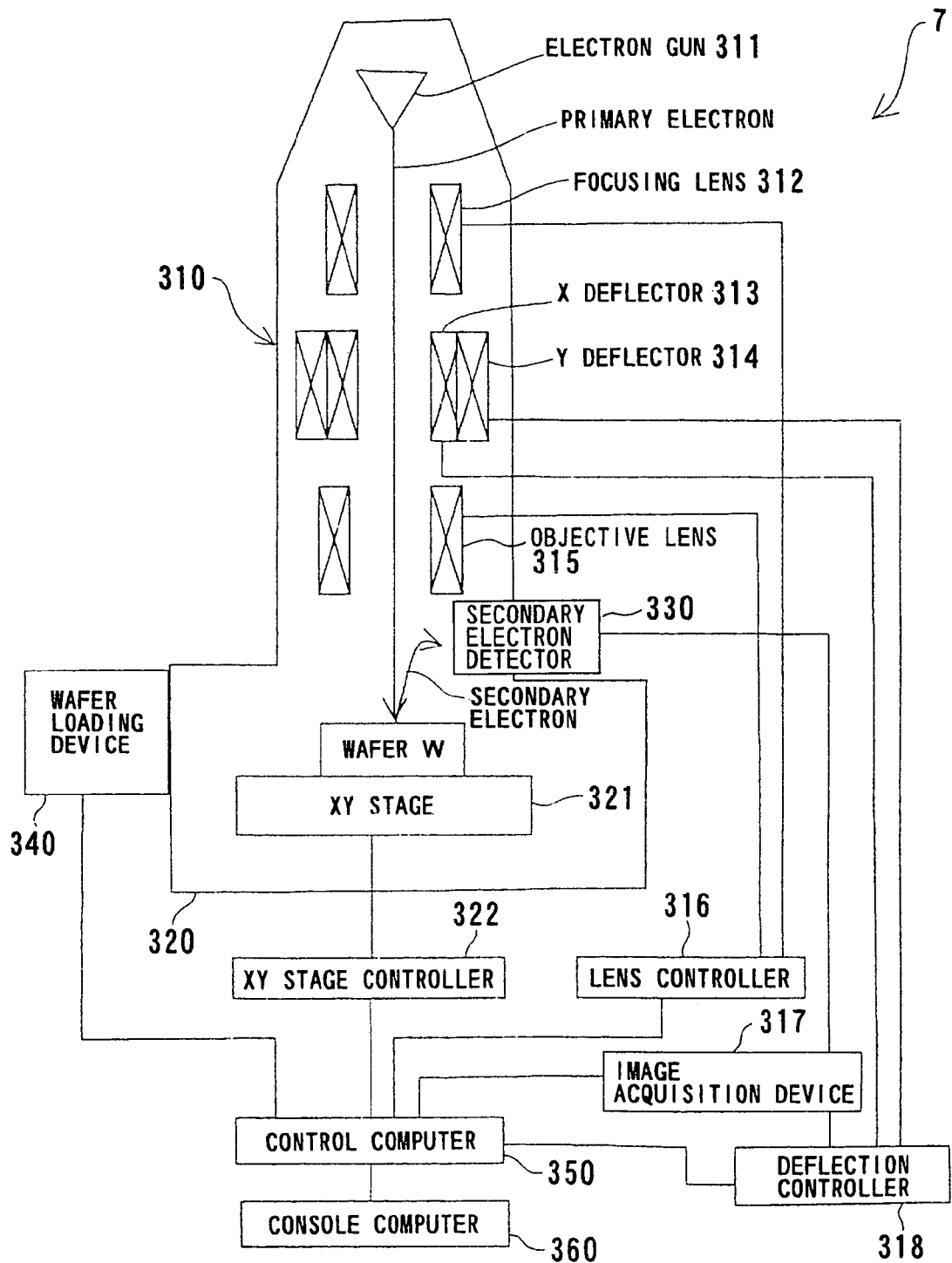
FIG. 1 is a schematic view, partly in block form, showing a basic arrangement of an image generation device in a pattern inspection apparatus according to an embodiment of the present invention.

FIG. 1 is a schematic view showing, partly in block form, a basic arrangement of the image generation device 7 in the pattern inspection apparatus according to the embodiment of the present invention. As shown in FIG. 1, the image generation device 7 generally comprises an irradiation system 310, a specimen chamber 320, and a secondary electron detector 330.

The irradiation system 310 comprises an electron gun 311, a focusing lens 312 for focusing primary electrons emitted from the electron gun 311, an X deflector 313 and a Y deflector 314 for deflecting an electron beam (charged particle beam) in the X and Y directions, respectively, and an objective lens 315. The specimen chamber 320 has an XY stage 321 movable in the X and Y directions. A wafer W as a specimen can be loaded into and unloaded from the specimen chamber 320 by a wafer-loading device 340.

In the irradiation system 310, primary electrons emitted from the electron gun 311 are focused by the focusing lens 312, deflected by the X deflector 313 and the Y deflector 314, and focused and applied by the objective lens 315 to a surface of the wafer W.

When the primary electrons are applied to the wafer W, the wafer W emits secondary electrons, and the secondary electrons are detected by the secondary electron detector 330. The focusing lens 312 and the objective lens 315 are connected to a lens controller 316 that is connected to a control computer 350. The secondary electron detector 330 is connected to an image acquisition device 317 that is also connected to the control computer 350. Intensity of the secondary electrons detected by the secondary electron detector 330 is converted into an image of a pattern to-be-inspected by the image acquisition device 317. A field of view is defined as the largest region where the primary electrons are applied and an image without distortion can be acquired.

The X deflector 313 and the Y deflector 314 are connected to a deflection controller 318 that is also connected to the control computer 350. The XY stage 321 is connected to an XY stage controller 322 that is also connected to the control computer 350. The wafer-loading device 340 is also connected to the control computer 350. The control computer 350 is connected to a console computer 360.

2.2 Scan Methods of Image Generation Device

Figure 5:
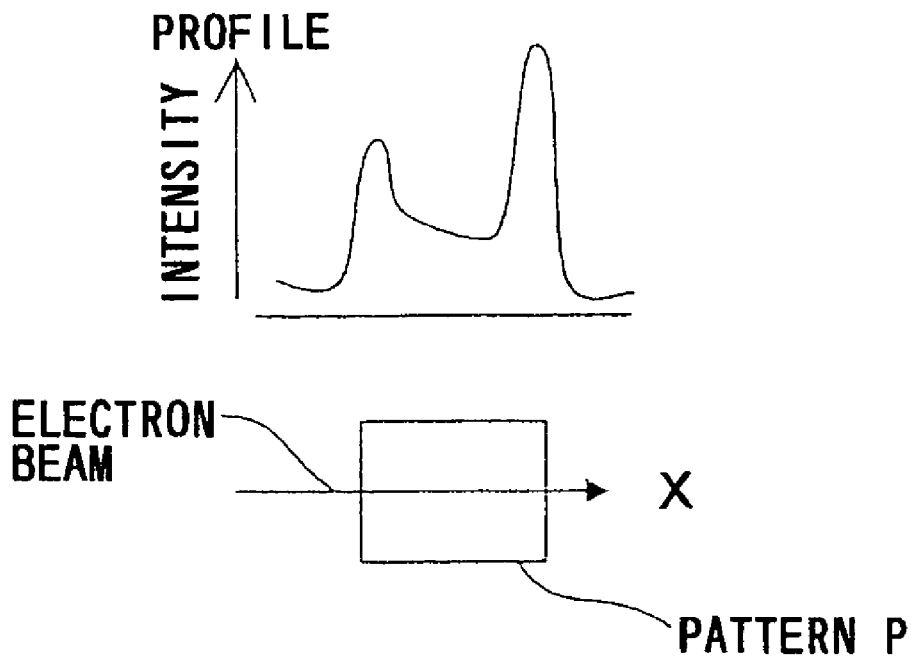
FIG. 5 is a schematic view showing intensity of secondary electrons detected by a secondary electron detector in the image generation device shown in FIG. 1.

FIG. 5 is a schematic view showing intensity of secondary electrons detected by the secondary electron detector 330 shown in FIG. 1. Specifically, FIG. 5 shows the intensity of the secondary electrons that are detected by the secondary electron detector 330 when a pattern P to-be-inspected is scanned by the one electron beam in the X direction. As shown in FIG. 5, the intensity of the secondary electrons is stronger at edges of the pattern P to-be-inspected due to the edge effect and weaker at a central area of the pattern P to-be-inspected. The intensity of the secondary electrons is not symmetrical horizontally across the pattern P to-be-inspected, but is observed with a lower level at the edge (left edge) where the electron beam starts scanning the pattern P to-be-inspected than at the opposite edge (right edge) where the electron beam leaves the pattern P to-be-inspected.

Figure 6:
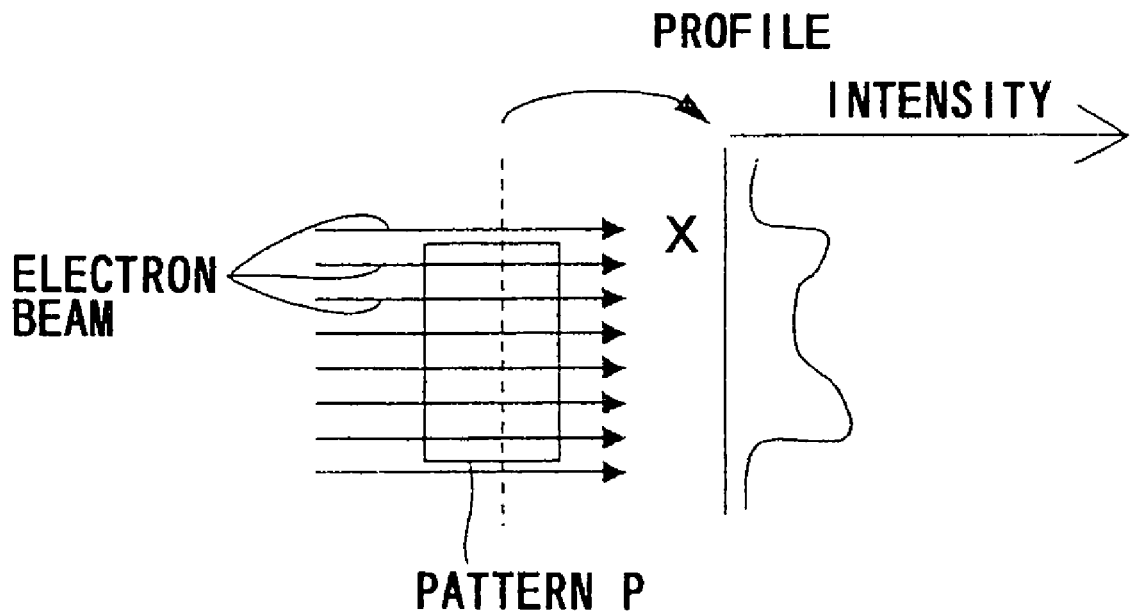
FIG. 6 is a schematic view showing intensity of the secondary electrons in the case where the pattern P shown in FIG. 5 is turned 90 degrees and profiles of the pattern P are obtained.

FIG. 6 is a schematic view showing intensity of the secondary electrons in the case where the pattern P to-be-inspected shown in FIG. 5 is turned 90 degrees and profiles of the pattern P to-be-inspected are obtained. Specifically, FIG. 6 shows the intensity of the secondary electrons that are detected by the secondary electron detector 330 when the pattern P to-be-inspected is scanned by a plurality of electron beams in the X direction. As shown in FIG. 6, the edge effect at edges of the pattern P to-be-inspected whose direction is parallel to the scanning direction is difficult to obtain more clearly than in the case shown in FIG. 5.

Figure 7:
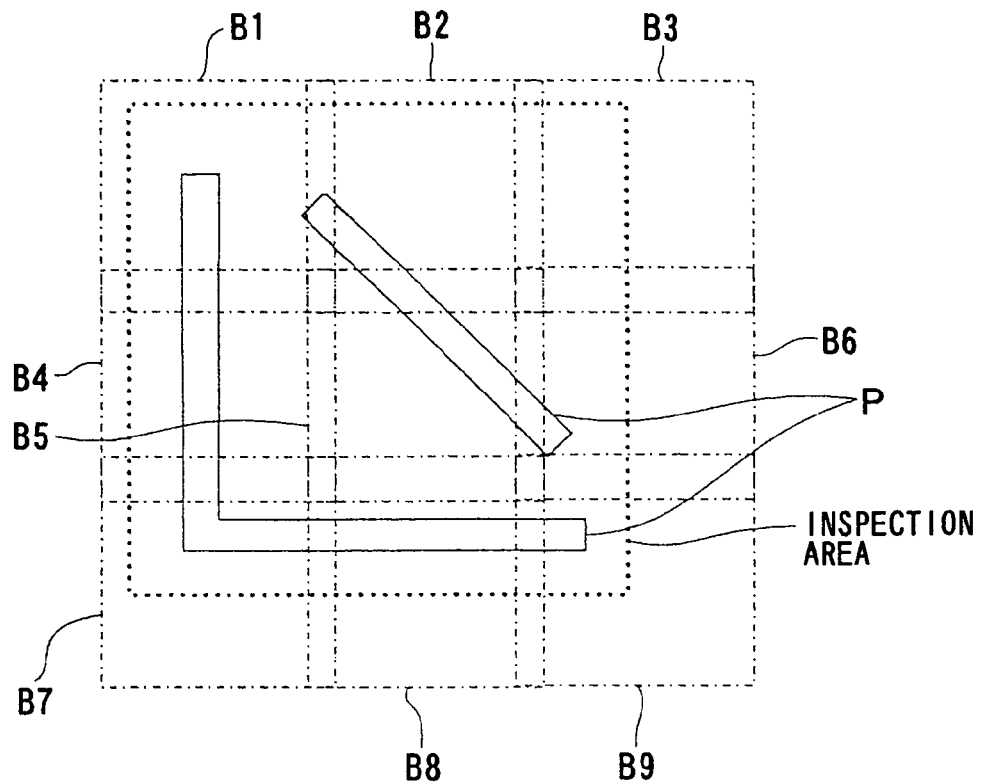
FIG. 7 is a schematic view showing a scanning area used when patterns to-be-inspected are inspected by the pattern inspection apparatus according to the embodiment of the present invention.

FIG. 7 is a schematic view showing a scanning area used when patterns to-be-inspected are inspected by the pattern inspection apparatus according to the embodiment of the present invention. In FIG. 7, a rectangle shown by dotted lines is an inspection area, which will be described later in 3.4 Inspection-unit-area. Patterns P to-be-inspected shown by solid lines exist in the inspection area. Inspection is performed for each inspection-unit-area that is obtained by dividing the inspection area by a field of view. The scanning area means an area that is scanned by a single scanning process. The maximum size of the scanning area is the field of view. A scanning area, which exists in the interior of a boundary of the inspection area, is the same as the inspection-unit-area. In the case of a scanning area that includes a boundary of the inspection area, an area that exists in the scanning area and also exists in the inspection area is the inspection-unit-area. Nine blocks B1 through B9 arranged in a matrix of three vertical columns and three horizontal rows shown by chain lines are the scanning areas.

Figure 8:
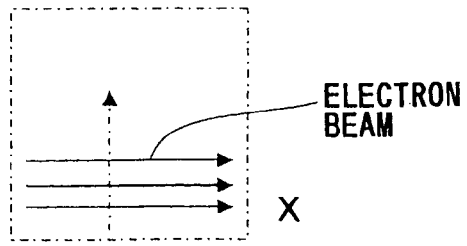
FIG. 8 is a schematic view illustrative of edge detection accuracy that is obtained when a pattern to-be-inspected is scanned horizontally.

The larger difference between a peak and a bottom of a profile obtained from an edge and its neighborhood of an image of a pattern to-be-inspected is, the higher edge detection accuracy is. FIG. 8 is a schematic view illustrative of edge detection accuracy that is obtained when a pattern to-be-inspected is scanned horizontally (in the X direction). As shown in FIG. 8, when the pattern to-be-inspected is scanned horizontally, edge detection accuracy with regard to edges in the vertical direction is as high as edge detection accuracy shown in FIG. 5. However, edge detection accuracy with regard to edges in the horizontal direction is low.

Figure 9:
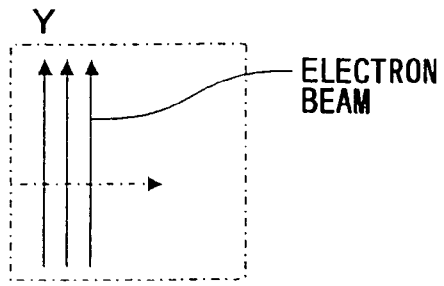
FIG. 9 is a schematic view illustrative of edge detection accuracy that is obtained when a pattern to-be-inspected is scanned vertically in an upward direction.

FIG. 9 is a schematic view illustrative of edge detection accuracy that is obtained when a pattern to-be-inspected is scanned vertically in the upward direction (in the Y direction). As shown in FIG. 9, when the pattern to-be-inspected is scanned vertically, edge detection accuracy is high with regard to edges in the horizontal direction, but is low with regard to edges in the vertical direction.

In a lower left block B7 of FIG. 7 where there are edges in the horizontal direction and edges in the vertical direction, if edge detection accuracies with regard to the edges in the horizontal direction and the edges in the vertical direction need to be high, two scans including the horizontal scan shown in FIG. 8 and the vertical scan shown in FIG. 9 are required. In a block B8 that is to the right of the block B7 where there is only edges in the horizontal direction, edge detection accuracy is high when only the vertical scan shown in FIG. 9 is performed. In a middle left block B4 where there is only edges in the vertical direction, edge detection accuracy is high when only the horizontal scan shown in FIG. 8 is performed. Therefore, by selectively performing the horizontal scan, the vertical scan, or both the horizontal and vertical scans, a desired image of a pattern to-be-inspected is obtained under the scan control.

Because most of patterns to-be-inspected on semiconductor integrated circuits (LSI) and liquid crystal panels comprise edges in the vertical direction and edges in the horizontal direction, those patterns to-be-inspected need to be scanned in both the horizontal and vertical scans for detecting the edges of the image of the patterns to-be-inspected composed of edges in the vertical direction and edges in the horizontal direction with high accuracy.

FIG. 10 is a schematic view showing a method in which a pattern to-be-inspected is scanned bidirectionally. As described by using FIG. 5, the intensity of the secondary electrons is observed with a lower level at the edge (left edge in FIG. 5) where the electron beam starts scanning the pattern P to-be-inspected than at the opposite edge (right edge in FIG. 5) where the electron beam leaves the pattern P to-be-inspected. In view of these observations, an image of a pattern to-be-inspected is acquired by scanning the pattern to-be-inspected in alternately opposite directions as shown in FIG. 10. Specifically, the image of the pattern to-be-inspected is acquired by scanning the pattern to-be-inspected alternately in leftward direction and rightward direction. Left edges of the pattern to-be-inspected are detected by using the image of the pattern to-be-inspected acquired by scanning in the leftward direction, and right edges of the pattern to-be-inspected are detected by using the image of the pattern to-be-inspected acquired by scanning in the rightward direction. As a result, high edge detection accuracy can be achieved at both the left edges and the right edges of the pattern to-be-inspected.

Figure 11A:
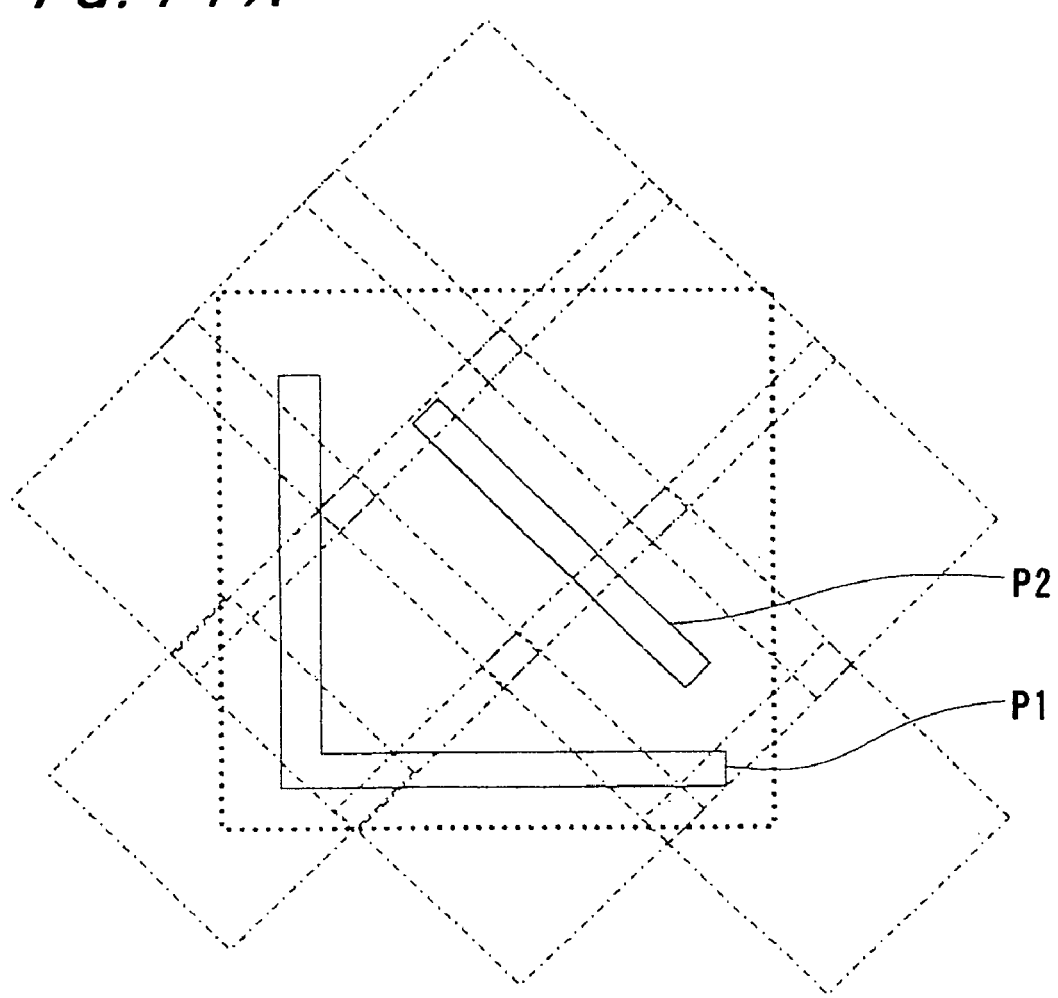
FIGS. 11A, 11B, and 11C are schematic views showing methods of scanning in the 45 degree direction or the minus 45 degree direction.
Figure 11B:
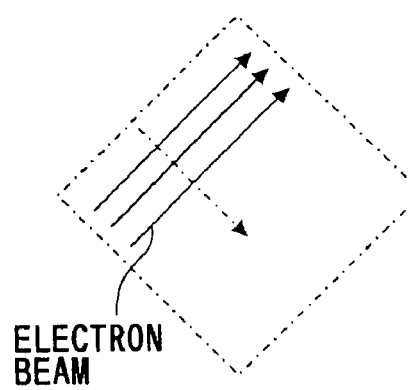
Figure 11C:
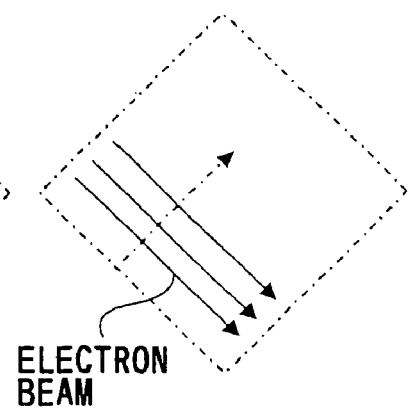

FIGS. 11A, 11B, and 11C are schematic views showing methods of scanning in the 45 degree direction or the minus 45 degree direction. A pattern P1 to-be-inspected composed of only edges in the horizontal direction and edges in the vertical direction as shown in FIG. 11A may be scanned once in the 45 degree direction as shown in FIG. 11B, or in the minus 45 degree direction as shown in FIG. 11C to achieve high edge detection accuracies with regard to the edges in the horizontal direction and the edges in the vertical direction.

If there is a pattern P2 to-be-inspected composed of edges in the 45 degree direction as shown in FIG. 11A, the pattern P2 to-be-inspected needs to be scanned twice in the 45 degree direction and in the minus 45 degree direction. However, it is expected that a frequency of requiring scan in two directions for the pattern P2 to-be-inspected is smaller than a frequency of requiring scan in one direction for the pattern P1 to-be-inspected composed of edges in the horizontal direction and edges in the vertical direction. Therefore, scanning in the 45 degree direction or in the minus 45 degree direction is efficient for achieving high edge detection accuracy in the case of one scanning.

Next, the case where scanning in the 45 degree direction and in the minus 45 degree direction is performed will be described. High edge detection accuracy with regard to edges in the lower right direction that constitute the pattern P2 to-be-inspected is achieved when the pattern P2 to-be-inspected is scanned in the direction of 45 degrees as shown in FIG. 11B. However, the high edge detection accuracy with regard to edges in the lower right direction cannot be achieved when the pattern P2 to-be-inspected is scanned in the minus 45 degree direction as shown in FIG. 11C, because the scanning direction and direction of edges are parallel. In the case where an inspection region is inspected by using scanning in the minus 45 degree direction, an inspection-unit-area including the pattern P2 to-be-inspected is inspected by using scanning in the 45 degree direction and the minus 45 degree direction. Generally, a frequency of requiring scanning in the 45 degree direction and in the minus 45 degree direction is smaller than a frequency of requiring scanning in the 0 degree direction and in the 90 degree direction.

As described in FIGS. 5 through 11, the image generation device 7 generates an image of a pattern to-be-inspected according to one of the following three scanning methods:

2.2.1 Scan Method 1

Unidirectional scan in the 0 degree direction, 90 degree direction, 45 degree direction, or minus 45 degree direction;

2.2.2 Scan Method 2

Alternate scan in the 0 degree direction and 180 degree direction; and 2.2.3 Scan Method 3

Bidirectional scan in the 0 degree direction and 90 degree direction or bidirectional scan in the 45 degree direction and minus 45 degree direction.

A coordinate system has the X-axis, whose direction is rightward, and the Y-axis, whose direction is upward, as the same manner as design data. A direction of the edge is defined as a direction in which the interior of the pattern to-be-inspected exists on the right-hand side. In the block B4 in FIG. 7, there are two edges in the vertical direction, a direction of the left side edge is determined as 90 degrees, and a direction of the right side edge is determined as 270 degrees.

As described later in 4.1 The first edge detection, the first edge is detected from a local image of a pattern to-be-inspected. A direction of the first edge is determined at the time of detection. A method in which the first edge is detected from an image of a pattern to-be-inspected acquired by the above-mentioned Scan method 1 through Scan method 3 will be described.

According to the unidirectional scan of the above-mentioned Scan method 1, and the alternate scan of the above-mentioned Scan method 2, edges are detected from a single image of a pattern to-be-inspected. According to the bidirectional scan of the above-mentioned Scan method 3, edges are detected from two images of a pattern to-be-inspected, and the detected edge information is merged. Specifically, according to the bidirectional scan in the 0 degree direction and the 90 degree direction, edges having an angle from 45 degrees to 135 degrees and an angle from 225 degrees to minus 45 degrees are detected from an image of a pattern to-be-inspected acquired by scanning in the 0 degree direction, and edges having an angle from 135 degrees to 225 degrees and an angle from minus 45 degrees to 45 degrees are detected from an image of a pattern to-be-inspected acquired by scanning in the 90 degree direction, and all detected edges are combined into total edges that are handled as edges detected from a single image of a pattern to-be-inspected.

According to the bidirectional scan in the 45 degree direction and the minus 45 degree direction, edges having an angle from 90 degrees to 180 degrees and an angle from 270 degrees to 360 degrees are extracted from an image of a pattern to-be-inspected acquired by scanning in the 45 degree direction, and edges having an angle from 0 to 90 degrees and an angle from 180 degrees to 270 degrees are extracted from an image of a pattern to-be-inspected acquired by scanning in the minus 45 degree direction, and all edges are combined into total edges that are handled as edges detected from a single image of a pattern to-be-inspected.

As described later in 4.11 The second edge detection, the second edge is detected from a profile (one-dimensional data). A direction of the second edge is determined at the time of setting the profile. A method in which the second edge is detected from the profile obtained by the above-mentioned Scan method 1 through Scan method 3 will be described.

According to the unidirectional scan of the above-mentioned Scan method 1, a profile is determined from one image of a pattern to-be-inspected.

According to the alternate scan in the 0 degree direction and 180 degree direction of the above-mentioned Scan method 2, a profile for detecting a right edge (edges at an angle from 180 degrees to 360 degrees) is obtained from an image of a pattern to-be-inspected acquired by scanning in the 0 degree direction, and a profile for detecting a left edge (edges at an angle from 0 degree to 180 degrees) is obtained from an image of a pattern to-be-inspected acquired by scanning at 180 degrees.

According to the bidirectional scan of the above-mentioned Scan method 3, a profile for detecting an edge having an angle from 45 degrees to 135 degrees or an angle from 225 degrees to minus 45 degrees is obtained from an image of a pattern to-be-inspected acquired by scanning in the 0 degree direction, and a profile for detecting an edge having an angle from 135 degrees to 225 degrees or an angle from minus 45 degrees to 45 degrees is obtained from an image of a pattern to-be-inspected acquired by scanning in the 90 degree direction.

Figure 12:
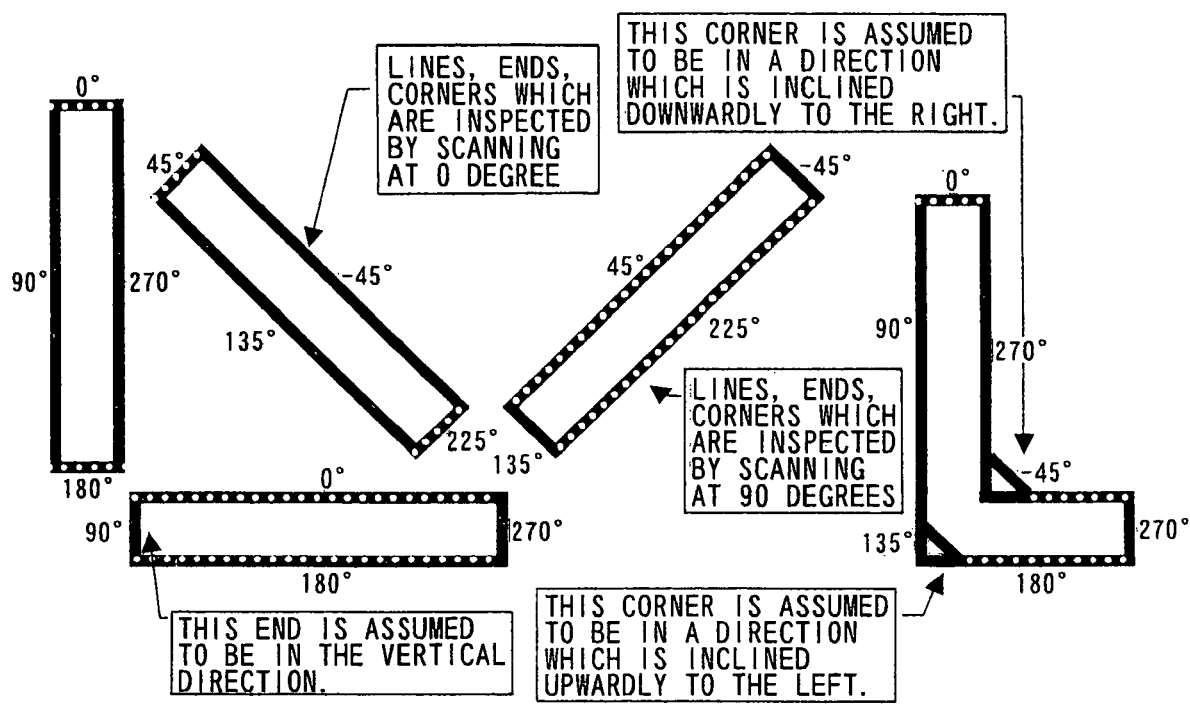
FIG. 12 is a schematic view showing examples of line segments, which should be inspected by using either the image scanned at 0 degree or the image scanned at 90 degrees.

FIG. 12 is a schematic view showing examples of line segments, which should be inspected by using either the image of the pattern to-be-inspected acquired by scanning in the 0 degree direction or the image of the pattern to-be-inspected acquired by scanning in the 90 degree direction. As shown in FIG. 12, line segments of line parts, ends, and corners, which have the vertical direction (90 degrees or 270 degrees), the upper left direction (135 degrees), and the lower right direction (minus 45 degrees), should be inspected by using an image of a pattern to-be-inspected acquired by scanning in the 0 degree direction. Further, line segments of line parts, ends, and corners, which have the horizontal direction (0 degree or 180 degrees), the upper right direction (45 degrees), and the lower left direction (225 degrees), should be inspected by using an image of a pattern to-be-inspected acquired by scanning in the 90 degree direction.

According to the bidirectional scan in the 45 degree direction and minus 45 degree direction, a profile for detecting an edge between an angle from 90 degrees to 180 degrees or an angle from 270 degrees to 360 degrees is obtained from an image of a pattern to-be-inspected acquired by scanning in the 45 degree direction, and a profile for detecting an edge between an angle from 0 degree to 90 degrees or an angle from 180 degrees to 270 degrees is obtained from an image of a pattern to-be-inspected acquired by scanning in the minus 45 degree direction.

In the case where the image of the pattern to-be-inspected is acquired by scanning in the 45 degree direction or minus 45 degree direction, there is rotation between the acquired image of a pattern to-be-inspected and design data, and therefore it is necessary to compensate for such rotation. As a method for compensating for rotation, a method in which design data is rotated can be used. However, because design data is rotated, the inclined image becomes final output image, and therefore such image is difficult to see. Therefore, a method in which an image of a pattern to-be-inspected is rotated is used. However, in the case where scanning is made in order to perform sampling uniformly in the X and Y directions, if an acquired image of a pattern to-be-inspected is rotated, interpolated values between pixels must be used as values of the rotated image. In this case, the rotated image of the pattern to-be-inspected may be unsharp by interpolation, and therefore in this embodiment, the rotated image is acquired only by replacing positions of pixels without using interpolation. In the case of using this embodiment, it is necessary to use the following scanning method.

FIG. 13 is a schematic view showing a method in which a rotated image of a pattern to-be-inspected is obtained by replacing positions of pixels. An object in a 45 degree inclination scanning method as shown in the left side of FIG. 13 is the same as an object in a 45 degree inclination image as shown in the right side of FIG. 13, with the object in the 45 degree inclination image being rotated by 45 degrees. The final image to be rotated is the image on the right-hand side of FIG. 13. In FIG. 13, grid points show positions of images of a pattern to-be-inspected that is acquired by uniform sampling in the X and Y directions. Solid circles (●) correspond to positions of actual sampling. Positions where there is no solid circle are not sampled. In order to obtain the image of the pattern to-be-inspected on the right-hand side of FIG. 13, the scanning method on the left-hand side of FIG. 13 is performed.

In this case, sampling intervals S in the X direction are the same for each scanning line, but sampling intervals in the Y direction are half of the sampling interval S in the X direction. Between odd-numbered lines and even-numbered lines, the positions of sampling are shifted by half of the sampling interval S in the X direction. This sampling interval S is obtained by multiplying the pixel interval on the right-hand side of FIG. 13 by $\sqrt{2}$. In this manner, a desired image of a pattern to-be-inspected can be obtained only by rotating the left side view. In this case, it is necessary to store values in the order different from the actual sampling order.

Although FIG. 13 shows the case in which scanning is performed in the 45 degree direction, FIG. 14 shows the case in which scanning is performed in the arctangent(2) degree direction, and a rotated image of a pattern to-be-inspected.

According to this embodiment, the pattern to-be-inspected may be scanned with a minimum electron beam (charged particle beam), and therefore the image of the pattern to-be-inspected can be obtained in a minimum time. In addition, the rotated image of the pattern to-be-inspected can be obtained without lowering image quality due to interpolation, and therefore the edge detection accuracy can be prevented from being lowered.

2.3 Basic Arrangement of Pattern Inspection Apparatus

FIG. 15 is a diagram showing an example of basic arrangement of the pattern inspection apparatus according to the embodiment of the present invention. The pattern inspection apparatus according to the embodiment of the present invention comprises a main control unit 1, a storage device 2, an input/output control unit 3, an input device 4, a display device 5, a printer 6, and the image generation device 7 shown in FIG. 1.

The main control unit 1 comprises a CPU (Central Processing Unit) or the like, and manages and controls the whole apparatus. The main control unit 1 is connected to the storage device 2. The storage device 2 can take a form of a hard disk drive, a flexible disk drive, an optical disc drive, and the like. Further, the input device 4 such as a keyboard or a mouse, the display device 5 such as a display for displaying the input data, calculation results, and the like, and the printer 6 for printing inspection results and the like are connected to the main control unit 1 through the input/output control unit 3.

The main control unit 1 has a control program such as an OS (Operating System), a program for the pattern inspection, and an internal memory (internal storage device) for storing necessary data and the like, and realizes the pattern inspection with these programs and the like. These programs can be initially stored in a flexible disk, an optical disc drive, and the like, read and stored in a memory, a hard disk, and the like before execution, and then executed.

2.4 Functional Block Diagram

FIG. 16 is a diagram showing a functional block diagram of the pattern inspection apparatus in this embodiment. A reference pattern generation unit (reference pattern generation device) 11, an inspection unit (inspection device) 12, an output unit 13, and a defect-class determination unit (defect classification device) 14 are all realized by programs. A fundamental database 21, a recipe database 22, and a defect-class reference database 23 are provided in the storage device 2. The inspection unit (inspection device) 12 includes a detecting device for detecting the first edge and the second edge of an image of the pattern to-be-inspected.

Alternatively, the fundamental database 21 may be provided outside the storage device 2 and the pattern inspection apparatus may access the fundamental database 21 through the LAN (Local Area Network).

Figure 17:
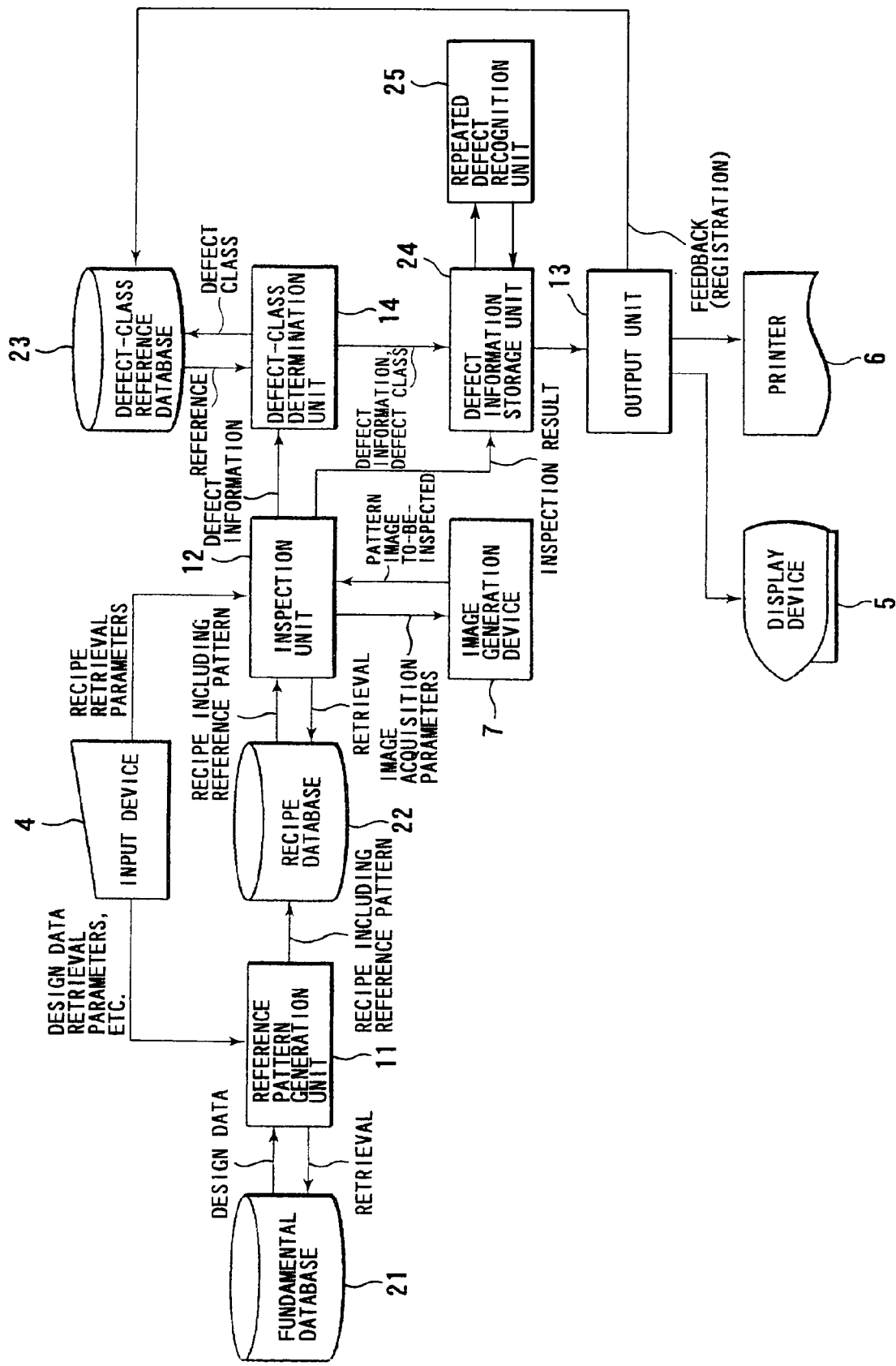
FIG. 17 is a functional block diagram of the pattern inspection apparatus according to another embodiment of the present invention.

FIG. 17 is a diagram showing the functional block diagram of the pattern inspection apparatus according to another embodiment of the present invention. FIG. 17 shows a structure having a function for recognizing repeated defects. In the example of FIG. 17, a defect information storage unit 24 and a repeated defect recognition unit (repeated defect recognition device) 25, which recognizes repeated defects, are added to the functional block of FIG. 16.

3. Explanations of Terms 3.1 Edge

An edge means a boundary between the inside of a pattern to-be-inspected and a ground. As the edge, an edge of an image of a pattern to-be-inspected and an edge of a reference pattern are used. The edge of the image of the pattern to-be-inspected is detected by edge detection methods, and the edge of the reference pattern is obtained by dividing the reference pattern represented by one or more lines pixel by pixel. As described by using FIG. 60 in 4.6 The first inspection later, inspection is performed by establishing correspondence between the edge of the image of the pattern to-be-inspected and the edge of the reference pattern.

The edge is represented by a vector that has information of a starting point (with sub pixel accuracy), a direction, and a magnitude for each pixel. In the case of the edge of the image of the pattern to-be-inspected, the magnitude is a length of vector multiplied by sharpness of the edge, where the sharpness is defined as a probability of being a real edge. In the case of the edge of the reference pattern, the magnitude is a length of vector multiplied by a degree of contribution to matching.

3.2 Reference Pattern

A reference pattern is represented by one or more lines. Each of the one or more lines comprises one of a line segment and a curve. The reference pattern is compared with an image of a pattern to-be-inspected. Design data can be used as the most suitable data for the reference pattern. As the design data, data obtained by modifying layout data that is represented by the GDSII (Graphic Design System II) data stream format by layer merging or fracturing can be used.

First, the design data is modified in order to be optimal for positions of edges detected from an image of a pattern to-be-inspected by performing shrink processing (processing in which magnification of the design data is altered), size processing (processing in which a line width is altered), and the like. Furthermore because position of an edge to-be-detected is generally different in the first edge detection and in the second edge detection, two kinds of reference patterns are prepared for the first edge detection and for the second edge detection.

Next, polygons obtained by the above processing are clipped by a rectangle whose one side is equal to the side of the field of view plus an error of the XY stage 321 and the maximum allowable pattern deformation quantity of a pattern to-be-inspected.

Figure 18:
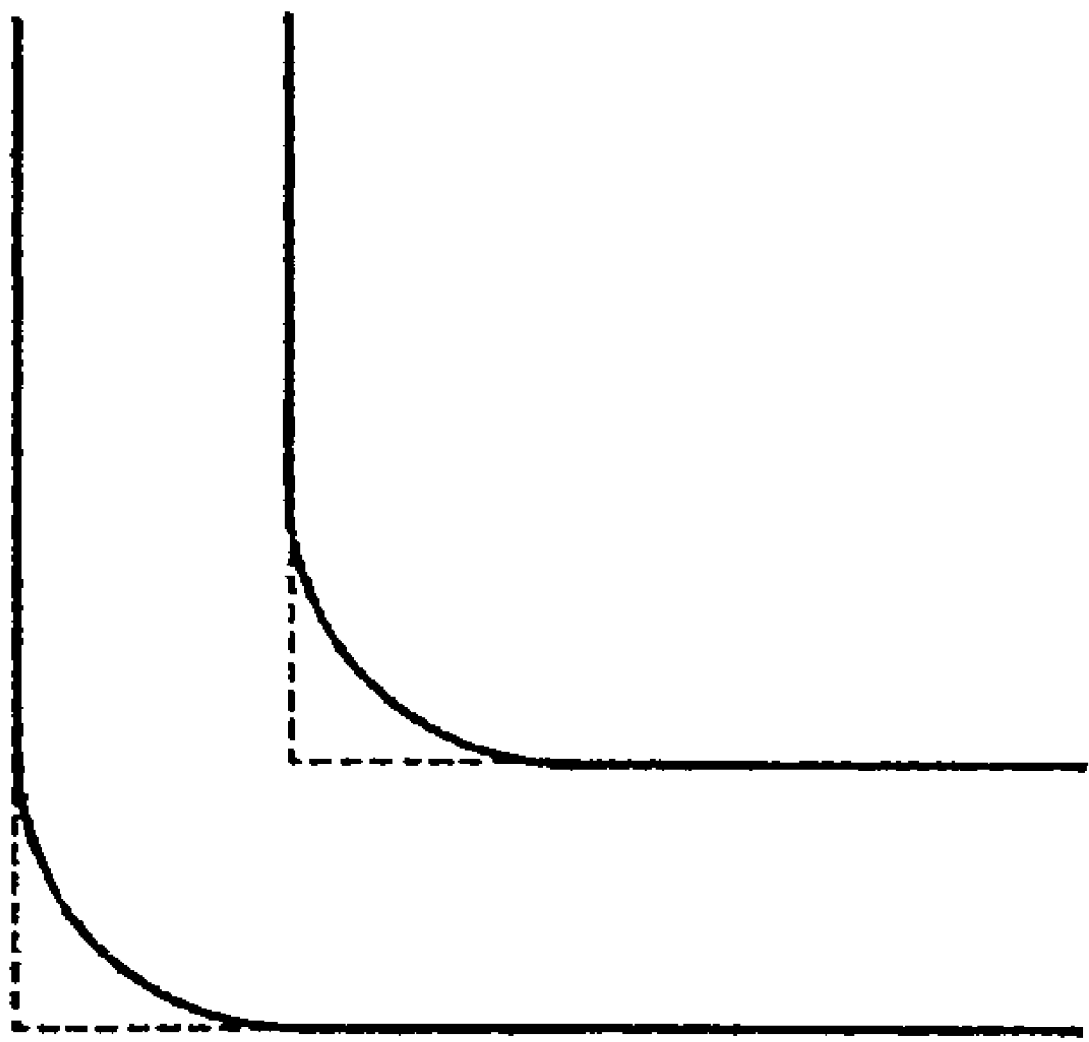
FIG. 18 is a diagram showing an example of correction of a reference pattern.

Next, corners of the obtained polygons are rounded off As shown in FIG. 18, normally the design data consists of polygons having acute angles (dotted lines in FIG. 18). On the other hand, a pattern to-be-inspected formed on a wafer has rounded corners. In order to cancel this difference, the corners are corrected to be close to the pattern to-be-inspected by applying a circle, an ellipse, a straight line, or a curve described by other methods to the corner parts.

Finally, results obtained by the above are registered as a reference pattern into the recipe database 22 beforehand. If the error of the XY stage 321 can be neglected, the absolute coordinate values of the pattern deformation can be measured. In this embodiment, the reference pattern is set to be larger than the image of the pattern to-be-inspected in consideration of the error of the XY stage 321 and the maximum allowable pattern deformation quantity of a pattern to-be-inspected to perform inspection. As an alternative method, the image of the pattern to-be-inspected may be set to be larger than the reference pattern to perform inspection.

If the design data is used as a reference pattern, defect inspection in which a pattern to-be-inspected formed on a wafer is compared with the design data can be performed. In this case, an allowable quantity that does not affect an electrical property is set. This pattern deformation quantity may be set for each attribute of pattern, and furthermore may be altered for a portion where patterns are crowded and for a portion where patterns are not crowded.

If a curve (solid lines in FIG. 73) representing a contour of a simulation pattern obtained by a lithography simulator is used as a reference pattern, the simulation capability can be verified. The simulation pattern is expressed by a light intensity distribution obtained by optical simulation using mask data. The curves of the contour are obtained from the distribution. In this case, an allowable pattern deformation is set to an error quantity that is allowed in the simulation.

In this embodiment, a method in which the design data is used as the reference pattern will be described.

Figure 19:
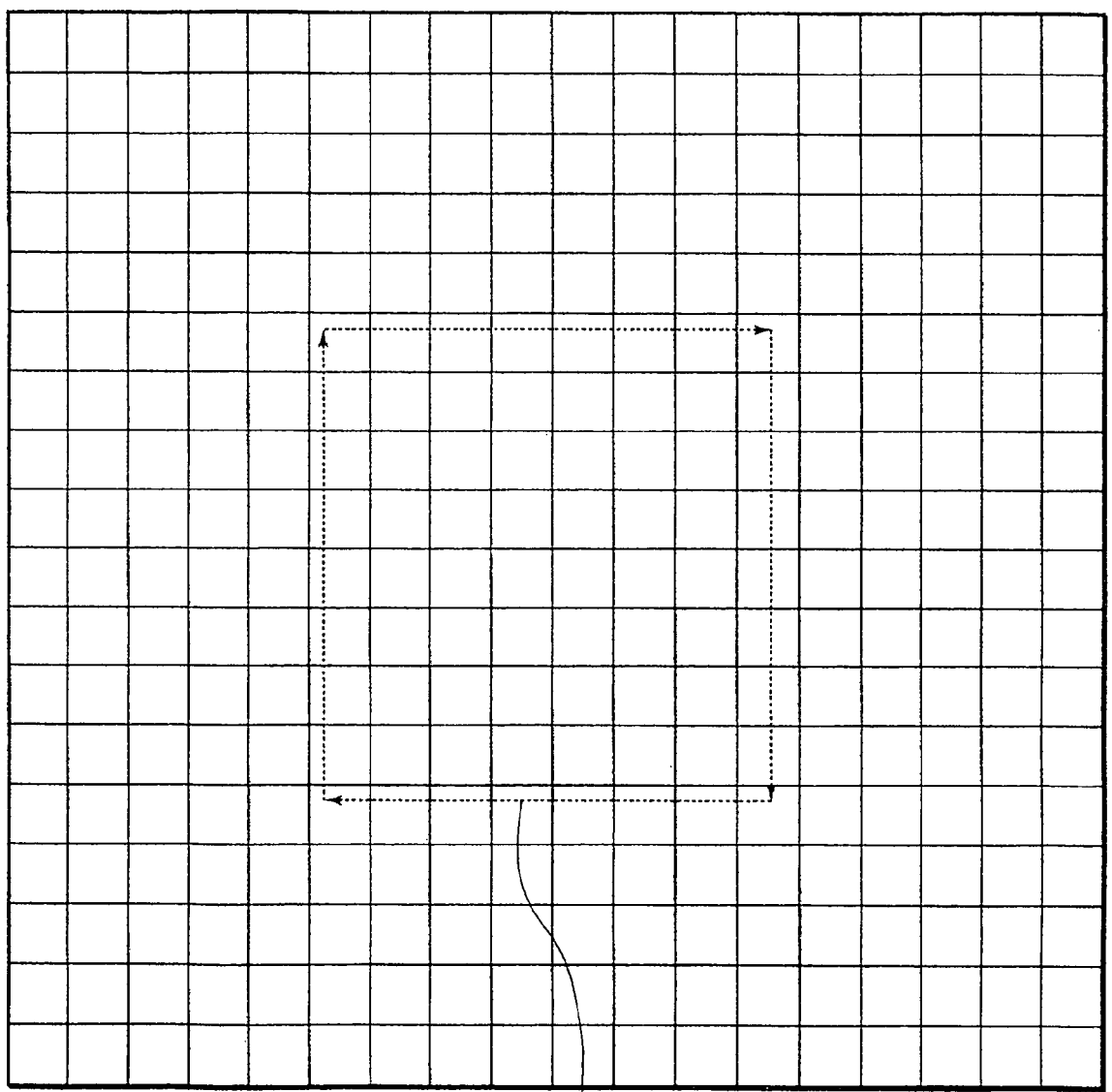
FIG. 19 is a diagram showing an example of a reference pattern.
Figure 20:
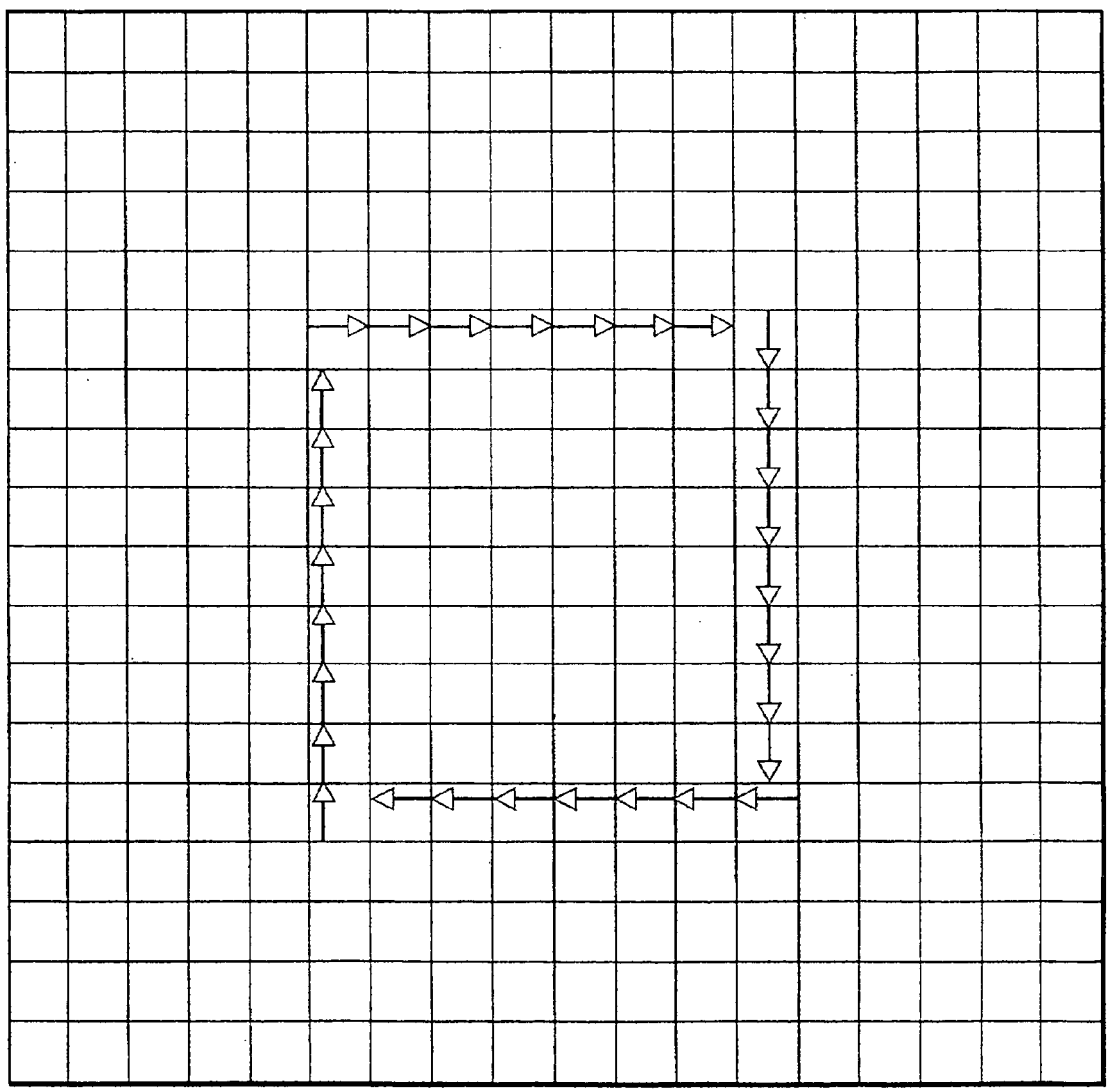
FIG. 20 is a diagram showing an example in which the reference pattern in FIG. 19 is converted into edges for respective pixels.

FIG. 19 is a diagram showing an example of a reference pattern, and FIG. 20 is a diagram showing an example in which the reference pattern S of FIG. 19 is converted into the edges for respective pixels. In FIG. 19, the reference pattern S (dotted lines) is shown with sub pixel accuracy. Normally, edge direction of the reference pattern is parallel to the horizontal direction (X-direction) or the vertical direction (Y-direction) of the pixel. The edge of the reference pattern, as with an edge of an image of a pattern to-be-inspected, has information of a starting point (with sub pixel accuracy), a direction, and the magnitude for each pixel. In this embodiment, the edge magnitude of the reference pattern is set to unity, i.e. 1 except for 4.2.1 Matching method in which unique pattern is used and 4.2.2 Matching method in which negative pattern is used described later.

As shown in FIG. 21, the reference pattern may include a curve. For converting a curvilinear part of the reference pattern into an edge of the reference pattern, a tangent line 263 at a point 262 that is on the reference pattern and is closest to the center 261 of the pixel is generated.

3.3 Recipe Data

Before the inspection, a set of inspection parameters called recipe data is set. As operator input parameters of the recipe data, design data retrieval parameters, image acquisition parameters, and edge detection/inspection parameters are set. As output data of the recipe data, the reference pattern generation unit 11 generates a reference pattern.

As the design data retrieval parameters, a device name and a process name with regard to a wafer (specimen) to-be-inspected are set. As the image acquisition parameters, a slot number for specifying a wafer, condition-setting parameters for the irradiation system 310, a pixel interval, the number of pixels and an inspection area are set.

The pixel interval means a distance on the wafer corresponding to an interval between the pixels of an image of a pattern to-be-inspected. For the number of pixels, 1024×1024, 8192×8192, or the like is set. The pixel interval is multiplied by the number of pixels, and the obtained product is a size of the image of the pattern to-be-inspected. A region having the size is the field of view, which is described in the above-mentioned 2.1 Basic arrangement of image generation device. For example, in the case where the pixel interval is 9 nm and the number of pixels is 8192×8192, the field of view is approximately 70 μm×70 μm.

As the edge detection/inspection parameters, the following parameters are set:

1. Pattern deformation quantities to be inspected
An edge placement error;
A deformation quantity of a line width;
The minimum line width;
A deformation quantity of a space width;
The minimum space width;
A contact-area inspection ratio;
A placement error of the centroid of a pattern, a deformation quantity of a diameter, and the like, in the case of an isolated pattern; and
A defect judgment coefficient of a correction pattern that should not be formed on a wafer.

2. Limit values of the negative side and the positive side of the allowable pattern deformation quantities, which correspond to the above pattern deformation quantities, and a limit of an allowable directional difference between edges used for matching.

These pattern deformation quantities are set for each attribute of a reference pattern.

3. Parameters for detecting the first edge, which are empirically determined from an image of pattern to-be-inspected.
The first edge detection method;
Coefficients of filter for edge dilation;
A threshold used in binarization of edges of an image of a pattern to-be-inspected; and
A p-tile coefficient used in binarization of edges of an image of a pattern to-be-inspected.

4. Parameters used in extraction rules for determining attributes of reference pattern (line part, corner, end, isolated pattern, and the like).

The attributes of the reference pattern are used for specifying part or the whole of the reference pattern. Typically, there are three kinds of attributes for specifying part of the reference pattern. One of the attributes is a line part (line part except for an end of the reference pattern), another of the attributes is a corner (portion having a vertex which does not contact the line part having the attribute of an end), and the other of the attributes is an end (line part corresponding to an end of the reference pattern). There is an isolated pattern (pattern isolated from the other) as an attribute for specifying the whole of the reference pattern.

5. Parameters used in extraction rules for a region suitable for a region inspection.
The maximum line width, the minimum line length, and a termination shortening length of a reference pattern suitable for line width inspection;
The maximum line width, the minimum line length, and a termination shortening length of a reference pattern suitable for space width inspection;
The maximum line width of a part that is liable to cause an open defect;
The maximum line length of a part that is liable to cause an open defect;
The maximum space width of a part that is liable to cause a bridge defect; and
The maximum space length of a part that is liable to cause a bridge defect.

6. Parameters for detecting the second edge, which are empirically determined image of pattern to-be-inspected.
A length of a profile acquisition section;
An interval between profile acquisition sections;
An interval between sampling points in a profile acquisition section;
A method of detecting an edge from a profile (the threshold method and the like); and
A flag for indicating whether profile acquisition sections are set at the time of setting recipe data, or are set after detecting the first edges.

7. The minimum size and the maximum size of an isolated pattern, and safety factors.

8. The number of inspection-unit-areas in order to obtain a global pattern deformation quantity.

9. The number of maximum registrations of defect images.

10. The number of maximum registrations of defects to-be-reinspected.

11. A region suitable for automatic contrast brightness adjustment, automatic focus adjustment, and automatic astigmatism adjustment.

12. An interval of representative distortion vectors held by a distortion correction vector calculation circuit 414.

The recipe data is managed by using the device name, the process name, and an inspection mode, which are the design data retrieval parameters, as a key. The inspection mode is a generic term for the image acquisition parameters, and the edge detection/inspection parameters.

Figure 22:
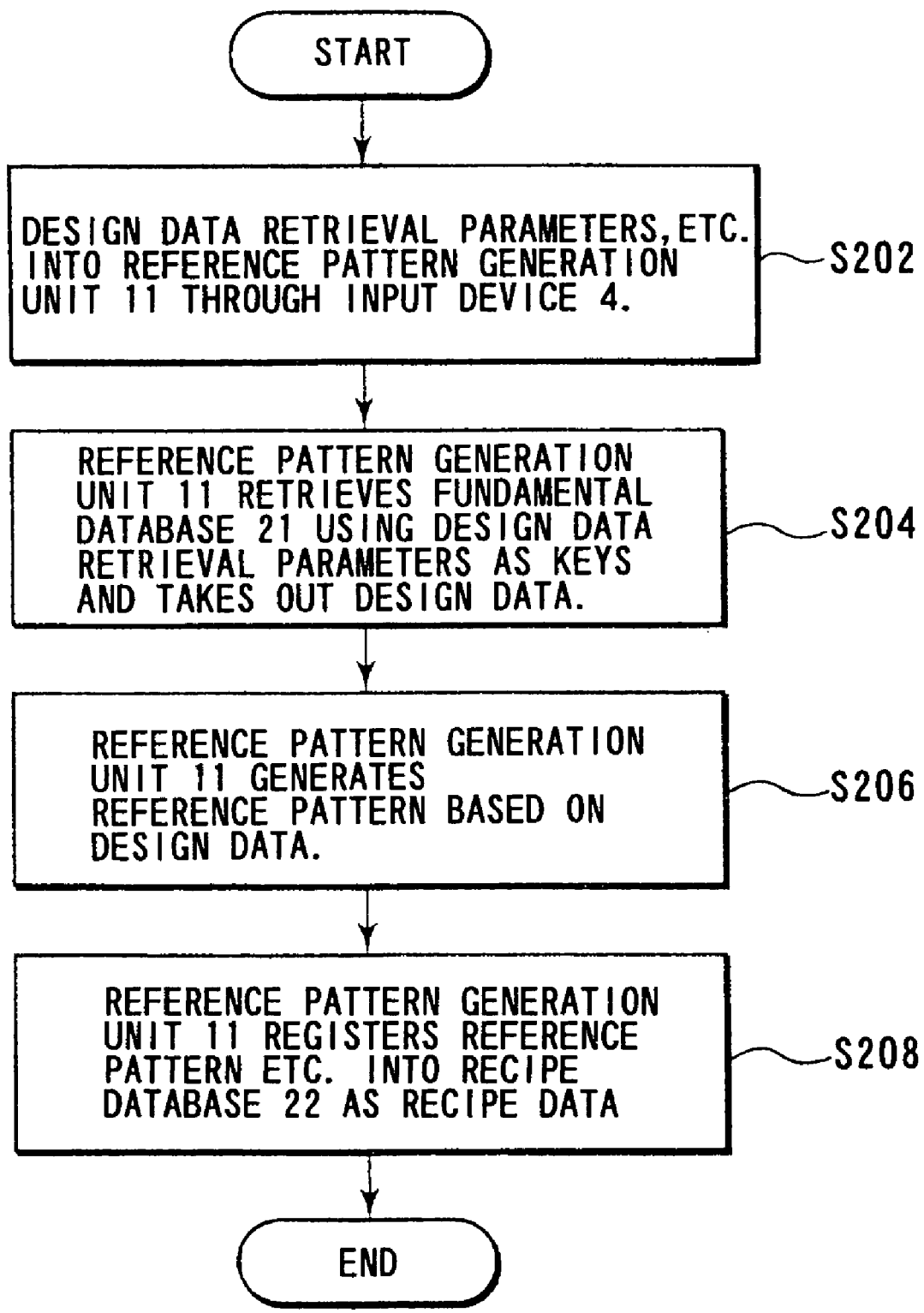
FIG. 22 is a flowchart showing an example of recipe registration processing according to the embodiment of the present invention.

FIG. 22 is a flowchart showing an example of recipe registration processing in this embodiment. First, the operator inputs the operator input parameters (the design data retrieval parameters, etc.) into the reference pattern generation unit 11 via the input device 4 (step S202).

The reference pattern generation unit 11 retrieves the fundamental database 21 using the design data retrieval parameters (a device name and a process name) as a key and takes out the design data (step S204). The fundamental database 21 serves as a database that stores the design data corresponding to a reference pattern. Next, the reference pattern generation unit 11 generates a reference pattern based on the design data (step S206).

Finally, the reference pattern generation unit 11 registers the reference pattern and the operator input parameters into the recipe database 22 as recipe data (step S208).

3.4 Inspection-Unit-Area

Because inspection is performed for each inspection-unit-area that is obtained by dividing the inputted inspection area by a field of view, a reference pattern is created corresponding to the inspection-unit-area. The inspection includes a sequential inspection or a random inspection.

Figure 23:
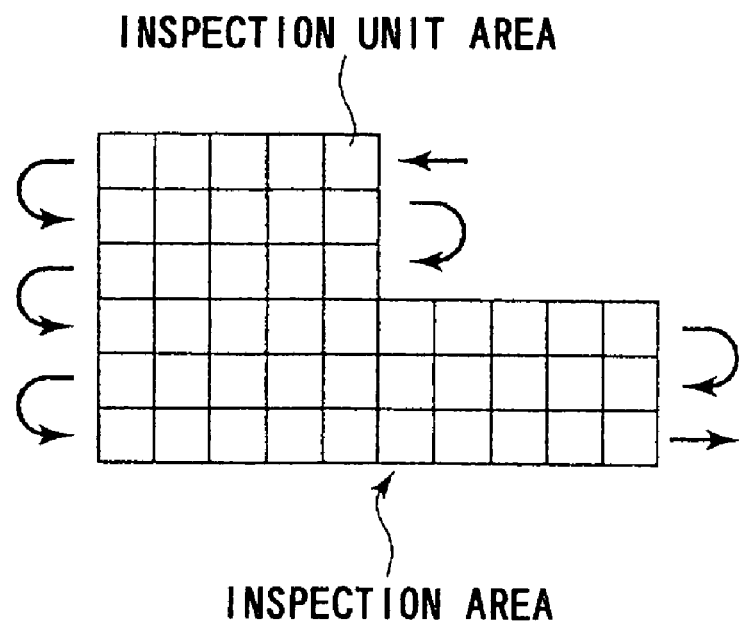
FIG. 23 is a diagram for explaining a sequential inspection.

FIG. 23 is a diagram for explaining the sequential inspection. The inspection area is not set on the whole wafer, but is set on a plurality of areas that are specified by rectangles (the upper short rectangle, the lower long rectangle, and the like as shown in FIG. 23), and each inspection-unit-area is scanned sequentially in order to inspect the areas at high speed. The reference pattern is created for each inspection-unit-area.

Figure 24:
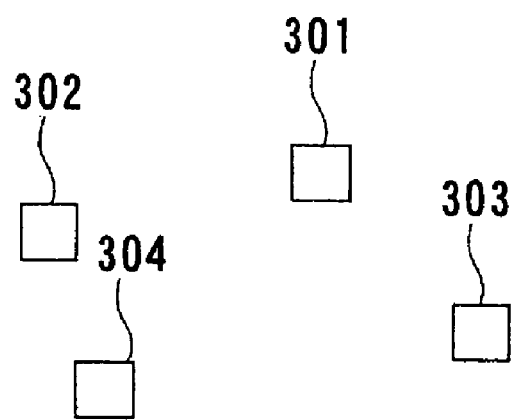
FIG. 24 is a diagram for explaining a random inspection.

FIG. 24 is a diagram for explaining the random inspection. In the random inspection, a certain area is not inspected sequentially, but limited areas are inspected. In FIG. 24, only inspection-unit-areas 301 to 304 are inspected.

3.5 Inspection Results

Inspection results include the following basic information:

1. Information of a defect having an abnormal pattern deformation quantity

2. Information of a defect recognized by using luminance distribution of pixels

3. Pattern deformation quantities obtained from the whole inspection-unit-area

The inspection results include the following information, which is obtained by using pattern deformation quantities with regard to attributes of a reference pattern:

4. Information of a defect detected by using the attributes of a reference pattern The results of inspection include the following information, which is obtained by using edges facing each other:

5. Information of a defect detected by the region inspection

4. Basic Inspection Processing

Figure 25:
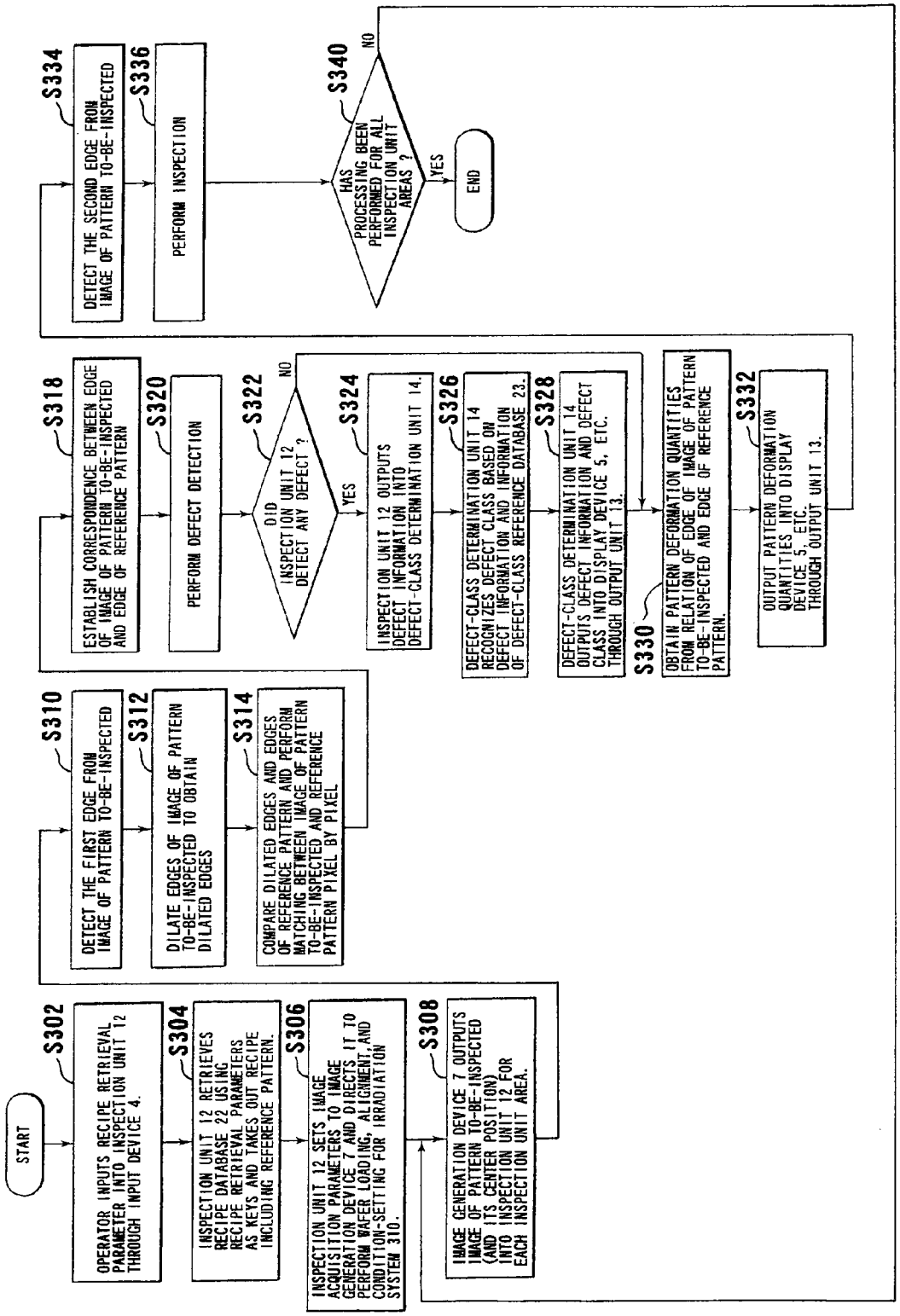
FIG. 25 is a flowchart showing an example of basic inspection processing according to the embodiment of the present invention.
Figure 26:
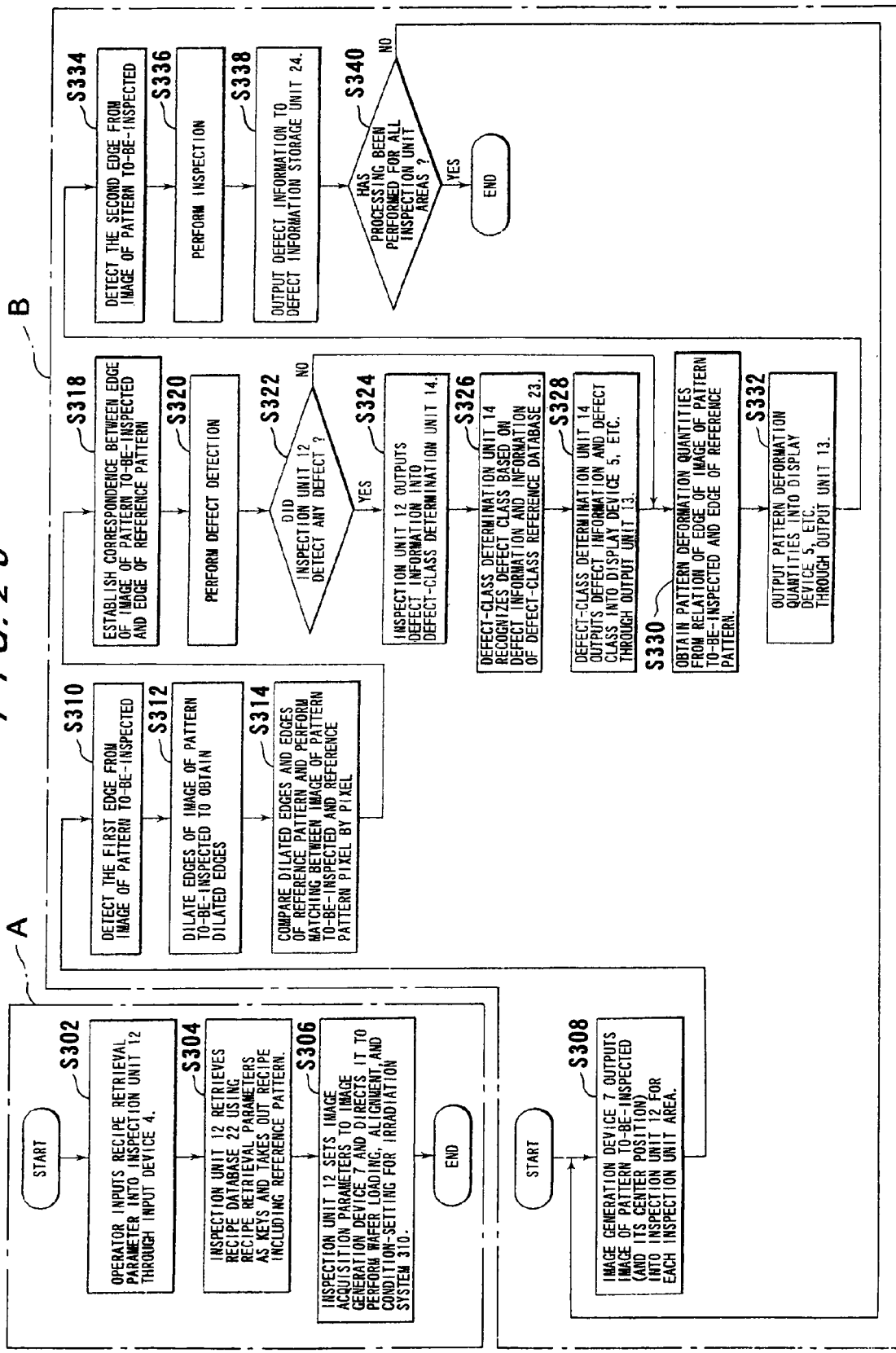
FIG. 26 is a sub-block of a flowchart showing an example of inspection processing for recognizing repeated defects.
Figure 27:
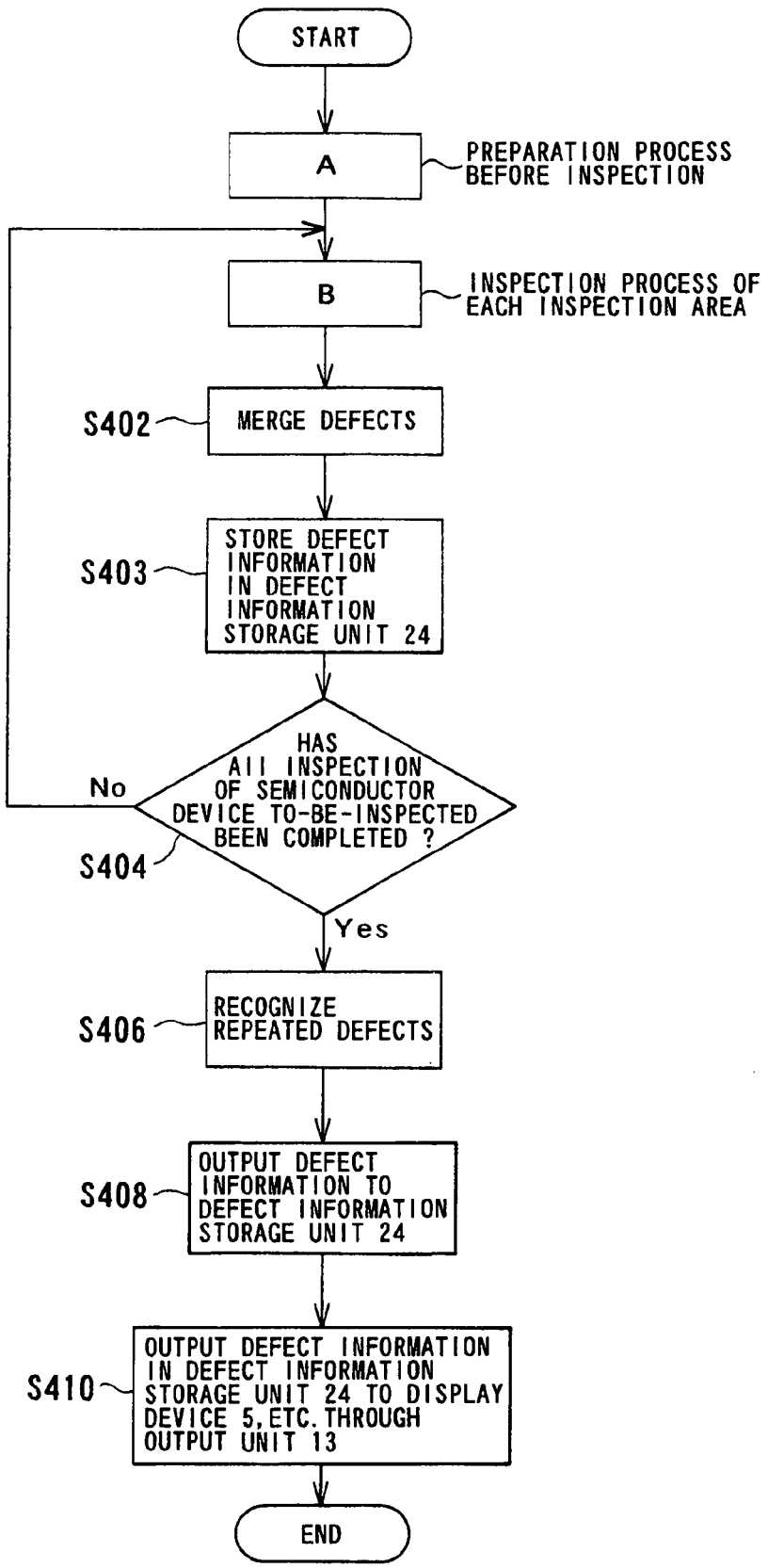
FIG. 27 is a main block of a flowchart showing an example of the inspection processing for recognizing repeated defects.

FIG. 25 is a flowchart showing an example of basic inspection processing according to the embodiment of the present invention. FIGS. 26 and 27 are flowcharts showing another example of the inspection processing in this embodiment, and show inspection processing for recognizing repeated defects. A block A of FIG. 27 is identical to the block A of FIG. 26, and is a preparation process before the inspection. A block B of FIG. 27 is identical to the block B of FIG. 26, and shows an inspection process of each inspection area.

In the basic inspection processing shown in the flowchart of FIG. 25, first, the operator inputs recipe retrieval parameters (a device name and a process name, and an inspection mode) into the inspection unit 12 through the input device 4 (step S302).

The inspection unit 12 retrieves the recipe database 22 using the recipe retrieval parameters as a key and takes out the recipe data including a reference pattern (step S304). Then, in order to acquire the image of the pattern to-be-inspected, the inspection unit 12 sets the image acquisition parameters to the image generation device 7 and directs the image generation device 7 to perform wafer loading, alignment, and condition-setting for the irradiation system 310 (step S306).

Here, the alignment means a method of obtaining transformation coefficients between a coordinate system that is used in design data and a coordinate system for controlling an observation position of the wafer (specimen). This method has been embodied by CAD (Computer Aided Design) navigation. The CAD navigation is a well-known method. In the method, after the alignment, the coordinate values of the position of CAD data that should be observed are transformed into the coordinate values of controlling the observation position of the wafer. Then a field of view of an image generation device is moved to that position, and an image at the position is acquired.

As the image generation device 7, a scanning electron microscope shown in FIG. 1 is most suitable. Various scanning microscopes such as a scanning focus ion-beam microscope, a scanning laser microscope, or a scanning probe microscope; or various microscopes may be used.

The image generation device 7 outputs an image of a pattern to-be-inspected and a center position of the image to the inspection unit 12 for each inspection-unit-area (step S308).

4.1 The First Edge Detection

Next, the inspection unit 12 detects the first edge from the image of the pattern to-be-inspected (step S310). For the first edge detection, the following two edge detection methods can be used. The first edge detection method is chosen according to the above-mentioned 3.3 Recipe data "3. The first edge detection method".

4.1.1 The First Edge Detection Method 1

One is a method suitable for an image having a contrast between the inside of a pattern and the ground. In many of such images, an edge can be detected through binarization processing. However, in the case where the contrast is relatively indistinct, the edges cannot be detected clearly. In this case, by applying a method disclosed in the literature [reference 1]: R. M. Haralick, "Digital step edges from ZERO crossing of second directional derivatives," IEEE Trans. Pattern Anal. Machine Intell., Vol. PAMI-6. No. 1, pp. 58-68, 1984 or other methods, the edges can be detected. By applying this method, a point of inflection on the edge part can be detected with sub pixel accuracy.

4.1.2 The First Edge Detection Method 2

The other is a method that can cope with an image having bright edges and having no contrast between the inside of a pattern and the ground. For example, a method disclosed in the literature [reference 2]: Cartan Steger, "An unbiased detector of curvilinear structures," IEEE Trans. Pattern Anal. Machine Intell., Vol. 20, No. 2, February 1998, can be used. By using this method, a peak of the edge can be detected with sub pixel accuracy. However, in this method, the edge direction has only a value of 0 to 180 degrees because the inside of the pattern and the ground cannot be distinguished.

As an alternative method of the above-mentioned 4.1.1 The first edge detection method 1, the method of the above-mentioned [literature 2] can be used. In this case, an image having a contrast between the inside of the pattern and the ground is processed by a differential filter (for example, Sobel filter or a band-pass filter) in order to generate an edge magnitude image, and the edge is detected by using the edge magnitude image. In this case, the inside of the pattern and the ground can be distinguished.

Because these methods are processed by using a rather large window, sub pixel accuracy can be obtained, and the edge direction can be stable. Therefore, a method, in which the edges are connected and the connected edges are processed by the linear approximation in order to obtain higher edge detection accuracy, is not necessarily required.

At the first edge detection of step S310, the edge magnitude and the edge direction are obtained from the image of the pattern to-be-inspected for each pixel. As described in 3.1 Edge, the magnitude is a length of vector multiplied by sharpness of the edge. In the case of an image having a contrast between the inside of the pattern and the ground as described in 4.1.1 The first edge detection method 1, by using the method of the above-mentioned [literature 1], the absolute value of the first derivative of the image can be set as the sharpness of the edge, and the zero cross point of the second derivative of the image can be taken as the edge position.

On the other hand, in the case of an image having bright edges and having no contrast between the inside of a pattern and the ground as described in 4.1.2 The first edge detection method 2, by using the method of the above-mentioned [literature 2], a sign-inverted value (absolute value) of the second derivative of the image can be set as the sharpness of the edge, and the zero cross point of the first derivative of the image can be taken as the edge position. In either case, the edge can be obtained with sub pixel accuracy.

Figure 29:
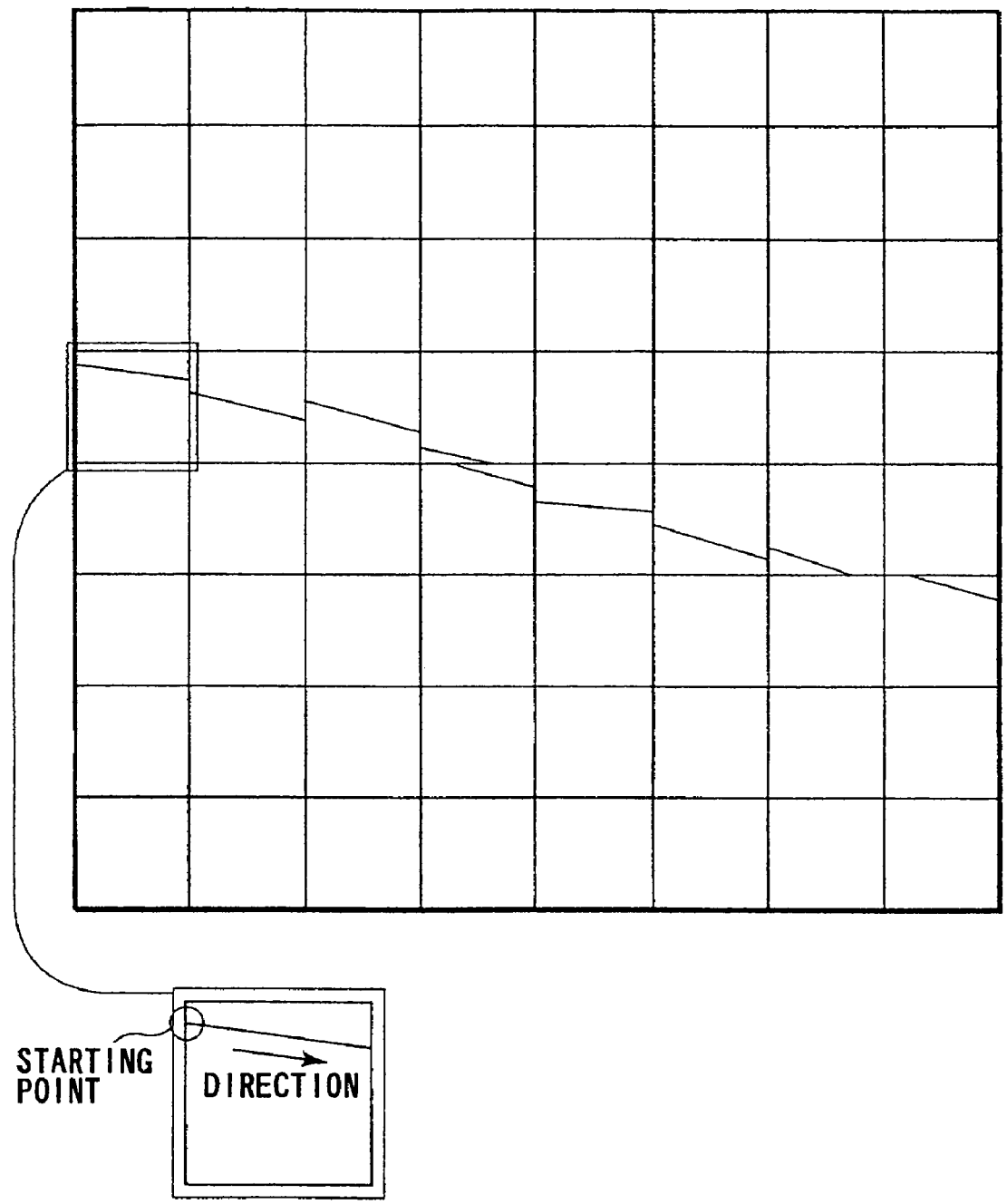
FIG. 29 is a diagram showing edges detected from the image of FIG. 28.

FIG. 28 is a diagram showing an example of an image of a pattern to-be-inspected having the contrast between the inside of the pattern and the ground as described in 4.1.1 The first edge detection method 1, and FIG. 29 is a diagram showing the edges detected from the image of FIG. 28. In FIG. 28, a luminance value is shown for each pixel. The luminance value means a digitized value of intensity of secondary electrons. As shown in FIG. 29, an edge is detected for each pixel, and information of a starting point (with sub pixel accuracy), a direction (in 0 to 360 degrees), and a magnitude can be obtained for each pixel. As described above, the sharper the edge is, the larger the magnitude becomes.

FIG. 30 is a diagram showing an example of an image of a pattern to-be-inspected having bright edges and having no contrast between the inside of the pattern and the ground described in the above-mentioned 4.1.2 The first edge detection method 2, and FIG. 31 is a diagram showing the edges detected from the image of FIG. 30. In FIG. 30 also, the luminance value is shown for each pixel. Furthermore, as shown in FIG. 31, an edge is detected for each pixel, and information of a starting point (with sub pixel accuracy), a direction (in 0 to 180 degrees), and a magnitude can be obtained for each pixel.

4.2 Line-Shaped Pattern Matching Method

Next, the inspection unit 12 dilates the edges of the image of the pattern to-be-inspected. Hereafter, obtained results are called dilated edges (step S312). In this embodiment, the edges are dilated by the allowable pattern deformation quantity that does not affect an electrical property. In this stage, the allowable pattern deformation quantity is a positive integer. The quantity is the biggest value among values in the above-mentioned 3.3 Recipe data "2. The limit values of the negative side and the positive side of the allowable pattern deformation quantities". By dilating the edges by the allowable pattern deformation quantity, the matching can be performed with the pattern deformation that does not affect an electrical property being allowed.

Methods of obtaining the dilated edges will be described. FIG. 32 is a diagram showing magnitudes of edges of a one-dimensional image of a pattern to-be-inspected and FIG. 33 is a diagram showing an example in which the edges of FIG. 32 are dilated. The dilated edges are shown in FIG. 33. For simple explanation, one-dimensional data is used in FIG. 32 and FIG. 33. As methods of obtaining FIG. 33 from FIG. 32, the following methods can be used. In the methods, the magnitudes of the edges are processed as an image, and appropriate filters are considered.

In order to ignore the pattern deformation within the allowable pattern deformation quantity, the diagram showing magnitudes of edges in FIG. 32 is processed by a maximum value filter having a window that is twice as large as the allowable pattern deformation quantity, so that the dilated edges shown in FIG. 33 are obtained. The maximum filter obtains the maximum value among intensity values, which neighboring pixels of a target pixel have, and sets the obtained maximum value to a value of the target pixel of a processed image. In FIG. 33, the edges of the image of the pattern to-be-inspected of FIG. 32 are dilated rightward and leftward by two pixels, respectively. This is an example for the case where the allowable pattern deformation quantity is two pixels.

The case where edges of a reference pattern are shown in FIG. 34 will be considered. First, figures are obtained by shifting FIG. 34. Each shift quantity used in the above is from two pixels in the leftward direction to two pixels in the rightward direction, respectively. Next, when the evaluation value of the matching is obtained from FIG. 33 and each shifted figure, each evaluation value has the same value. Therefore, the shift quantity is not determined uniquely. The evaluation value of the matching will be described later.

In order to solve this problem, the edges of FIG. 32 are dilated with weights giving to the neighboring pixels as shown in FIG. 35. In order to realize the dilation of FIG. 35, a smoothing filter consisting of 0.5, 0.75, 1.0, 0.75, and 0.5 coefficients may be used. In the case of the example shown in FIG. 35, when FIG. 34 (the edges of the reference pattern) is shifted by one pixel or more in the rightward direction or the leftward direction, the evaluation value will decrease.

Next, the case where the edges of the reference pattern are wider than the edges of the reference pattern shown in FIG. 34 by two pixels as shown in FIG. 36 will be considered. First, figures are obtained by shifting FIG. 36. Shift quantities used in the above are one pixel in the leftward direction and one pixel in the rightward direction. Next, when the evaluation value of the matching is obtained from FIG. 35 and each shifted figure, each evaluation value has the same value. Therefore, the shift quantity is not determined uniquely.

In order to solve this problem, the edges of FIG. 32 are dilated with weights giving to the neighboring pixels as shown in FIG. 37. In order to realize the dilation of FIG. 37, a smoothing filter consisting of 0.5, 0.9, 1.0, 0.9, and 0.5 coefficients (FIG. 38) may be used.

From the above consideration, the dilation as shown in FIG. 37 is most suitable. However, from a viewpoint of processing speed, crowdedness of the edges, and the like, the dilation as shown in FIG. 33 or FIG. 35 may be used.

After determining the coefficients of the smoothing filter, the coefficients are set into the above-mentioned 3.3 Recipe data "3. The coefficients of filter for edge dilation", and are used.

Figure 39:
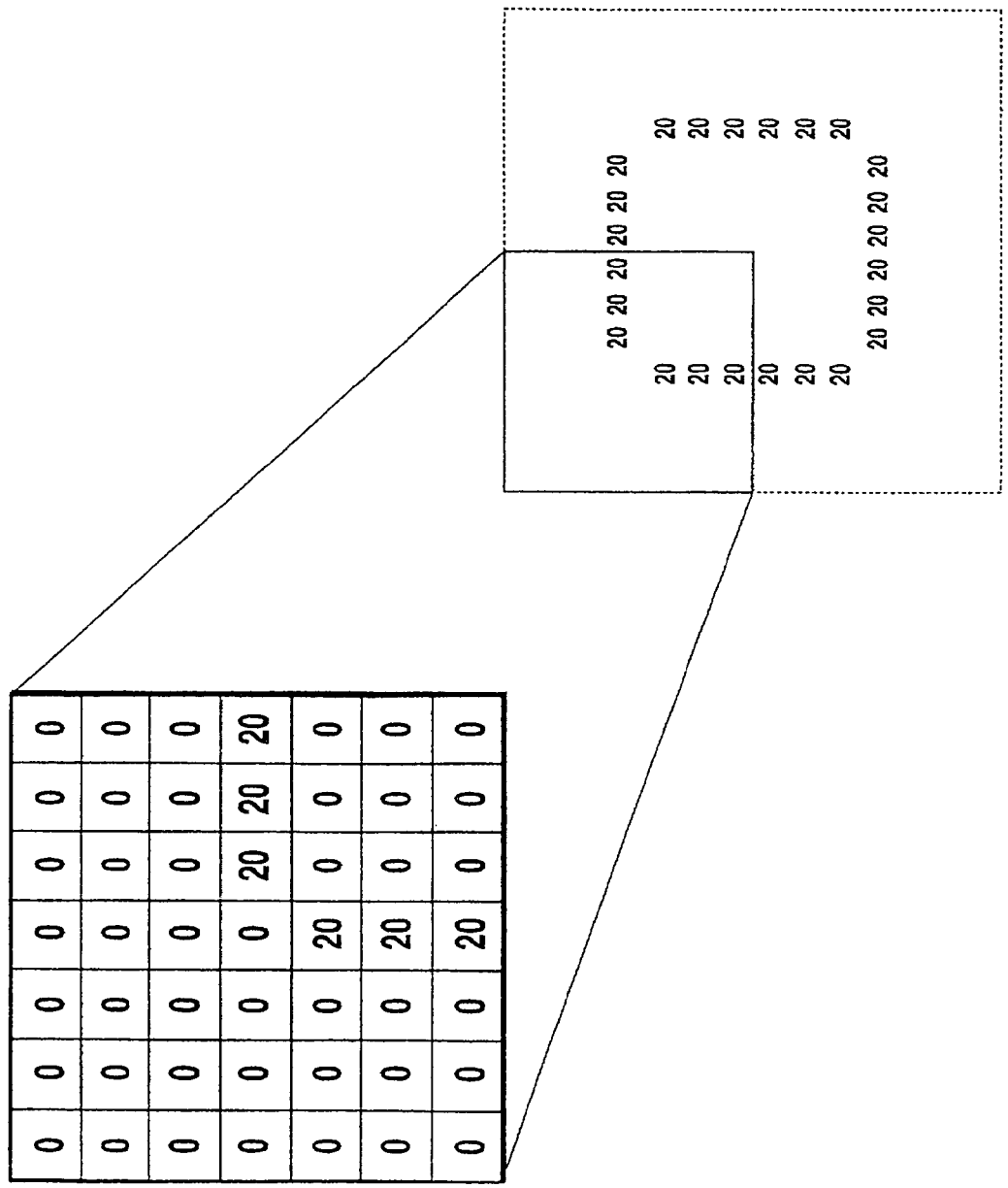
FIG. 39 is a diagram showing an example of magnitudes of edges of a two-dimensional image of a pattern to-be-inspected.
Figure 40:
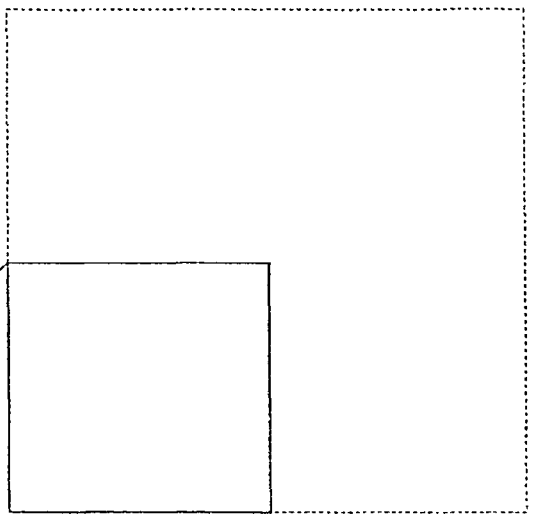
FIG. 40 is a diagram showing an example in which the edges of FIG. 39 are dilated.
Figure 41:
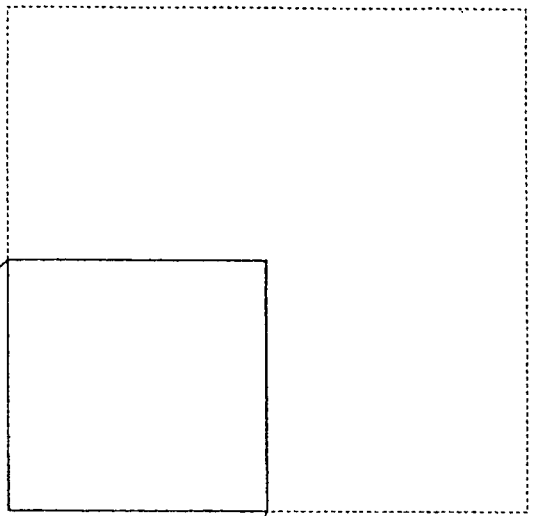
FIG. 41 is a diagram showing another example in which the edges of FIG. 39 are dilated.

FIG. 39 is a diagram showing an example of magnitudes of edges of a two-dimensional image of a pattern to-be-inspected, and FIGS. 40 and 41 are diagrams showing examples in which the edges of FIG. 39 are dilated. In FIG. 39, the magnitudes of edges are all zero except for pixels whose magnitudes are 20. FIG. 40 shows a result of the same dilation shown in FIG. 33, and FIG. 41 shows a result of the same dilation shown in FIG. 37.

Figure 42:
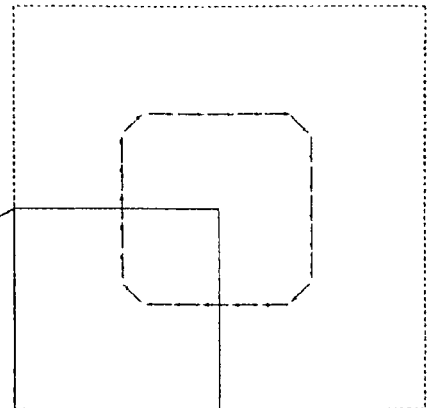
FIG. 42 is a diagram showing an example of edge vectors of the two-dimensional image of a pattern to-be-inspected.
Figure 43:
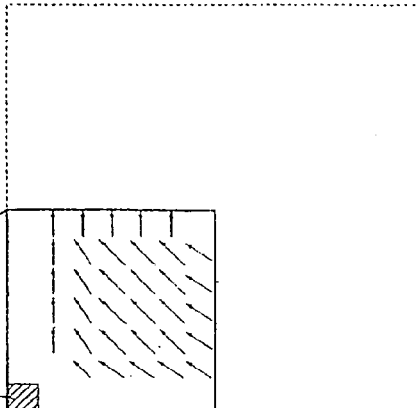
FIG. 43 is a diagram showing an example in which the edge vectors in FIG. 42 are dilated.
Figure 44:
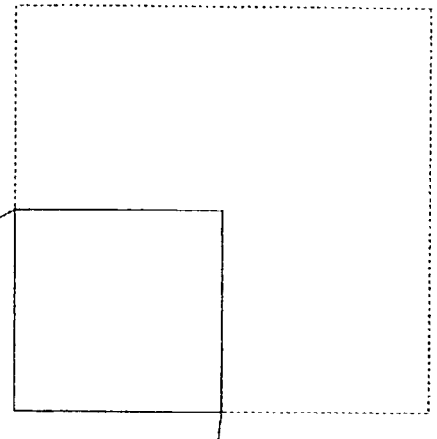
FIG. 44 is a diagram showing another example in which the edge vectors in FIG. 42 are dilated.

FIG. 42 is a diagram showing an example of edge vectors of the two-dimensional image of the pattern to-be-inspected, and FIGS. 43 and 44 are diagrams showing examples in which the edges of FIG. 42 are dilated. FIG. 43 shows a result of the same dilation shown in FIG. 33, and FIG. 44 shows a result of the same dilation shown in FIG. 37. The dilation is performed for each X- and Y-component separately.

The inspection unit 12 compares the dilated edges with the edge of the reference pattern, and performs the matching between the image of the pattern to-be-inspected and the reference pattern, pixel by pixel (step S314).

In this embodiment, the matching is performed by using a shift quantity $S_2$ with sub pixel accuracy as described in the following description of 4.8 Pattern deformation quantities obtained from the whole inspection-unit-area. Therefore, the matching is performed pixel by pixel for purpose of high-speed calculation. Therefore, as shown in FIG. 45, edge vectors, which represent the edge vectors of the reference pattern in FIG. 20 in pixel unit, are used for matching.

Figure 46:
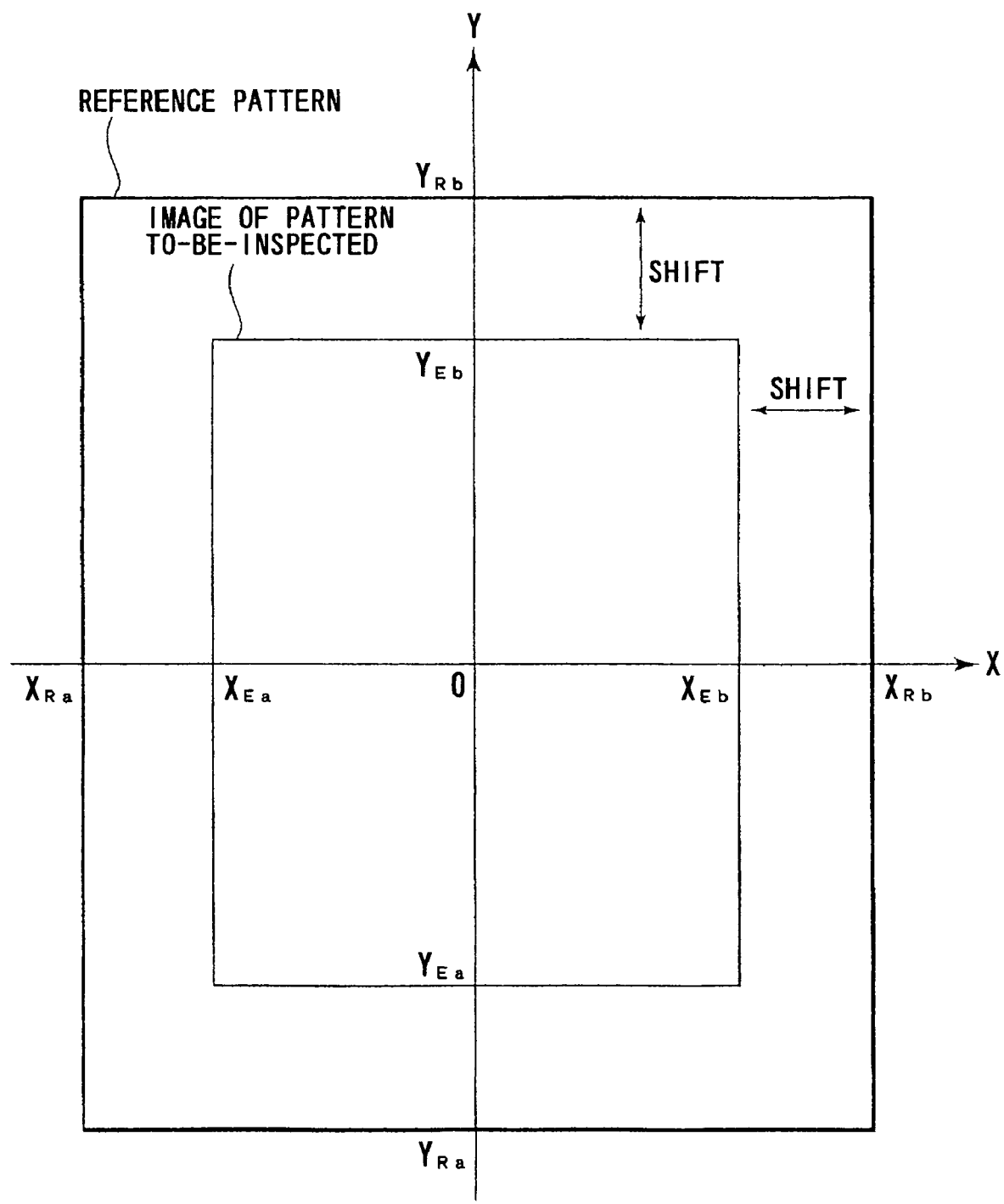
FIG. 46 is a diagram for explaining a matching.

In the matching of this embodiment, the reference pattern is shifted vertically and horizontally for every pixel relatively to the image of the pattern to-be-inspected to obtain a position where the evaluation value $F_0$ becomes the maximum, and the obtained position is taken as a matching position (FIG. 46). In this embodiment, as described in the following equation, a total sum of the magnitudes of the dilated edges in pixels where the edge of the reference pattern exists is used as the evaluation value $F_0$.

$$F_0(x_s, y_s) = \sum_{x=X_{Ea}}^{X_{Eb}} \sum_{y=Y_{Ea}}^{Y_{Eb}} |E(x, y)||R(x + x_s, y + y_s)|$$

$$(X_{Ra} - X_{Ea} \leq x_s \leq X_{Rb} - X_{Eb})$$

$$(Y_{Ra} - Y_{Ea} \leq y_s \leq Y_{Rb} - Y_{Eb})$$

where $E(x,y)$ is a vector whose magnitude is equal to the magnitude of the dilated edge, and whose direction is equal to the direction of the dilated edge. In pixels where no edge exists, the magnitude of $E(x,y)$ is zero. $R(x+x_s, y+y_s)$ is a vector whose direction is equal to the edge direction of the reference pattern, where the magnitude of $R(x+x_s, y+y_s)$ is a length of the reference pattern in the pixel. Here, a vector $(x_s, y_s)$ is the shift quantity $S_1$ of the edge of the reference pattern.

If, in the calculation of $F_0$, only the pixels whose $R(x,y)$ is non-zero are stored, the calculation can be performed at high speed and the memory area to be used can be reduced. If truncation of calculations used in the sequential similarity detection algorithm (SSDA) is adopted, the calculation can be speeded up even further.

FIGS. 47 and 48 are diagrams made by superimposing FIG. 43 (the dilated edges) on FIG. 45 (the edges of the reference pattern). In FIG. 47, a pixel 254 corresponds to a pixel 251 of FIG. 43 and a pixel 252 of FIG. 45. FIG. 48 shows relationship of positions of FIG. 43 and FIG. 45 in which FIG. 43 is shifted by one pixel in rightward direction and by one pixel in downward direction from relationship of positions shown in FIG. 47. Therefore, a pixel 255 corresponds to the pixel 251 of FIG. 43 and the pixel 253 of FIG. 45. By using evaluation value $F_0$, the larger the degree of overlapping of the pixels where the edges exist is, the higher the evaluation value becomes. In the case where the evaluation value $F_0$ is used, the dilation processing as shown in FIGS. 39 through 41 should be performed. In addition, the evaluation value $F_0$ can be applied to both images described in the above-mentioned 4.1.1 The first edge detection method 1 and the above-mentioned 4.1.2 The first edge detection method 2.

In this embodiment, the above-mentioned evaluation value $F_0$ is used, however, other evaluation values can also be used. For example, in the case of the image having the contrast between the inside of the pattern and the ground described in the above-mentioned 4.1.1 The first edge detection method 1, the following evaluation value Fa can be used:

$$F_a(x_s, y_s) = \sum_{x=X_{Ea}}^{X_{Eb}} \sum_{y=Y_{Ea}}^{Y_{Eb}} E(x, y) \cdot R(x + x_s, y + y_s)$$

$$(X_{Ra} - X_{Ea} \leq x_s \leq X_{Rb} - X_{Eb})$$

$$(Y_{Ra} - Y_{Ea} \leq y_s \leq Y_{Rb} - Y_{Eb})$$

Moreover, for example, in the case of the image having bright edges and having no contrast between the inside of the pattern and the ground described in the above-mentioned 4.1.2 The first edge detection method 2, the following evaluation value $F_b$ can be used.

$$F_b(x_s, y_s) = \sum_{x=X_{Ea}}^{X_{Eb}} \sum_{y=Y_{Ea}}^{Y_{Eb}} |E(x, y) \cdot R(x + x_s, y + y_s)|$$

$$(X_{Ra} - X_{Ea} \leq x_s \leq X_{Rb} - X_{Eb})$$

$$(Y_{Ra} - Y_{Ea} \leq y_s \leq Y_{Rb} - Y_{Eb})$$

In the case where the evaluation value $F_a$ or $F_b$ is used, the dilation processing as shown in FIGS. 42 through 44 should be performed.

Figure 49A:
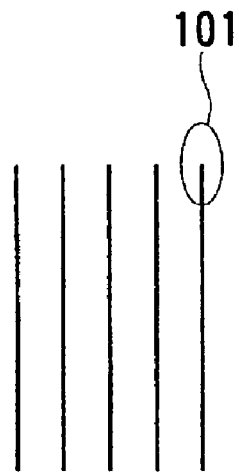
FIG. 49A is a diagram showing an example of reference patterns.
Figure 49B:
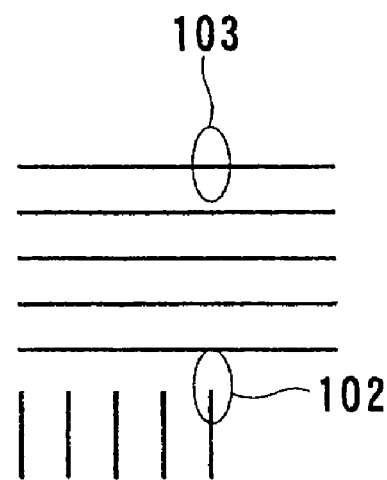
FIG. 49B is a diagram showing an example of an image of a pattern to-be-inspected.

The evaluation values $F_0$, $F_a$, and $F_b$ will be considered. The evaluation value $F_0$ has advantage with regard to high-speed calculation, because the data is scalar. On the other hand, the evaluation values $F_a$ and $F_b$ are effective, for example, in the case as shown in FIGS. 49A and 49B. When the evaluation values $F_a$ and $F_b$ are used, because the inner product between the edge (vector) of vertical line part of the reference pattern (FIG. 49A) and the edge (vector) of the horizontal line part of the image of the pattern to-be-inspected (FIG. 49B) becomes close to zero, a part 101 and a part 102 can be matched successfully. On the contrary, when the evaluation value $F_0$ is used, because only the magnitude is used without considering the direction, the part 101 and a part 103 are likely to be matched erroneously.

Figure 50:
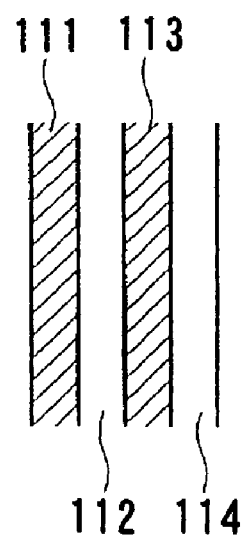
FIG. 50 is a diagram showing an example in which widths of lines and widths of spaces are equal.

The evaluation value $F_a$ is more robust for matching than the evaluation value $F_b$, because the evaluation value $F_a$ distinguishes the inside of the pattern and the ground. For example, in the case where widths of lines 111, 113 and widths of spaces 112, 114 are equal as shown in FIG. 50, the value $F_a$ can obtain a more suitable result than the value $F_b$, because distinction between the line and the space is clear.

In this embodiment, the edges of the image of the pattern to-be-inspected are dilated and the matching is performed. As an alternative method, the edges of the reference pattern may be dilated to perform the matching.

4.2.1 Matching Method in Which Unique Pattern is Used

The above-mentioned matching method uses the magnitudes of the edges of the reference pattern equally. As described in the above-mentioned 3.1 Edge, the magnitude is a length of vector multiplied by a degree of contribution to matching. As an alternative method of the above-mentioned matching method, a matching method in which matching is more robust by setting different values to the magnitudes of the edges of the reference pattern can be used. This method is performed in the following procedure using FIGS. 51A and 51B.

FIG. 51A is a diagram showing an example of reference patterns, and FIG. 51B is a diagram showing an example of the reference patterns (shown by dotted lines) and an image of a pattern to-be-inspected (shown by solid lines) corresponding to the reference patterns in FIG. 51A. The reference pattern shown in FIG. 51A is periodic patterns that have a gap at one position. When the matching between the reference patterns and the image of the pattern to-be-inspected is performed, even if both are shifted by one period as shown in FIG. 51B, most of parts except for the gap part match with each other, and therefore this matching gives a high evaluation value erroneously. In order to solve this problem, a large value is set to the degree of contribution to matching of edges of reference pattern corresponding to the gap part so that the matching evaluation value will decrease drastically, when the gap of the image of the pattern to-be-inspected and the gap of the reference pattern do not match with each other.

First, the period of the reference patterns is obtained by the autocorrelation method. Next, by comparing the original reference patterns with the reference patterns shifted by one period, a reference pattern that exists in part of the original reference patterns, but does not exist in the reference pattern shifted by one period is obtained. Then, the obtained reference pattern is recognized as a unique pattern. A degree of contribution to matching of edges of the unique pattern is made larger value than that of other reference patterns. The value is larger than unity (1). As the value, a constant value obtained experimentally, a value defined as a constant value divided by a ratio of the unique pattern to all the patterns, or the like can be used.

4.2.2 Matching Method in Which Negative Pattern is Used

Figures 52A, 52B:
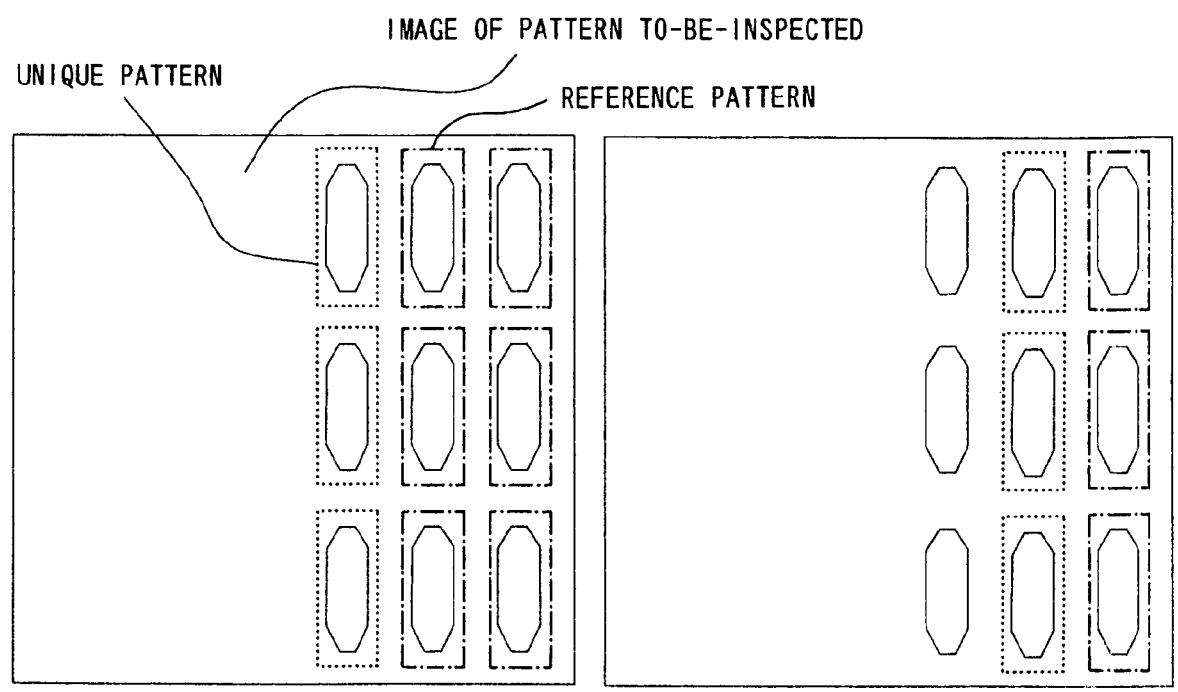
FIGS. 52A and 52B are schematic views showing a method of calculating a matching evaluation value of an array of rectangular patterns.

In order to utilize the unique pattern more efficiently, a matching method in which a negative pattern paired with the unique pattern is used can be used. FIGS. 52A and 52B are schematic views showing a method of calculating a matching evaluation value of reference patterns, which are a periodical array of rectangular pattern. Although rectangular patterns are periodically arranged also on the right-hand side of patterns to-be-inspected shown in FIGS. 52A and 52B, termination of the rectangular patterns on the right-hand side cannot be recognized, because the image is limited. In this case, if matching is performed by using the above-mentioned 4.2.1 Matching method in which unique pattern is used, the matching evaluation value in FIG. 52A becomes substantially equal to the matching evaluation value in FIG. 52B, and therefore the matching position cannot be uniquely determined.

In order to solve this problem, negative patterns paired with unique patterns are extracted by using the following procedure, and the extracted negative patterns are used in calculation of the matching evaluation value.

FIGS. 53A, 53B and 53C are schematic views showing a method of calculating a matching evaluation value in which negative patterns paired with unique patterns are used. If there is no reference pattern at a portion shifted from the original reference pattern to the leftward by one period, the portion of the original reference pattern is taken as the unique pattern (rectangle shown by dotted lines). The portion shifted from the unique pattern to the leftward by one period is taken as a negative pattern (rectangle shown by solid lines). Similarly, a negative pattern is extracted in other directions such as rightward, upward, and downward.

With regard to the unique pattern, the degree of contribution to matching is higher than unity (1). On the other hand, with regard to the negative pattern, the degree of contribution to matching is the above-mentioned value, which is larger than unity (1), multiplied by (−1).

The evaluation value using the negative pattern will be considered. An evaluation value when a pattern to-be-inspected exists in one unique pattern is taken as F1. An evaluation value of FIG. 53A is $(3 \cdot F_1)$, an evaluation value of FIG. 53B is (0), and an evaluation value of FIG. 53C is $(3 \cdot F_1) - (3 \cdot F_1)$, i.e. nearly equal to (0). From this calculation, the condition shown in FIG. 53A is recognized as matching position.

According to this embodiment, it is possible to perform matching of the boundary between the region where the same patterns are periodically arranged and the other regions, because the negative patterns give a huge penalty for the evaluation value, in the case of shifting from the optimal matching position by one period.

4.2.3 Matching Method in Which Projection Data Obtained by Projecting Edge on the Horizontal and Vertical Axes are Used Although the above matching method is high-speed enough, a method of performing at higher speed is required. In order to perform at higher speed, the portion "matching pixel by pixel" in the step S314 is improved.

Design data is mostly composed of horizontal lines and vertical lines. By using this characteristic of the design data, it is possible to perform matching at higher speed by using projection data obtained by projecting edges of a reference pattern on the horizontal and vertical axes, and projection data obtained by projecting edges of an image of a pattern to-be-inspected on the horizontal and vertical axes.

Figure 54A:
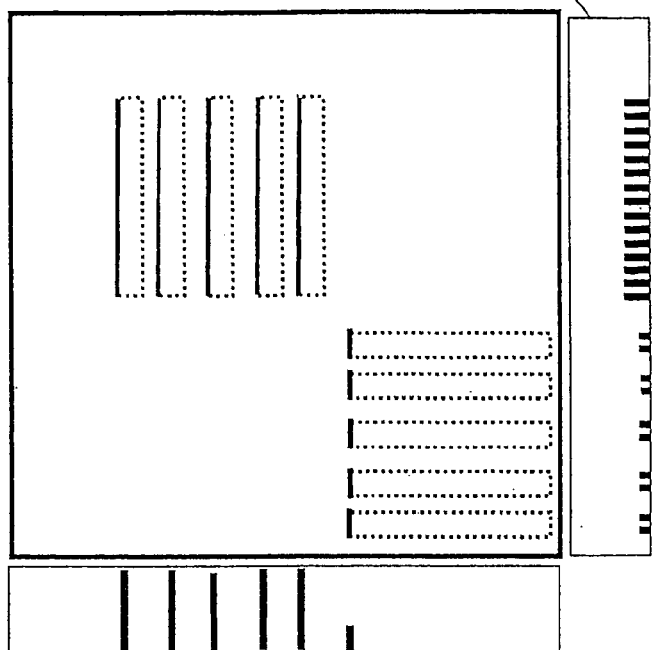
FIGS. 54A and 54B are schematic views showing a matching method in which projection data obtained by projecting an edge detected by the first edge detection on the horizontal and vertical axes are used.
Figure 54B:
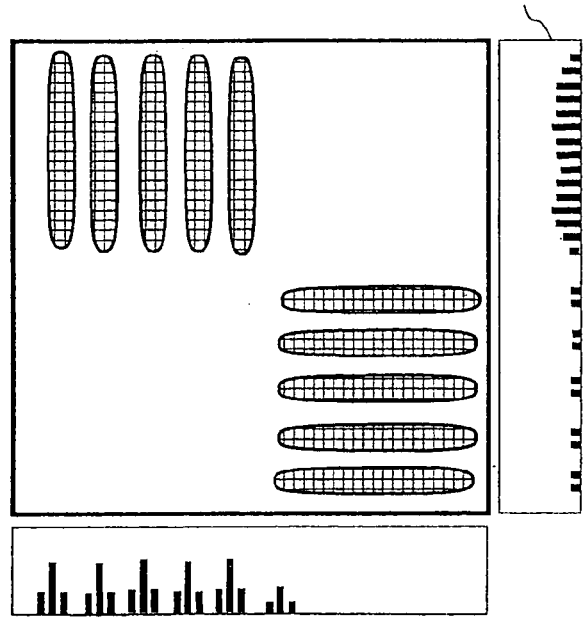

FIGS. 54A and 54B are schematic views showing a matching method in which projection data obtained by projecting edges detected by the above-mentioned 4.1 The first edge detection on the horizontal and vertical axes are used. In this embodiment, the matching method is explained by using the edge detection suitable for an image having a contrast between the inside of the pattern and the ground as described in 4.1.1 The first edge detection method 1. The reference patterns are composed of line segments that extend in four directions including upward, downward, rightward and leftward directions. As a representative example, a method in which matching is performed by using upward line segments will be described.

1. A summation $L_{rp}$ of lengths of all line segments that constitute the reference patterns is obtained. Next, the edges obtained by 4.1.1 The first edge detection method 1 are sorted out by magnitudes. The $L_{rp}$ edges are selected in the descending order of magnitude from the sorted edges and are left, and other edges are eliminated. The reference patterns are represented by a coordinate system of a pixel unit, and a size of the reference patterns is almost the same as a size of the image of the pattern to-be-inspected. Therefore, the selected edges correspond to edges of the reference patterns for the most part.

2. The upward line segments that constitute the reference pattern are extracted. The extracted line segments are projected onto the horizontal axis (the X-axis) to produce one-dimensional data. This one-dimensional data is in the form of array, and an index corresponds to an X coordinate value and an element corresponds to a length of the line segments. Similarly, the extracted line segments are projected onto the vertical axis (the Y-axis) to produce one-dimensional data. This one-dimensional data is in the form of array, and an index corresponds to a Y coordinate value and an element corresponds to a length of the line segments. This result is shown in FIG. 54A.

3. Upward edges are extracted from the above selected edges. The edges are projected onto the horizontal axis (the X-axis) to produce one-dimensional data. This one-dimensional data is in the form of array, and an index corresponds to an X coordinate value and an element corresponds to a Y component of the edge (vector). Similarly, the edges are projected onto the vertical axis (the Y-axis) to produce one-dimensional data. This one-dimensional data is in the form of array, and an index corresponds to a Y coordinate value and an element corresponds to a Y component of the edge (vector). These results are shown in FIG. 54B.

4. While shifting the projection data of the upward edges onto the horizontal axis within the range of the X direction shown in FIG. 46, matching error values $E_{pm}$ in the X direction between the projection data of the upward edges onto the horizontal axis and the projection data of upward line segments onto the horizontal axis are calculated. Similarly, while shifting the projection data of the upward edges onto the vertical axis within the range of the Y direction shown in FIG. 46, the matching error values $E_{pm}$ in the Y direction between the projection data of the upward edges onto the vertical axis and the projection data of upward line segments onto the vertical axis are calculated. In FIG. 55, the calculated matching error values $E_{pm}$ are shown.

5. The maximum value $E_{pmMax}$ and the minimum value $E_{pmMin}$ of matching error values $E_{pm}$ in the X direction are obtained to calculate a threshold value by the following equation, and a threshold value with regard to the Y direction is calculated by the same manner:

$$E_{pmMin} \cdot k_{mt} + E_{pmMax}(1-k_{mt})$$

Figure 56:
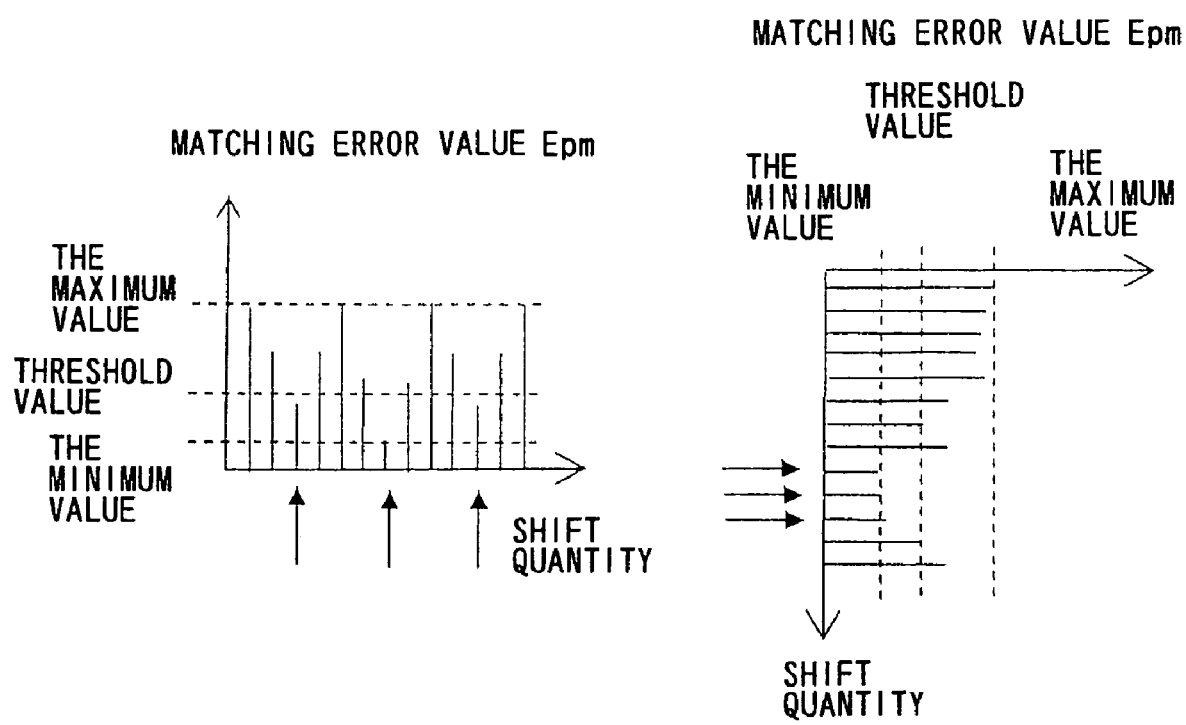
FIG. 56 is a schematic view showing shift quantities recognized to be suitable for matching from the calculated matching error values $E_{pm}$.

The shift quantities having the matching error values $E_{pm}$, that are equal to or less than the threshold value are recognized to be suitable for matching. A coefficient $k_{mt}$ is a value that is empirically determined and is in the range of 0 to 1. As the coefficient $k_{mt}$ is nearer to 0, the number of the shift quantities that are recognized to be suitable for matching becomes larger. The shift quantities shown by the arrows in FIG. 56 are recognized to be suitable for matching.

6. Next, the optimal solution is obtained from the shift quantities that are recognized to be suitable for matching in the above step 5. In the above-mentioned 4.2 Line-shaped pattern matching method, "In the matching of this embodiment, the reference pattern is shifted vertically and horizontally for every pixel relatively to the image of the pattern to-be-inspected to obtain a position where the evaluation value $F_0$ becomes the maximum, and the obtained position is taken as a matching position (FIG. 46)" has been explained. According to this method, this phrase is replaced with "In the matching of this embodiment, the reference pattern is shifted vertically and horizontally for every shift quantity obtained from the above step 5 relatively to the image of the pattern to-be-inspected to obtain a position where the evaluation value $F_0$ becomes the maximum, and the obtained position is taken as a matching position (FIG. 46)", and matching of the above-mentioned Line-shaped pattern matching method is performed.

Figure 57A:
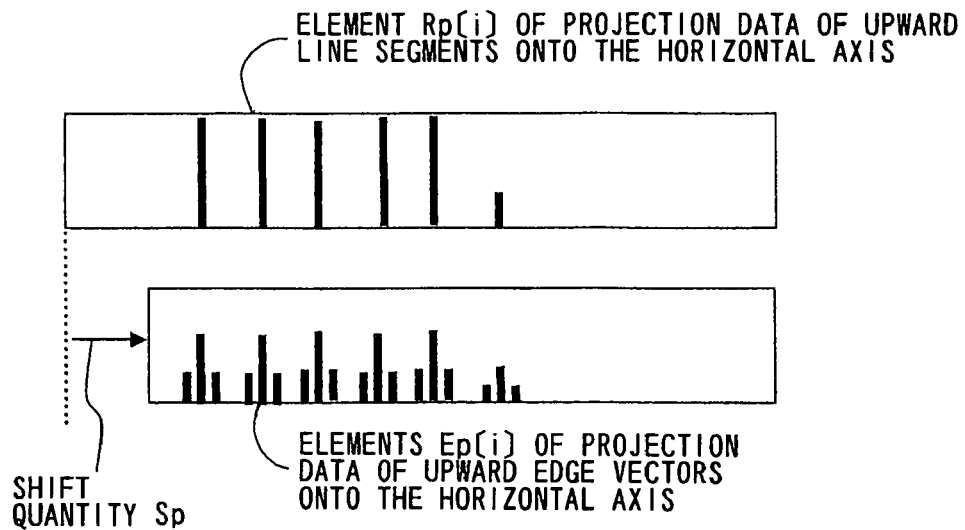
FIGS. 57A, 57B and 57C are schematic views showing a method of calculating the matching error values $E_{pm}$.

The matching error value $E_{pm}$ is calculated by the method shown in FIG. 57A. In this embodiment, elements $R_p[i]$ of the projection data of upward line segments onto the horizontal axis, elements $E_p[i]$ of the projection data of upward edges onto the horizontal axis, and a shift quantity $S_p$ are used, as a representative example. The simple matching error value $E_{pmS}$ is calculated by the following equation using the elements $R_p[i]$ of the projection data of upward line segments onto the horizontal axis, and the shifted element $E_p[i+S_p]$ of the projection data of upward edges onto the horizontal axis:

$$E_{pmS} = \Sigma_i |R_p[i] - E_p[i+S_p]|$$

where $\Sigma_i$ means summation for all the elements $E_p[i]$.

As described in the step S312 (dilate the edges of the image of the pattern to-be-inspected to obtain dilated edges), the pattern deformation within the allowable pattern deformation quantity that does not affect an electrical property is necessary to be ignored.

Although the same manner as the step S312 may be used, in this case, the following different manner is used.

The case where the allowable pattern deformation quantity is one pixel will be described. First, the following calculations are performed for all the elements $E_p[i]$:

1. If $R_p[i] \geq E_p[i+S_p]$ is satisfied, the following calculations are performed:

$$R_p[i] \Leftarrow R_p[i] - E_p[i+S_p]$$

$$E_p[i+S_p] \Leftarrow 0$$

2. If $R_p[i] < E_p[i+S_p]$ and the following $\delta R$ is positive, the following calculations with regard to $\rho_{-1}$ through $E_p[i+S_p]$ are performed:

$$\delta R \Leftarrow R_p[i-1] + R_p[i] + R_p[i+1] - E_p[i+S_p]$$

$$\rho_{-1} \Leftarrow R_p[i+S_p-1]/(R_p[i+S_p-1] + R_p[i+S_p+1])$$

$$\rho_{+1} \Leftarrow R_p[i+S_p+1]/(R_p[i+S_p-1] + R_p[i+S_p+1])$$

$$R_p[i] \Leftarrow 0$$

$$R_p[i-1] \Leftarrow \delta R \cdot \rho_{-1}$$

$$R_p[i+1] \Leftarrow \delta R \cdot \rho_{+1}$$

$$E_p[i+S_p] \Leftarrow 0$$

3. If $R_p[i] < E_p[i+S_p]$ and $\delta R$ is negative, the following calculations are performed:

$$R_p[i-1] \Leftarrow 0$$

$$R_p[i] \Leftarrow 0$$

$$R_p[i+1] \Leftarrow 0$$

$$E_p[i+S_p] \Leftarrow -\delta R$$

After finishing the above calculations, the matching error value $E_{pmD}$ in consideration of the deformation quantity is calculated by the following equation:

$$E_{pmD} = \Sigma_i (R_p[i] + E_p[i+S_p])$$

Figure 57B:
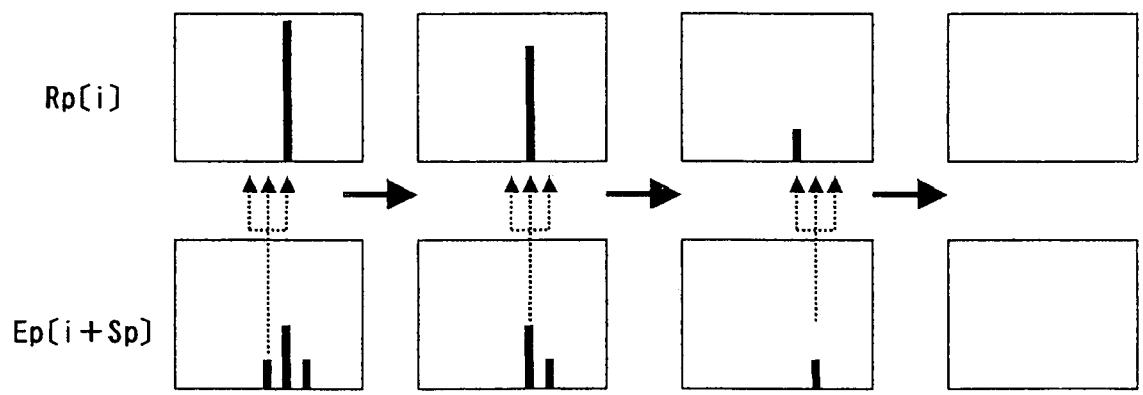
Figure 57C:
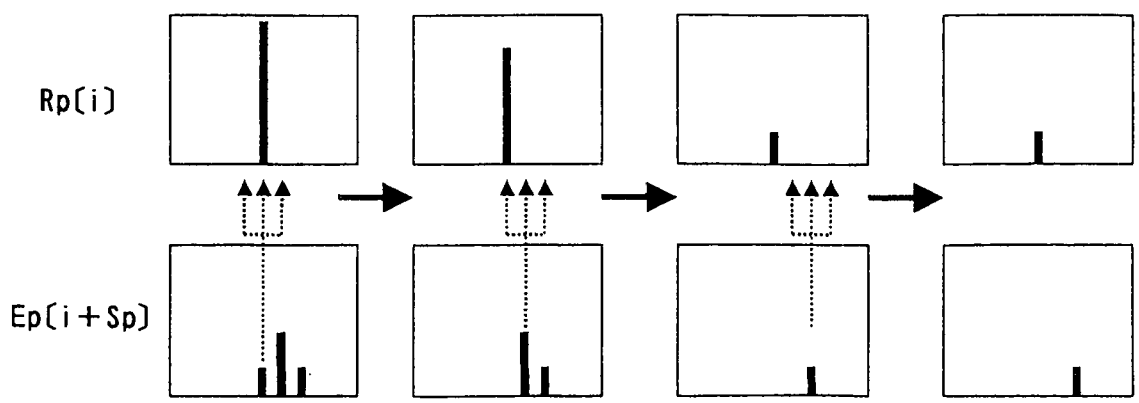

The results of the above calculations are shown in FIGS. 57B and 57C. In FIG. 57B, $R_p[i]$ and $E_p[i+S_p]$ are placed in a position suitable for matching. On the other hand, in FIG. 57C, $R_p[i]$ and $E_p[i+S_p]$ are placed in a position displaced by 1 pixel from the position suitable for matching. As shown in FIGS. 57B and 57C, the matching error value $E_{pmD}$ in consideration of the deformation quantity is smaller than the simple matching error value $E_{pmS}$ by the value that is created by correspondence in consideration of the allowable pattern deformation quantity. Therefore, the matching error value $E_{pmD}$ in consideration of the deformation quantity is suitable for the matching error value $E_{pm}$.

In the case where the allowable pattern deformation quantity is larger than one pixel, the above calculations should be performed by using not only $R_p[i-1], R_p[i+1]$, but also $R_p[i-2], R_p[i+2]$, and so forth.

The above matching error value $E_{pmD}$ calculation is performed for edges and line segments in downward, rightward and leftward directions also. The line segments in another direction, for example, directions of multiples of 45 degrees, also can be used.

In this embodiment, edges in the opposite directions of 180 degrees, for example, upward edge and downward edge, can be distinguished from each other. However, in the case of using the above-mentioned 4.1.2 The first edge detection method 2, the edges in the opposite directions of 180 degrees cannot be distinguished. In this case, edges in the opposite directions of 180 degrees are mingled and are calculated.

FIG. 46 shows the method in which the reference pattern is shifted vertically and horizontally for every pixel, and position where the evaluation value $F_0$ becomes the maximum is taken as a matching position. However, according to this embodiment, the reference pattern is shifted at sporadic pixel unit intervals, instead of shifting every pixel. Therefore, the calculation time is greatly shortened.

4.3 Matching Method in Which Geometrical Information for Isolated Pattern is Used The above matching method is suitable for a line-shaped pattern. However, an alternative method of performing matching for a hole pattern and an island pattern, which are isolated patterns, can be used. A hole pattern and an island pattern are rectangular patterns, and both the longer side and the shorter side of each pattern are shorter than the width that is two to three times the minimum line width. A calculation time for matching of a hole pattern and an island pattern is longer than a calculation time for matching of a line-shaped pattern because the hole pattern and the island pattern are smaller and more numerous than the line-shaped pattern. In order to solve this problem, the following high-speed calculation method that requires less calculation time than the above-mentioned 4.2 Line-shaped pattern matching method can be used.

This method can be used for the case where all patterns to-be-inspected comprise hole patterns or island patterns. In addition, ordinarily a hole pattern and an island pattern don't exist simultaneously. Therefore, in this embodiment, a method in which every pattern to-be-inspected is a hole pattern will be described. In the case of an island pattern, matching method of a hole pattern can be used by replacing hole with island.

Figure 58A:
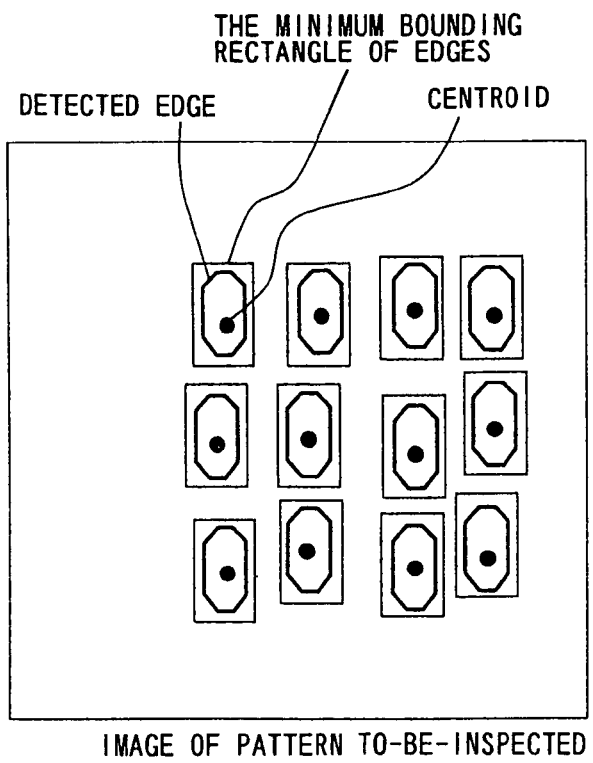
FIGS. 58A, 58B and 58C are schematic views of the first matching method of a hole pattern.
Figure 58B:
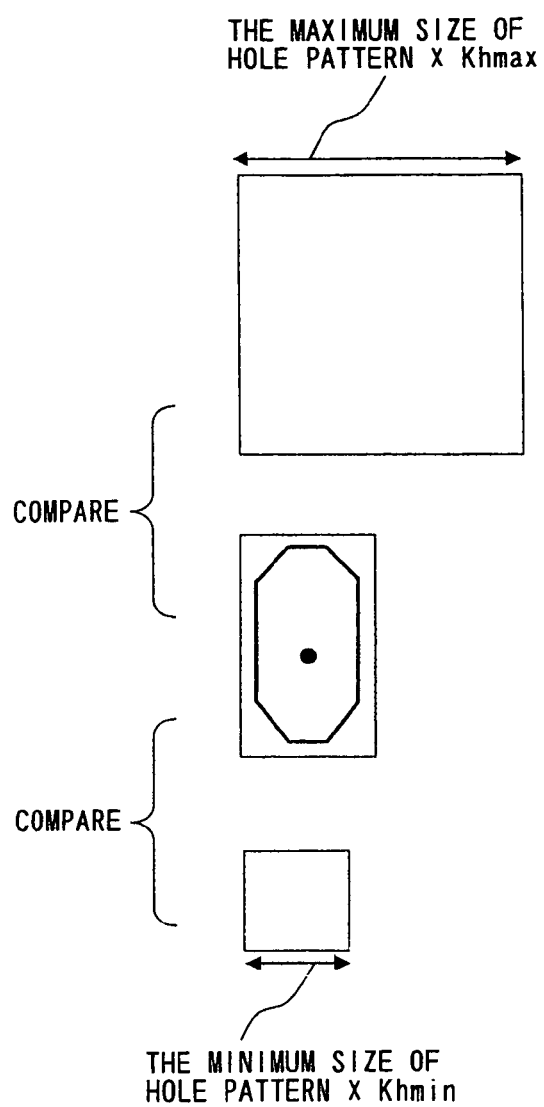
Figure 58C:
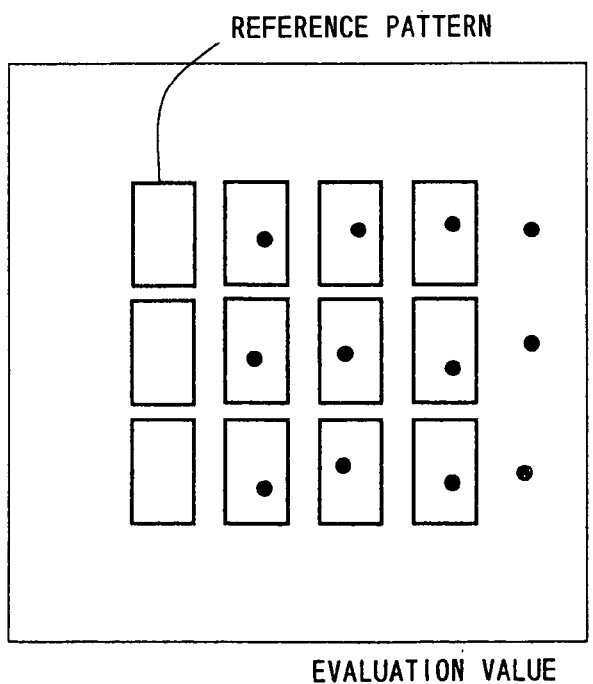

In the first matching method of a hole pattern, geometrical information obtained from edges of an image of a pattern to-be-inspected is used: FIGS. 58A, 58B and 58C are schematic views of the first matching method of a hole pattern. FIG. 58A shows bold lines as edges of an image of a pattern to-be-inspected, and solid circles (●) as centroids of the edges.

As the first step, edges are detected, and the minimum bounding rectangle and a centroid of the connecting edges are calculated as shown in FIG. 58A. In the case of an image having a contrast between the inside of the pattern and the ground, the edge detection as described in 4.1.1 The first edge detection method 1 can be used.

In the case of an image having bright edges and having no contrast between the inside of the pattern and the ground, the edge detection as described in the above-mentioned 4.1.2 The first edge detection method 2 can be used. In this case, detected edges may not be necessarily recognized as connecting pixels. Therefore, detected edges are dilated in order to be connected to each other, and are recognized as connecting pixels by the labeling processing. Then, the minimum bounding rectangle and the centroid of the edges are calculated as the minimum bounding rectangle and the centroid of those connecting pixels.

As the second step, the detected edges are selected by the following procedure using FIG. 58B:

1. The above-mentioned 3.3 Recipe data "7. The minimum size $S_{hmin}$ and the maximum size $S_{hmax}$ of an isolated pattern, and the safety factors $k_{hmin}$ and $k_{hmax}$" are determined, and set beforehand.

2. If a size of the minimum bounding rectangle of the edges is greater than $S_{hmin} \times k_{hmax}$, the edges are not recognized as edges of a hole pattern. The safety factor $k_{hmax}$ is a value that is 1 to 2 and is empirically determined.

3. If a size of the minimum bounding rectangle of the edges is smaller than $S_{hmax} \times k_{hmin}$, the edges are recognized as noise or dust, and are not recognized as edges of a hole pattern. The safety factor $k_{hmin}$, is a value that is 0.5 to 1 and is empirically determined.

4. If the detected edges don't form a ring-shape, the edges are not recognized as edges of a hole pattern.

5. In the case of an image having a contrast between the inside of the pattern and the ground, it is possible to recognize whether the inside of the ring-shape of the above 4 is a hole or an island. If the inside of the ring-shape is not a hole, the edges are not recognized as edges of a hole pattern.

In this embodiment, matching is performed by using an evaluation value $F_h$ instead of the evaluation values $F_0$, $F_a$, and $F_b$ used in the above-mentioned 4.2 Line-shaped pattern matching method. The matching is performed in the same manner as the above-mentioned Line-shaped pattern matching method except for using the evaluation value $F_h$. In this embodiment, reference patterns are obtained from the design data by simple transformation. The evaluation value $F_h$ is a summation of values calculated from all the reference patterns, which are hole patterns, by the following procedure:

1. As shown in the first column of FIG. 58C, if there is no centroid of the edges in the reference pattern, the value is 0.

2. As shown in the second column of FIG. 58C, if there is a centroid of the edges in the reference pattern, the value is 1.

In order to use the above-mentioned 4.2.1 Matching method in which unique pattern is used, and the above-mentioned 4.2.2 Matching method in which negative pattern is used described in the above-mentioned 4.2 Line-shaped pattern matching method, the following two calculations are added. The recognition of the unique pattern and negative pattern, and setting of the degree of contribution to matching are the same as the above-mentioned 4.2 Line-shaped pattern matching method.

3. If there is a centroid of the edges in the unique pattern, the value is the above-mentioned degree of contribution to matching.

4. If there is a centroid of the edges in the negative pattern, the value is the above-mentioned degree of contribution to matching multiplied by (−1).

According to this embodiment, a matching method in which condensed information obtained from a plurality of edges is used can be realized. The method is performed at higher speed than a method in which edges are individually used. Moreover, calculation cost is reduced greatly.

Further, high-speed calculation can be performed by using the above-mentioned 4.2.3 Matching method in which projection data obtained by projecting edge on the horizontal and vertical axes are used. In this case, projection data obtained by projecting the centroid of the edges are used, instead of projection data obtained by projecting the edges.

4.4 Matching method in which statistic values for isolated pattern are used

Figure 59A:
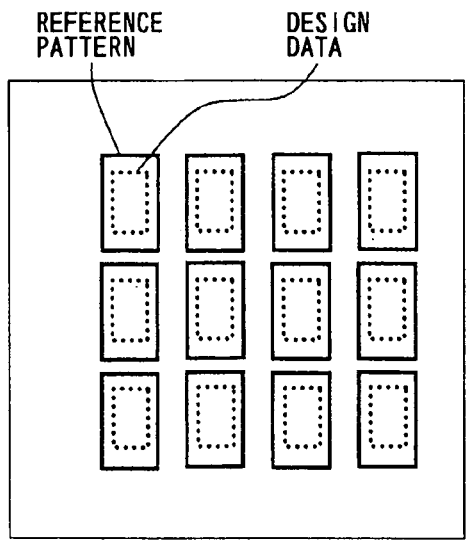
FIGS. 59A, 59B and 59C are schematic views of the second matching method of a hole pattern.
Figure 59B:
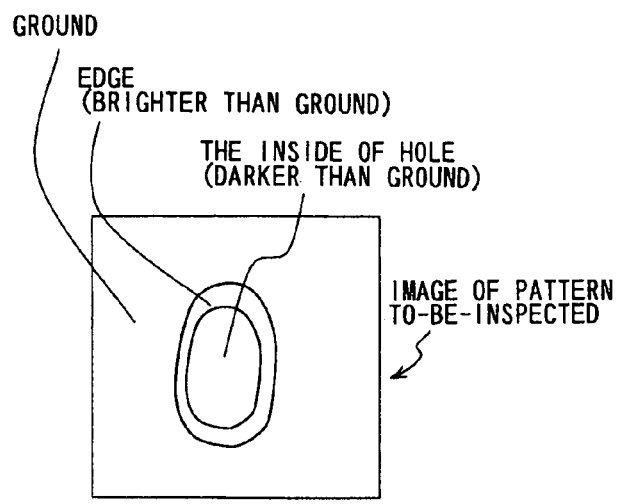
Figure 59C:
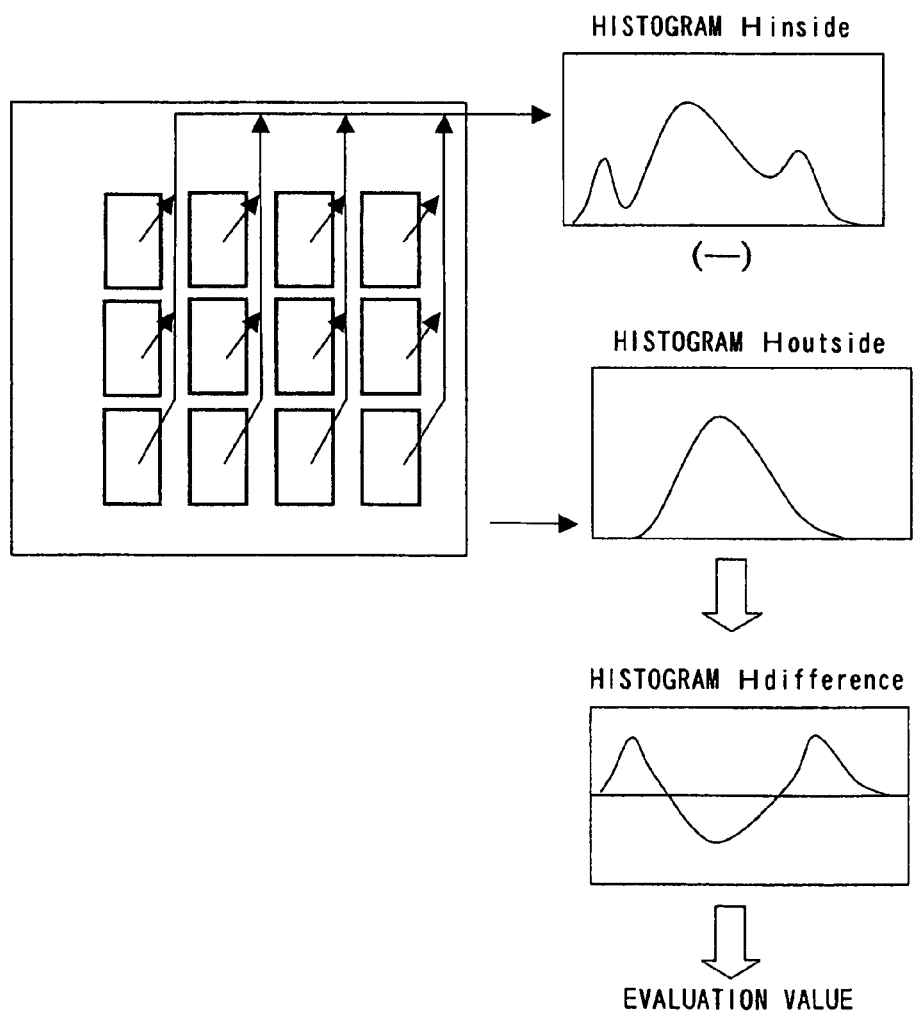

In the second matching method of a hole pattern, a statistic value calculated from part of the image of the pattern to-be-inspected corresponding to the inside of a reference pattern and a statistic value calculated from part of the image of the pattern to-be-inspected corresponding to the outside of the reference pattern are compared. FIGS. 59A, 59B, and 59C are schematic views of the second matching method of a hole pattern. FIG. 59A shows reference patterns used in this embodiment. These reference patterns are obtained by applying the size processing to design data. A dilating quantity of the size processing is less than half of the limit value of the positive side of the above-mentioned 3.3 Recipe data "2. The allowable pattern deformation quantity of a diameter, in the case of an isolated pattern". FIG. 59B shows a typical image of a hole pattern to-be-inspected. Edges of the hole pattern are brighter than the ground, and the inside of the hole pattern is darker than the ground.

In this embodiment, matching is performed by using an evaluation value $F_d$ instead of the evaluation values $F_0$, $F_a$, and $F_b$ used in the above-mentioned 4.2 Line-shaped pattern matching method. The matching is performed in the same manner as the Line-shaped pattern matching method except for using the evaluation value $F_d$. The evaluation value $F_d$ is calculated from the following procedure:

1. As shown in FIG. 59C, a histogram $H_{inside}$ is obtained from pixels of the image of the hole pattern to-be-inspected corresponding to the insides of all the reference patterns. The obtained histogram $H_{inside}$ is standardized.

2. A histogram $H_{outside}$ is obtained from pixels of the image of the hole pattern to-be-inspected corresponding to the outside of all the reference patterns. The obtained histogram $H_{outside}$ is standardized.

3. Each element of a difference histogram $H_{difference}$ is calculated as a difference between an element of the histogram $H_{inside}$ and an element of the histogram $H_{outside}$ that correspond to the element of the difference histogram $H_{difference}$ respectively. The evaluation value $F_d$ is calculated by summing absolute values of all the elements of the difference histogram $H_{difference}$.

In order to use the above-mentioned 4.2.1 Matching method in which unique pattern is used, and the above-mentioned 4.2.2 Matching method in which negative pattern is used described in the above-mentioned 4.2 Line-shaped pattern matching method, the following two calculations are added. The recognition of the unique pattern and negative pattern, and setting of the degree of contribution to matching are the same as the above-mentioned 4.2 Line-shaped pattern matching method.

4. In the case of pixels of the image of the hole pattern to-be-inspected corresponding to the inside of the unique pattern, each of these pixels is converted into the number of the above-mentioned degree of contribution to matching pixels, and the converted pixels are used for obtaining the histogram $H_{inside}$.

5. In the case of pixels of the image of the hole pattern to-be-inspected corresponding to the inside of the negative pattern, each of these pixels converted into the above-mentioned degree of contribution to matching multiplied by (−1) pixels, and the converted pixels are used for obtaining the histogram $H_{inside}$.

The above-mentioned step 5 means the following: If a hole exists in a negative pattern, the total number of the elements of the histogram $H_{inside}$ decreases, however, a shape of histogram $H_{inside}$ is not deformed particularly. Therefore, in this case, the evaluation value $F_d$ is nearly equal to the evaluation value $F_d$ that has been calculated before calculation of this negative pattern. On the other hand, if a hole does not exist in the negative pattern, the histogram $H_{inside}$ becomes similar to the difference histogram $H_{difference}$. The evaluation value $F_d$ using the difference histogram $H_{difference}$, which is used instead of the histogram $H_{inside}$ made by the above-mentioned procedure step 1, and the histogram $H_{outside}$ is greater than the evaluation value $F_d$ using the histogram $H_{inside}$ and the histogram $H_{outside}$. Therefore, in this case, the evaluation value $F_d$ becomes greater than the evaluation value $F_d$ that has been calculated before calculation of this negative pattern.

Image brightness distribution of ground of a hole pattern and an island pattern may be non-uniform due to the electrification phenomenon and the like. It means that the histogram $H_{outside}$ may become spreading. However, by using this embodiment, the evaluation value $F_d$ is not drastically affected by spreading of the histogram $H_{outside}$.

According to this embodiment, the difference histogram made from histograms with regard to the inside and outside of the hole pattern or the island pattern is used as the evaluation value, and therefore the matching method which is robust against non-uniform image brightness distribution of the ground due to the electrification phenomenon and the like can be realized. In addition, this method can also be used for the line-shaped pattern matching.

4.5 Post-Matching Processing

When the matching is performed and the shift quantity $S_1=(x_s,y_s)$ at which the evaluation value takes the maximum is obtained, the reference pattern is shifted by the shift quantity $S_1$. The subsequent processing is performed while this shift is being maintained. The shift quantity $S_1$ can be outputted to the display device 5 and the printer 6 as the inspection result.

After the matching is completed, the edges of the image of the pattern to-be-inspected are binarized. The binarization is performed by using the above-mentioned 3.3 Recipe data "3. The threshold used in binarization of the edges of the image of the pattern to-be-inspected". Specifically, if the magnitude of each edge of the image of the pattern to-be-inspected is larger than the above-mentioned 3.3 Recipe data "3. The threshold used in binarization of the edges of the image of the pattern to-be-inspected", the edge of the image of the pattern to-be-inspected becomes an edge of the image of the pattern to-be-inspected after binarization, otherwise the edge of the image of the pattern to-be-inspected does not become an edge of the image of the pattern to-be-inspected after binarization. In subsequent processing, the magnitude of each edge of the image of the pattern to-be-inspected is not used.

As another binarization method, the p-tile method can be used. In this method, the number of the edges of the image of the pattern to-be-inspected after binarization becomes the number of the edge of the reference pattern×p. Specifically, in the descending order, the number of the edge of the reference pattern×p pieces of the edges of the image of the pattern to-be-inspected becomes edges of the image of the pattern to-be-inspected after binarization. The remainders do not become edges of the image of the pattern to-be-inspected after binarization. The coefficient p is normally about 0.9 to 1.1, and is set as the parameter in the above-mentioned 3.3 Recipe data "3. The p-tile coefficient used in binarization of the edges of the image of the pattern to-be-inspected", and is used.

4.6 The First Inspection

Next, the inspection unit 12 performs the first inspection. Specifically, calculation of a pattern deformation quantity, defect detection, and recognition of a defect-class are performed. The inspection unit 12 establishes a correspondence between the edge of the image of the pattern to-be-inspected and the edge of the reference pattern (step S318). The position of edges is treated with sub pixel accuracy. Therefore, the distance between the two edges can also be obtained with sub pixel accuracy. The direction of the edges is determined as a value in a range of 0 to 360 degrees with the right direction being set to 0 degree.

In this embodiment, the establishing of correspondence is performed in consideration of a distance between the edge of the image of the pattern to-be-inspected and the edge of the reference pattern, which is shifted by the shift quantity $S_1$, and the directions of both the edges as described in the following procedure:

For each edge of the reference pattern, the edge of the image of the pattern to-be-inspected located within the distance of the above-mentioned 3.3 Recipe data "2. The limit values of the negative side and the positive side of the allowable pattern deformation quantities" is searched. Then, a directional difference between each detected edge and the edge of the reference pattern is calculated. If the directional difference is smaller than the above-mentioned 3.3 Recipe data "2. The limit values of the allowable directional difference between edges", the edge that is used in the calculation is recognized as a corresponding edge within the allowable pattern deformation quantity. A vector d(x,y) between the two edges having the correspondence can be used to calculate the pattern deformation quantity. In addition, if a plurality of edges are recognized in the above procedure, an edge whose distance is smallest and whose directional difference is smallest is adopted.

Figure 60:
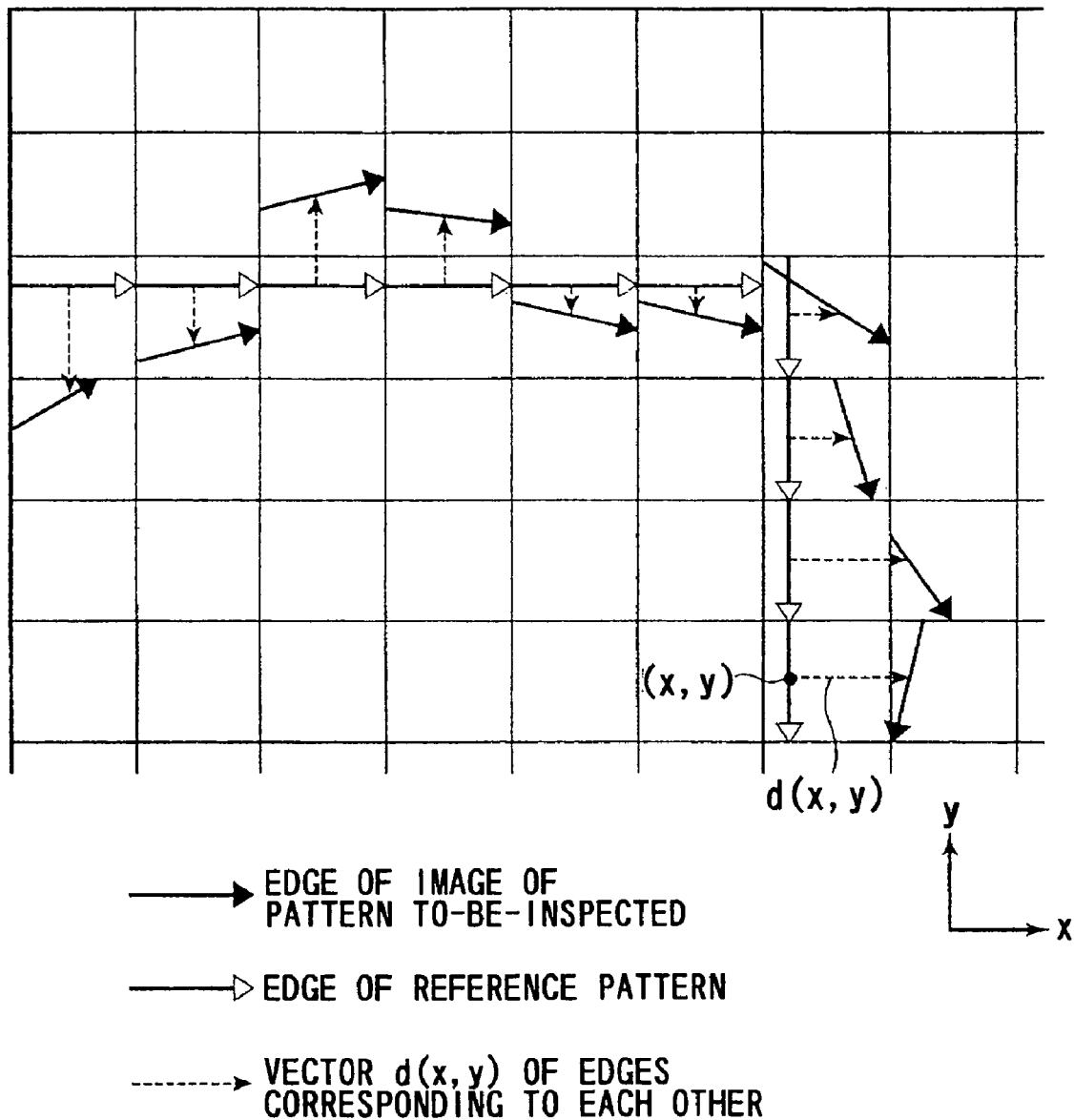
FIG. 60 is a diagram showing an example of establishing of correspondence between an edge of the image of the pattern to-be-inspected and an edge of the reference pattern.

FIG. 60 is a diagram showing an example of the establishing of correspondence between the edge of the image of the pattern to-be-inspected and the edge of the reference pattern. In FIG. 60, each edge is shown by an arrow to show its direction. In the example of FIG. 60, the establishing of correspondence is performed for each pixel that contains the edge of the reference pattern by searching an edge of the image of the pattern to-be-inspected in a direction perpendicular to the edge direction from the center of the edge of the reference pattern. If a distance between an edge of the image of the pattern to-be-inspected and the center of the edge of the reference pattern is shorter than the allowable pattern deformation quantity, and a directional difference between those is smaller than the allowable directional difference between edges, those edges correspond. In FIG. 60, the vector d(x,y) between the two edges is an example of the above vector.

Figure 61A:
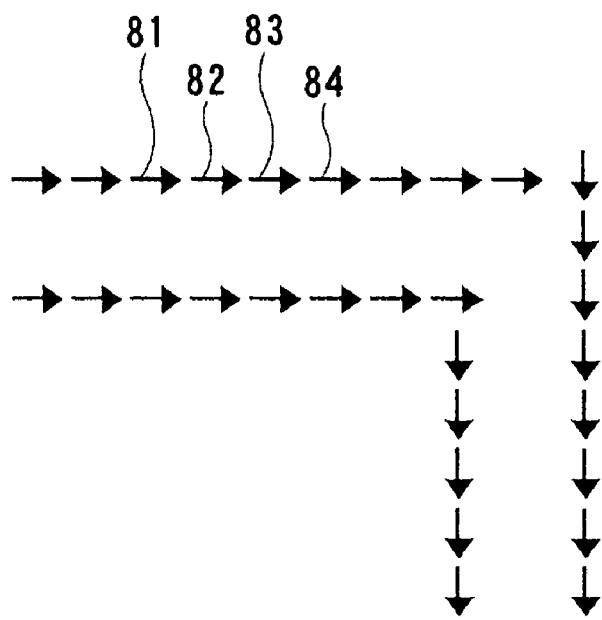
FIG. 61A is a diagram showing an example of the edges of the reference pattern.
Figure 61B:
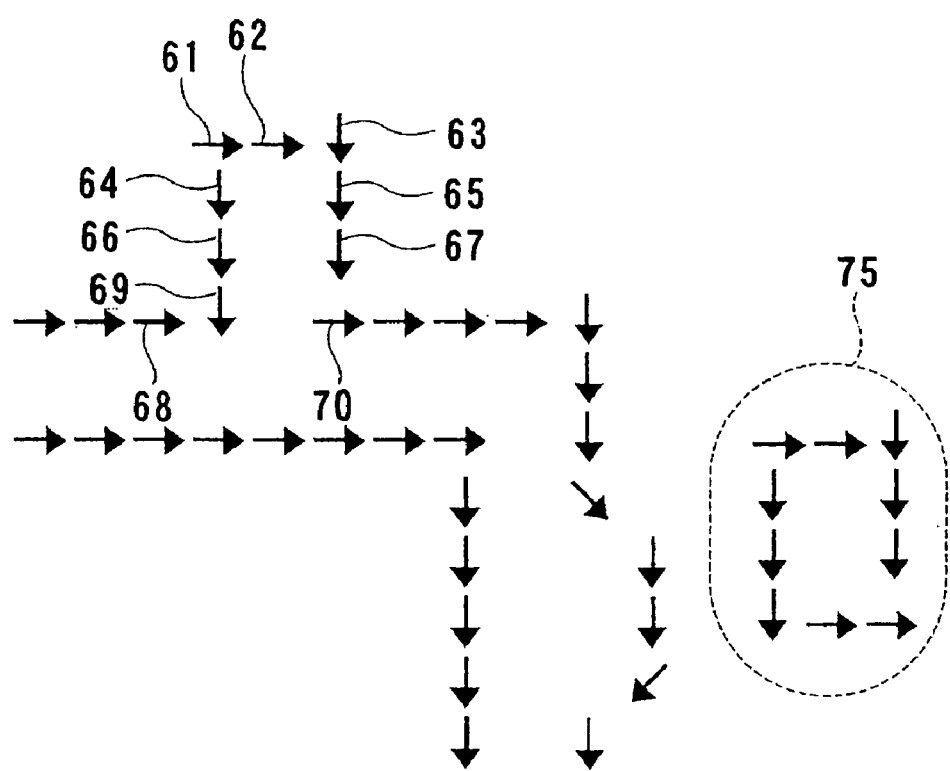
FIG. 61B is a diagram showing an example of the edges of the image of the pattern to-be-inspected.

FIG. 61A is a diagram showing an example of the edge of the reference pattern, and FIG. 61B is a diagram showing an example of the edge of the image of the pattern to-be-inspected corresponding to the reference pattern in FIG. 61A. The establishing of correspondence of both the edges will be described in FIGS. 61A and 61B. In this example, the allowable pattern deformation quantity is set to one pixel, and the allowable directional difference between edges is set to 60 degrees. For example, when an edge of the image of the pattern to-be-inspected corresponding to an edge 81 of the reference pattern is searched, because an edge 68 is located within the distance of the allowable pattern deformation quantity from the edge 81 and those directional difference is smaller than the allowable directional difference between edges, the edge 68 is recognized as the corresponding edge to the edge 81. With regard to an edge 84 of the reference pattern also, an edge 70 is recognized as the corresponding edge of the image of the pattern to-be-inspected.

With regard to an edge 82 of the reference pattern, an edge 61 is not located within the distance of the allowable pattern deformation quantity. An edge 64 is not located within the distance of the allowable pattern deformation quantity, and a directional difference is larger than the allowable directional difference between edges. Although edges 66 and 69 exist within the distance of the allowable pattern deformation quantity, those directional differences are not smaller than the allowable directional difference between edges. Therefore, an edge corresponding to the edge 82 cannot be obtained. Similarly, an edge corresponding to an edge 83 cannot be obtained.

Figure 62:
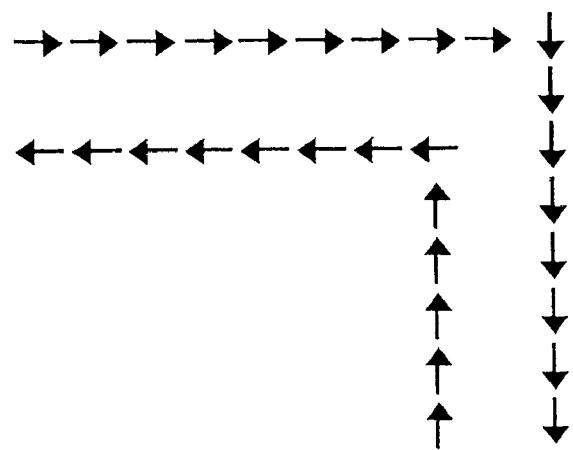
FIG. 62 is a diagram showing another example of the edges of the reference pattern.

In addition, FIGS. 61A and 61B show a method in which the inside and the outside of a pattern are not distinguished and the direction has a value only in a range of 0 to 180 degrees. However, a method in which the inside and the outside of the pattern are distinguished can be used. For example, if the edge direction is determined so that the inside of the pattern is always located on the right-hand side of the edge, the edges of reference pattern in FIG. 61A become the state shown in FIG. 62. Therefore, the establishing of correspondence can be executed more exactly.

Next, the inspection unit 12 performs defect detection (step S320). In order to detect a defect, the following two methods are used.

4.6.1 Method of Recognizing Defect Having Abnormal Pattern Deformation Quantity

Figure 63A:
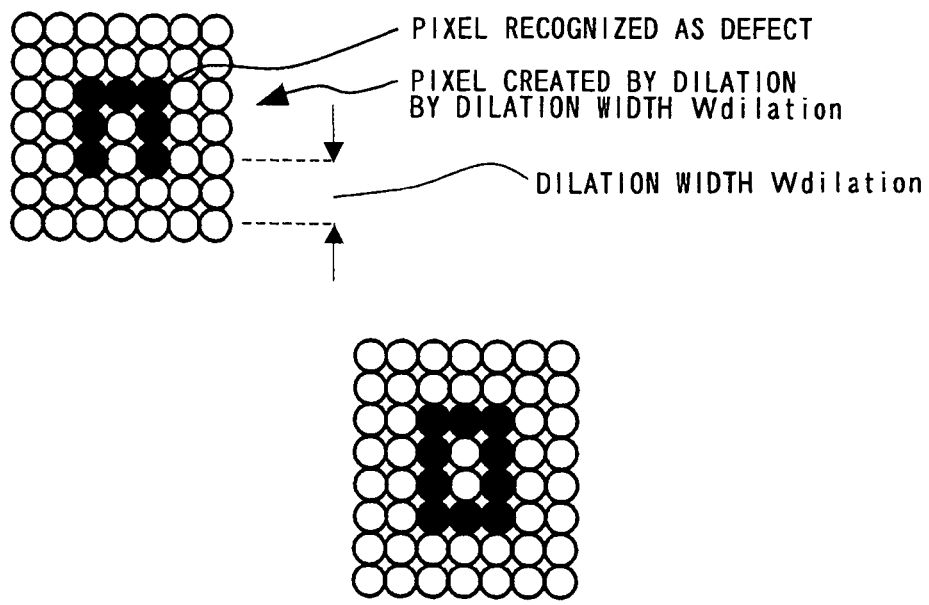
FIGS. 63A and 63B are schematic views showing a method of recognizing a defect having abnormal pattern deformation quantity.
Figure 63B:
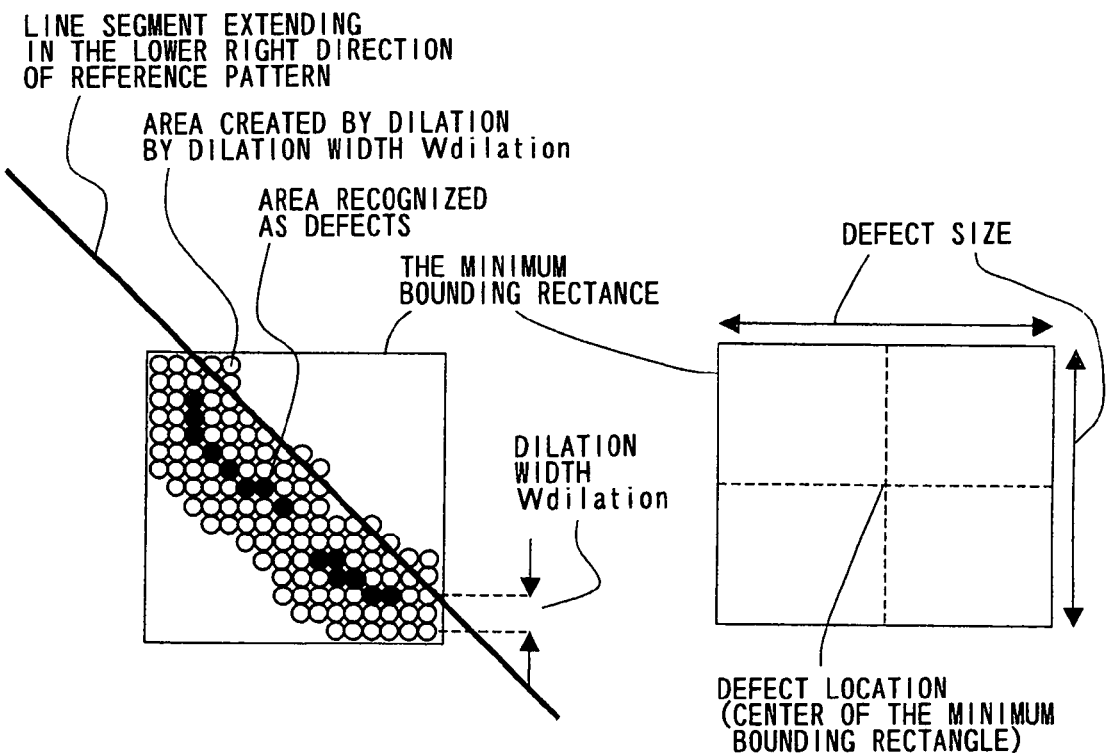

As the first defect detection method, a defect having abnormal pattern deformation quantity is recognized by the following procedure: FIGS. 63A and 63B are schematic views showing a method of recognizing a defect having abnormal pattern deformation quantity. The inspection unit 12 recognizes edges of the image of the pattern to-be-inspected that do not correspond to edges of the reference pattern (for example, the edges 61 to 67, the edge 69, and the edge 75 of FIG. 61B) as defect pixels. A binary bitmap that represents the above defect pixels is obtained.

Next, the obtained binary bitmap is dilated in order to connect defect pixels each other by a dilation width $W_{dilation}$ (in this figure, the dilation width $W_{dilation}$ is two pixels) as shown in FIG. 63A. The dilated binary bitmap is obtained as the result of the dilation operation on the binary bitmap. The dilation operation is a well-known operation used in the mathematical morphology.

As shown in FIG. 63B, when a defect is detected, the defect may be detected in such a state that the defect is divided into a plurality of parts due to noise and the like. In this case, the divided parts are merged by using the dilation width $W_{dilation}$, which is empirically determined, and an area including the merged parts is recognized as a single defect.

The dilation operation and the erosion operation that are well known in the mathematical morphology will be described. The dilation operation δ and the erosion operation ε are operations that make the following results of calculation:

$$\delta_B(A) = \bigcup_{b \in B} (A)_{-b}$$

$$\varepsilon_B(A) = \bigcap_{b \in B} (A)_{-b}$$

In these equations, 'A' is a target image (binary bitmap), and 'B' is a structure element (binary bitmap). '$(A)_{-b}$' means translation of 'A' by '−b'. The symbols ∪, ∩ mean summation operation OR, and product operation AND of binary bitmaps for each b which satisfies b∈B.

Next, the pixels that connect with each other are recognized as one area by the labeling processing. The labeling processing is defined as a method in which a group of connected pixels is formed by writing the same value on the pixels that are being connected at four neighborhoods or eight neighborhoods thereof. By giving different values to groups of connected pixels that are not connected each other, each group of connected pixels can be distinguished. When the group of the connected pixels is recognized as an area containing a defect, the minimum bounding rectangle of the defect is obtained. The minimum bounding rectangle of the defect is defined as a minimum rectangle containing the group of connected pixels.

The above procedure is performed as shown in FIG. 63B. In FIG. 63B, there are discontinuous defects corresponding to a line segment extending in the lower right direction of a reference pattern. These defects are to be a single defect inherently, but appear in a divided state. First, areas that have been recognized as the defects are obtained as a binary image (shown by black pixels). This binary image is dilated by the dilation width $W_{dilation}$ so that a region shown by white pixels is created. Next, the black pixels and the white pixels are recognized as an area by the labeling process, and the minimum rectangle including the obtained recognized area is obtained as the minimum bounding rectangle.

Finally, a center of the minimum bounding rectangle and a size of the minimum bounding rectangle are calculated to obtain a defect location and a defect size. The obtained defect location and the defect size are taken as defect information.

4.6.2 Method of Recognizing Defect Using Luminance Distribution of Pixels

As the second defect detection method, a defect is recognized by the following procedure using luminance distribution of pixels. First, a region is obtained by connecting edges of an image of a pattern to-be-inspected that correspond to a reference pattern. Luminance distribution of pixels existing in the inside of the region and luminance distribution of pixels existing in the outside of the region are obtained. If there is no defect, these luminance distributions should be normal distributions. Therefore, pixels having luminance values that are out of the normal distribution are recognized as defect pixels.

Pixels having luminance values that are out of the normal distribution are obtained, and are recognized as an area by the labeling process, and the minimum rectangle including the recognized area is obtained as the minimum bounding rectangle. Finally, a center of the minimum bounding rectangle and a size of the minimum bounding rectangle are calculated to obtain a defect location and a defect size. The obtained defect location and the defect size are taken as defect information.

Figure 64:
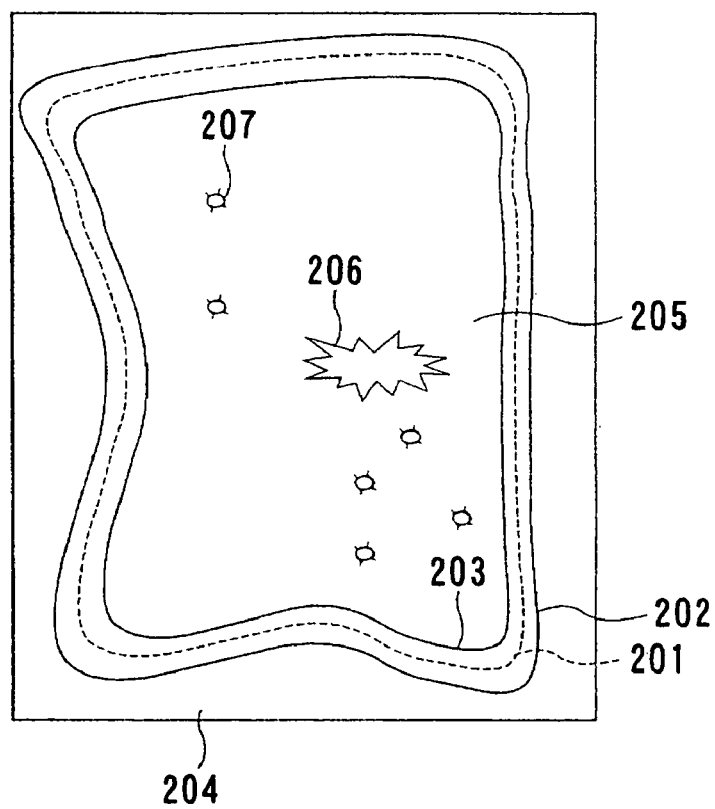
FIG. 64 is a schematic view showing a method of recognizing a defect using luminance distribution of pixels.

FIG. 64 is a schematic view showing a method of recognizing a defect using luminance distribution of pixels. A broken line 201 shows edges of an image of a pattern to-be-inspected. Solid lines 202, 203 on both sides of the broken line 201 are boundaries of a region formed by dilating the edges by a predetermined width, and a part surrounded by the solid lines 202, 203 is determined as an edge area. Luminance values of the ground 204 and the inside 205 of the pattern to-be-inspected roughly constitute the normal distribution.

As shown in FIG. 65, parts D, which are located beyond the ±3σ region of luminance distribution, are very likely to be a defect. Although the parts D also contain a noise, the noise exists in the area in a relatively uniform manner. On the other hand, the defect exists as being clustered. A binarized map in which any pixel having a luminance value corresponding to the parts D is binarized to unity, i.e. (1), and a pixel having other luminance value is binarized to zero is created. The clustered pixels having a luminance value of unity (1) whose size is not more than a specified size (for example, 2×2 pixels) are erased (for example, the clustered pixels 207 of FIG. 64 being erased). For this calculation, the median filter or the like can be used. A window size of these filters should be empirically determined in consideration of a size of a defect that should be detected. The clustered pixels having a luminance value of unity (for example, the clustered pixels 206 in FIG. 64) are recognized as a defect.

The above-mentioned 4.6.1 Method of recognizing defect having abnormal pattern deformation quantity detects a defect existing near the edge of the reference pattern. On the other hand, this method of recognizing a defect using luminance distribution of pixels detects a defect exiting in parts except for the neighborhood of the edges of the reference pattern.

When the defect is detected, defect information (the defect position, the defect size, and the image including the defect) is outputted to the defect-class determination unit 14 (steps S322, S324).

4.7 Method of Determining Defect-Classes Based on Feature Quantity Obtained from Image The defect-class determination unit 14 determines a defect-class using the defect information and information of the defect-class reference database 23 (step S326). Specifically, feature quantities are obtained from part of an image of a pattern to-be-inspected corresponding to a defect and are compared with other feature quantities to recognize the defect-class. The other feature quantities are obtained from parts of images of patterns to-be-inspected corresponding to other defects, and stored in the defect-class reference database 23. The defect-class determination unit 14 outputs the defect information (the defect position, the defect size, and the image including the defect) and the defect-class to the display device 5 and the printer 6 through the output unit 13 (step S328). The defect-class reference database 23 is a database in which the already acquired images have been registered for respective defect-classes.

The defect-class determination unit 14 determines the defect-classes in the following procedure:

Geometrical information, which is a kind of a feature quantity, of connected pixels determined as defects is obtained. By using the geometrical information, a shape feature such as being circular, being elongated, and the like can be recognized, and if the shape is circular, the defect is recognized as an alien substance, or the like. If the shape is elongated, the defect is recognized as a scratch, or the like. The pixels recognized as defects are classified into three parts: pixel inside the pattern to-be-inspected; pixel outside the pattern to-be-inspected; and pixel on the boundary. For each part, the feature quantities of the pixels are obtained by using the pixel luminance values of the image of the pattern to-be-inspected. If the pixel is recognized as an alien substance, whether the alien substance is a metal piece or organic material (for example, human dirt) or the like can be recognized. Specifically, if the alien substance is a metal, it looks bright; and if it is the organic material, it looks dark.

Further, in the case where the alien substance exists in the inside of the pattern to-be-inspected, when the pixels recognized as the alien substance show a large variation in the luminance, it is recognized that the alien substance is likely to exist on the pattern to-be-inspected; when such pixels show a small variation in the luminance, it is recognized that the alien substance is likely to exist beneath the pattern to-be-inspected. This is difficult processing for the conventional die-to-die method, because whether the defect is in the inside of the pattern to-be-inspected or the outside of the pattern to-be-inspected is difficult to determine only by using the image of the pattern to-be-inspected. The present method uses these feature quantities to determine the defect-class by a well-known classification method. As the classification method, the k nearest neighbor method can be used.

The above method of determining the defect-class is a method based on a conventional optical method, namely, the ADC (Automatic Defect Classification) of the SEM method. According to this embodiment, the inside and the outside of the pattern to-be-inspected can be clearly recognized by using the design data. Therefore, the feature quantities for each part are obtained correctly, and accuracy of the classification is improved.

4.8 Pattern Deformation Quantities Obtained from the Whole Inspection-Unit-Area Next, the inspection unit 12 obtains pattern deformation quantities from relation between the edge of the image of the pattern to-be-inspected and the edge of the reference pattern that correspond (step S330). The pattern deformation quantities are obtained from part where a defect is not detected. Then, the pattern deformation quantities are outputted to the display device 5 and the printer 6 through the output unit 13 (step S332).

Two kinds of pattern deformation quantities are used. One is pattern deformation quantities obtained from the whole inspection-unit-area, and the other is pattern deformation quantities obtained for each attribute of the reference pattern. As the pattern deformation quantities obtained from the whole inspection-unit-area, an edge placement error, a magnification variation quantity, and a deformation quantity of the line width can be used.

The edge placement error can be calculated as an average value of the vectors d(x,y) between the two edges that correspond. The edge placement error becomes the shift quantity $S_2$ with sub pixel accuracy. The shift quantity $S_2$ to which the shift quantity $S_1$ is added, which was described in the above-mentioned 4.5 Post-matching processing, becomes a shift quantity with sub pixel accuracy. If the error of the XY stage 321 can be neglected, a value of the shift quantity $S_1+S_2$ becomes an edge placement error of pattern to-be-inspected in each inspection-unit-area.

If the error of the XY stage 321 cannot be neglected and inspection is performed with sub pixel accuracy, the value of the shift quantity $S_1+S_2$ is substituted for the shift quantity $S_1$, and the reference pattern is shifted by the shift quantity $S_1$, and then steps S318 through S330 are performed again.

In order to calculate a magnification variation quantity in the X-direction, X-components of the vectors d(x,y) with regard to a line segment of a reference pattern in the vertical direction are approximated by a regression line, and a regression line D(x) is obtained. Then, a gradient of the regression line is taken as the magnification variation quantity in the X-direction. The procedure is the same for the magnification variation quantity in the Y-direction.

Figure 66A:
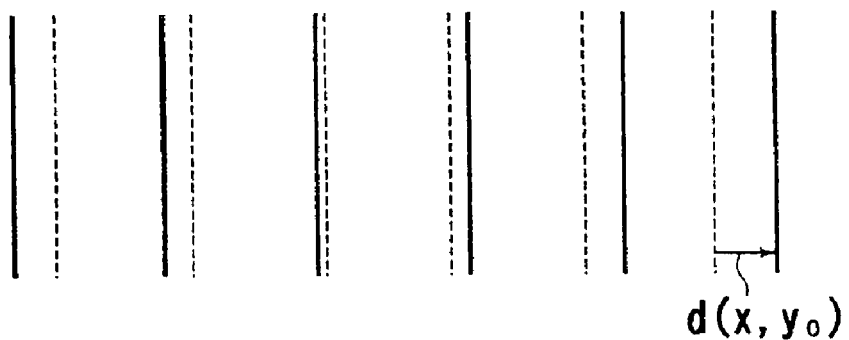
FIG. 66A is a diagram showing an example of edges of a reference pattern and edges of an image of a pattern to-be-inspected.
Figure 66B:
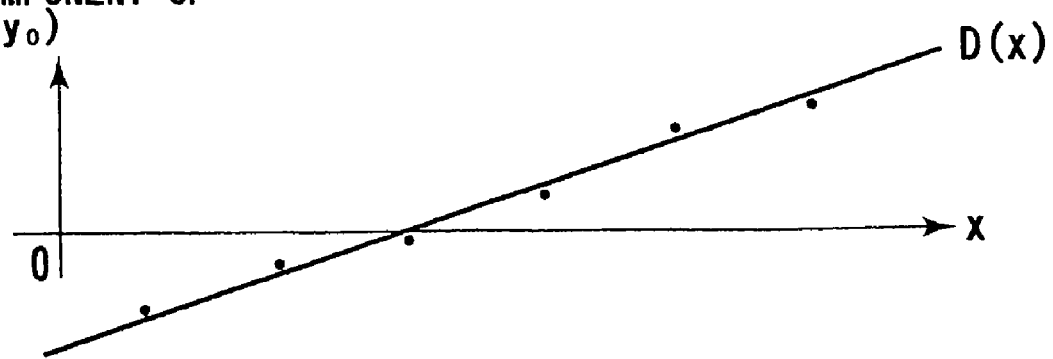
FIG. 66B is a diagram showing an example in which X components of the vectors $d(x,y_0)$ at $y=y_0$ between two edges shown in FIG. 66A are approximated by a regression line $D(x)$.

FIG. 66A is a diagram showing an example of edges of the reference pattern (broken lines) and edges of the image of the pattern to-be-inspected (solid lines), and FIG. 66B is a diagram showing an example in which the X-components of the vectors d(x,$y_0$) between two edges at y=$y_0$ shown in FIG. 66A are approximated by the regression line D(x). When the X-components of the vectors d(x,$y_0$) are approximated by the regression line D(x)=ax+b, the gradient 'a' corresponds to the magnification variation quantity. In the example of FIG. 66A, it is recognized that the patterns to-be-inspected are larger than the reference pattern as a whole.

Figure 67A:
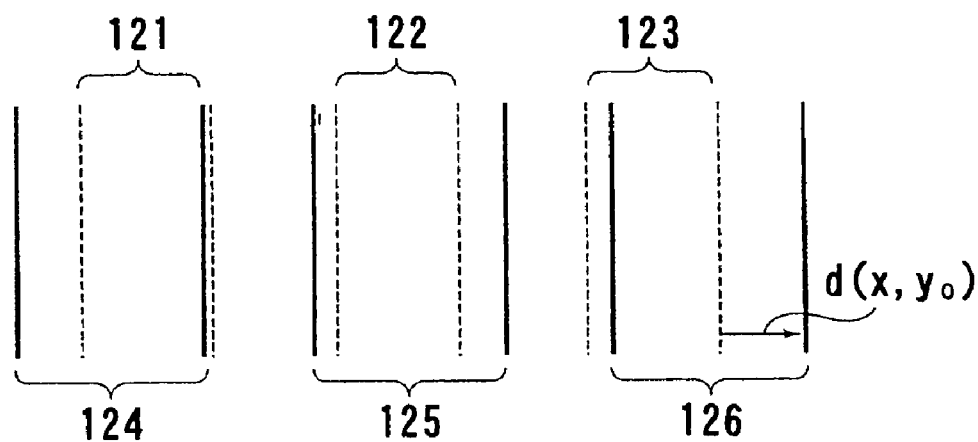
FIG. 67A is a diagram showing another example of the edges of the reference pattern and the edges of the image of the pattern to-be-inspected.
Figure 67B:
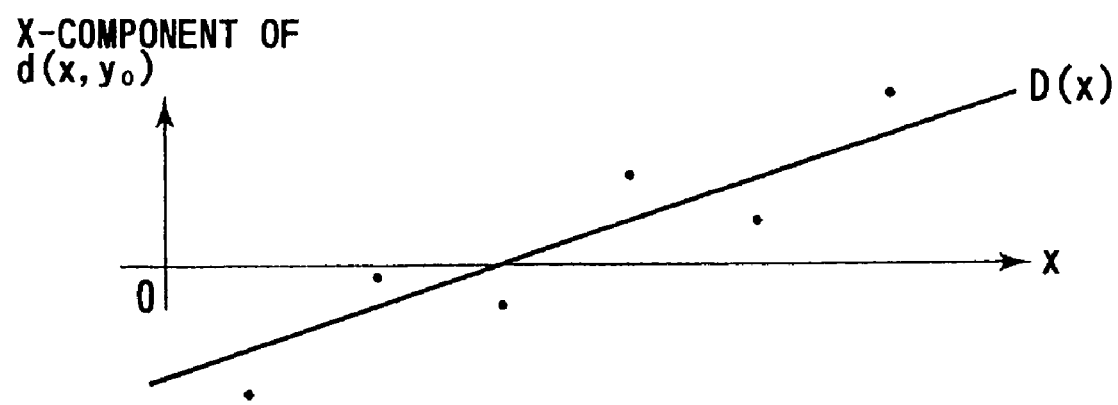
FIG. 67B is a diagram showing an example in which the X-components of the vectors $d(x,y_0)$ at $y=y_0$ between the two edges shown in FIG. 67A are approximated by the regression line $D(x)$.

FIG. 67A is a diagram showing another example of the edges of the reference pattern (broken lines) and the edges of the image of the pattern to-be-inspected (solid lines), and FIG. 67B is a diagram showing an example in which the X-components of the vectors d(x,$y_0$) between the two edges at y=$y_0$ shown in FIG. 67A are approximated by the regression line D(x). In the example of FIG. 67A, in addition to patterns in the image of the pattern to-be-inspected being larger than the reference pattern as a whole, line widths are dilated. In FIG. 67A, line-shaped patters 121, 122, and 123 of the reference pattern correspond to line-shaped patterns 124, 125, and 126 of the image of the pattern to-be-inspected, respectively.

The deformation quantity of the line width in the X-direction can be obtained, for example, by calculating the average value of sign(x,$y_0$) {X-component of d(x,$y_0$)−D(x)}, where sign (x,$y_0$) takes a value of −1 when (x,$y_0$) is positioned on the left side of the line, and takes a value of +1 when (x,$y_0$) is positioned on the right side of the line. In addition, if the standard deviation of sign(x,$y_0$)·{X-component of d(x,$y_0$)−D(x)} is calculated with regard to the deformation quantity of the line width, the standard deviation of the line widths can be obtained.

4.9 Extraction Rules for Attributes of Reference Pattern

Examples of the above-mentioned 3.3 Recipe data "4. The parameters used in the extraction rules for determining attributes of the reference pattern" will be described by using FIG. 68. The line part 171 is extracted as a line segment having a length longer than a predetermined length L. The corner 172 is extracted as a portion positioned in the neighborhood of connecting points where two line parts connect with each other at a predetermined angle (90 degrees, 135 degree, 270 degrees, and the like). The end 173 is extracted as a line segment having a length equal to or shorter than a predetermined length L and having both terminations 173t, 173t which contact the line parts 171, 171 at an angle of 90 degrees. The end 173 and the two line parts 171, 171 form a U shape. The isolated pattern is extracted as a closed figure having an area equal to or smaller than a predetermined area.

4.10 Method of Detecting Defect Using Attributes of Reference Pattern

Figure 68:
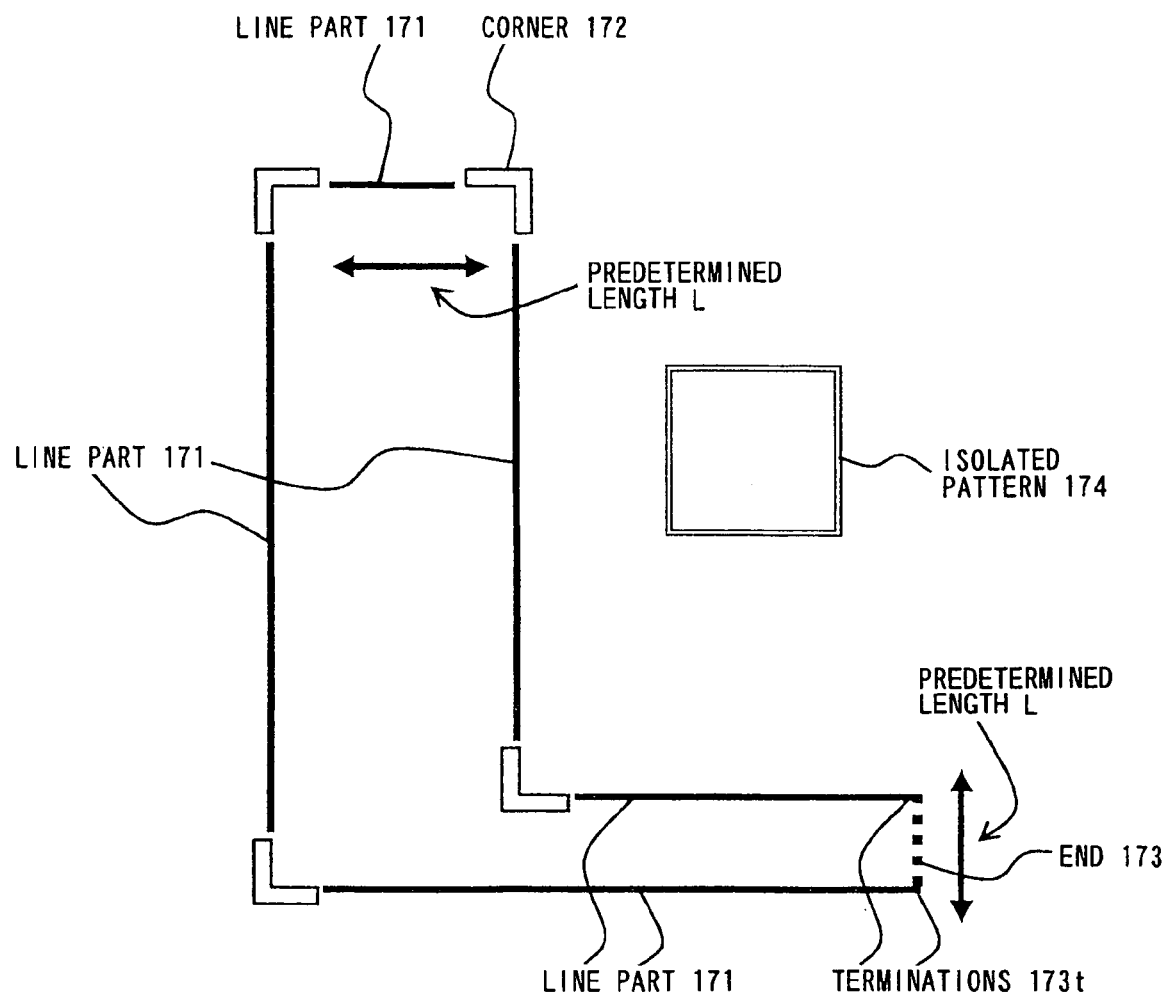
FIG. 68 is a diagram showing an example of attributes of a reference pattern.

As attributes of reference pattern, a line part 171, a corner 172, an end 173, an isolated pattern 174, and the like are used as shown in FIG. 68. The attributes of reference pattern are automatically added to the reference pattern and used at the time of inspection.

As the pattern deformation quantities with regard to the attributes of reference pattern, the followings can be used: the edge placement error, the magnification variation quantity, and the deformation quantity of the line width, which were described in the above-mentioned 4.8 Pattern deformation quantities obtained from the whole inspection-unit-area; in addition, deformation quantities of feature quantities such as a diameter, an area, a length of periphery, a circularity, a moment, and a radius of curvature.

4.10.1 Defect of End Having Edge Placement Error

Figure 69A:
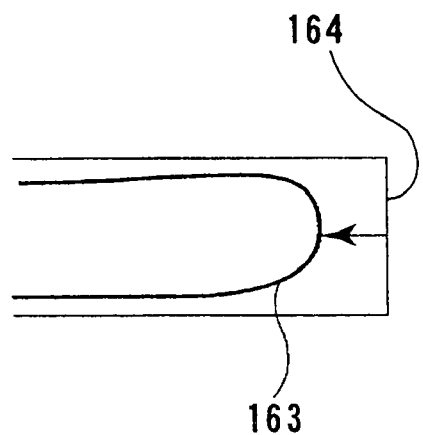
FIGS. 69A and 69B are diagrams showing edge placement errors of an end.
Figure 69B:
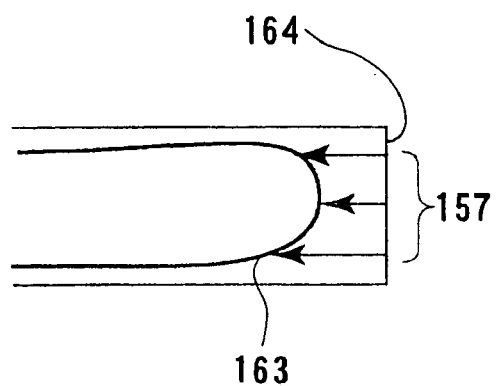

FIGS. 69A and 69B are diagrams showing an edge placement error of an end. As shown in FIG. 69A, the edge placement error of the end is the minimum distance between edges 164, which constitute the end of the reference pattern, and edges 163 of the image of the pattern to-be-inspected.

As an alternative method, as shown in FIG. 69B, an average value, the maximum value, the minimum value, the median, or the like of distances corresponding to a section 157 having an arbitrary length may be used as the edge placement error of the end.

If the edge placement error is not within the allowable edge placement error of an end in the above-mentioned 3.3 Recipe data "2. The limit values of the negative side and the positive side of the allowable pattern deformation quantities", it is recognized that the end has a defect.

4.10.2 Defects of Line Part and Corner Having Edge Placement Error

In FIGS. 69A and 69B, the edge placement error of the end has been described. In addition, with regard to a line part and a corner, the edge placement error can be calculated in the same manner. With regard to the line part, the edge placement error corresponding to the line part is calculated and a defect is detected. With regard to the corner, the edge placement error corresponding to direction at an angle of half of the corner's angle or a specified angle is calculated and a defect is detected.

In these cases, instead of the allowable edge placement error of an edge, the allowable edge placement error of a line part and a corner are used, respectively.

4.10.3 Defects of Isolated Pattern Having Placement Error

Figure 70:
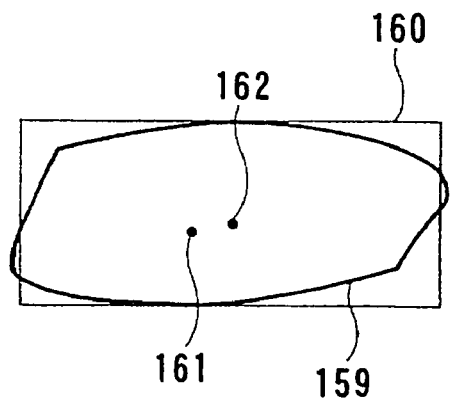
FIG. 70 is a diagram showing a placement error of an isolated pattern.

FIG. 70 is a diagram showing a placement error of an isolated pattern. A placement error is defined as a distance between a centroid 162 of edges 160 of a reference pattern (which forms an isolated pattern) and a centroid 161 of edges 159 of an image of a pattern to-be-inspected (which forms the isolated pattern).

If the placement error is not within the allowable placement error of an isolated pattern in the above-mentioned 3.3 Recipe data "2. The limit values of the negative side and the positive side of the allowable pattern deformation quantities", it is recognized that the isolated pattern has a defect.

4.10.4 Other Defects of Isolated Pattern

Moreover, deformation quantities of feature quantities of the isolated pattern can be inspected. As the feature quantities, a diameter, an area, a length of periphery, the degree of circularity, a moment, and the like can be used. As shown in FIG. 70, the above-mentioned feature quantities of the edges 160 of the reference pattern and the edges 159 of the image of the pattern to-be-inspected are calculated, and then differences between feature quantities of both are inspected to detect a defect.

4.10.5 Defect of Corner Having Abnormal Curvature

Figure 71A:
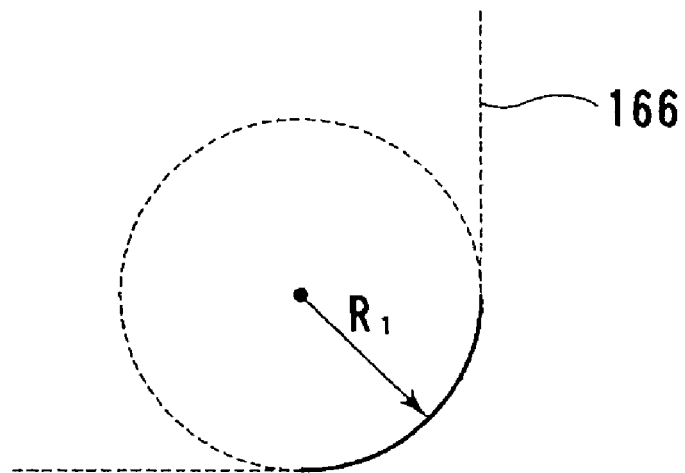
FIG. 71A is a diagram showing an example of edges of a corner of a reference pattern.
Figure 71B:
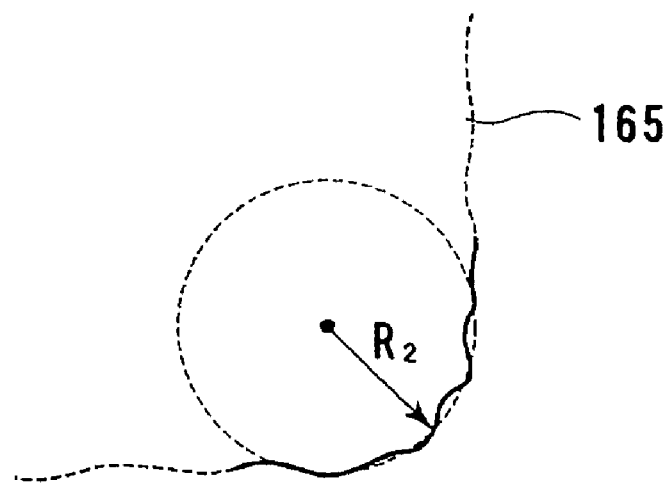
FIG. 71B is a diagram showing an example of edges of a corner of an image of a pattern to-be-inspected.

FIG. 71A is a diagram showing an example of edges of a corner of a reference pattern, and FIG. 71B is a diagram showing an example of edges of a corner of an image of a pattern to-be-inspected. An edge 166 of the corner of the reference pattern shown in FIG. 71A has been rounded off with a radius $R_1$. As a curvature of an edge 165 of the image of the pattern to-be-inspected, a radius $R_2$ of a circle that is approximated by a circle by using the least square method is obtained. Instead of the radius $R_2$, a major axis or minor axis of an ellipse that is approximated by an ellipse by the least square method may be used. A difference between the radius $R_1$ and the radius $R_2$ is inspected to detect a defect.

The above inspection methods are performed simultaneously for a plurality of positions within the field of view. The inspection items are selected according to the above-mentioned 3.3 Recipe data "1. The pattern deformation quantities to be inspected".

4.11 The second edge detection

Figure 76:
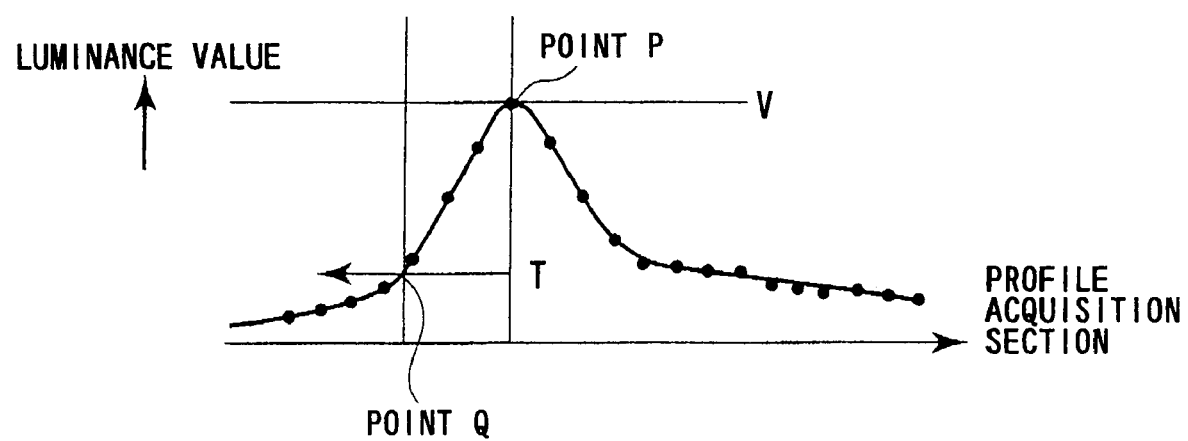
FIG. 76 is a diagram showing an example of a profile.

The inspection unit 12 detects the edge (the second edge) again from the image of the pattern to-be-inspected (step S334). The second edge is detected from a profile obtained from the image of the pattern to-be-inspected. As the second reference pattern, a reference pattern whose edge is a point Q in FIG. 76 is used. On the contrary, in the case of the image having bright edges and having no contrast between the inside of the pattern and the ground, as described in 4.1.2 The first edge detection method 2, as the first reference pattern, a reference pattern whose edge is a point P in FIG. 76 is used. Therefore, the second reference pattern generally differs from the first reference pattern.

Before detecting the second edge of the image of the pattern to-be-inspected, the second reference pattern is shifted by the above-mentioned shift quantity of $S_1+S_2$. Any subsequent processing is performed with the shift quantity keeping.

In order to detect an edge position from the profile, various methods (for example the threshold method, the linear approximation method, and the like) have been disclosed. In this embodiment, the threshold method is used and measurement of a line width that is performed in a CD-SEM is applied to an image of a two-dimensional pattern (an image of a pattern to-be-inspected). However, if the threshold method is replaced with other methods such as the linear approximation method, the processing can be made similarly. The linear approximation method is a method in which the profile is approximated by lines and an intersection is used to detect the edge.

Figure 72:
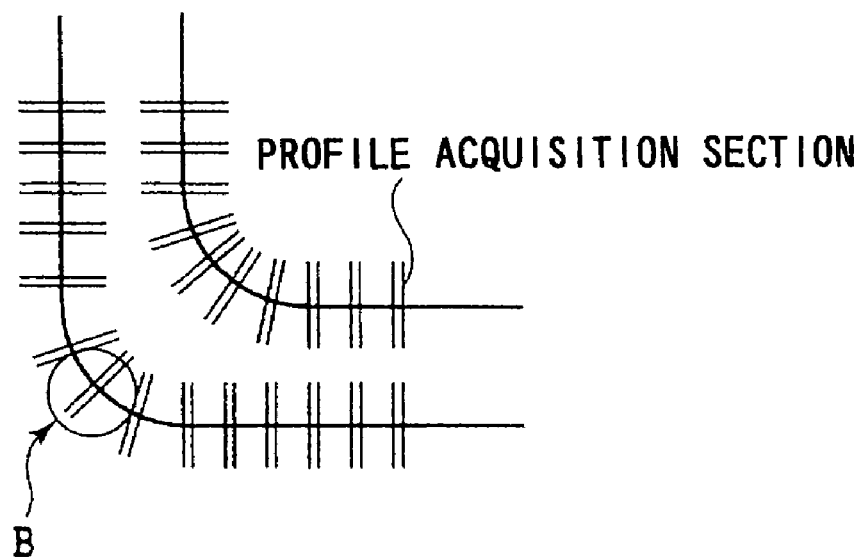
FIG. 72 is a diagram showing an example of profile acquisition sections.

FIG. 72 is a diagram showing an example of profile acquisition sections. As shown in FIG. 72, the profile acquisition sections are perpendicular to edges of the second reference pattern, and the edges of the second reference pattern are center points of the profile acquisition section (double lines in FIG. 72). A length of the profile acquisition section is the above-mentioned 3.3 Recipe data "6. The length of a profile acquisition section", and an interval between the profile acquisition sections is the above-mentioned 3.3 Recipe data "6. The interval between profile acquisition sections".

Figure 73:
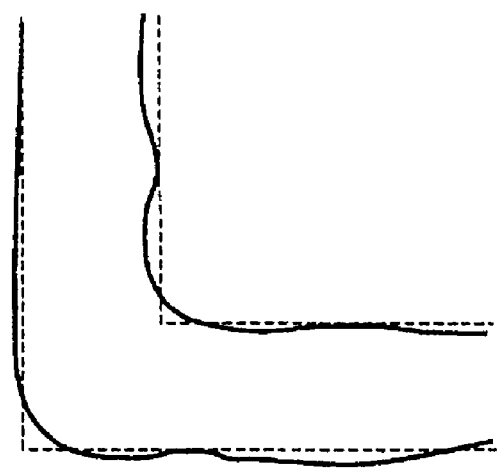
FIG. 73 is a diagram showing a contour of a simulation pattern obtained by a lithography simulator.

In addition, instead of the above-mentioned second reference pattern, as shown in FIG. 73, a contour of an exposed pattern obtained by a lithography simulator (solid lines in FIG. 73) can be used.

Profile data is obtained from a section of the image of the pattern to-be-inspected corresponding to the profile acquisition section for every interval, which is the above-mentioned 3.3 Recipe data "6. The interval between sampling points in a profile acquisition section". The length of the profile acquisition section is set to an arbitrary length longer than the allowable pattern deformation quantity. The interval between sampling points is set to an arbitrary value equal to or smaller than the interval of pixels. For obtaining profile data, the bilinear interpolation, the spline interpolation, or the Fourier series is used.

FIG. 74 is an enlarged diagram of a part of FIG. 72 (portion B) and FIG. 75 is an enlarged diagram of a part of FIG. 74 (portion C). A double line in FIG. 74 or FIG. 75 is the same profile acquisition section in FIG. 72. In FIG. 75, intersections of a grid represent positions of pixels, and solid circles on the profile acquisition section represent positions where luminance values of the profile acquisition section are obtained.

The bilinear interpolation method is a method in which a luminance value I(x,y) at a position (x,y) ($0<x\leq 1$, $0<y\leq 1$) is calculated by the following equation using luminance values I(0,0), I(0,1), I(1,0), and I(1,1) of pixels shown by (0,0), (0,1), (1,0), and (1,1).

$$I(x,y)=\{I(0,0)(1-x)+I(1,0)x\}(1-y)+\{I(0,1)(1-x)+I(1,1)x\}y$$

From the profile obtained by using this equation, the second edge position is detected by using the threshold method. As shown in FIG. 76, the maximum luminance value V and its position P in the profile are obtained. The maximum luminance value V is multiplied by a previously specified coefficient k to obtain a threshold T, and intersections of a line whose luminance value is equal to the threshold T and the profile curve are obtained. From these intersections, an intersection Q, which is located in an outward direction of the pattern to-be-inspected from the point P and is closest to the point P, is obtained. By calculating the intersections Q from all profiles, the second edges are detected.

A cross section of a pattern to-be-inspected formed on a wafer has a trapezoidal shape. By using the coefficient k, it can be set whether measurement is performed at the upper level, the lower level, or the middle level.

For example, in the case of using the coefficient k equal to 0.5, the detected edge exists in a position shifted from an ideal position by a half of an electron beam spot size in the outer direction of the pattern to-be-inspected. The electron beam spot size is defined as a width of a section, in which luminance values are more than a half of the maximum luminance value.

After the second edges are detected, the detected second edges are approximated by curves (including the polygon approximation) to connect the detected second edges. The simplest method is to connect the detected second edges by segment lines (polygonal lines). For example, in the case of using the split-and-merge method disclosed in the following, the detected second edges are smoothly connected by polygon approximation using the least square method. T. Pavlidis and S. L. Horowitz, "Segmentation of plane curves," IEEE Trans. on Computers, Vol. C-23, No. 8, August, 1974. FIG. 77A is a diagram showing examples of the above method.

As an alternative method, a curve approximation of plane data by a two-dimensional spline function using the least square method, as shown in FIG. 77B, can also be used. The former can be processed at high speed, but has little flexibility for a curve containing many rounded parts. On the other hand, the latter can be processed at high speed and can be flexible. Besides the above methods, various methods such as a method in which the Fourier descriptor is used have been disclosed and one of these can be substituted for the above methods.

In addition, the above curve approximation may be performed after detecting the first edges.

As methods of setting the profile acquisition sections, the following two methods can be used. One is the above-mentioned method in which directions and positions for acquiring the profiles are set beforehand by using the second reference pattern. This method is used for the case where the above-mentioned 3.3 Recipe data "6. The flag for indicating whether profile acquisition sections are set at the time of setting recipe data, or are set after detecting the first edges" is "at the time of settling recipe data". In this method, the profile acquisition sections are set uniquely by using the second reference pattern.

As an alternative method of setting the profile acquisition sections, a method in which the profile acquisition sections are adaptively set after detecting the first edges can be used. This method is used for the case where the above-mentioned 3.3 Recipe data "6. The flag for indicating whether profile acquisition sections are set at the time of setting recipe data, or are set after detecting the first edges" is "after detecting the first edges".

Figure 78A:
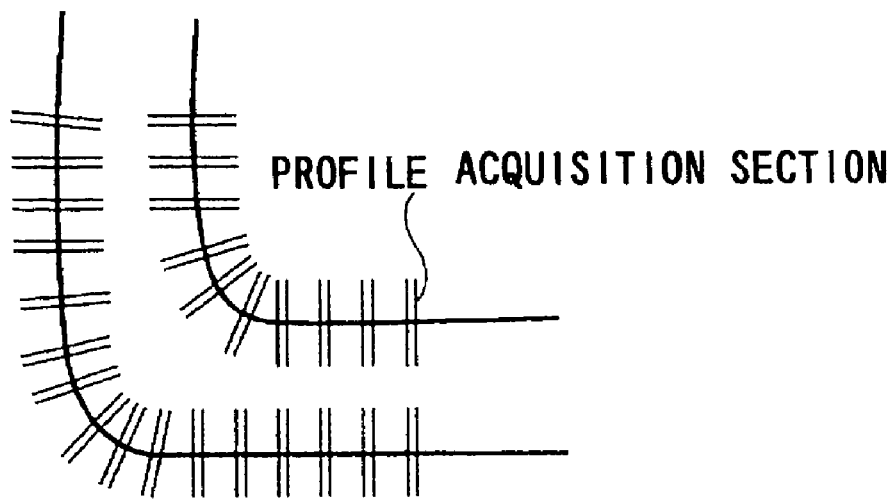
FIG. 78A is a diagram showing another example of the profile acquisition sections.
Figure 78B:
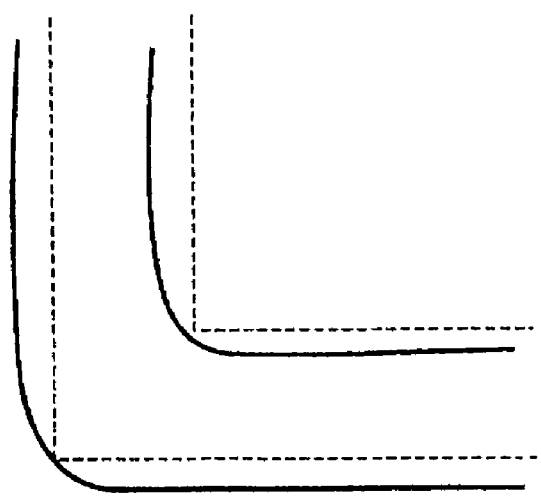
FIG. 78B is a diagram showing an example of relation between the first edges of the image of the pattern to-be-inspected and the second reference pattern.

Specifically, as shown in FIG. 78A, in this method, profile acquisition sections are set in a direction perpendicular to the detected first edges of the image of the pattern to-be-inspected. According to this method, as shown in FIG. 78B, even if the detected first edges (solid lines) of the image of the pattern to-be-inspected are displaced from the above-mentioned second reference pattern (dotted lines), the profile acquisition sections can be shorter than the above-mentioned method. Further, this method can easily follow pattern deformation compared to the above-mentioned method. After the profile acquisition sections are set, the same processing as the above-mentioned method is performed.

4.12 The Second Inspection

After the second edge detection, the inspection unit 12 performs the second inspection (step S336). This inspection (step S336) is the same processing as the steps S320 through S332 in the above-mentioned 4.6 The first inspection except for using the second edge instead of the first edge. In step S318, the inspection unit 12 establishes the correspondence between the edge of the image of the pattern to-be-inspected and the edge of the reference pattern; however, in the second inspection, the correspondence is established by the profile acquisition sections.

The second inspection performs the defect detection, and then obtains the pattern deformation quantity. The shift quantity $S_3$ with regard to the whole image corresponds to the quantity $S_2$ as described in the above-mentioned 4.8 Pattern deformation quantities obtained from the whole inspection-unit-area. The obtained quantity $S_3$ plus the above shift quantity $S_1$ and $S_2$ becomes the total shift quantity between the second reference pattern and the patterns in the image of the pattern to-be-inspected.

In the second inspection, the above-mentioned 4.6.1 Method of recognizing defect having abnormal pattern deformation quantity and the above-mentioned 4.6.2 Method of recognizing defect using luminance distribution of pixels are altered.

In the above-mentioned 4.6.1 Method of recognizing defect having abnormal pattern deformation quantity of the first inspection, the edges of the image of the pattern to-be-inspected that do not correspond to the edges of the reference pattern are recognized as the defect pixels. However, in the second inspection, the profile acquisition sections which do not have edges within the above-mentioned 3.3 Recipe data "2. The limit values of the negative side and the positive side of the allowable pattern deformation quantities" are recognized as a defect.

In the above-mentioned 4.6.2 Method of recognizing defect using luminance distribution of pixels of the above-mentioned first inspection, the region is obtained by connecting the edges of the image of the pattern to-be-inspected that correspond to the reference pattern. However, in second inspection, a region is obtained by connecting the edges of the reference pattern.

If the above basic inspection processing has been performed for all the inspection-unit-areas, the inspection processing is terminated; otherwise the flow goes back to step S308 (step S340).

5. Application Inspection Processing

The foregoing is the basic inspection processing according to the flow chart shown in FIG. 25. In this chapter, application processing expanded based on the basic inspection processing will be described.

5.1 Method of Recognizing Repeated Defects

As described in the above-mentioned 4. Basic Inspection processing, the example of inspection processing for recognizing repeated defects is described in FIG. 27. The inspection processing is an expanded process of the inspection processing according to the flow chart shown in FIG. 25.

5.1.1 The first method of recognizing repeated defects

As the first method of recognizing repeated defects, the following procedures are performed:

First, the block A of the preparation process before inspection is performed. Next, defects are detected by the block B of the inspection process for an inspection area in each semiconductor device, and then the detected defects are merged (step S402). The block A and the block B of FIG. 27 are identical to the block A and the block B of FIG. 26, respectively. The steps S302 to S306 in the block A are identical to the steps S302 to S306 of FIG. 25. Further, the steps S308 to S336 in the block B are identical to the steps S308 to S336 of FIG. 25.

In the block B, after the step S336, the step S338 for outputting the defect information to the defect information storage unit 24 is added. Addition of step S338 is different from FIG. 25. The step S340 in the block B is identical to the step S340 of FIG. 25. The inspection-unit-areas in the step S340 are obtained by dividing the inspection area represented by the coordinate system used in the design data, and the inspection-unit-areas in each semiconductor device are inspected.

In the case where the inspection area larger than the inspection-unit-area shown in FIG. 23 is inspected, a defect existing in a plurality of the inspection-unit-areas may be detected in such a state that the defect is divided into a plurality of portions. By merging these divided portions of the defect, division of the defect by the boundaries between the inspection-unit-areas can be eliminated.

Figure 79:
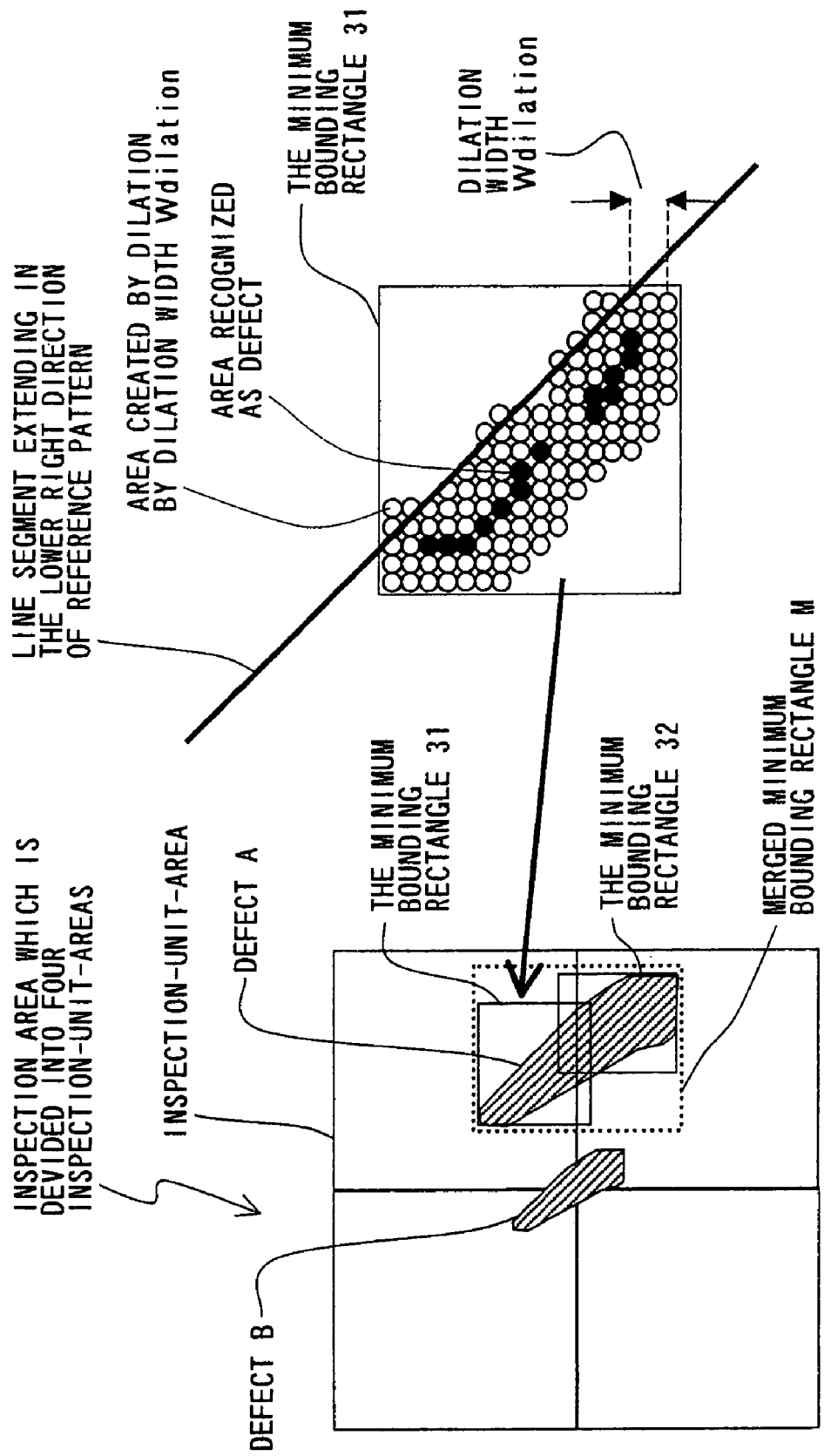
FIG. 79 is a schematic view showing an example in which an inspection area is divided into four inspection-unit-areas.

FIG. 79 is a schematic view showing an example in which an inspection area is divided into four inspection-unit-areas. A defect A lies across an inspection-unit-area on the upper right side and an inspection-unit-area on the lower right side. First, the minimum bounding rectangle 31 of a part of the defect A located in the inspection-unit-area on the upper right side and the minimum bounding rectangle 32 of a part of the defect A located in the inspection-unit-area on the lower right side are obtained. The minimum bounding rectangle 31 and the minimum bounding rectangle 32 are obtained by the procedure shown in FIG. 63B.

Next, overlapping check of the minimum bounding rectangles included in all of the inspection-unit-areas that constitute the inspection area is performed. If the minimum bounding rectangles overlap, the minimum bounding rectangle including all the overlapped minimum bounding rectangles is taken as the merged minimum bounding rectangle. In this example, the minimum bounding rectangle M is obtained as the merged minimum bounding rectangle from the minimum bounding rectangle 31 and the minimum bounding rectangle 32. In FIG. 79, although the minimum bounding rectangle M (shown by dotted line), the minimum bounding rectangle 31, and the minimum bounding rectangle 32 should be overlapped partially, the minimum bounding rectangle M is drawn slightly larger for simple drawing.

Similarly, the defect B lying across four inspection-unit-areas may be merged. In this case, the four minimum bounding rectangles are merged as a single minimum bounding rectangle (step S402). The defect information existing in the obtained minimum bounding rectangle is merged, and the merged defect information is stored in the defect information storage unit 24 (step S403).

After checking whether all the inspection of the semiconductor device to-be-inspected has been completed (step S404), if it is judged that all the inspection has been completed, repeated defects are recognized (step S406). The defect information obtained from the same inspection areas in each semiconductor device, which has been fabricated based on the same design data, and is represented in a coordinate system used in the design data. The defect information is stored in the defect information storage unit 24 by step S338.

Figure 80:
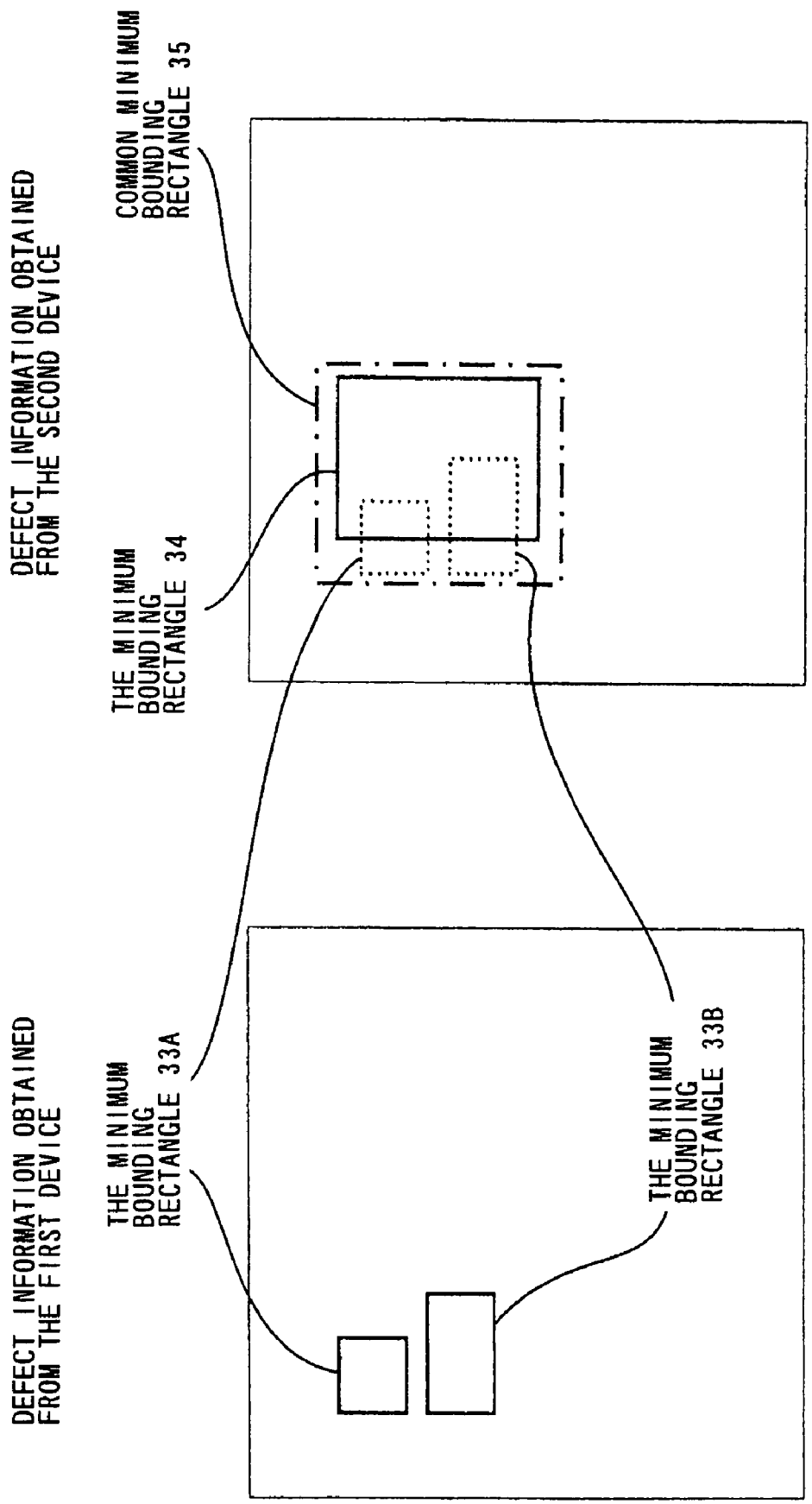
FIG. 80 is a schematic view showing defect information obtained from the first semiconductor device and defect information obtained from the second semiconductor device.

FIG. 80 is a schematic view showing defect information obtained from the first semiconductor device and defect information obtained from the second semiconductor device. When the defect information obtained from the first semiconductor device and the defect information obtained from the second semiconductor device are superimposed, it is recognized that the minimum bounding rectangle 33A and the minimum bounding rectangle 33B overlap with the minimum bounding rectangle 34. This processing is well known as processing of the Boolean operation. The common minimum bounding rectangle 35 is obtained as the minimum bounding rectangle including these three minimum bounding rectangles. Defects, which are not shown in the figure, in the common minimum bounding rectangle 35 are recognized as defects that exist commonly in a plurality of semiconductor devices, i.e. repeated defects.

This means that there exist the repeated defects in the common minimum bounding rectangle 35, the defects have been detected as the divided minimum bounding rectangle 33A and the minimum bounding rectangle 33B due to noise or the like in the first semiconductor device, and the defect has been detected as the single minimum bounding rectangle 34 in the second semiconductor device. The shift of the minimum bounding rectangle 33A and the minimum bounding rectangle 33B from the minimum bounding rectangle 34 means that the defects have been detected at a slightly different position.

The above processing can be performed in the case of using defect information that has been obtained from N semiconductor devices including at least three semiconductor devices. In this case, when the minimum bounding rectangles obtained from semiconductor devices of not less than M overlap each other, repeated defects are recognized. The number M is in the range of two to N. The larger M is, the more accurately the repeated defects can be obtained.

The defect information of the repeated defects detected by the above inspection is outputted to the defect information storage unit 24 (step S408). The defect information in the defect information storage unit 24 is outputted to the display device 5 and the printer 6 through the output unit 13 (step S410).

According to this embodiment, huge labor of an operator is made unnecessary, and the defect recognition inaccuracy caused by an operator's mistake can be prevented. In addition, even if a specimen is contaminated, contaminations are not detected as repeated defects, because the contaminations seldom or never exist at the same location of different devices.

5.1.2 The Second Method of Recognizing Repeated Defects

As the second method of recognizing repeated defects, defect information is obtained from the entire inspection area in at least one of semiconductor devices, and then defect information is obtained by inspecting an area of another semiconductor device corresponding to the defect locations in the defect information obtained from the above inspected semiconductor device and its neighborhood. Then, repeated defects are recognized.

In this embodiment, a method in which defect information is obtained from the entire inspection area in the first semiconductor device, and then defect information is obtained by inspecting an area of the second semiconductor device corresponding to the defect locations in the defect information obtained from the first semiconductor device and its neighborhood will be described.

As the first step, with regard to the first semiconductor device, the block A, the block B, the step S402, and the step S403 are performed. On the left-hand side of FIG. 81, defect information of the first semiconductor device obtained from the step S403 is shown schematically. An image of a pattern to-be-inspected corresponding to the minimum bounding rectangle 41 obtained from the first semiconductor device and its neighborhood is acquired from the second semiconductor device, and the defect is inspected from the image. On the right-hand side of FIG. 81, defect information in limited areas is shown schematically as defect information obtained from the second semiconductor device.

As the second step, the defect information obtained from the first semiconductor device and the defect information from the second semiconductor device are superimposed. In FIG. 81, the minimum bounding rectangle 41 overlaps with the minimum bounding rectangle 42A and the minimum bounding rectangle 42B. Next, the minimum bounding rectangle including these three minimum bounding rectangles is obtained as the common minimum bounding rectangle 43. Defects, which are not shown in the figure, in the common minimum bounding rectangle 43 are recognized as defects that exist commonly in both semiconductor devices, i.e. repeated defects. The same processing is performed on the minimum bounding rectangle 51.

In this embodiment, the second semiconductor device is inspected in the limited areas with regard to all the defects included in the defect information that have been obtained from the first semiconductor device. In the case where the number of the defects included in the defect information that has been obtained from the first semiconductor device is small, this method is performed faster than the above-mentioned 5.1.1 The first method of recognizing repeated defects.

5.1.3 The Third Method of Recognizing Repeated Defects

As the third method of recognizing repeated defects, a method in which defect information is obtained from the entire inspection area of one semiconductor device, and repeated defects caused by an OPC pattern is recognized can be used. This method can be used in the case where reference patterns, which are related to mask data having the same OPC pattern, are classified by using a cell name of design data.

For example, in FIG. 82, a pattern having a cell name CellA of design data and a pattern having a cell name CellB of the design data are the same; however, these patterns have different OPC patterns. In this case, it is necessary for these patterns of the design data to have different cell names. In the case where these patterns of the design data have the same cell name, combination of the cell name and line segment numbers of the cells used in defect detection is used. In this case, the reference patterns may not be classified strictly. The cell name of the design data means one of native geometric information of the design data. As another native geometric information of the design data, a cell name of mask data corresponding to the design data can be used.

In this embodiment, as the first step, with regard to one semiconductor device, the block A, the block B, the step S402, and the step S403 are performed. On the left-hand side of FIG. 81, defect information of the semiconductor device obtained from the step S403 is shown schematically. A cell name of the design data corresponding to the minimum bounding rectangle 41 obtained from the semiconductor device is obtained. The same processing is performed on the minimum bounding rectangle 51.

As the second step, the defect information is classified by the obtained cell names. If the number of defects belonging to the same cell name is more than one, the defects are recognized as repeated defects caused by an OPC pattern; otherwise, whether the defects are repeated defects is recognized by the above-mentioned 5.1.2 The second method of recognizing repeated defect.

According to this embodiment, in the case where reference patterns which are related to mask data having the same OPC pattern are classified by the cell name of the design data, repeated defects caused by an OPC pattern can be recognized by inspecting one semiconductor device. Consequently, inspection time can be shortened.

5.1.4 The Fourth Method of Recognizing Repeated Defects

FIG. 83 is a schematic view showing an example of a plurality of semiconductor devices that are fabricated based on a photomask having a plurality of the same photomask patterns fabricated based on design data. In this case, semiconductor devices are fabricated by one-time exposure using the photomask. As shown in FIG. 83, an error of the design data causes repeated defects on all the semiconductor devices. On the other hand, a defect on the photomask causes repeated defects on the same location described by the photomask coordinates. As the fourth method of recognizing repeated defects, the following procedure can be used for such semiconductor devices.

In this embodiment, as the first step, with regard to the semiconductor devices fabricated by one-time exposure using the photomask, defect information is obtained and repeated defects are recognized by the above-mentioned 5.1.1 The first method of recognizing repeated defect. The obtained repeated defects are recognized as repeated defects caused by the error of the design data. Next, an unrepeated defect is obtained by removing the repeated defects from all the defects in the defect information.

As the second step, with regard to the semiconductor device fabricated by another one-time exposure using the photomask, defect information is obtained by inspecting the same location, described by the photomask coordinates, of the obtained unrepeated defect and its neighborhood, then the repeated defects are recognized. The above-mentioned 5.1.2 The second method of recognizing repeated defects can be used for the above processing. In this case, instead of using a defect detected from the entire inspection area in at least one of semiconductor devices, the unrepeated defect is used. The repeated defects obtained by the modified 5.1.2 The second method of recognizing repeated defects are recognized as repeated defects caused by the defect on the photomask. A defect except for the obtained repeated defects is recognized as a random defect such as a particle on the semiconductor device.

Generally, the number of the repeated defects caused by the error of the design data is larger than the number of the repeated defects caused by the defect on the photomask. Therefore, by using this embodiment, inspection time can be made shorter than inspection time in the case of using the above-mentioned 5.1.1 The first method of recognizing repeated defects or 5.1.2 The second method of recognizing repeated defects. Further, the defects can be classified into the repeated defects caused by the error of the design data, the repeated defects caused by the defect on the photomask, and the random defect.

5.2 Region Inspection Method

In the above-mentioned 4.6 The first inspection and the above-mentioned 4.12 The second inspection, the design data is simply transformed into the reference pattern. As an alternative inspection method, an inspection method in which a reference pattern suitable for a region inspection method is extracted by using geometrical information of line segments constituting design data, and/or by using relationship between line segments that contact with each other or are located closely to each other can be used. The region inspection method means an inspection method in which edges facing each other are used.

As the region inspection method, methods of inspecting a line width, an average line width, a space width, and an average space width of a line-shaped pattern; a line width, an average line width, a space width, and an average space width of a curvilinear-shaped pattern; a part that is liable to cause an open or bridge defect; and a gate width can be used.

Figure 84:
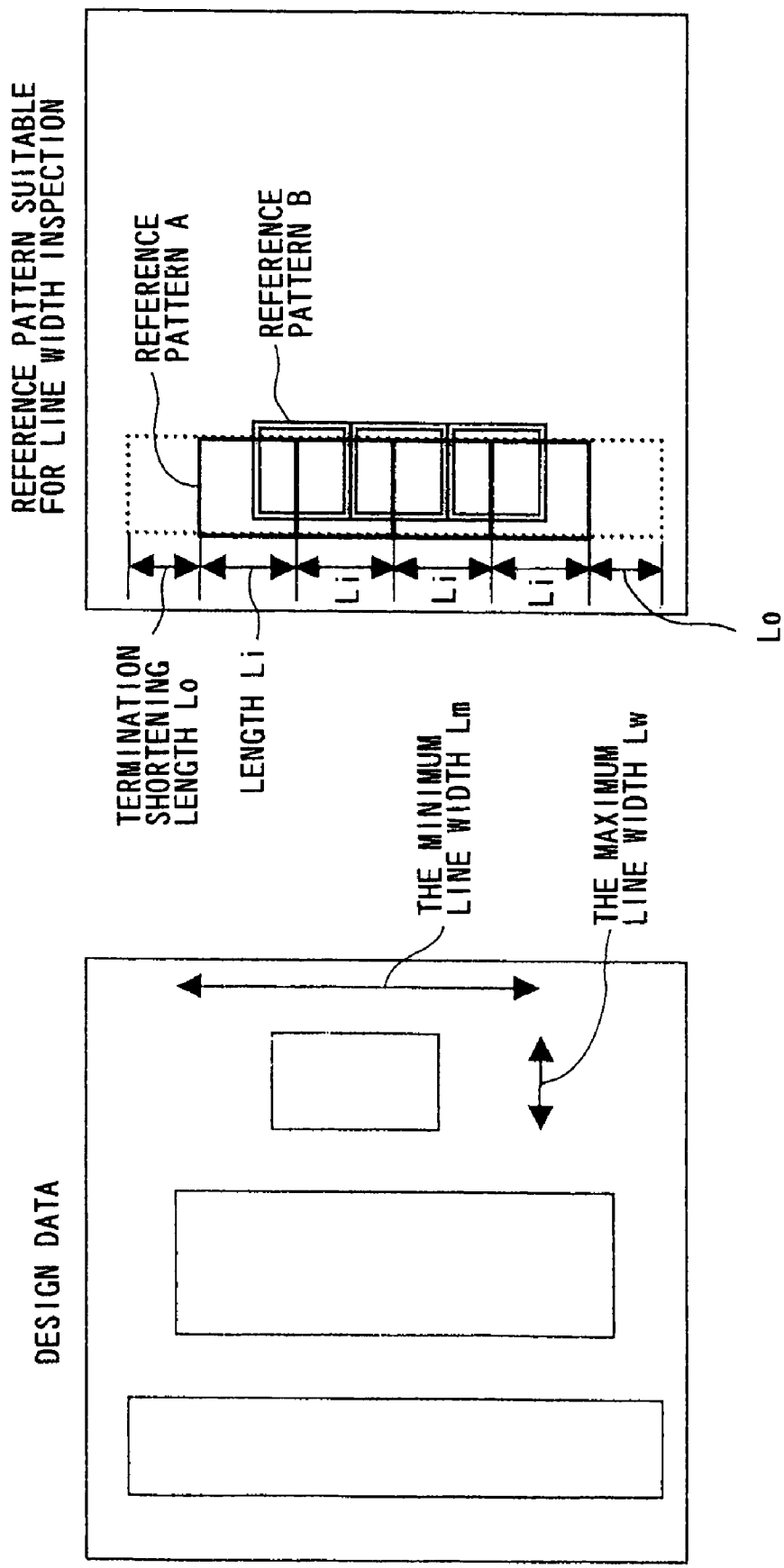
FIG. 84 is a schematic view showing a rule for automatically extracting reference patterns suitable for line width inspection from design data.

5.2.1 Methods of Inspecting Line Width, Average Line Width, Space Width, and Average Space Width of Line-Shaped Pattern A semiconductor device process is controlled by monitoring a line width, an average line width, a space width, or an average space width. According to this embodiment, an inspection method in which a reference pattern suitable for inspection of the line width, the average line width, the space width, or the average space width is extracted from design data; and an allowable pattern deformation quantity for the line width, the average line width, the space width, or the average space width is set to the extracted reference pattern can be used. The inspection method is performed in the following procedure:

FIG. 84 is a schematic view showing a rule for automatically extracting reference patterns suitable for line width inspection from design data. A line-shaped pattern of the design data that has a width smaller than a predetermined maximum line width Lw and has a length longer than a predetermined minimum line length Lm is an object for obtaining a reference pattern suitable for line width inspection. As shown in the left side of FIG. 84, there are three line-shaped patterns in the design data. The left line-shaped pattern can be the object to be processed, but the middle line-shaped pattern cannot be the object to be processed because the middle line-shaped pattern has a width larger than the maximum line width Lw. Further, the right line-shaped pattern cannot be the object to be processed because the right line-shaped pattern has a length shorter than the minimum line length Lm.

Next, as shown on the right-hand side of FIG. 84, the selected line-shaped pattern is shortened from its terminations by a predetermined termination shortening length Lo. The line-shaped pattern is divided into rectangles having a length Li, and the divided rectangles are set as reference patterns A (shown by solid lines) for line width inspection. Further, reference patterns B (shown by double lines) whose centers are located at boundaries between the adjacent reference patterns A for line width inspection may be added for line width inspection.

By addition of the reference patterns B, defect detection capability is improved in the case where a defect exists in the boundaries of the reference patterns A and their neighbors. The higher a ratio of a defect size to a reference pattern size is, the higher defect detection capability is. The ratio of the defect size to the reference pattern size in the case where the defect exists in the one reference pattern is defined as R. Then, two respective ratios of the defect size to the reference pattern size in the case where the defect, which has the same size as the above, exists in the two reference patterns in a divided manner are less than R. Therefore, the defect detection capability is higher in the case where the defect exists in the one reference pattern.

Figure 85:
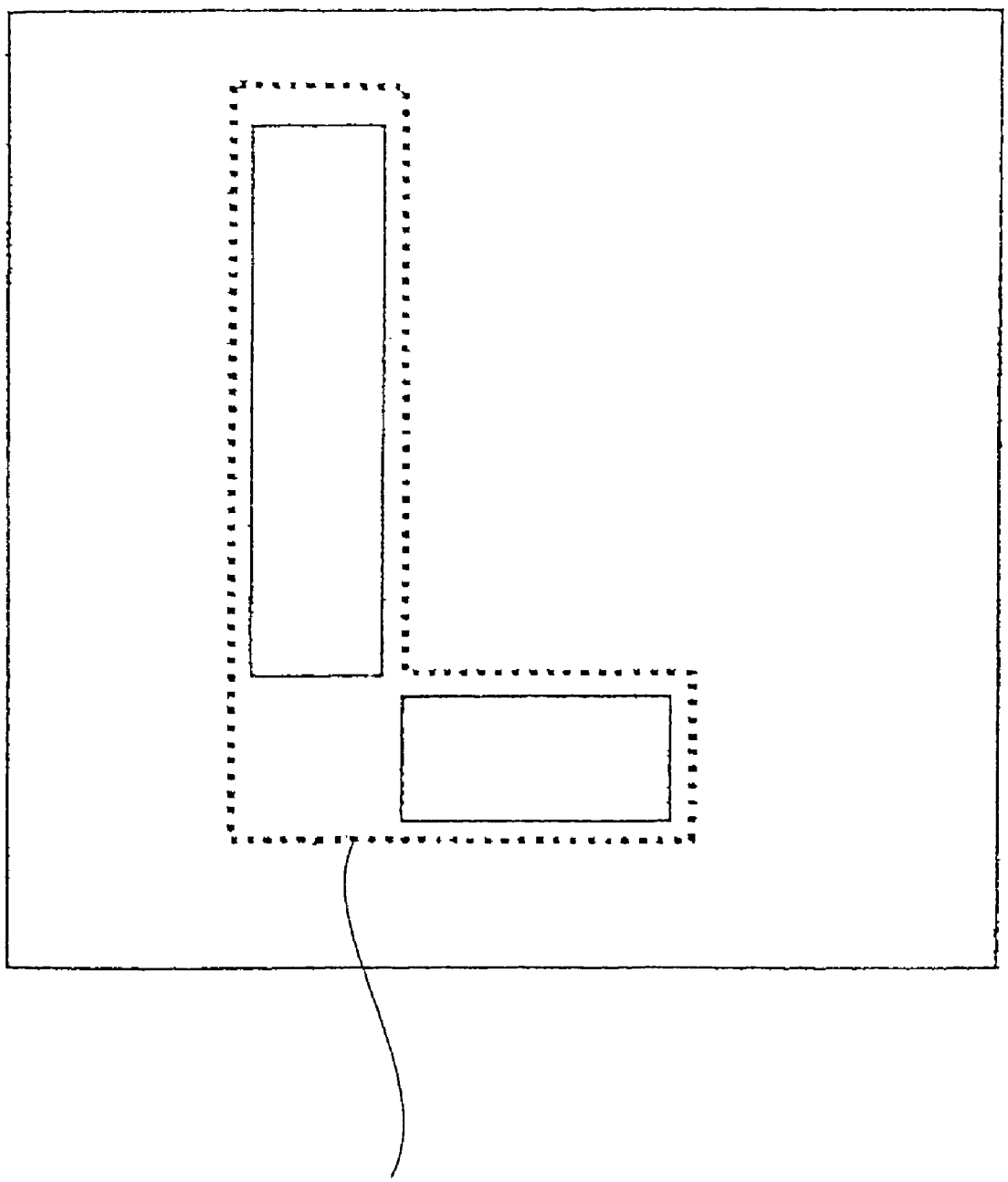
FIG. 85 is a schematic view showing a method of dividing a line-shaped pattern having a corner into two rectangles at a corner portion.

As shown in FIG. 85, a line-shaped pattern of the design data having at least one corner is separated into a plurality of rectangles at the corner, and then the plurality of rectangles is processed. In an example shown in FIG. 85, the line-shaped pattern (L-shaped polygon) having a corner (shown by dotted lines) is separated into two rectangles (shown by the solid lines).

Figure 86:
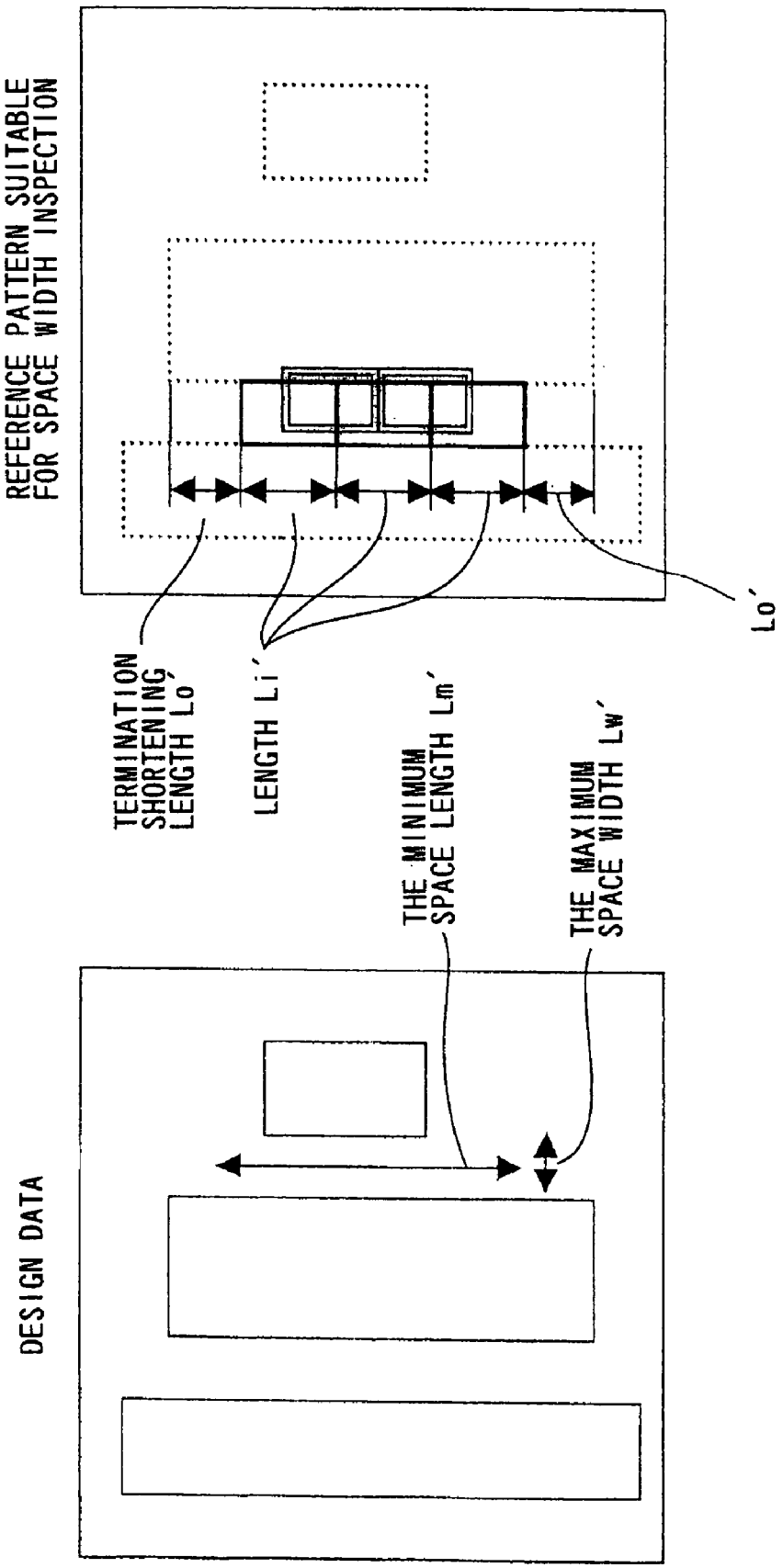
FIG. 86 is a schematic view showing a rule for automatically extracting a reference pattern suitable for space width inspection from design data.

The space width inspection can be realized in the same process described above by using inverted design data. The inverted design data is produced by inverting inside and outside of a pattern in the design data, i.e. inverting the inside into the outside and the outside into the inside. FIG. 86 is a schematic view showing a rule for automatically extracting a reference pattern suitable for space width inspection from design data. As shown in FIG. 86, Lm', Lw', Li', and Lo' are the same as Lm, Lw, Li, Lo, however, the values of Lm', Lw', Li', and Lo' are different from those of Lm, Lw, Li, and Lo. By using these values, the space width inspection may be performed in the same manner as the method described in FIG. 84. The values of Lm, Lw, Li, Lo, Lm', Lw', Li', and Lo' are controlled as the above-mentioned 3.3 Recipe data "5. the maximum line width, the minimum line length, and the termination shortening length of a reference pattern suitable for line width inspection; and the maximum line width, the minimum line length, and the termination shortening length of a reference pattern suitable for space width inspection".

An inspection method in which the reference patterns suitable for line width inspection and the reference patterns suitable for space width inspection are used is performed in the following procedure:

Average edge locations of edges of an image of a pattern to-be-inspected corresponding to line segments in the obtained reference pattern that had existed in the design data are calculated. A distance between the average edge locations is calculated. If a difference between the distance and a line width or space width W of the design data exceeds the above-mentioned 3.3 Recipe data "2. The allowable-pattern deformation quantity of a line width", or "The allowable pattern deformation quantity of a space width", it is recognized that the portion corresponding to the reference pattern has a defect.

Figure 87:
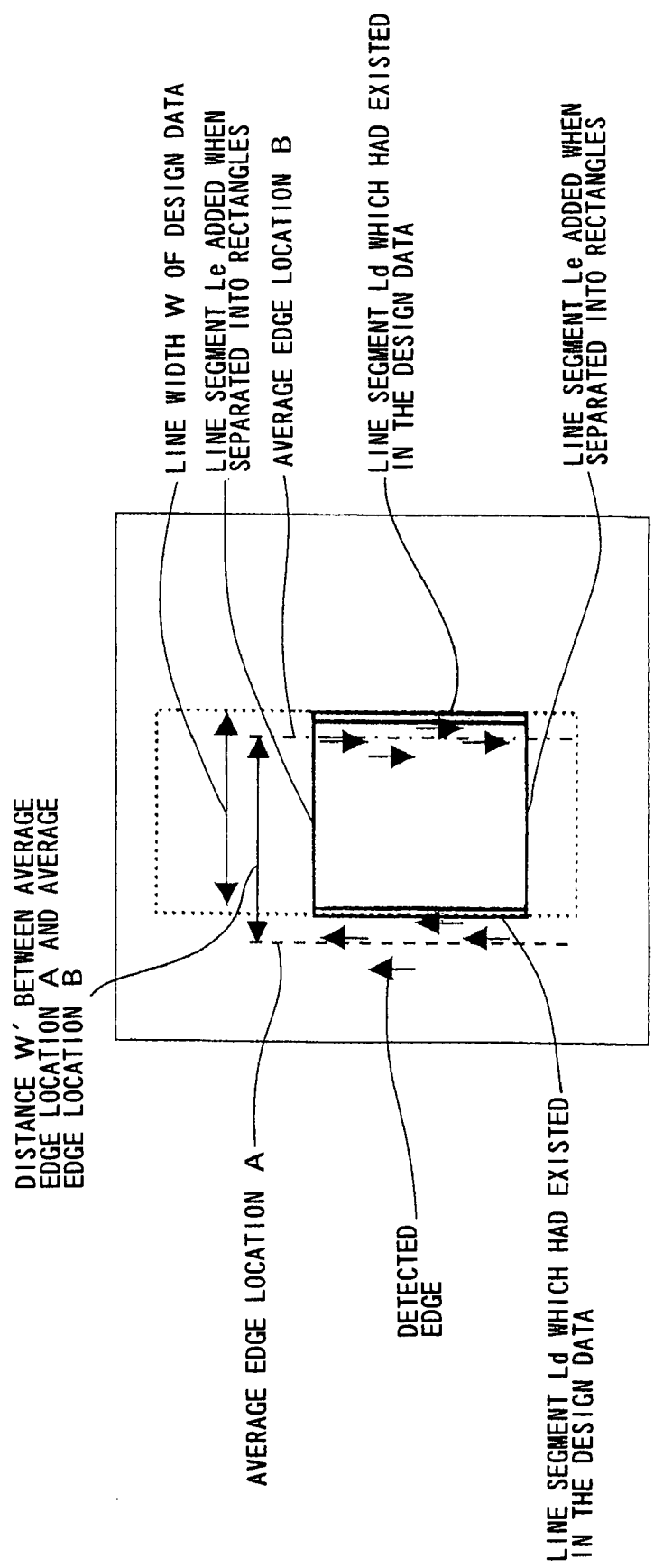
FIG. 87 is a schematic view showing an inspection method which uses a reference pattern suitable for line width inspection and a reference pattern suitable for space width inspection.

FIG. 87 is a schematic view showing the inspection method in which a reference pattern suitable for line width inspection and a reference pattern suitable for space width inspection is used. The reference pattern includes line segments Ld (shown by double lines) which had existed in the design data, and line segments Le added when separated into rectangles. As shown in FIG. 72, profiles are acquired in a direction perpendicular to the line segments Ld, and edges are detected from the profiles as shown in FIG. 76. The detected edge locations are averaged to calculate an average edge location.

As shown in FIG. 87, the left average edge location A and the right average edge location B are calculated. Next, the distance W' between the left average edge location A and the right average edge location B is calculated, and then a difference between the distance W' and the line width W of the design data is calculated. If this difference is larger than the allowable pattern deformation quantity, it is recognized that the portion corresponding to the reference pattern has a defect.

As an alternative method, a method in which all profiles with regard to the line segment Ld are acquired, and these profiles are averaged to obtain an average edge location can be used.

The above description also is made for methods of inspection of the average line width and the average space width. Instead of using the average values, a method in which an individual line width or an individual space width is inspected can be used.

Further, as described later, 5.3.1 Method of inspecting gate line width is a kind of the inspection methods of the line width and the average line width of the line-shaped pattern. In 5.3.1 Method of inspecting gate line width, a method of extracting a gate pattern as a reference pattern suitable for line width inspection is added.

5.2.2 Methods of Inspecting Line Width, Average Line Width, Space Width, and Average Space Width of Curvilinear-Shaped Pattern Methods of inspecting a line width, an average line width, a space width, and an average space width of a curvilinear-shaped pattern that cannot be inspected by the above region inspection methods can be used. A typical example of the curvilinear-shaped pattern is a corner part of design data. Although complex calculation for methods of inspecting a curvilinear-shaped pattern is required, these inspection methods are as important as the above methods for inspecting the line-shaped pattern in order to control a semiconductor device process.

Figure 88:
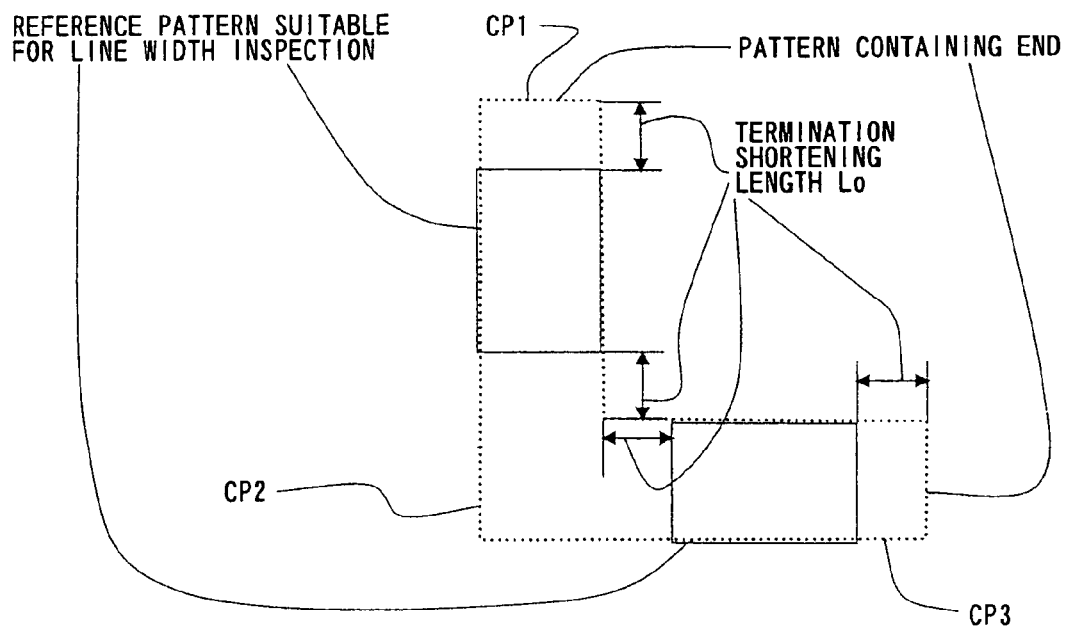
FIG. 88 is a schematic view showing a method of obtaining a reference pattern suitable for line width inspection of a corner part of design data.
Figure 89:
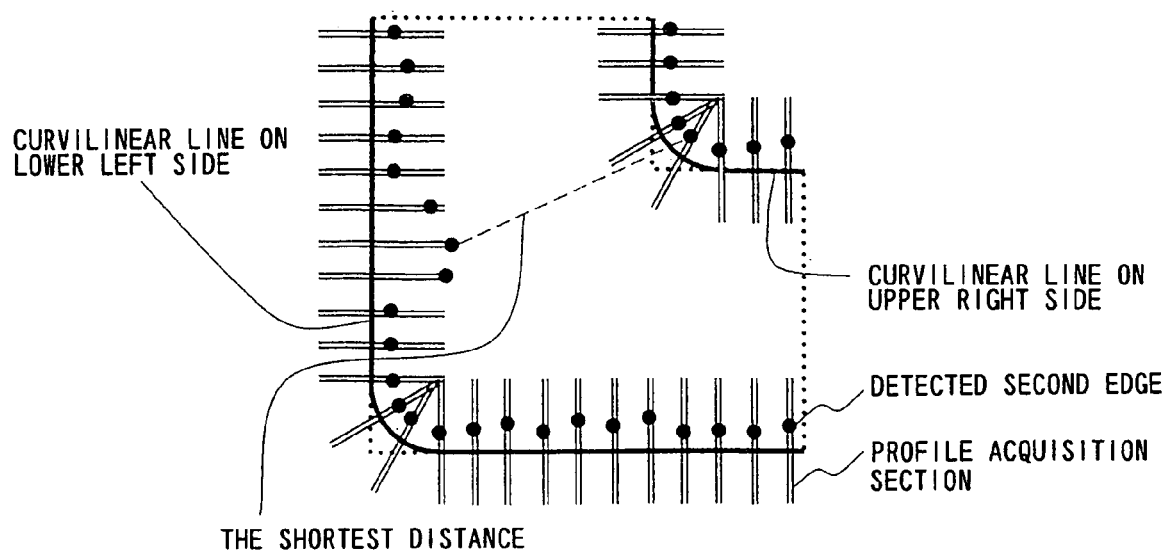
FIG. 89 is a schematic view showing a method of inspecting the minimum line width of a curvilinear-shaped pattern that is the corner part of the design data.

FIG. 88 is a schematic view showing a method of obtaining a reference pattern suitable for line width inspection of a corner part of design data, and FIG. 89 is a schematic view showing a method of inspecting the minimum line width of the curvilinear-shaped pattern that is the corner part of the design data.

As shown in FIG. 88, polygons CP1, CP2, and CP3 are obtained by subtracting reference patterns (two rectangles shown by solid lines) suitable for the line width inspection of the line-shaped pattern from a reference pattern (L-shaped polygon shown by dotted lines) obtained from the design data. The polygon CP2 that does not contain an end is chosen as a reference pattern suitable for line width inspection of a corner part of design data.

A line width to-be-inspected is the minimum distance between curvilinear lines (shown by bold solid lines in FIG. 89 corresponding to the L-shaped line segments having corners rounded off by the curve as shown in FIG. 18) corresponding to line segments that had existed in the design data. First, the second edges (see FIGS. 72 through 76) corresponding to these curvilinear lines are detected. In FIG. 89, double lines represent profile acquisition sections and solid circles (●) represent the detected second edges.

The following procedure is performed for all the detected second edges corresponding to the curvilinear line on the lower left side:

1. Distances from one of the detected second edges corresponding to the curvilinear line on the lower left side to all the detected second edges corresponding to the curvilinear line on the upper right side are calculated.

2. The shortest distance of the above distances is chosen.

In the case where the shortest distance in the obtained distances is shorter than the above-mentioned 3.3 Recipe data "2. The allowable minimum line width", it is recognized that a part corresponding to the reference pattern has a defect. A method of inspecting an average line width may also be performed by calculating an average distance, instead of the shortest distance.

The curvilinear-shaped patterns are composed of a plurality of line-shaped patterns that have different line widths in general. In addition, the curvilinear-shaped patterns are used for connection of circuits. From the above reasons, the method of inspecting the minimum line width is more suitable than the method of inspecting the line width that uses the allowable pattern deformation quantity.

Figure 90:
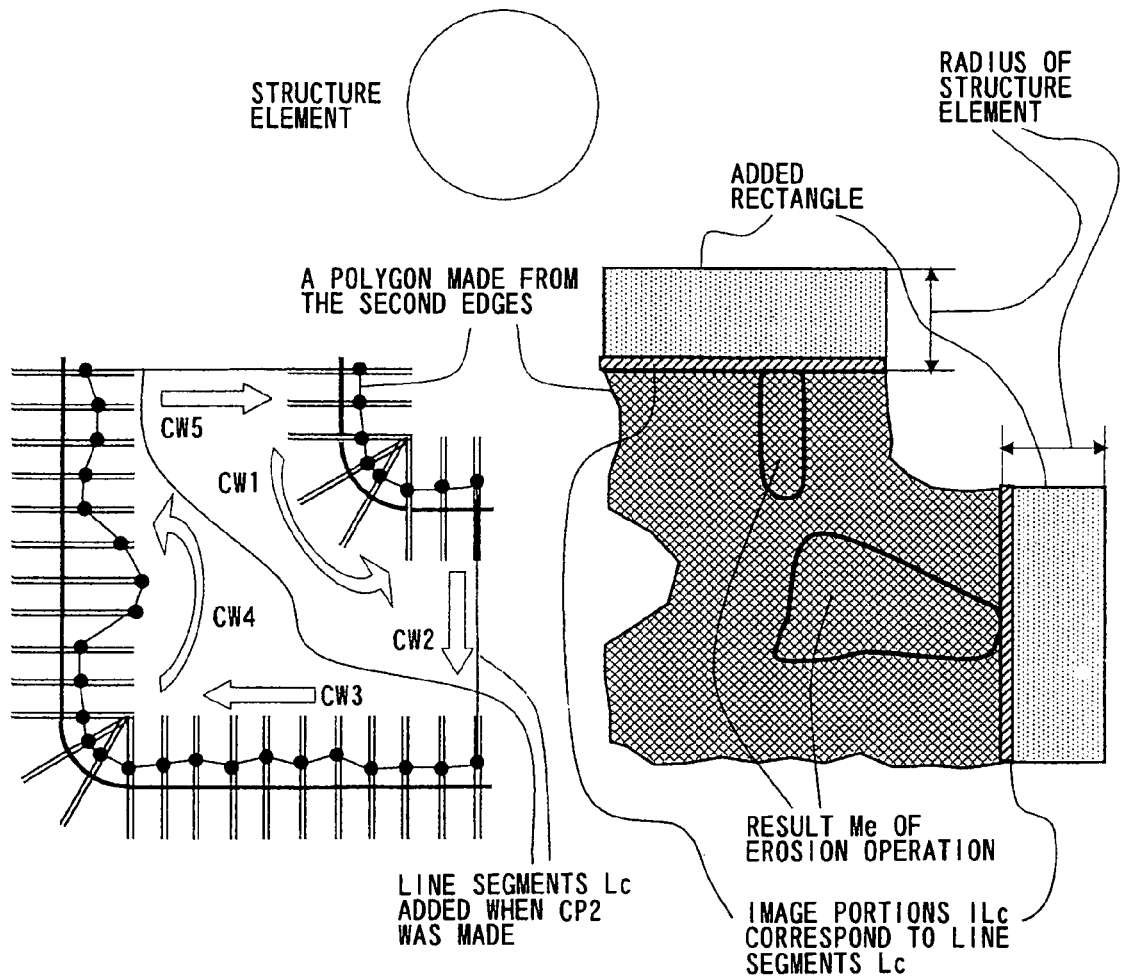
FIG. 90 is a schematic view showing a method of inspecting the minimum line width of a curvilinear-shaped pattern that is the corner part of the design data, using the erosion operation.

An alternative method in which the erosion operation is used can be used. The erosion operation is described in the above-mentioned 4.6.1 Method of recognizing defect having abnormal pattern deformation quantity. FIG. 90 is a schematic view showing a method of inspecting the minimum line width of the curvilinear-shaped pattern that is the corner part of the design data, using the erosion operation. A method of inspecting the minimum line width using the erosion operation is performed in the following procedure:

1. A polygon is made from the detected second edges on the lower left side and the detected second edges on the upper right side with all the detected second edges sequentially connecting clockwise or counterclockwise. In FIG. 90, all the detected second edges are connected sequentially clockwise by line segments as shown by arrows CW1-CW5.

2. The above polygon is transformed into a binary bitmap (a grid-like part in FIG. 90).

3. Rectangles having a width equal to a radius of a structure element, which is used in the erosion operation, are attached to line segments $L_C$ that are added when the polygon CP2 was made (two rectangles shown by dotted parts in FIG. 90).

4. A result of the erosion operation on the above binary bitmap is obtained (the two regions Me surrounded with bold lines in FIG. 90). The structure element used in erosion operation is a circle whose diameter is an absolute value of the above-mentioned 3.3 Recipe data "2. The limits values of the negative side of the allowable pattern deformation quantity of a line width".

5. If portions $IL_C$ of the bitmap corresponding to the line segments $L_C$ are connected through the regions Me, it is recognized that a part corresponding to the reference pattern does not have a defect. However, in this case, the portions $IL_C$ corresponding to the line segments $L_C$ are not connected through the regions Me, and therefore it is recognized that this part has a defect.

As an equivalent process of the above-mentioned steps 1 through 5, the size processing for the polygon shown by the arrows CW1-CW5 may be used. In this case, the line segments $L_C$ are not size-processed, and other line segments in the polygon are size-processed by a half of the absolute value of the above-mentioned 3.3 Recipe data "2. The limits values of the negative side of the allowable pattern deformation quantity of a line width" in order to shrink. If the size-processed polygon has line segments corresponding to both of the line segment $L_C$, it is recognized that a part corresponding to the reference pattern does not have a defect; otherwise it is recognized that this part have a defect.

Although, he above description is made for the method of inspecting the line width, a space width is inspected in the same manner.

According to these embodiments with regard to the region inspections, defect detection capability and defect recognition accuracy can be improved, because the above-mentioned region inspections use a plurality of edge information.

5.2.3 Method of Inspecting Part that is Liable to Cause Open or Bridge Defect

Figure 91:
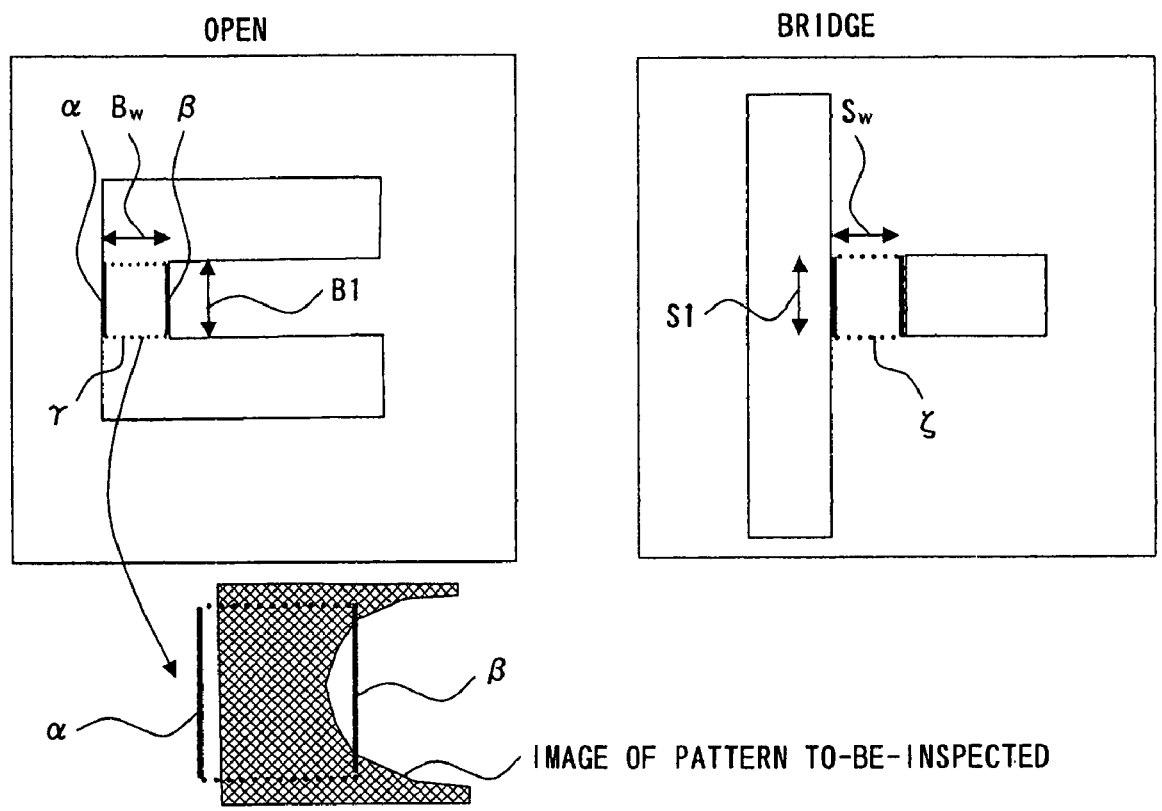
FIG. 91 is a schematic view showing a method of extracting a part that is liable to cause open or bridge.

As a kind of the methods of inspecting the line width of the line-shaped pattern and the space width of the line-shaped pattern, a method of inspecting a part that is liable to cause an open or bridge defect can be used. FIG. 91 is a schematic view showing a method in which a part that is liable to cause an open or bridge defect is extracted. As shown on the right-hand side of FIG. 91, a part (shown by a rectangle γ) of a line-shaped pattern of design data, whose line width is narrower than the above-mentioned 3.3 Recipe data "5. The maximum line width Bw of a part that is liable to cause an open defect", and whose length is shorter than the above-mentioned 3.3 Recipe data "5. The maximum line length Bl of a part that is liable to cause an open defect", is extracted.

The extracted part (shown by the rectangle γ) means a part that is liable to cause open, and the part is set as a reference pattern. The second edge detection is performed with regard to a line segment a and a line segment β, which are both sides of the rectangle γ, in the same manner shown in FIG. 87. The line segment β has corner roundness. Therefore, without using the average line width, an individual line width is inspected.

Similarly, with regard to the part that is liable to cause a bridge defect, as shown on the right-hand side of FIG. 91, a rectangle ζ obtained by using the above-mentioned 3.3 Recipe data "5. The maximum space width Sw of a part that is liable to cause a bridge defect" and 3.3 Recipe data "5. The maximum space length S1 of a part that is liable to cause a bridge defect" is set as the part that is liable to cause bridge, and the space width is inspected.

Figure 92:
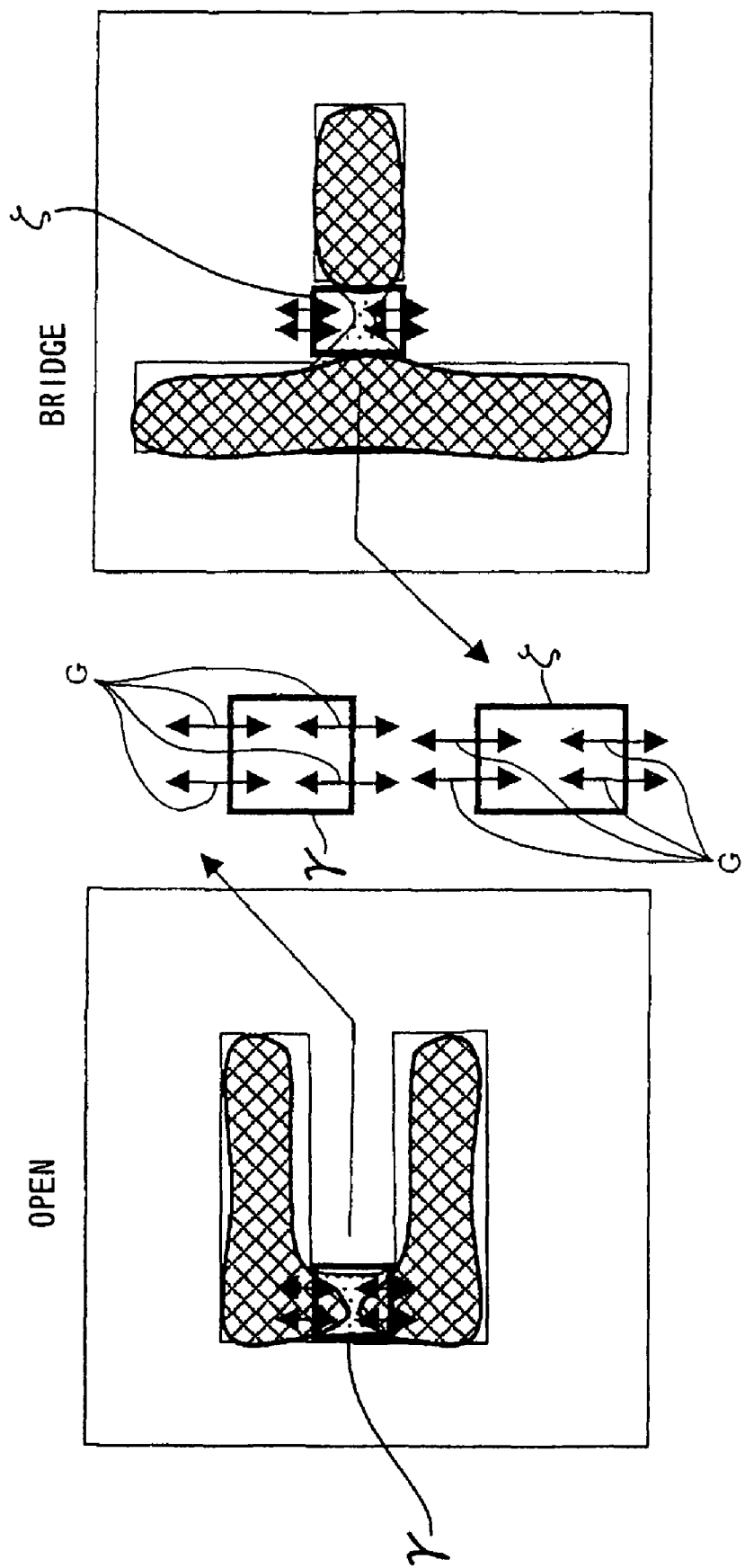
FIG. 92 is a schematic view showing a procedure for inspecting a part that is liable to cause open or bridge.

An alternative method of inspecting a part that is liable to cause an open or bridge defect is performed in the following procedure as shown in FIG. 92:

The left-hand side of FIG. 92 shows schematically a method of inspecting a part that is liable to cause an open defect, and the right-hand side of FIG. 92 shows schematically a method of inspecting a part that is liable to cause a bridge defect. Patterns shown by bold lines in FIG. 92 are the same as the rectangle γ and the rectangle ζ of FIG. 91. Parts of an image of a pattern to-be-inspected corresponding to grid-like parts of FIG. 92 have a high contrast to the ground; however, Parts of the image of the pattern to-be-inspected corresponding to a dotted part have a low contrast to the ground. The dotted part of the left-hand side of FIG. 92 shows open state, and the dotted part of the right-hand side of FIG. 92 shows bridge state.

In such cases, three kinds of edges exist. One of them is an edge that exists in a boundary between the ground and the grid-like parts, another is an edge that exists in the boundary between the ground and the dotted part, and the remaining one is an edge that exists in a boundary between the grid-like parts and the dotted part. In the case of the open defect as shown on the left-hand side of FIG. 92, the edges existing in the boundary between the ground and the dotted part are detected so that a defect cannot be detected. Further, in the case of the bridge defect as shown on the right-hand side of FIG. 92, the edges existing in the boundary between the grid-like parts and the dotted part are detected so that a defect cannot be detected. In either case, a defect existing in the dotted part can be detected in the following manner:

It is inspected whether the second edge exists or not in the eight sections (shown by G) included in the rectangle γ and the rectangle ζ in the direction shown by arrows. The second edge should not exist in these eight sections. Therefore, if the second edge is detected in these eight sections, the rectangle γ or the rectangle ζ is recognized as a defect.

According to this embodiment, an open or bridge defect observed as a weak contrast can be detected. Further, the defect-class having information of an open or bridge defect can be set.

According to these embodiments with regard to the region inspections, inspection for a wide area that cannot be inspected by an operator can be performed.

5.3 Inspection Methods in Which Result of the Boolean Operation on Reference Patterns is Used In the above-mentioned 4.6 The first inspection and the above-mentioned 4.12 The second inspection, inspection is performed by using a reference pattern with regard to a process at the time of the inspection. However, by using inspection methods in which a result of the Boolean operation on a reference pattern with regard to a process at the time of the inspection and a reference pattern with regard to related process of the process at the time of the inspection is used, advanced inspections can be realized.

5.3.1 Method of Inspecting Gate Line Width

As the first inspection method in which a result of the Boolean operation on reference patterns is used, an inspection method in which a reference pattern suitable for region inspection is extracted by using a result of the Boolean operations can be used. As the method, a method of inspecting a gate line width or a method of inspecting an end-cap is performed.

Figure 93:
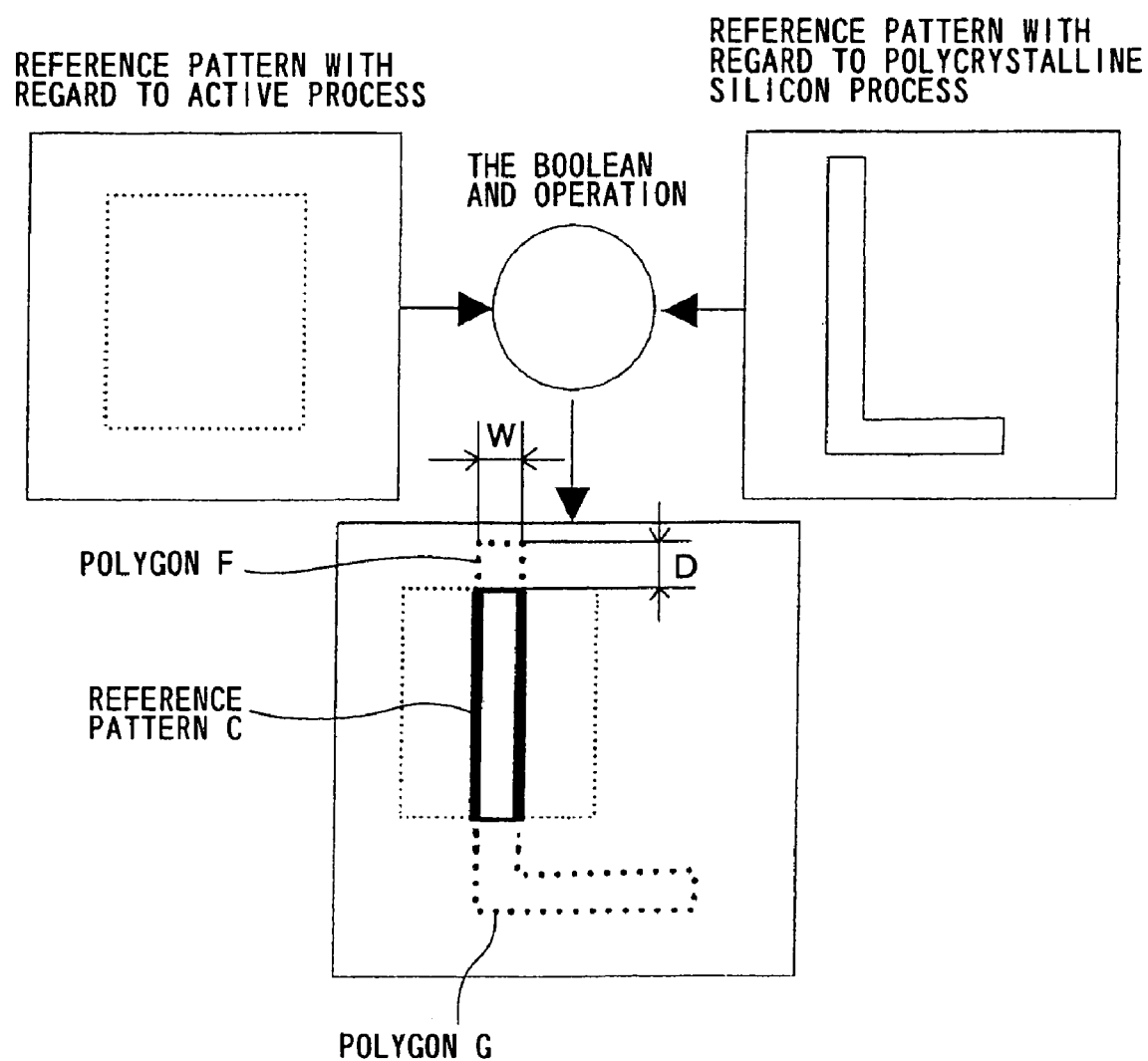
FIG. 93 is a schematic view showing an inspection method in which a reference pattern obtained from a result of the Boolean AND operation on a reference pattern with regard to a process at the time of inspection and a reference pattern with regard to the preceding process or the subsequent process is used.

For inspecting a semiconductor device, a method of inspecting a gate width of a transistor is used. An object of the gate width to-be-inspected is an overlapping part of a reference pattern with regard to a polycrystalline silicon process and a reference pattern with regard to an active process (the preceding process of the polycrystalline silicon process). FIG. 93 is a schematic view showing an inspection method in which a reference pattern obtained from a result of the Boolean AND operation on a reference pattern with regard to a process at the time of inspection (the polycrystalline silicon process) and a reference pattern with regard to the preceding process or the subsequent process (the active process) are used.

A reference pattern C (a rectangle shown by solid lines) is obtained from a result of the Boolean AND operation on a reference pattern with regard to the polycrystalline silicon process and a reference pattern with regard to the active process. The Boolean AND operation used in this calculation is a well-known operation used in computational geometry. The inspection is performed in the same manner as the above-mentioned 5.2.1 Methods of inspecting line width and average line width of line-shaped pattern by using the reference pattern C.

According to this embodiment, the gate portion is automatically extracted. Therefore, all the gate widths of the entire semiconductor device can be automatically inspected, and the inspection can contribute to performance improvement of a semiconductor device.

5.3.2 Method of Inspecting End-Cap

As a kind of methods of inspecting an end, a method of inspecting an end-cap of a gate is used. First, a method of recognizing an end-cap will be described. Polygons are obtained by subtracting the reference pattern C from the reference pattern with regard to the polycrystalline silicon process as shown in FIG. 93. These polygons are a polygon F and a polygon G in FIG. 93. A polygon that satisfies the following conditions is recognized as the end-cap:

1. A polygon is a rectangle whose line width W (in FIG. 93) is a predetermined value or less.

2. A rectangle has a distance D (FIG. 93) between line segments facing each other (one of which is the end), and this distance D has a predetermined value or less.

The polygon that satisfies these conditions is the polygon F. Next, the end in the polygon F is inspected in the same manner as that shown in FIGS. 69A and 69B. An allowable pattern deformation quantity for controlling shrinkage of the end-cap of the gate is smaller than that of a simple end. This is because the effective gate length should be ensured.

According to this embodiment, the end-cap of the gate can be inspected more strictly, because the allowable deformation, which is smaller than the allowable deformation of the simple end, can be automatically set to the end-cap of the gate.

5.3.3 Method in Which Allowable Pattern Deformation Quantity of End of Wiring Pattern to be Connected to Contact Hole/Via Hole is Adaptively Set As the second inspection method in which a result of the Boolean operation on reference patterns is used, a method in which an allowable pattern deformation quantity of end of wiring pattern to be connected to contact hole/via hole is adaptively set can be used. In this method, an end to be connected to a contact hole/via hole, whose margin does not have a certain value, is recognized, and an allowable pattern deformation quantity is adaptively set to the recognized end, and then the end is inspected. FIG. 94 is a schematic view showing the above method.

A contact-area of a contact hole/via hole with an end of a wiring pattern is inspected. Even if an end has the same or similar shape, an allowable pattern deformation quantity for controlling shrinkage of the end to be connected to the contact hole/via hole is smaller than that of a simple end. This is because the contact-area should be ensured.

The allowable pattern deformation quantity of the end of the wiring pattern to be connected to the contact hole/via hole is determined in consideration of an overlay error between a wiring process and a contact hole/via hole process, and a margin of an end. Almost all margins of ends should keep a certain value or larger. However, a margin of an end of dense wiring patterns may not keep the certain value or larger.

A method of recognizing an end to be connected to the contact hole/via hole, whose margin does not have a certain value, is performed as the following procedure:

1. The rectangles shown by solid lines on the upper left side of FIG. 94 that include line segments Lea as ends of the wiring patterns and have a length equal to an allowable pattern deformation quantity in the inward direction of the wiring patterns are produced. Hereafter, these rectangles are called "end neighborhood patterns".

2. Results of the Boolean AND operation on the end neighborhood patterns and reference patterns with regard to a contact hole/via hole process are obtained as a region, which is a rectangle region shown by a dotted part. The end, whose margin may not keep a certain value or larger, generates the region obtained by the Boolean AND operation.

An allowable pattern deformation quantity of the end shrinkage of the wiring pattern related to the generation of the region (dotted part) is made smaller than the allowable pattern deformation quantity of the end shrinkage for other ends. The quantity to be made smaller corresponds to a length A in FIG. 94. An allowable pattern deformation quantity reflected by the length A is adaptively set to the recognized end, and then the end is inspected.

According to this embodiment, the allowable pattern deformation quantity of end shrinkage can be adaptively set according to the margin which the end to be connected to a contact hole/via hole has.

5.3.4 Method of Inspecting Contact-Area

As the third inspection method in which a result of the Boolean operation on reference patterns is used is a method of inspecting a contact-area of a contact hole/via hole and an end of a wiring pattern can be used. FIGS. 95A and 95B are schematic views showing the above method.

First, a reference pattern Rca is obtained by the Boolean AND operation on a reference pattern with regard to a contact hole/via hole process and a reference pattern with regard to a wiring process in the same manner as shown in FIG. 93. The Boolean AND operation is described in 5.3.1 Method of inspecting gate line width.

Next, edges corresponding to segments Ld (shown by double lines) which had existed in the design data are detected in the same manner as shown in FIG. 87. A polygon Pca is obtained by connecting the detected edges. Each line segment shown by a dotted line in FIG. 87 connects a terminal of detected edges corresponding to one of line segments Ld with a terminal of the detected edges corresponding to the other line segment Ld.

Finally, a ratio of an area of the polygon Pca to an area of the reference pattern Rca is calculated. If the ratio is less than the above-mentioned 3.3 Recipe data "2. The allowable contact-area inspection ratio", it is recognized that a part corresponding to the reference pattern Rca has a defect.

5.4 Method of Inspecting Correction Pattern that Should Not be Formed on Wafer

In the above-mentioned 4.6 The first inspection and the above-mentioned 4.12 The second inspection, a pattern that should be formed on a wafer is inspected. As another inspection, a correction pattern that should not be formed on a wafer is inspected. For example, as a kind of OPC pattern, a correction pattern arranged in the neighborhood of a pattern to be corrected is added to mask data. The correction pattern should not be formed on a wafer. However, the correction pattern might be formed as a defect. Although such patterns are used in plenty, currently, there has not been automatic inspection method.

Figure 96A:
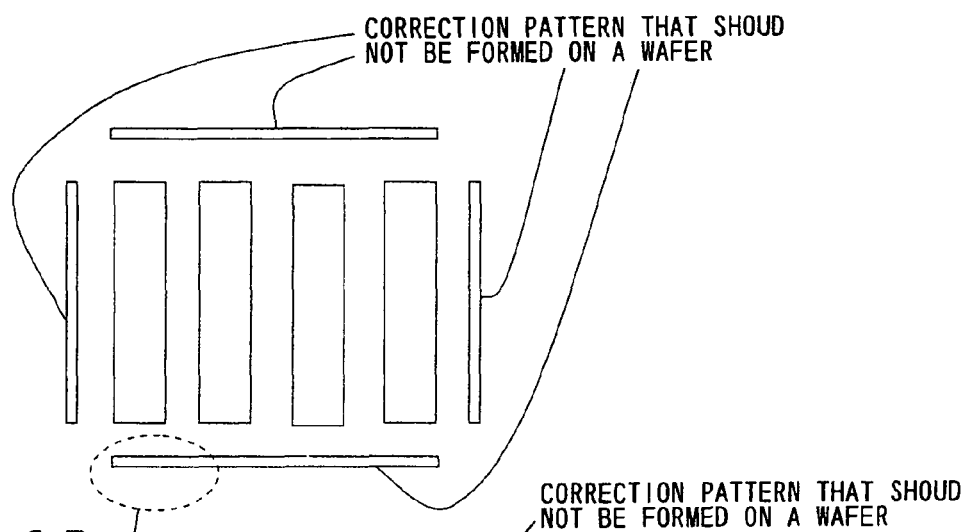
FIG. 96A is a diagram showing an example of correction patterns that should not be formed on a wafer.
Figure 96B:
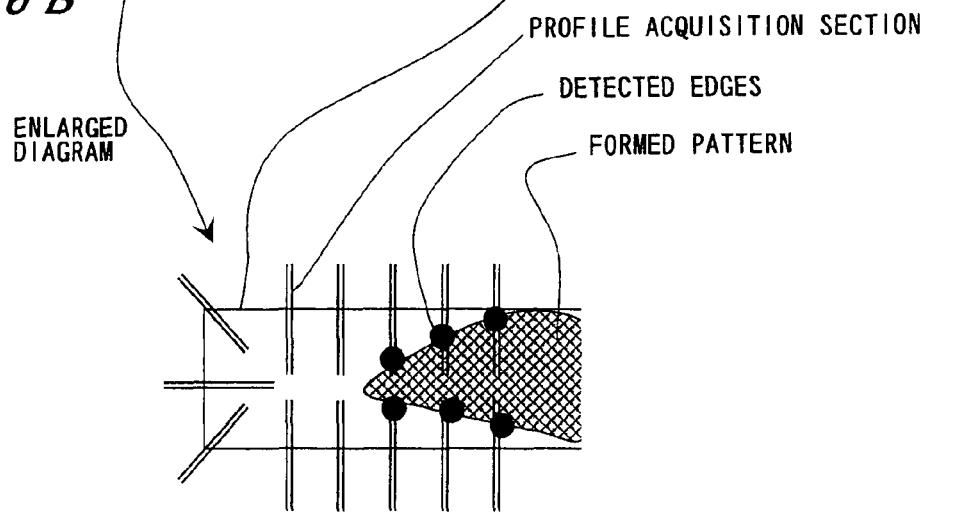
FIG. 96B is a schematic view showing a method of inspecting correction patterns that should not be formed on a wafer.

FIG. 96A is a diagram showing an example of correction patterns that should not be formed on a wafer, and FIG. 96B is a schematic view showing a method of inspecting correction patterns that should not be formed on a wafer. In order to solve this problem, the inspection method is performed in the following procedure:

1. The OPC patterns are converted into reference patterns. In this inspection method, the OPC pattern is used instead of design data.

2. As shown in FIG. 96B, the second edges are detected by using the reference patterns. Such OPC patterns formed on a wafer have far different shapes from the shapes of the reference pattern, even if the OPC patterns are formed. Therefore, it is necessary for profile acquisition sections to be large in order to cover the deformations.

3. If a ratio of the number of the detected second edges to the number of profile acquisition sections is greater than the above-mentioned 3.3 Recipe data "2. The defect judgment coefficient $K_{cp}$ of a correction pattern that should not be formed on a wafer", it is recognized that this part has a defect. The defect judgment coefficient $K_{cp}$ is less than 0.1, and is empirically determined.

According to this embodiment, the method of inspecting the correction pattern that should not be formed on a wafer can be realized by applying the edge detection.

5.5 Inspection Method in Which Inspection Result of Pattern To-Be-Inspected of Standard Semiconductor Device is Used In the above-mentioned 5.3.2 Method of inspecting end-cap and 5.3.3 Method in which allowable pattern deformation quantity of end of wiring pattern to be connected to contact hole/via hole is adaptively set, the allowable deformation quantities of end shrinkage are set by using the design data.

Figure 97:
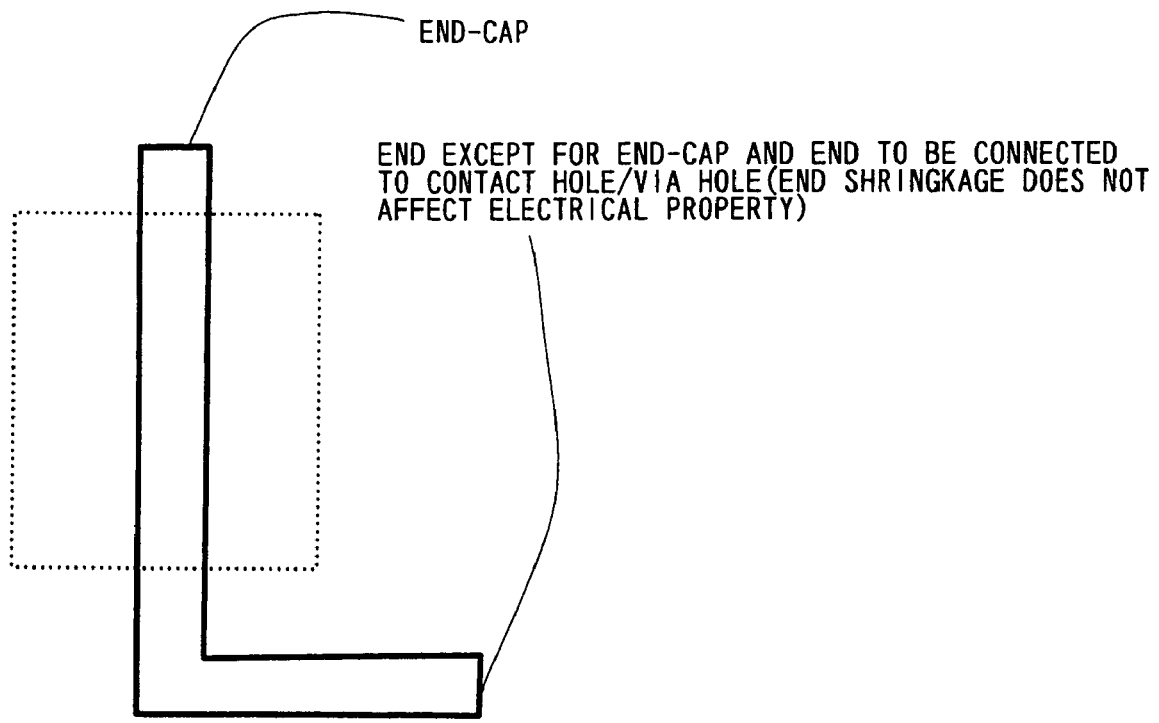
FIG. 97 is a schematic view showing an example of end shrinkage, which is more than an allowable pattern deformation quantity of end shrinkage but is not necessary to be recognized as a defect.

As an alternative method of the above-mentioned methods, a method of inspecting the end shrinkage by using a result of inspection of a pattern to-be-inspected of a standard semiconductor device can be used. An end except for an end-cap and an end of a wiring pattern to be connected to a contact hole/via hole may not be corrected by an OPC pattern correctly. Even if the end is shrunken by more than an allowable pattern deformation quantity for an end-cap or an end of a wiring pattern to be connected to a contact hole/via hole, it is not necessary to recognize the shrunken end as a defect. According to this embodiment, such end, which is shrunken by more than the allowable pattern deformation quantity of end shrinkage, can be ignored. FIG. 97 is a schematic view showing an example of an end, which is shrunken by more than an allowable pattern deformation quantity, but is not necessary to be recognized as a defect.

First, a pattern to-be-inspected of a standard semiconductor device is inspected. The standard semiconductor device means a semiconductor device that is judged to have a good quality by using another inspection method. Although the standard semiconductor device has a good quality, a defect may be detected. The detected defect is called a nuisance defect, which is defined as a defect that is not necessary to be recognized as a defect.

Next, a semiconductor device to-be-inspected is inspected to detect a defect. In the case of the detected defect whose location and size correspond to those of the above-mentioned nuisance defect, the defect is deleted from inspection result. According to this embodiment, generation of nuisance defects can be reduced.

5.6 Method of Obtaining Optimal Allowable Pattern Deformation Quantity by Inspecting Standard Specimen The optimal allowable pattern deformation quantity depends on a desirable electrical property. Therefore, it is necessary to provide a method of obtaining an optimal allowable pattern deformation quantity by inspecting a standard specimen. The standard semiconductor device means a semiconductor device having good quality that is judged by using another inspection method.

Figure 98:
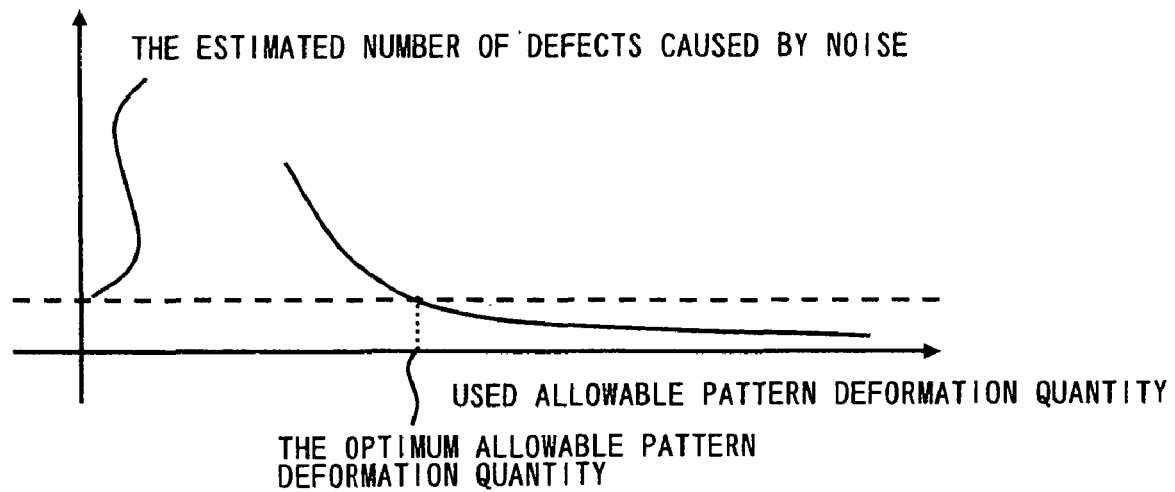
FIG. 98 is a schematic view showing a method of obtaining an optimal allowable pattern deformation quantity.

FIG. 98 is a schematic view showing a method of obtaining an optimal allowable pattern deformation quantity. First, the identical pattern to-be-inspected of a standard specimen is inspected repeatedly in order to obtain inspection results, while altering an allowable pattern deformation quantity successively. In FIG. 98, relationship between the number of detected defects in the inspection results and the employed allowable deformation quantities is shown by a curve.

Next, an allowable pattern deformation quantity, which corresponds to an intersection point of the curve shown in FIG. 98 with an estimated number of defects caused by noise, is taken as the optimal allowable pattern deformation quantity. The estimated number of defects caused by noise is empirically determined.

According to this embodiment, the optimal allowable pattern deformation quantity can be automatically obtained by inspecting a standard specimen.

5.7 Method of Inspecting Patterns Requiring Signal Intensity Correction

In the above-mentioned 4.6 The first inspection and the above-mentioned 4.12 The second inspection, a pattern to-be-inspected is inspected individually. However, in some cases, a distance between two edges of a pattern to-be-inspected is observed to be narrower than the actual width, or to be wider than the actual width due to phenomena caused by a variation in generation rate of charged particles and a variation in capture rate of secondary charged particles. These phenomena appear in parts of patterns to-be-inspected corresponding to proximate line segments and remote line segments of a reference pattern. The proximate line segments are defined as line segments that face each other closest together with a distance between them shorter than a predetermined distance. The remote line segments are defined as line segments that face each other closest together with a distance between them longer than a predetermined distance.

For example, in some cases, a distance between two edges corresponding to the proximate line segments is observed to be wider than the actual width, or a distance between two edges corresponding to the remote line segments is observed to be narrower than the actual width. According to this embodiment, positions of the proximate/remote line segments are corrected and allowable deformation quantities of the proximate/remote line segments are set to different values from those of other line segments of the reference pattern to cancel these phenomena.

Further, in some cases, a distance between two edges corresponding to the remote line segments is shorter than a distance between those in design data, due to a variation in process condition. However, an electrical property of a semiconductor device is not necessarily affected by this shorter distance. In such cases, the allowable deformation quantities of the remote line segments are made larger to neglect the shorter distance.

FIG. 99 is a schematic view showing a method of extracting proximate line segments from reference patterns. The maximum distance between the proximate line segments that requires correction is taken as Dp. First, line segments close to the one shown by a bold line on the right-hand side of a left rectangle in the left frame of FIG. 99 are obtained. Line segments to be obtained face the line segment shown by the bold line, exist in the rightward direction, and correspond to line segments for forming the left sides of the reference patterns (shown by dotted lines in the left frame of FIG. 99).

Next, the line segment Lp (shown by the dotted line) being a part of a central rectangle is selected, because the line segment Lp is located within the distance Dp from the bold line. Finally, the selected line segment Lp is projected on the line segment (shown by the bold line), and an overlapping part is recognized as a proximate line segment to be corrected (shown by a wavy line in the right frame of FIG. 99).

With regard to the proximate line segment, the correction of the position of the line segment is made, and the allowable pattern deformation quantity is set to a different value from those of other line segments. In this case, the position correction quantity or the allowable pattern deformation quantity may be variable according to the distance.

FIG. 100 is a schematic view showing a method of extracting remote line segments from reference patterns. The minimum distance between the remote line segments that requires correction is taken as Dt. First, line segments close to the one shown by a bold line on the right-hand side of a left rectangle in the left frame of FIG. 100 are obtained. Line segments to be obtained face the line segment shown by the bold line, exist in the rightward direction, and correspond to line segments for forming the left sides of reference patterns (shown by dotted lines in the left frame of FIG. 100).

Next, line segments Lt (shown by the dotted lines) are selected, because they are located within the distance Dt from the bold line. Finally, the selected line segments Lt are projected on the line segment (shown by the bold line), and an overlapping part is recognized as a line segment not to be corrected (shown by a wavy line in the right frame of FIG. 100). Finally, the line segment that is a part of the line segment shown by the bold line and is not a part shown by the wavy line is recognized as a remote line segment.

Also with regard to the remote line segment, the correction of the position of the line segment is made, and the allowable pattern deformation quantity is set to a different value from those of other line segments. In this case, the position correction quantity or the allowable pattern deformation quantity may be variable according to the distance. For example, the case where a position correction quantity for a part H is set to a smaller quantity than the position correction quantity for the obtained remote segment and a position correction quantity for the part J is set to zero can be used.

According to this embodiment, by correcting the position of the line segment of the reference pattern or setting the allowable pattern deformation quantity individually, these effects of the above-mentioned phenomena can be reduced.

5.8 Method of Inspecting Pattern To-Be-Inspected Affected by Pattern of Preceding Process In the case where there is a pattern of a lower layer formed in the preceding process of a process at the time of the inspection beneath a pattern to-be-inspected, part of the pattern to-be-inspected where there is a pattern of the lower layer formed in the preceding process of the process at the time of the inspection and part of the pattern to-be-inspected where there is no pattern of the lower layer formed in the preceding process of the process at the time of the inspection have different shapes, and are sometimes observed differently. In order to solve this problem, it is necessary to provide a method in which inspection is performed by using different inspection parameters according to the part of the pattern to-be-inspected where there is the pattern of the lower layer formed in the preceding process of the process at the time of the inspection and the part of the pattern to-be-inspected where there is no pattern of the lower layer formed in the preceding process of the process at the time of the inspection.

Figure 101:
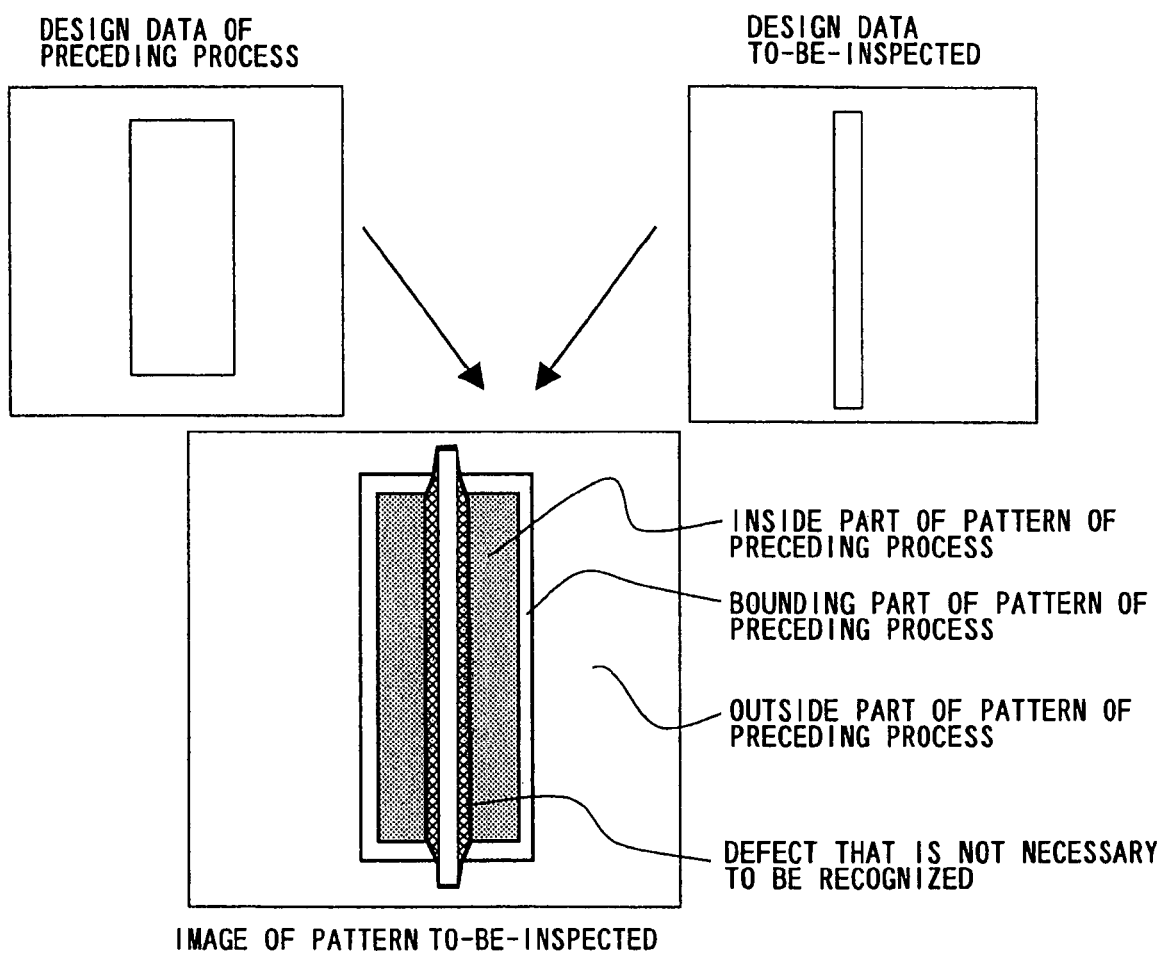
FIG. 101 is a schematic view showing the case where there is a pattern of a lower layer formed in the preceding process beneath a pattern to-be-inspected.

FIG. 101 is a schematic view showing the case where there is a pattern of a lower layer formed in the preceding process of a process at the time of the inspection beneath a pattern to-be-inspected. In such case, inspection is performed by separating an inspection area into an inside part, a boundary part, and an outside part of the pattern of the preceding process of the process at the time of the inspection. The inside part of the pattern of the preceding process of the process at the time of the inspection is recognized by the same manner as the reference pattern C described in the above-mentioned 5.3.1 Method of inspecting gate line width. The boundary part of the pattern of the preceding process of the process at the time of the inspection is recognized as a band-shaped part whose centerline is a reference pattern of the preceding process of the process at the time of the inspection and whose width has a predetermined value that is determined empirically. The outside part of the pattern of the preceding process of the process at the time of the inspection is the remainder of parts.

The inside part and the outside part of the pattern of the preceding process of the process at the time of the inspection may have different contrast due to an effect of the pattern of the preceding process of the process at the time of the inspection. In addition, the pattern to-be-inspected is formed in different widths due to undulation of a top surface of the lower layer.

In order to cancel the effect, position correction quantities for a line segment of a reference pattern and allowable deformation quantities are set separately to line segments in the inside part of the pattern of the preceding process of the process at the time of the inspection and line segments in the outside part of the pattern of the preceding process of the process at the time of the inspection respectively. If the boundary part is suitable for edge detection, a different position correction quantity and an allowable pattern deformation quantity are set to the boundary part. If the boundary part is not suitable for edge detection, this boundary part is excluded from the inspection area.

According to this embodiment, probability of detecting a defect (nuisance defect) that is not necessary to be recognized as a defect shown in the grid-like parts of FIG. 101 can be reduced.

5.9 Method of Inspecting Relationship Between Location of Pattern To-Be-Inspected and Location of Pattern of Preceding Process As an inspection method which can be used for the case where there is a pattern of a lower layer formed in the preceding process of a process at the time of the inspection beneath a pattern to-be-inspected, a method of inspecting relationship between a location of a pattern to-be-inspected and a location of a pattern of the preceding process of the process at the time of the inspection can be used.

Figure 102:
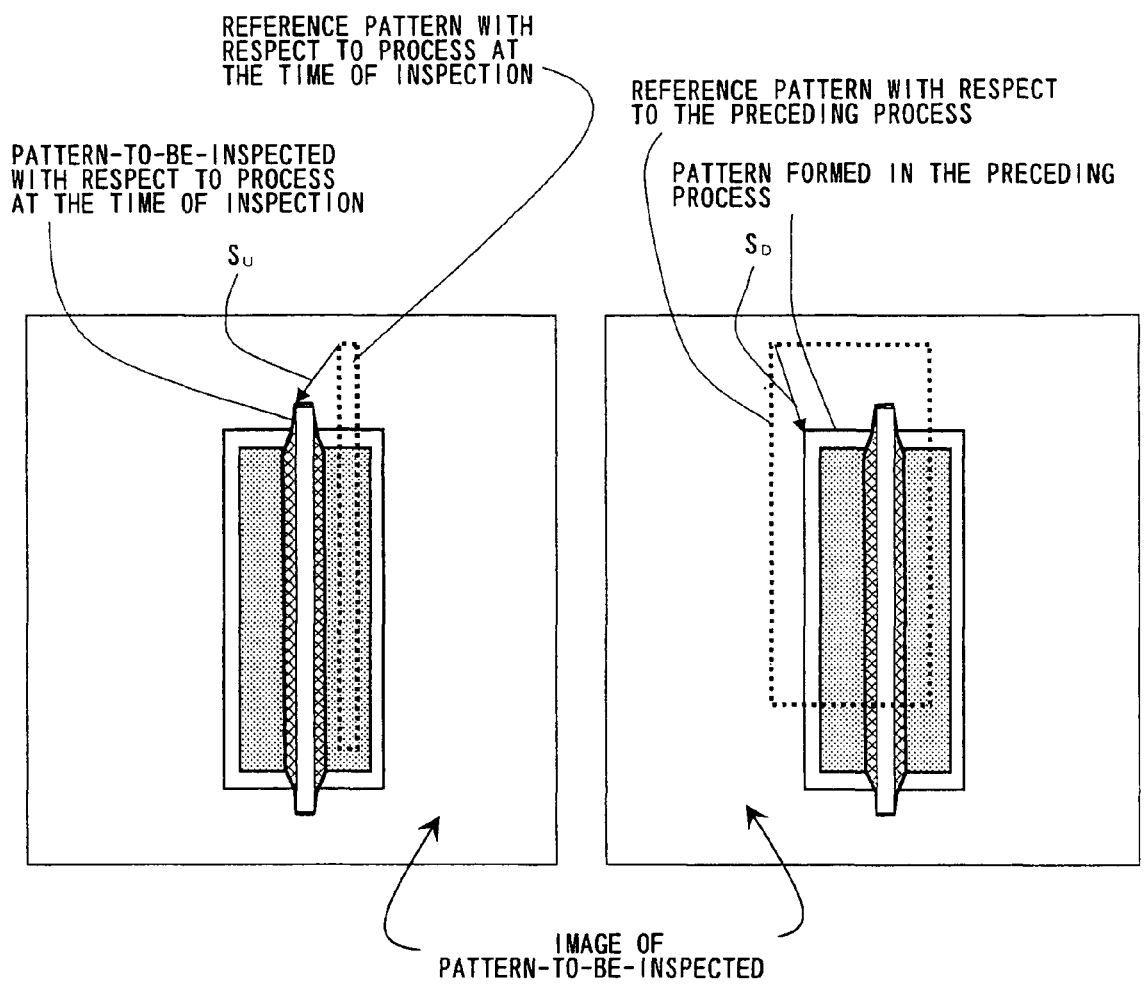
FIG. 102 is a schematic view showing an example of an image of a pattern to-be-inspected, a reference pattern with regard to a process at the time of the inspection, and a reference pattern with regard to the preceding process of the process at the time of the inspection.

In this embodiment, a reference pattern with regard to a process at the time of the inspection, and a reference pattern with regard to the preceding process of the process at the time of the inspection are used. FIG. 102 is a schematic view showing an example of an image of a pattern to-be-inspected, a reference pattern with regard to a process at the time of the inspection, and a reference pattern with regard to the preceding process of the process at the time of the inspection.

First, matching is performed by using the reference pattern with regard to the process at the time of the inspection, the reference pattern with regard to the preceding process of the process at the time of the inspection, and the image of the pattern to-be-inspected. Generally, an edge placement error, which is called the overlay error, exists between the pattern formed in the process at the time of the inspection and the pattern formed in the preceding process of the process at the time of the inspection. Next, a shift quantity $S_3$, which is described in the above-mentioned 4.12 The second inspection, is calculated by using the reference pattern with regard to the process at the time of the inspection and the image of the pattern to-be-inspected. The obtained shift quantity $S_3$ is taken as a shift quantity $S_U$. A shift quantity $S_D$ is calculated by using the reference pattern with regard to the preceding process of the process at the time of the inspection and the image of the pattern to-be-inspected in the same manner. Finally, a difference between the shift quantity $S_U$ and the shift quantity $S_D$ is taken as the overlay error quantity.

By calculating the overlay error for each inspection unit area in the entire semiconductor device, overlay error distribution of the entire semiconductor device can be obtained. Conventionally, the overlay error is controlled by measuring limited areas in the semiconductor device, and therefore the local overlay error caused by a stepper aberration or the like cannot be controlled. However, according to this embodiment, the obtained overlay error distribution of the entire semiconductor device can be used for controlling the local overlay error over the entire semiconductor device.

5.10 Inspection Method in Which Contours are Used 5.10.1 Die-to-Die Comparison Method in Which Contours are Used The conventional die-to-die comparison method is performed by comparing corresponding two images. In this method, it is necessary for luminance values of pixels to be interpolated so that the two images have the same relationship between a pattern to-be-inspected and pixel boundaries. However, in this embodiment, edges of the two images are compared, and therefore interpolation of luminance value is not necessary. Consequently, inspection accuracy is improved.

Figure 103:
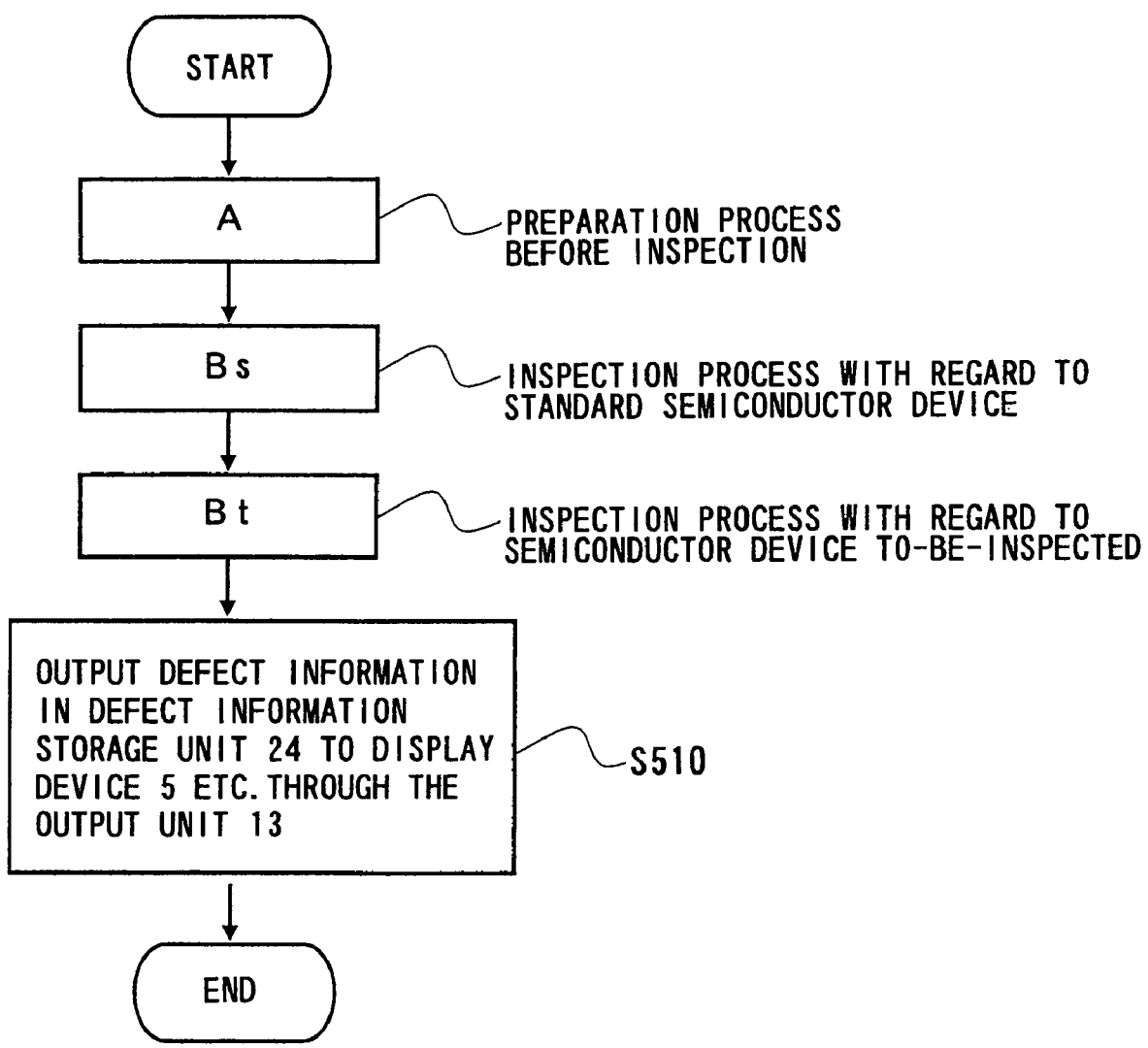
FIG. 103 is a flowchart showing a die-to-die comparison method in which contours are used.

FIG. 103 is a flowchart showing a die-to-die comparison method in which contours are used. FIG. 103 is made based on FIG. 27. A block A of FIG. 103 is identical to the block A of FIG. 26, and is a preparation process before the inspection. A block Bs of FIG. 103 shows an inspection process of an inspection area with regard to a standard semiconductor device. The block Bs of FIG. 103 is identical to the block B of FIG. 26 except for the following steps:

1. Instead of performing the step S336 (the second inspection), a contour is obtained from the standard semiconductor device. Hereafter, this processing is called step S336-1.

2. Instead of performing the step S338 (outputting the defect information to the defect information storage unit 24), the contour obtained by S336-1 is outputted to the defect information storage unit 24. Hereafter, this processing is called step S338-1.

A block Bt of FIG. 103 shows the inspection process of the inspection area with regard to a semiconductor device to-be-inspected. The block Bt of FIG. 103 is identical to the block B of FIG. 26 except for the following steps:

3. Instead of performing the step S336 (the second inspection), the detected second edge is compared with the stored contour in the defect information storage unit 24. Hereafter, this processing is called step S336-2.

Step S510 (the defect information in the defect information storage unit 24 is outputted to the display device 5 and the printer 6 through the output unit 13) is identical to the step S410 except for outputting a result of the die-to-die comparison method as the defect information.

Figure 104:
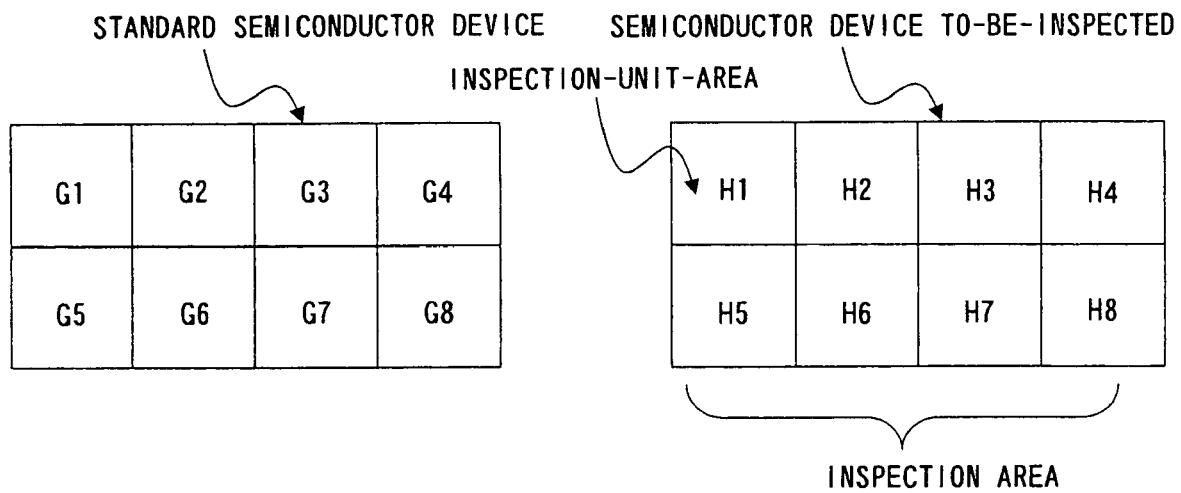
FIG. 104 is a schematic view showing a die-to-die comparison method in which contours are used.

FIG. 104 is a schematic view showing a die-to-die comparison method in which contours are used. The inspection-unit-areas in the step S340 are obtained by dividing the inspection area represented by the coordinate system used in the design data, and the inspection-unit-areas in each semiconductor device are inspected. The inspection-unit-areas of this embodiment are inspection-unit-areas G1 through G8 of the standard semiconductor device and inspection-unit-areas H1 through H8 of the semiconductor device to-be-inspected. The inspection-unit-areas G1 through G8 correspond to the inspection-unit-areas H1 through H8, respectively.

First, the steps S336-1 and S338-1 will be described. The Block A and the steps S308 through S332 in the Block Bs are performed. The second edges are detected from the inspection-unit-area G1 of the standard semiconductor device by the step S334 (the second edge detection). The detected second edges are connected in the detection order for obtaining a polygon, and the obtained polygon is used as a contour (the step S336-1). The obtained contour is outputted to the defect information storage unit 24 (the step S338-1).

The same processing is applied for the inspection-unit-areas G2 through G4 successively. The standard semiconductor device means a semiconductor device having good quality that is judged by using another inspection method. By the above processing, the inspection process of the inspection area with regard to the standard semiconductor device is completed.

Next, the steps S336-2 will be described. The steps S308 through S332 in the Block Bs are performed. The second edges are detected from the inspection-unit-area H1 of the semiconductor device to-be-inspected by the step S334 (the second edge detection). The detected second edges are compared with the stored contour with regard to the inspection-unit-area G1 in the defect information storage unit 24 (the step S336-2).

The same processing is applied for the inspection-unit-areas H2 through H4 successively. By the above processing, the inspection process of the inspection area with regard to the semiconductor device to-be-inspected is completed.

Figure 105:
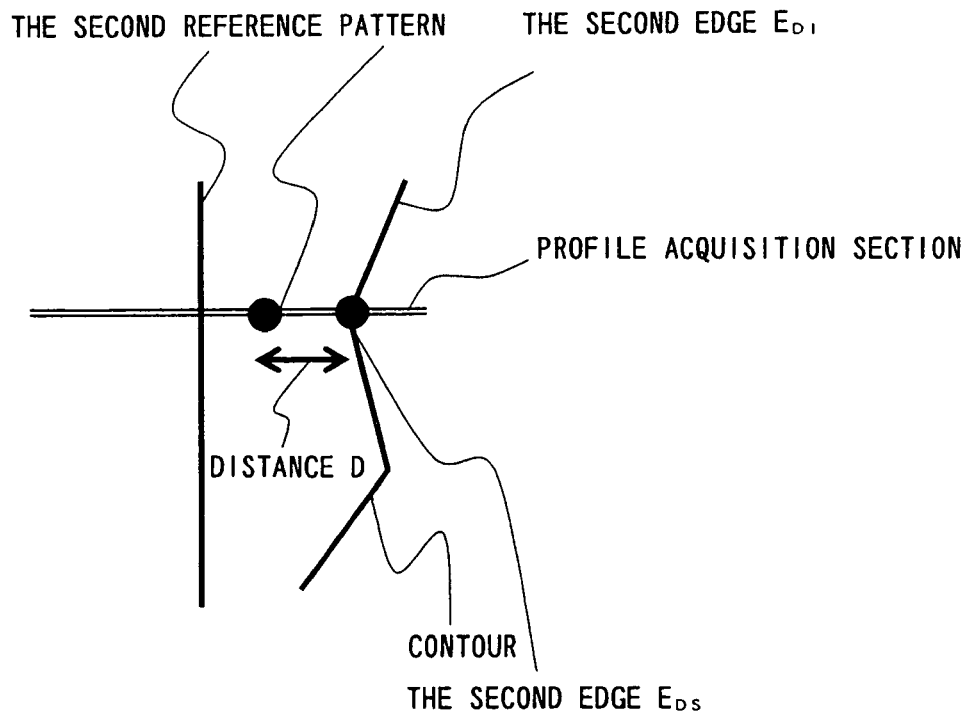
FIG. 105 is a schematic view showing a method of comparing a contour with the second edge.

FIG. 105 is a schematic view showing a method of comparing the contour with the second edge. In the case where the two images have the same pixel intervals and the method in which directions and positions for acquiring the profiles are set beforehand by using the second reference pattern is used, a distance D between an edge $E_{DI}$ and an edge $E_{DS}$ is calculated. The edge $E_{DI}$ is an edge detected from a profile acquisition section of the semiconductor device to-be-inspected, and the edge $E_{DS}$ is an edge detected from the profile acquisition section of the standard semiconductor device. Those profile acquisition sections exist in the same position. The edge $E_{DS}$ is a vertex of the stored contour.

In the case where the calculated distance D is larger than a predetermined distance, which is an allowable pattern deformation quantity of the die-to-die comparison inspection, it is judged that a part corresponding to the profile acquisition section has a defect. The allowable pattern deformation quantity of the die-to-die comparison inspection can be set for all the attributes of a reference pattern, or allowable deformation quantities can be set for the respective attributes of a reference pattern.

FIG. 106 is a schematic view showing an alternative method of comparing the contour with the second edge. In the case where two images have different pixel intervals or the method in which the profile acquisition sections are adaptively set after detecting the first edges is used, profile acquisition sections do not exist in the same position. In this case, an intersection point $E_X$ of the contour with the profile acquisition section is obtained, a distance D' between the second edge $E_{DI}$ and the intersection point Ex is calculated, and the above-mentioned method is performed by using the distance D' instead of using the distance D.

In the above, the contour obtained from the standard semiconductor device is used for the inspection. However, a simulator obtains a contour that corresponds to the pattern to-be-inspected, and the obtained contour may be used. In addition, in the case of inspecting periodical patterns such as part of a memory, a contour obtained from the periodical patterns or a contour corresponding to the periodical patterns obtained by a simulator may be used. As an alternative method, a process controlling method, in which a contour of a semiconductor device having good quality at the starting time of fabrication is stored, and the second edge of a semiconductor device that is being fabricated is compared with the stored contour, can be used.

According to this embodiment, the die-to-die comparison inspection, in which contours of patterns to-be-inspected are used, can be performed with sub pixel accuracy, and can be performed by using a contour of one image of a pattern to-be-inspected, whose pixel interval is different from a pixel interval of an image of another pattern to-be-inspected, or a contour obtained by a simulator, or the like. Further, a process controlling method in which a contour of a semiconductor device having good quality at the starting time of fabrication is used can be realized.

5.10.2 Method of Correcting Contour and Methods of Reducing Noise on Contour

As described in the above-mentioned 4.11 The second edge detection, the second edges in the above-mentioned 5.10.1 Die-to-die comparison method in which contours are used exist in the different positions from positions where the edges should be detected ideally. For example, in the case of using the coefficient k in FIG. 76 equal to 0.5, the detected edge exists in the position shifted from the ideal position by the half of the electron beam spot size in the outward direction of the pattern to-be-inspected. In the case of comparing contours, which are obtained from images acquired by using different electron beam spot sizes, the die-to-die comparison should be applied after correcting the edge shift quantity caused by the electron beam spot size.

The edge shift quantity $W_{beam}$ caused by the electron beam spot size is obtained by the following equation:

$$W_{beam}=(W_{measure}-W_{standard})/2$$

where a line width $W_{standard}$ means a standard line width and a line width $W_{measure}$ means a line width obtained by measuring a pattern to-be-inspected having a standard line width.

Figure 107:
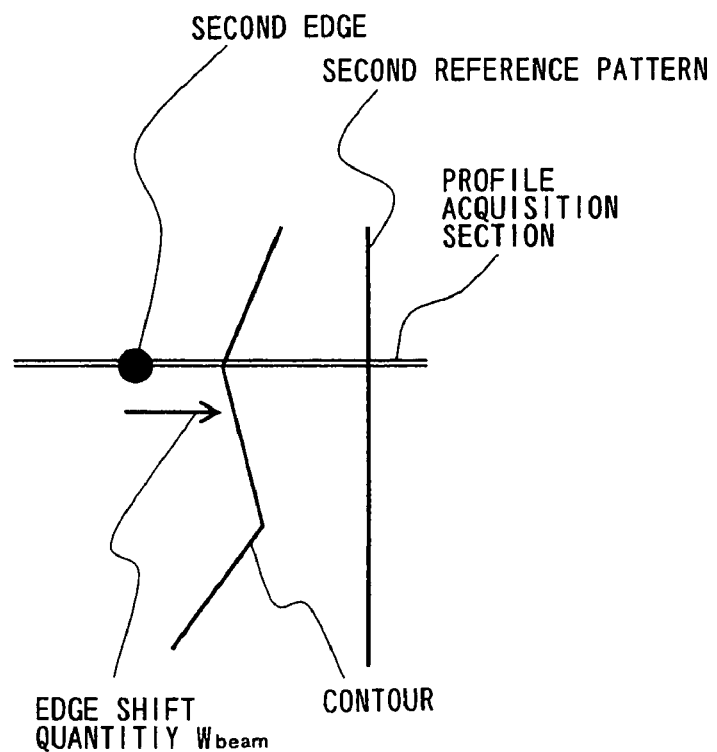
FIG. 107 is a schematic view showing a method of correcting a contour.

FIG. 107 is a schematic view showing a method of correcting a contour. As shown in FIG. 107, the second edge is shifted by the edge shift quantity $W_{beam}$ along the profile acquisition section in the inside direction (the opposite direction) of the pattern-to-be-inspected in order to cancel the edge shift quantity $W_{beam}$. Then a position of the shifted second edge is registered as a position of a vertex of a contour.

Figure 108:
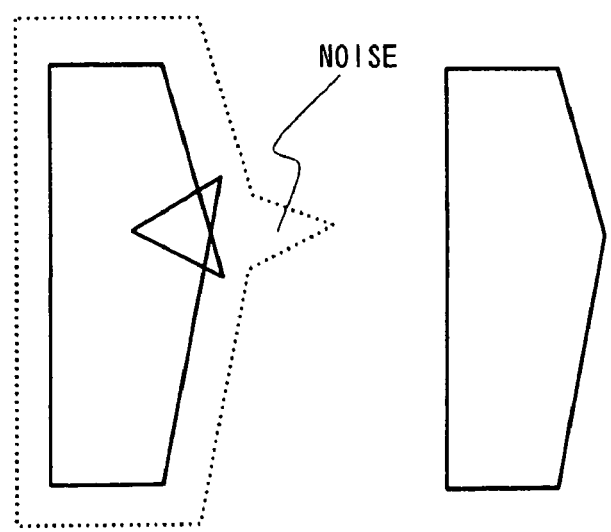
FIG. 108 is a schematic view showing a method of reducing a noise on a contour.

Next, a method of reducing a spike noise on a contour will be described. FIG. 108 is a schematic view showing a method of reducing a noise on a contour. A contour shown on the left-hand side of FIG. 108 by dotted lines has a spike noise. The spike noise has about one pixel width and about two or three pixel length. In order to reduce such a spike noise, a contour shown on the left-hand side of FIG. 108 by solid lines is obtained by applying the size processing to the contour by a half of a pixel interval. Then, a contour shown on the right-hand side of FIG. 108 by solid lines is obtained by applying the Boolean OR operation to the applied contour. The obtained contour is a contour after noise reduction. Two triangles exist in a part of the contour shown on the left-hand side, the part corresponding to the outside of the contour shown by the solid lines on the right-hand side. In order to understand easily, the two triangles are shown in a large size, however, they are tiny so that they are ignored in practice.

In order to compensate for shrinkage of the contour after the noise reduction, it is necessary to apply the above method of correcting the contour before the noise reduction. The half of pixel interval is subtracted from the edge shift quantity $W_{beam}$, and the obtained quantity is used as the edge shift quantity, which compensates for the noise reduction.

Figure 109:
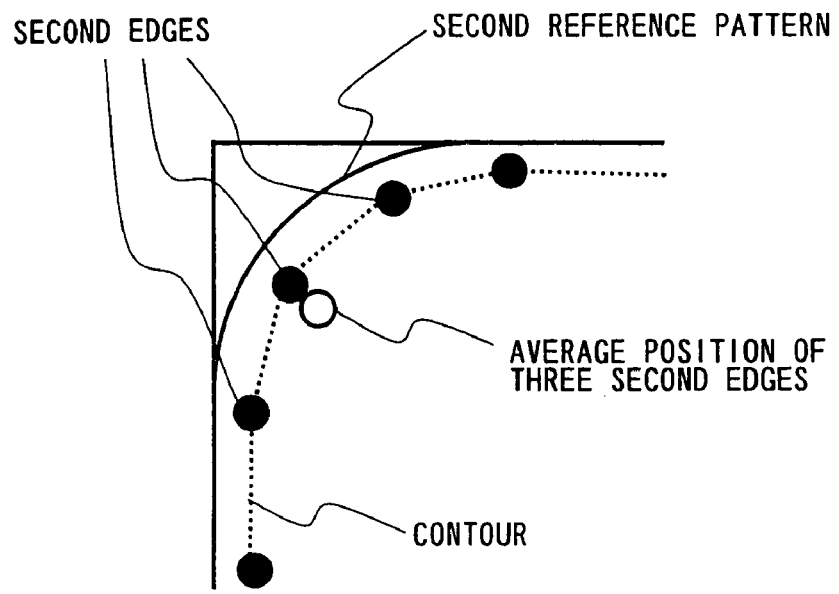
FIG. 109 is a schematic view showing a method of reducing noise on a contour by using an average position of the second edge, the preceding edge to the second edge, and the subsequent edge to the second edge.

As an alternative method, a method of reducing noise on a contour by using an average of distances between edges of the second reference pattern and the corresponding second edges of an image of a pattern to-be-inspected can be used. FIG. 109 is a schematic view showing a method of reducing noise on a contour by using an average position of the second edge, the preceding edge to the second edge, and the subsequent edge to the second edge. The average position means a position whose X and Y coordinate values are average values of the X and Y coordinate values of the three edges. The obtained average position is registered as a vertex of a contour. In this method, although a corner part of the contour does not have noise, a curvature of the corner part of the contour after reducing noise is different from a curvature of the corner part of the contour before reducing noise.

Figure 110:
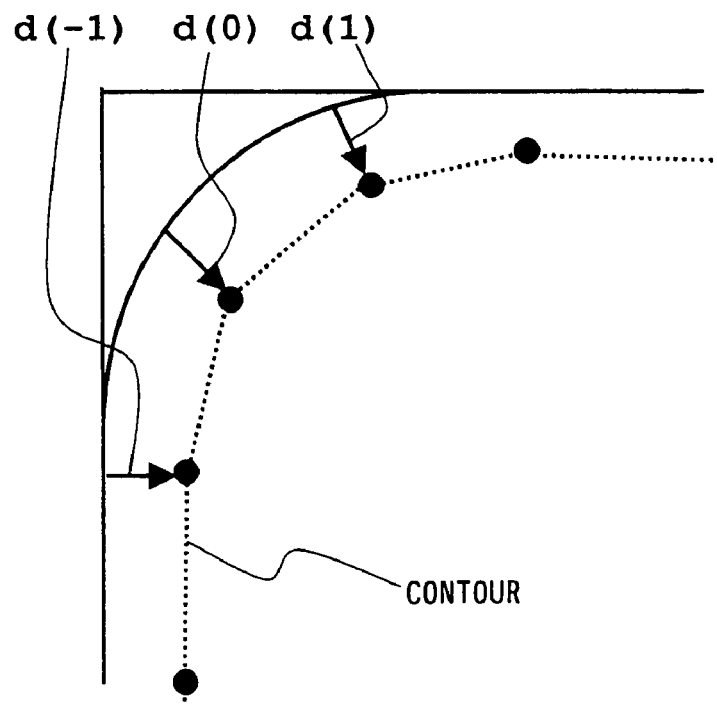
FIG. 110 is a schematic view showing a method of reducing noise on a contour by using an average of distances between edges of the second reference pattern and the corresponding second edges of an image of a pattern to-be-inspected.

FIG. 110 is a schematic view showing a method of reducing noise on a contour by using an average of distances between edges of the second reference pattern and the corresponding second edges of an image of a pattern to-be-inspected. Although a vector between the two edges having the correspondence is shown by d(x,y) in 4.6 The first inspection, the vector is shown by d(i) in order to relate the vector to a vertex of a contour. 'i' means a sequential number of a vertex. In order to reduce noise of the second edge that is an end point of a vector d(0), the following calculation is performed by using vectors d(−1), d(0), and d(1):

(len(d(−1))+len(d(0))+len(d(1))/3 where len is a function that returns a signed length of a vector. The sign is positive when the vector goes to the outside of a pattern to-be-inspected; and the sign is negative when the vector goes to the inside of a pattern to-be-inspected. A vector, which has a length same as the obtained length, a start point same as a start point of the vector d(0), and a direction same as a direction of the vector d(0), is the vector d(0) after reducing noise. An end point of the vector d(0) after reducing noise is the second edge after reducing noise.

In this method, a curvature of a corner part of the contour after reducing noise is not drastically different from a curvature of the corner part of the contour before reducing noise, because the lengths of the vectors used in the above calculation are measured from a curve applied to the corner part. The number of edges for average length may be 5, 7, or the other number. Further, the lengths of the vectors may be given weights. Furthermore, median value of the lengths or the like may be used, instead of the average lengths. In the case of using the median value of the lengths, it is efficient to reduce spike noise.

According to this embodiment, because correction of the contour or reduction of spike noise on the contour can be performed by shifting edges, deterioration of the image of the pattern to-be-inspected caused by the image filter is not caused. As an alternative method, in the case where noise on the contour is reduced by using distances between edges of reference pattern and edges of the image of the pattern to-be-inspected, variation in curvature of corners can be minimized.

5.10.3 Method of Outputting Contour to External Inspection Device

The contour described in the above-mentioned 5.10.1 Die-to-die comparison method in which contours are used can be used for input data of a lithography simulator or the like. In this case, it is necessary to input the contour indirectly, because lithography simulator processing is slower than contour output processing.

Figure 111:
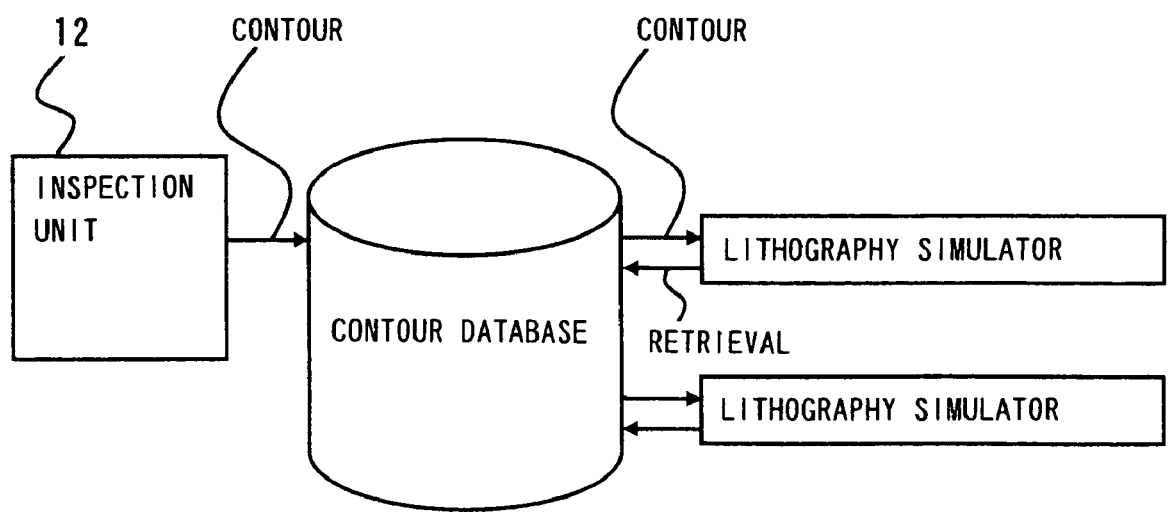
FIG. 111 is a schematic view showing a method of outputting a contour to an external inspection device.

FIG. 111 is a schematic view showing a method of outputting a contour to an external inspection device. The inspection unit (inspection device) 12 is the same as the inspection unit (inspection device) 12 in FIG. 16 and outputs (sets) a contour obtained from a semiconductor device to-be-inspected to a contour database. A lithography simulator retrieves the contour database and inputs the contour through on-line or off-line linkage. A plurality of lithography simulators can be connected to the contour database in order to realize multi-processing. In the case where the inspection unit 12 outputs the contour by using additional information of the design data, relationship between the contour and the design data becomes clear.

According to this embodiment, an inspection method that can be used in combination with an alternative method, which performs in slower processing, can be realized. In addition, in the case where a contour is outputted by using additional information of the design data, relationship between the contour and the design data becomes clear.

5.11 Method of Separating Pattern Deformation Quantities into Global Pattern Deformation Quantities and Local Pattern Deformation Quantities In the above-mentioned 4.8 Pattern deformation quantities obtained from the whole inspection-unit-area, the pattern deformation quantity is obtained for every inspection-unit-area. By using the method, in the case where the patterns to-be-inspected are globally formed in line widths different from line widths of the design data due to differences of conditions of pattern formation, all the pattern deformation quantities obtained from the whole inspection-unit-area, have big values. However, an electrical property of a semiconductor device is restricted by a variation in line widths in a local region rather than a variation in average line widths in a global region. Therefore, it is necessary to evaluate an electrical property of the semiconductor device by separating the pattern deformation quantities into global pattern deformation quantities and local pattern deformation quantities.

Figure 112:
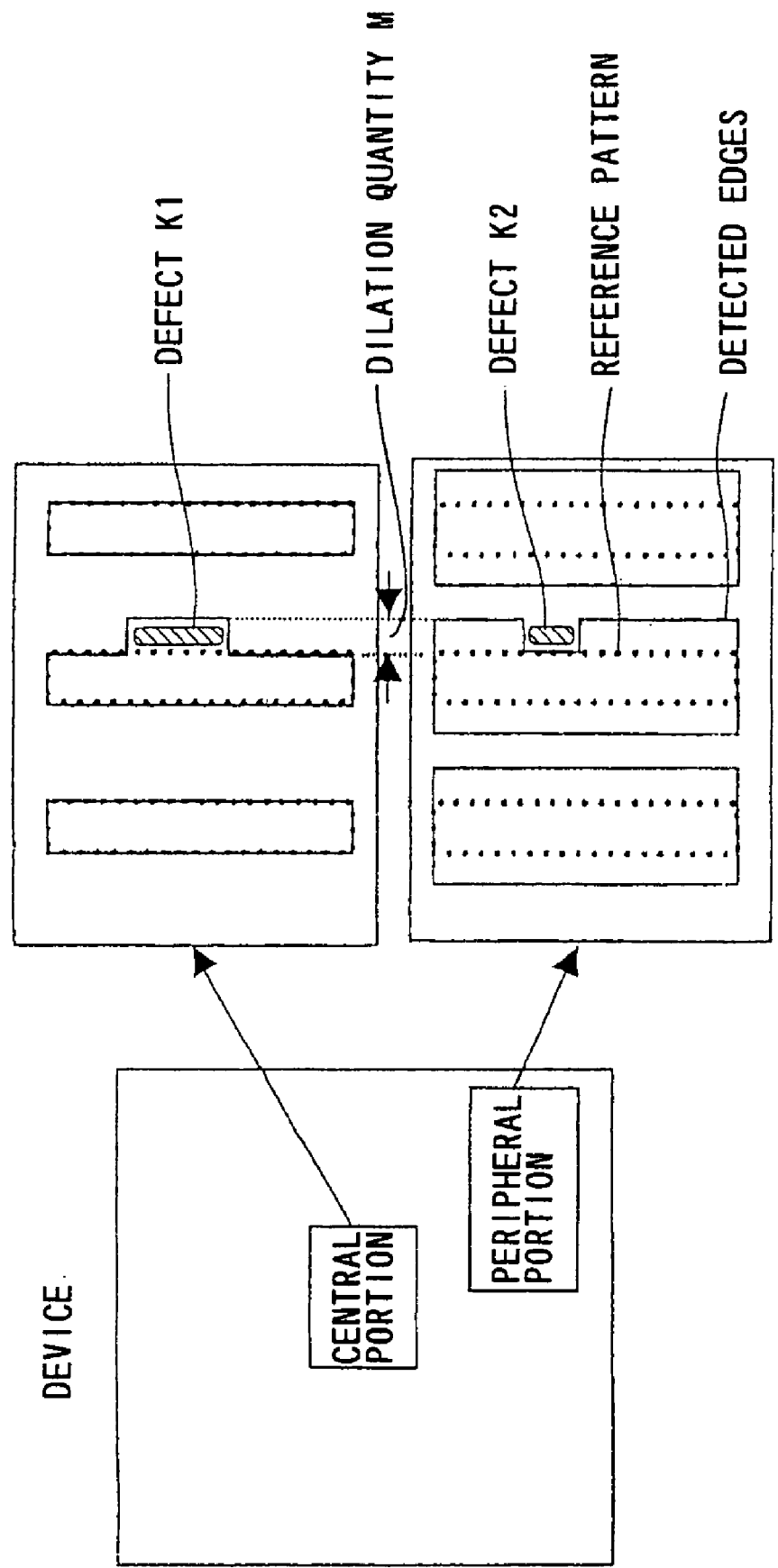
FIG. 112 is a schematic view showing an example in which patterns are formed in line widths different from line widths of design data over the entire semiconductor device due to differences of conditions of pattern formation.

FIGS. 112 through 115 are schematic views showing a method of separating pattern deformation quantities into global pattern deformation quantities and local pattern deformation quantities. In this embodiment, as a deformation quantity, a deformation quantity of a line width is used. FIG. 112 is a schematic view showing an example in which patterns to-be-inspected are formed in line widths different from line widths of design data over the entire semiconductor device due to differences of conditions of pattern formation.

As shown in FIG. 112, in a central portion of a semiconductor device, line widths are normal in a global region, and a defect K1 exists. On the other hand, in the peripheral portion of the semiconductor device, line widths are dilated in the X direction in the global region. It is assumed that this deformation quantity and the size of the defect K1 in the X direction have the same quantity M. In this case, the defect K1 should be recognized as a defect, but the lines that have the deformation quantity M should not be recognized as defects. Further, if the lines that have the deformation quantity M are recognized as defects, a great number of defects should be registered.

In order to solve this problem, a method in which line widths of a reference pattern are corrected in consideration of a global deformation quantity of an average line width in the global region before recognizing defects may be used. In order to correct line widths of the reference pattern, the pattern inspection apparatus should have a first method that obtains a global deformation quantity of an average line width using inspected inspection-unit-areas, and a second method of correcting the line widths of the reference pattern using the global deformation quantity obtained by the first method. The global deformation quantity of the average line width should be obtained from a sufficiently large region, but it is not necessary for this region to be the entire semiconductor device.

FIGS. 113A, 113B and 113C are views showing an example of the first method that obtains a global deformation quantity of an average line width using inspected inspection-unit-areas. As a deformation quantity of an average line width, the deformation quantity of the line width in the X direction used in the above-mentioned 4.8 Pattern deformation quantities obtained from the whole inspection-unit-area is used.

First, by applying the method described in connection with the deformation quantity of the line width in the X direction (see FIGS. 67A and 67B) to each inspection-unit-area, a deformation quantity $C_X$ of a line width is obtain as shown in FIG. 113A. A deformation quantity of a line width in the Y direction is obtained in the same manner. If necessary, deformation quantities of line widths in 45 degrees and 135 degrees may be obtained.

Next, in order to obtain a global deformation quantity $<C_X>$ of an average line width in the X direction, an average of $C_X$ is obtained (<> means the average value). For example, as shown in FIG. 113B, with regard to an inspection-unit-area to-be-corrected (part shown by dots), a method of obtaining an average of $C_X$ of inspected inspection-unit-areas (grid-like parts in FIG. 113B) located near the inspection-unit-area may be used.

Further, in the sequential inspection described in the above-mentioned 3.4 Inspection-unit-area (shown in FIG. 113C), with regard to an inspection-unit-area to-be-corrected (part shown by dots), a method of obtaining an average of the above-mentioned 3.3 Recipe data "8. The number of inspection-unit-areas in order to obtain a global pattern deformation quantity" of $C_X$ obtained from the latest inspected inspection-unit-areas (grid-like parts in FIG. 113C) may be used. Instead of the average, a moving average may be used. Global deformation quantities $<C_Y>$, $<C_{45}>$, and $<C_{135}>$ of the average line widths in the Y direction, 45 degree direction, and 135 degree direction can be obtained in the same manner. The obtained global deformation quantities $<C_X>$, $<C_Y>$, $<C_{45}>$, and $<C_{135}>$ become the global pattern deformation quantities.

The global deformation quantities of the average line widths may be separated into quantities obtained from each group that has the same attribute of the patterns to-be-inspected. Further, this separation may be performed by dividing all line segments into proximate line segments, remote line segments, and other line segments, or may be performed according to line widths. Further, the global deformation quantity of the average line width may be expressed in the form of a function of a line width.

Figure 114:
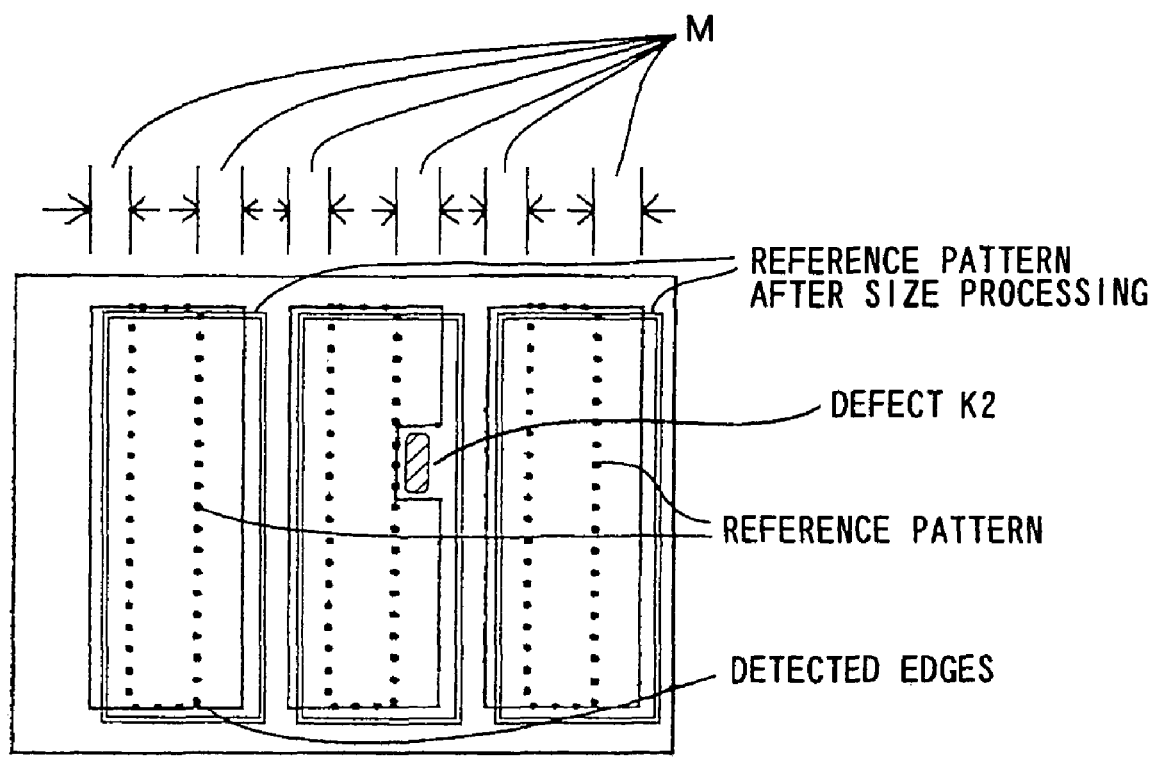
FIG. 114 is a view showing an example of the second method of correcting line widths of the design data using the global deformation quantities obtained by the first method as shown in FIGS. 113A, 113B and 113C.

FIG. 114 is a view showing an example of the second method of correcting the line widths of a reference pattern using the global deformation quantities obtained by the first method. In this embodiment, as the global deformation quantities of the average line widths, the above global deformation quantities $<C_X>$, $<C_Y>$, $<C_{45}>$, and $<C_{135}>$ are used.

When the obtained global deformation quantities $<C_X>$, $<C_Y>$, $<C_{45}>$, and $<C_{135}>$ of the average line widths are used for correction of line widths of a reference pattern, the size processing (processing in which the line width is altered) in step S206 (see FIG. 22) for generating the reference patterns based on the design data is performed. Specifically, each line segment in the reference patterns is moved by the global deformation quantities $<C_X>$, $<C_Y>$, $<C_{45}>$, or $<C_{135}>$ of the average line width in each direction. This step is performed after the inspection unit 12 retrieves the recipe database 22 using the recipe retrieval parameters as a key and takes out the recipe data including a reference pattern (step S304).

As an example of this step, a result obtained by the size processing, in which the reference patterns (shown in FIG. 112) are altered by the global deformation quantity $<C_X>$ of the average line width in the X direction, is shown by double lines in FIG. 114. Here, the global deformation quantity $<C_X>$ of the average line width in the X direction obtained by the first method is nearly equal to the deformation quantity M.

The global deformation quantity of the average line width, which is not calculated in the above calculations, for example, a global deformation quantity $<C_{30}>$ of an average line width in 30 degree direction, is obtained by interpolating the global deformation quantities of the average line width, which are calculated in the above calculations.

$$<C_{30}>=(2<C_X>+<C_Y>)/3$$

$$<C_{30}>=(2<C_{45}>+<C_X>)/3$$

In these equations, the global deformation quantity $<C_X>$ of the average line width in the X direction, the global deformation quantity $<C_Y>$ of the average line width in the Y direction, and the global deformation quantity $<C_{45}>$ of the average line width in 45 degree direction are used as the global deformation quantities of the average line width, which are calculated in the above calculations.

Figure 115:
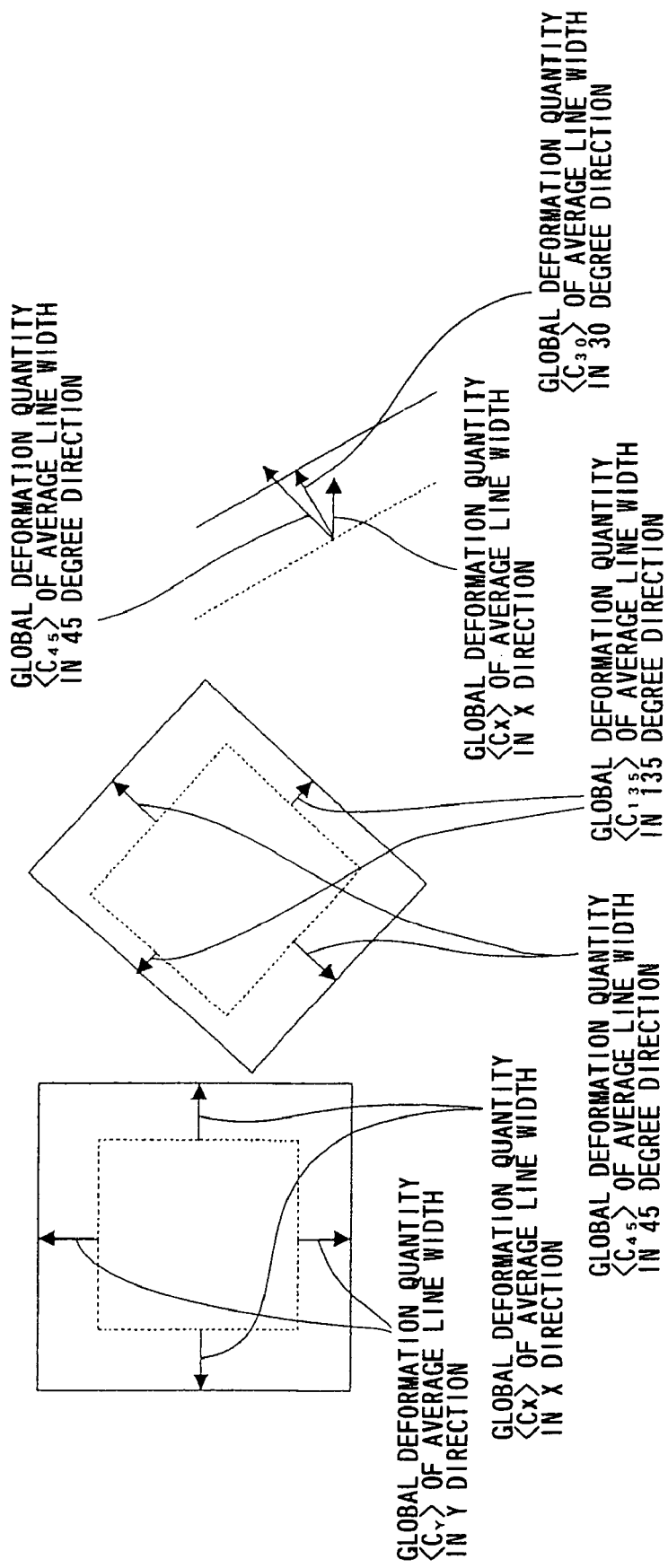

In FIG. 115, the latter calculation example is shown. In FIG. 115, line segments shown by dotted lines schematically show a reference pattern, and line segments shown by solid lines schematically show edges detected from an image of a pattern to-be-inspected. The global deformation quantity $<C_X>$ of the average line width in the X direction, the global deformation quantity $<C_Y>$ of the average line width in the Y direction, the global deformation quantity $<C_{45}>$ of the average line width in 45 degree direction, the global deformation quantity $<C_{135}>$ of the average line width in 135 degree direction, and the global deformation quantity $<C_{30}>$ of the average line width in 30 degree direction, are defined based on FIG. 115. On the right-hand side of FIG. 115, the global deformation quantity $<C_{30}>$ of the average line width in 30 degree direction, which has been obtained by interpolating the global deformation quantity $<C_X>$ of the average line width in the X direction and the global deformation quantity $<C_{45}>$ of the average line width in 45 degree direction, is shown.

As an alternative method, a method of detecting each global deformation quantity of an average line width once at a specified position before inspection and correcting line widths of a reference pattern in each inspection-unit-area using the detected global deformation quantity of the average line width may be used.

When the steps subsequent to step S304 (see FIG. 25) described in FIG. 25 are performed, the defect is detected in step S320 (see FIG. 25). As described above, in a central portion of the semiconductor device shown in FIG. 112, line widths are normal in a global region, and in the peripheral portion of the semiconductor device shown in FIG. 112, line widths are dilated in the X direction in the global region. In the case where the size processing is performed so that the defect K1 is detected from the semiconductor device shown in FIG. 112, the defect K2 is not detected and most part of the dilated pattern is recognized as a defect. However, according to this embodiment, as shown in FIG. 114, only the defect K2 can be recognized as a defect.

As a result, the defect information that is separated into the global deformation quantities of the line widths in each inspection-unit-area as the global deformation quantities and defect information as the local deformation quantities can be outputted.

In the case of using this embodiment, it is necessary to cancel the variation in defect information caused by correcting the line widths of the reference pattern. Specifically, the global deformation quantity of the average line width is added to each deformation quantity of the line width, which is one of pattern deformation quantities obtained from the whole inspection-unit-area described in the above-mentioned 4.8 Pattern deformation quantities obtained from the whole inspection-unit-area.

According to this embodiment, by separating the pattern deformation quantities into the global deformation quantities and the local deformation quantities, the number of defects to be detected can be reduced. As a result, important defects can be detected fully, and detection of a nuisance defect can be reduced. The nuisance defect is defined as a defect that is not necessary to be recognized as a defect.

5.12 Method of Correcting Time-Dependence Variation in Measurement Values of Line Widths In the case of long-term inspection, an electron beam spot size may be varied gradually. The wider electron beam spot size is, the larger measurement value of line width is. This variation is added to the above-mentioned global deformation quantities of average the line widths. Therefore, it is necessary to correct the global deformation quantities of the average line widths for canceling a time-dependence variation in measurement values of line widths.

FIG. 116 is a schematic view showing a variation in electron beam spot size on a modified figure drawn from FIG. 23. In FIG. 116, although an electron beam spot size becomes wider gradually, a variation in the electron beam spot size can be ignored while inspecting inspection-unit-areas in one line. Such a variation in the measurement values of the line widths caused by the variation in the electron beam spot size is corrected by the following procedure:

First, inspection-unit-areas to be inspected twice are determined by the method shown in FIG. 117. Each inspection-unit-area to be inspected twice is set for each time range in which the variation in the electron beam spot size can be ignored. In FIG. 116, time for inspecting inspection-unit-areas in one line corresponds to the time range. Therefore, the inspection-unit-areas to be inspected twice are determined as shown in FIG. 117.

Next, the inspection-unit-areas to be inspected twice are inspected in order to obtain the above global deformation quantities $<C_X>$, $<C_Y>$, $<C_{45}>$, and $<C_{135}>$ of average the line widths, as shown in FIG. 117. In this embodiment, the case where the global deformation quantity $<C_X>$ of the average line widths in the X direction is used will be described, because calculation procedure of the global deformation quantities $<C_X>$, $<C_Y>$, $<C_{45}>$, or $<C_{135}>$ is the same. In order to represent the first time inspection and the inspection-unit-area number, the first suffix and the second suffix are used respectively as shown by $<C_X>_{1,1}$, $<C_X>_{1,11}$ in FIG. 117.

The global deformation quantities represent location-dependence quantities, and the global deformation quantities representing time-dependence quantities can be ignored.

After the first time inspection, all the inspection-unit-areas are inspected as the second time inspection in order to obtain the above global deformation quantities $<C_X>$, $<C_Y>$, $<C_{45}>$, and $<C_{135}>$ of the average line widths, as shown in FIG. 118. In order to represent the second time inspection and the inspection-unit-area number, the first suffix and the second suffix are used respectively as shown by $<C_X>_{2,1}$, $<C_X>_{2,11}$ in FIG. 118.

When the inspection-unit-area whose inspection-unit-area number is 1 is inspected, a correction quantity $\delta<C_X>_1$ is calculated by the following equation using the global deformation quantity $<C_X>_{2,1}$ and the global deformation quantity $<C_X>_{1,1}$:

$$\delta<C_X>_1 = <C_X>_{2,1} - <C_X>_{1,1}.$$

The obtained correction quantity $\delta<C_X>_1$ means a time-dependence correction quantity.

The obtained correction quantity $\delta<C_X>_1$ is added to each deformation quantity $<C_X>$ of the average line width obtained from the inspection-unit-area, whose inspection-unit-area number is from 2 to 10, in order to correct a time-dependence variation. The inspection-unit-area number 10 means the preceding number of the next inspection-unit-area number 11, and the next inspection-unit-area is to be inspected twice.

The above procedure is performed for each of the global deformation quantities $<C_Y>$, $<C_{45}>$, and $<C_{135}>$ of the average line width in the same manner. These procedures are performed for all the inspection-unit-areas, which are to be inspected twice.

In the case where patterns to-be-inspected made of an ArF resist are inspected by a scanning electron microscope any number of times, patterns to-be-inspected are shrunk gradually. However, according to this embodiment, this shrinkage can be ignored, because the same portion is inspected only twice. Therefore, the variation in the measurement values of the line widths caused by the gradual variation in the electron beam spot size can be corrected, even if the above patterns to-be-inspected are inspected.

5.13 Defect-Classes Based on Geometrical Information of Reference Pattern, Information of Design Data, or Information of Data Related to Design Data The defect-classes are determined by using characteristic quantities of a defect image by a defect-class determination unit 14 as described in the above-mentioned 4.7 Method of determining defect-classes based on feature quantity obtained from image. In addition, these defect-classes, which are determined by using geometrical information of a reference pattern, information of design data, or information of data related to design data, can be used.

The following items are used as geometrical information of the design data:

1. Attributes of a reference pattern (line part, corner, end, isolated pattern, and the like)

2. A proximate line segment, a remote line segment, or the other

3. Line widths (for example, the minimum line width, widths larger than the minimum line width and smaller than the minimum line width×1.5, widths not less than the minimum line width×1.5)

The following items are used as information of the design data:

4. Places where a defect is detected (for example, memory part, logic part, and the like)

5. A cell name of the design data corresponding to the defect. In addition, a line segment number of the cell used in defect detection, or a position of the defect on a coordinate system, which describes the cell, can be used as additional information.

6. Attributes of a wiring (ground wiring, clock wiring, and the like) in the case where these attributes are defined in the design data.

The following item is used as information of data related to the design data: Here, as information of the data related to the design data, the mask data is used.

7. A cell name of the mask data corresponding to the defect. In addition, a line segment number of the cell corresponding to the defect, or a position of the defect on a coordinate system, which describes the cell, can be used as additional information.

Further, in addition to the above, as a defect-class that uses the pattern deformation, the following item can be used:

8. Defect size information (for example, six classifications of large dilation, medium dilation, small dilation, large shrinkage, medium shrinkage, small shrinkage, and the like).

Figure 119:
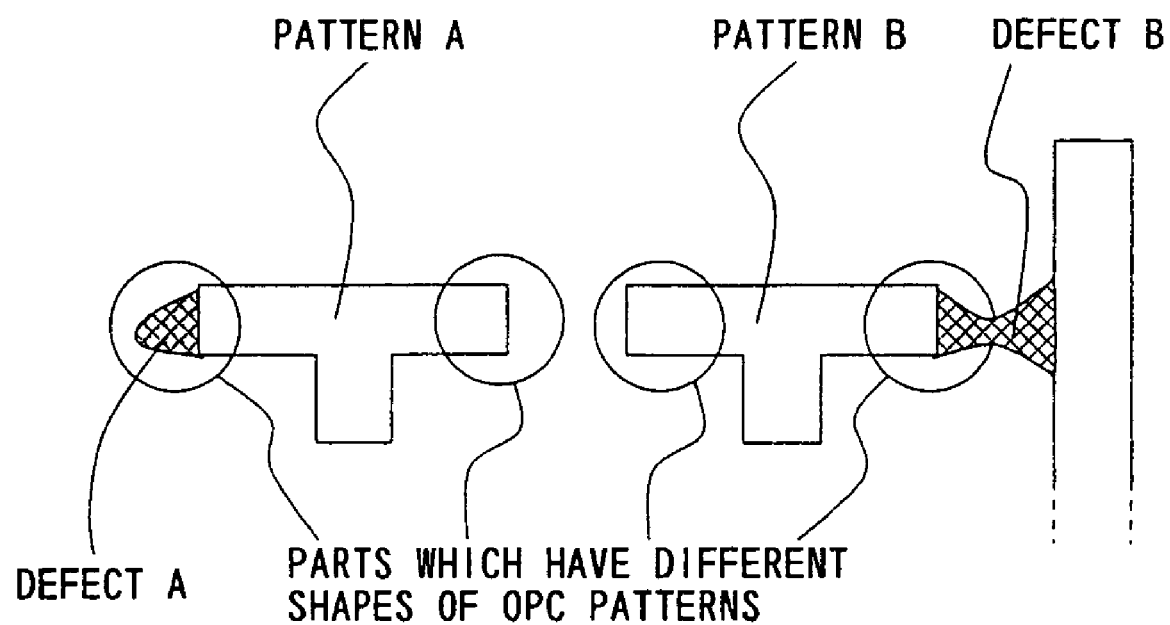

FIG. 119 is a schematic view showing a defect-class that is determined by the cell name and the line segment number (see the above-mentioned 5.). T-shaped two patterns A and B represent cells of memories that have the same cell name. End parts surrounded by circles have the same shape of a reference pattern; however, have different shapes of OPC patterns. In this case, a defect A and a defect B are different defects that are caused by the different OPC patterns. The defect A and the defect B cannot be classified by the cell name. On the other hand, OPC patterns that have related to a cause of a defect can be recognized by the line segment number.

The above defect-classes can be used in combination. FIG. 120 is a schematic view showing defect-classes that are determined by the above defect-classes in combination. The defect-classes shown in FIG. 120 are combinations of the three defect-classes, which are above-mentioned 6, 1 and 8.

According to this embodiment, tendencies for defects to be caused can be easily grasped. Further, a cause of defects can be easily specified.

5.14 Method of Grouping Defects Based on Feature of Reference Patterns

Figure 121:
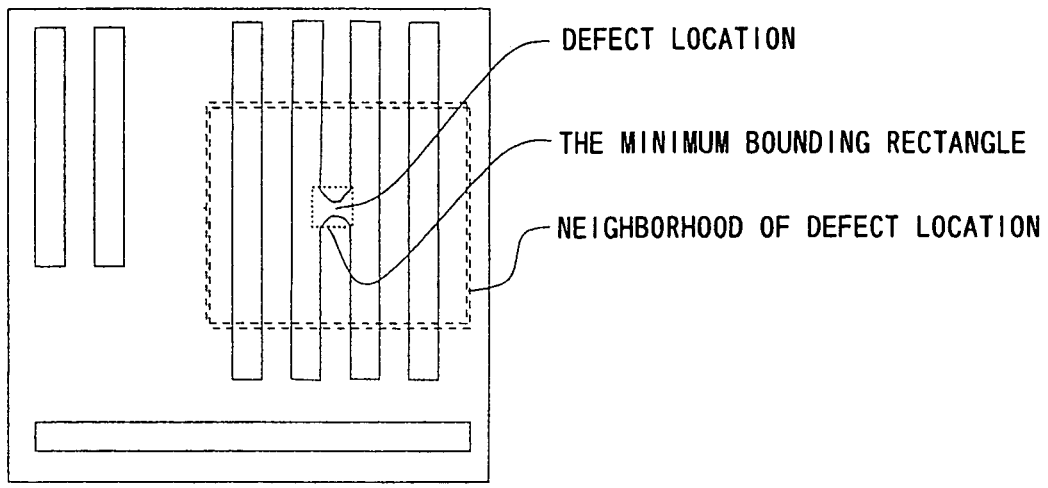
Figure 122:
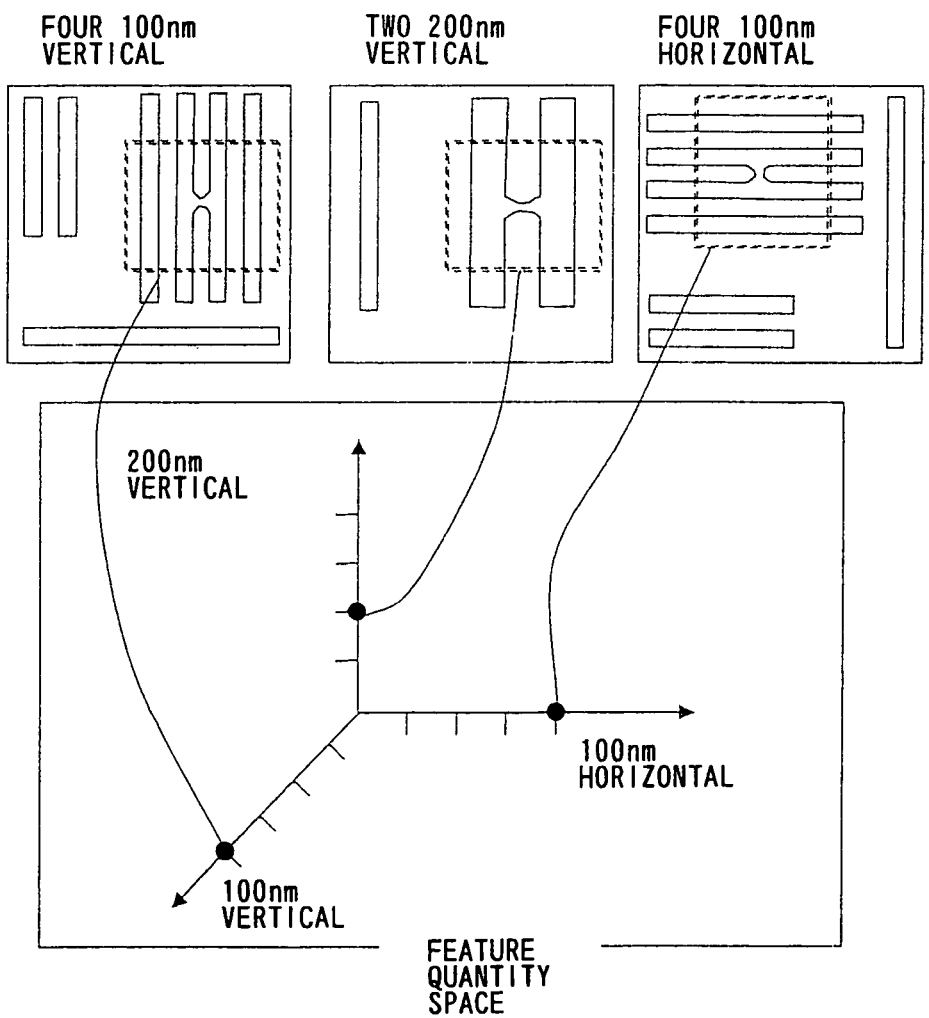

A method of grouping defects based on features of reference patterns, which are used in detection of defects, and neighboring reference patterns to the used reference patterns can be used. FIGS. 121 through 123 are schematic views showing the above method. When a defect is detected, reference patterns are clipped by a rectangle corresponding to the neighborhood of a defect location and are memorized. When the inspection is finished, feature quantities are calculated from the clipped reference patterns, and the defects are grouped.

In FIG. 121, a defect location, clipped reference patterns, and the minimum bounding rectangle are shown. The defect location is a center of the minimum bounding rectangle. The clipped reference patterns exist in a rectangle corresponding to the neighborhood of the defect location. As the feature quantity with regard to the line-shaped patterns, a set of a line width, a line direction, and the number of polygons can be used. In addition, a set of a space width, a space direction and the number of spaces can be used. As other feature quantities, a set of a type of a corner and the number of the corners, a set of a type of an end and the number of the ends, or a set of a type of an isolated pattern and the number of the isolated patterns can be used. Next, the feature quantity space that is composed of the above feature quantities is grouped according to the cluster analysis. The cluster analysis is one of classification methods and is well known in the statistics.

FIG. 122 is a schematic view showing an example of a feature quantity space. In FIG. 122, a set of 100 nm line width, the vertical direction, and the four line-shaped patterns; a set of 200 nm line width, the vertical direction, and the two line-shaped patterns; and a set of 100 nm line width, the horizontal direction, and the four line-shaped patterns are used as the feature quantities. In this example, three clipped reference patterns are clearly separated in the feature quantity space. However, the clipped reference patterns might not necessarily be clearly separated, because it is uncertain whether a pattern located in a boundary is included in a clipped reference patterns or not, due to a tiny difference in defect locations. Therefore, the cluster analysis that can classify objects being similar to each other is required.

For grouping the clipped reference patterns in detail, it is necessary to subdivide the feature quantities. For an example shown in FIG. 123, it is necessary to use feature quantities having upward and downward line-shaped patterns and having short and long line-shaped patterns.

According to this embodiment, tendencies for defects to be caused such as "many defects have been caused at dense patterns which have thin vertical lines" can be easily grasped as a whole. Moreover, the defect can be classified for every reference pattern of the similar feature. Further, a cause of defects can be easily specified.

5.15 Method of Selecting Defect Image To-Be-Registered

The defect-class determination unit 14 outputs a defect image to the display device 5 and the printer 6 through the output unit 13 in step S328 (see FIG. 25). The defect image means an image of a pattern to-be-inspected from which a defect is detected. If the number of defects drastically increases, a huge number of defect images must be registered, and therefore the memory capacity increases. Therefore, this method is of no practical use. Therefore, in order to solve this problem, the number of maximum registrations of the defect images for each defect-class is predetermined.

The number of maximum registrations of the defect images for each defect-class may be statically determined based on the number of the above-mentioned 3.3 Recipe data "9. The number of maximum registrations of defect images", or may be dynamically variable based on the number of defects which have been detected and monitored. For example, the above dynamic number of maximum registrations for each defect-class may be determined as the number that is proportional to the logarithm of the number of the detected defects.

A new defect image is registered until the number of registered defect images becomes equal to the number of the maximum registrations of the defect images. In the case where the number of the registered defect images is equal to the number of maximum registrations of the defect images, whether the new defect image should be registered is determined according to the defect size or other index. If the defect image is judged registered, a defect image to be deleted is determined, and then deleted. As an alternative method, random numbers may be used to determine whether the new defect image is to-be-registered.

According to this embodiment, even if there are many defects having the same defect-class and there are few defects having other defect-class, much more kinds of images can be registered.

5.16 Method of Selecting Defect To-Be-Reinspected

In some cases, an image of a pattern to-be-inspected is reacquired under the condition of acquiring an image at high magnification different from magnification at the time of inspection, and is reinspected. The reinspection is performed in the following procedure:

1. The recipe registration processing described in FIG. 22 is performed.

In step S202 of FIG. 22, an operator inputs the operator input parameters into the reference pattern generation unit 11 via the input device 4. In the case of reinspection, also the operator inputs the operator input parameters for reinspection into the reference pattern generation unit 11 via the input device 4 in step S202. Here, an inspection area, which is one of the image acquisition parameters in the input parameters for reinspection, is not inputted, because the inspection area is determined in the following step 4.

2. The inspection processing described in FIG. 25 or FIG. 26 is performed.

3. A defect to-be-reinspected is automatically selected from detected defects.

4. The recipe registration processing described in FIG. 22 is performed.

The operator input parameters for reinspection described in the above-mentioned step 1 are inputted into the reference pattern generation unit 11, instead of performing step S202. The inspection area is an inspection area for the random inspection. The inspection area, whose center is a position of the defect to-be-reinspected, is automatically set by using the position of the defect to-be-reinspected.

5. The inspection processing described in FIG. 25 or FIG. 26 is performed as reinspection.

As described in the above step 4, in the case of reinspection, it is necessary to select a defect to-be-reinspected automatically from the detected defects before reinspection. The defect to-be-reinspected may be selected from the detected defects by thinning out simply. However, defects having the same defect-class that are frequently caused are not necessarily important, and in some cases, the defects having the same defect-class that are occasionally caused are required to-be-reinspected fully. In order to meet this requirement, the number of maximum registrations of defects to-be-reinspected for each defect-class is determined.

As used in the determination of the number of maximum registrations of the defect images described in the above-mentioned 5.15 Method of selecting defect image to-be-registered, the number of maximum registrations of the defects to-be-reinspected for each defect-class may be statically determined based on the above-mentioned 3.3 Recipe data "10. The number of maximum registrations of defects to-be-reinspected.", or may be dynamically variable based on the number of defects which have been detected and monitored. For example, the above dynamic number of maximum registrations for each defect-class may be determined as a number that is proportional to the logarithm of the number of the detected defects.

After inspection is performed, whether a defect should be reinspected or not is determined based on random numbers. Specifically, all detected defects are given random numbers. A defect having a larger random number is more important. If a larger defect should be reinspected selectively, a random number to which a certain weight is given based on the defect size information may be used. Further, the weight may be made using other criteria than the defect size information.

According to this embodiment, the defects having the same defect-class that have been frequently caused and the defects having the same defect-class that have been occasionally caused are reinspected fully.

5.17 Method of Displaying Distribution Diagram of Pattern Deformation Quantities Obtained from the Whole Inspection-Unit-Area As described in steps S328, S332 (see FIG. 25), the defect information is outputted to the display device 5 and the printer 6 through the output unit 13. If the output unit 13 outputs the defect information as numerical numbers, a tendency for defects in the entire semiconductor device to be caused is difficult to be grasped. In order to solve this problem, it is necessary to provide a method in which the output unit 13 creates a distribution diagram presented by a bitmap, and outputs the created distribution diagram to the display device 5 and the printer 6. The distribution diagram is created by transforming the above-mentioned 4.8 Pattern deformation quantities obtained from the whole inspection-unit-area into a gray-scale or pseudo-color bitmap, and by superimposing defects.

Figure 124:
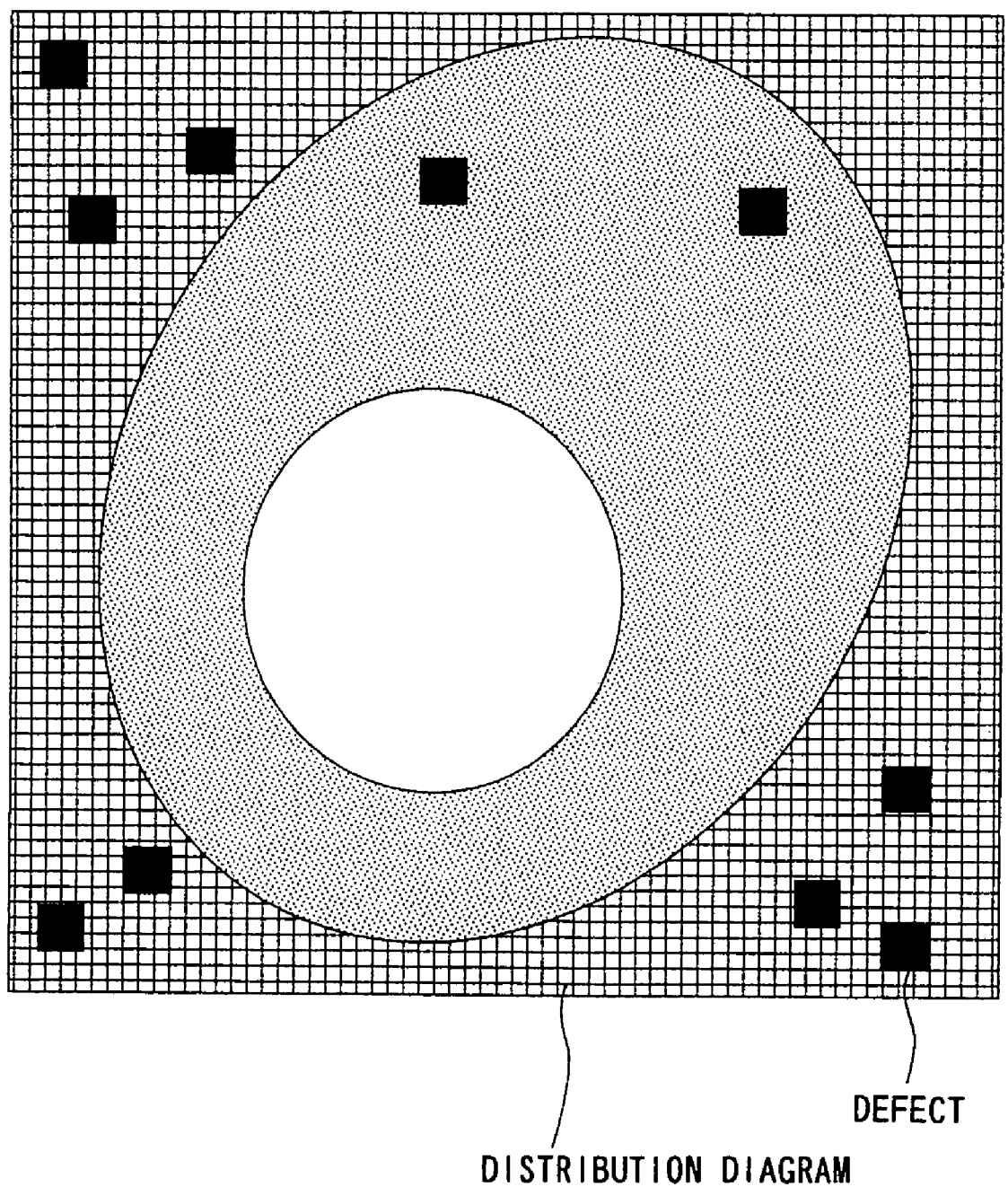

FIG. 124 shows an example of a distribution diagram that is created by transforming deformation quantities of the line widths, which are one of the pattern deformation quantities obtained from the whole inspection-unit-area, into a gray-scale bitmap, and by superimposing defects. A grid part has the largest deformation quantity of the line width, a dotted part has the larger deformation quantity, and a blank part has normal deformation quantity. Black squares show defects. From FIG. 124, it is recognized that the larger deformation quantity of the line width a part has, the more number of defects in the part is.

Further, as shown in FIG. 124, in the case where the deformation quantity of the line width is displayed, a stepper aberration, pattern deformation being dependent on a location in a wafer, and the like, can be grasped graphically. For example, if a semiconductor device, which constitutes periodical patterns, and which is formed normally, is inspected to obtain a distribution diagram and the distribution diagram is observed, a tendency for line widths in a peripheral part of the distribution diagram to be larger than a line width in a center part of the distribution diagram is grasped. From the tendency, it is understood that a peripheral part of the stepper lens has the aberration. As another example, if a SoC, which is formed normally, is inspected to obtain a distribution diagram and the distribution diagram is observed, it is understood that line widths for every function block such as a memory or logic have different values.

Moreover, by using the standard deviation of the line widths, a quality of a semiconductor device can be verified. The standard deviation of the line widths is another quantity of the pattern deformation quantities obtained from the whole inspection-unit-area.

According to this embodiment, a cause of defects can be easily specified and the quality of the semiconductor device can be verified, because it becomes easy to recognize tendencies for defects in the entire semiconductor device to be caused graphically.

5.18 Method of Classifying Measurement Values Based on Geometrical Information of Reference Pattern, Information of Design Data, or Information of Data Related to Design Data In the above-mentioned 5.17 Method of displaying distribution diagram of pattern deformation quantities obtained from the whole inspection-unit-area, the example of the distribution diagram using the deformation quantities of the line widths is described. If the gate line widths described in the above-mentioned 5.3.1 Method of inspecting gate line width are used as the line widths, a method of displaying deformation quantities of gate line widths classified by locations can be performed. As an alternative method of classifying the deformation quantities of the gate line widths, a method of classifying deformation quantities of gate line widths based on gate lengths, the minimum distances to the nearest pattern, or the like can be used.

FIG. 125 is a schematic view showing a method of classifying gate line widths based on gate lengths. Two gates in FIG. 125 have the same gate line width W, but have different gate lengths $L_1$ and $L_2$. In the case where each gate in a semiconductor device is one of these two gates, graphs $G_1$ and $G_2$ in FIG. 125 are obtained from deformation quantities of all the gate line widths. The graphs $G_1$ shows distribution of the deformation quantities of the gate line widths of the gates having the gate length $L_1$; and the graphs $G_2$ shows distribution of the deformation quantities of the gate line widths of the gates having the gate length $L_2$.

These graphs should be ideally identical, however, actually are different in general. By investigating a cause of the difference among these graphs, it becomes possible to improve quality of the semiconductor device.

In this embodiment, the method of classifying measurement values based on geometrical information of reference pattern is described by using the gate lengths or the minimum distances to the nearest pattern as geometrical information. However, a method of classifying measurement values based on one of the following information as geometrical information of reference pattern can be used:

1. Attributes of a reference pattern (line part, corner, end, isolated pattern, and the like)
2. A proximate line segment, a remote line segment, or other segments
3. Line widths (for example, the minimum line width, widths larger than the minimum line width and smaller than the minimum line width×1.5, widths not less than the minimum line width×1.5)

Further, the above geometrical information can be used in combination.

In addition, instead of using geometrical information of the reference pattern, information of design data, or information of data related to design data can be used. For example, a cell name of design data or cell name of mask data can be used.

According to this embodiment, for improving quality of the semiconductor device, it can be realized that all the gate widths in a semiconductor device are measured, the measured gate widths are classified based on the gate lengths, the minimum distances to the nearest pattern, or the like, and the gate widths are analyzed.

5.19 Deformation Quantity of Pattern Exposed by Shaped Beam

Figure 126:
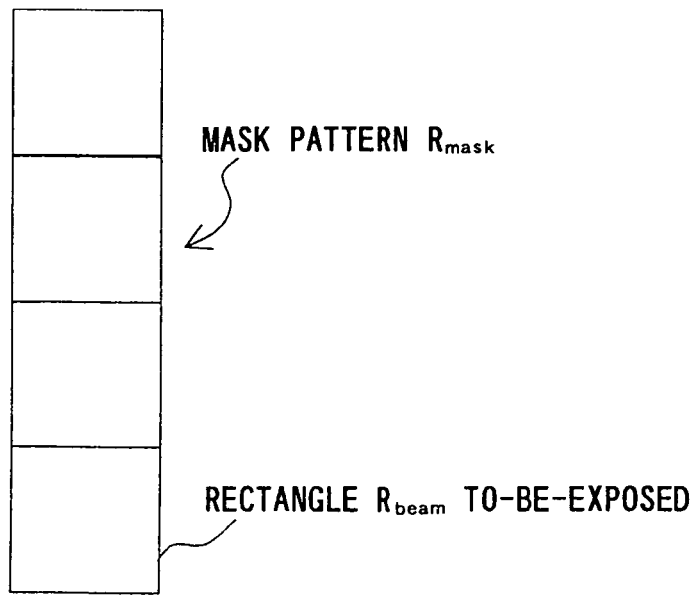

In order to write a photomask pattern by using an electron beam mask writer or a laser beam mask writer, there is a method in which a shaped beam such as a rectangular beam is used for exposure. In addition, a wafer direct writer by using an electron beam uses the same manner. In this embodiment, an example, in which a rectangular beam is used for exposing a rectangle, will be described. FIG. 126 is a schematic view showing rectangles, which are used in a writer, obtained by dividing a photomask pattern. Four rectangles $R_{beam}$ are exposed in order to write a photomask pattern $R_{mask}$, which is a rectangle extending in the vertical direction, shown in FIG. 126. The exposed patterns fabricated by rectangles $R_{beam}$ constitute a pattern to-be-inspected.

The shaped beam is deformed and exposed, so that a photomask pattern may be deformed more than an allowable pattern deformation quantity. Conventionally, deformation of the shaped beam is controlled by exposing a test pattern before writing a photomask pattern of a product. However, there has not been a method in which a variation in the shaped beam, which is deformed during the exposure of the photomask pattern of the product, is controlled.

In order to solve this problem, the following method is used. In this method, the second edges of an image of a pattern to-be-inspected obtained from a photomask pattern corresponding to the rectangles $R_{beam}$ used in the writer are obtained, and deformation quantities of exposed patterns fabricated by the rectangles $R_{beam}$ used in the writer are obtained by using the obtained second edges. FIG. 127 is a schematic view showing the second edges of an image of a pattern to-be-inspected corresponding to the rectangle used in the writer. The second edges $E_L$ and $E_R$ shown in FIG. 127 represent shapes of the left-hand side and the right-hand side of exposed patterns fabricated by the rectangles $R_{beam}$ used in the writer.

The deformation quantities of the exposed patterns are obtained, assuming that the edges of the exposed patterns fabricated by the rectangles $R_{beam}$ used in the writer form quadrilaterals. Specifically, a line $L_L$ shown in FIG. 127 is obtained by approximating coordinate values of the second edges $E_L$ using the least square method. A line $L_R$ shown in FIG. 127 is obtained from the second edges $E_R$ by the same manner. It is understood that the rectangles $R_{beam}$ used in the writer shown in FIG. 127 have been exposed by a rectangle beam inclined clockwise. Further, it is understood that a gap G shown in FIG. 127 has been caused by the rectangle beam inclined clockwise.

Distances between the line $L_L$ and the second edges $E_L$, and distances between the line $L_R$ and the second edges $E_R$ are obtained, and then local deformation quantities of the exposed patterns fabricated by the rectangles $R_{beam}$ used in the writer can be obtained. A location $P_{bump}$ shown in FIG. 127 has the larger local deformation quantity than other parts. Edge roughness of a part corresponding to the line $L_L$ is larger than edge roughness of a part corresponding to the line $L_R$. In the above method, the edges of the exposed patterns fabricated by the rectangles $R_{beam}$ used in the writer have been assumed to form quadrilaterals. However, another shape, for example, four connected circular arcs of shown in FIG. 128, may be used.

According to this embodiment, an electron beam mask writer can be evaluated and controlled by obtaining deformation quantities of exposed patterns fabricated by a pattern used in a writer.

6. Other Scan Methods of Image Generation Device

Instead of scan methods described in the above-mentioned 2.2 Scan methods of image generation device, the following scan methods can be used in the image generation device 7.

6.1 Method of Scanning Electron Beam in 18 Degrees, Method of Scanning Hexagonal Area, and Method of Automatically Determining Scanning Conditions Based on Reference Pattern FIGS. 129A and 129B schematically show a method of scanning an electron beam in 18 degrees. FIG. 129A shows patterns P1, P2 which are identical to those shown in FIG. 11A. More than 99% of edges of an image of pattern to-be-inspected on semiconductor integrated circuits (LSI) or liquid crystal panels have the horizontal direction, vertical direction, the 45 degree direction, or the minus 45 degree direction. In order to give as large angles as possible between all the directions of the edges and a scanning direction, the scanning direction of the 18 degrees shown in FIG. 129B can be used. If such a scanning direction is used, edge detection accuracies with regard to almost all the edges become relatively high.

The scanning direction of 18 degrees is used in consideration of the 30 degree direction of edges of an image of a pattern to-be-inspected. In the case of ignoring inspection of edges having the 30 degree direction, the 22.5 degree or arctangent (2) degree direction shown in FIG. 14 may be used. Further, angles obtained by adding a multiple of 45 degrees to these angles can be used.

Figure 130A:
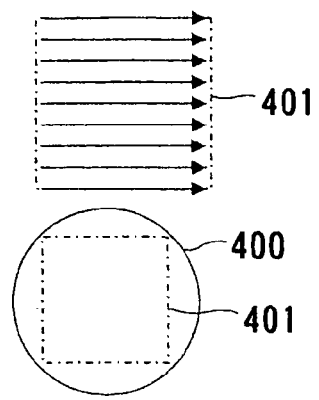
Figure 130C:
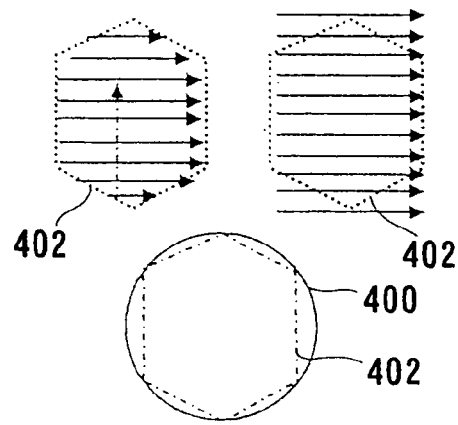
Figure 130B:
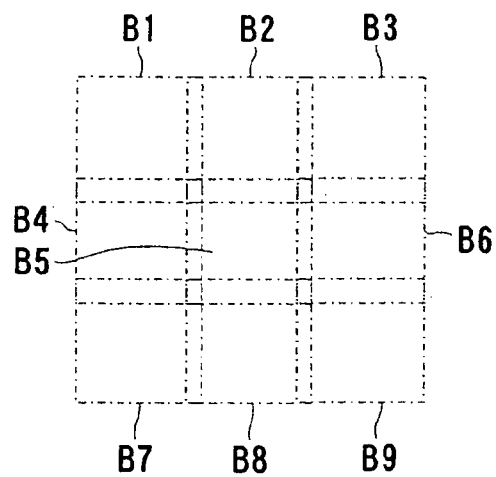

FIGS. 130A through 130D are schematic views showing a method of scanning a hexagonal area. A conventional scanning electron microscope such as a CD-SEM or the like generally acquires a square image with horizontal scanning lines. However, because of limitations on design of a scanning electron microscope, an area that can be scanned free of distortions is a circular area 400. Therefore, as shown in FIG. 130A, it is customary for a scanning electron microscope to scan a square area 401 bounding the circular area 400. The circular area 400 contains areas, which can be scanned free of distortions but are not scanned, in the upper part, the lower side, the left side, and the right side of the square area 401. Therefore, these parts are wasted in order to scan a larger area. In this case, for inspecting an inspection area, nine overlapping square areas B1 through B9 shown in FIG. 130B are scanned.

Figure 130D:
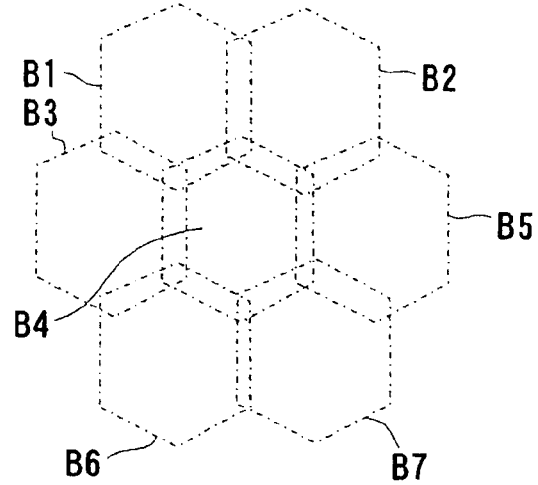

In the case of scanning a hexagonal area 402 bounding the circular area 400 in the lower side of FIG. 130C, the wider area can be scanned, because the scanning area approximates to the circular area 400. The hexagonal area 402 can be scanned in the following two methods:

As the first method, a method in which the hexagonal area 402 is scanned fully inside but not outside, as shown on the left-hand side of FIG. 130C can be used. As the second method, a method in which a rectangle region containing the hexagonal area 402 is scanned, and the upper right, the lower right, the upper left, and the lower left triangular areas around the hexagonal area 402 within the rectangle region are not used for inspection, as shown on the right-hand side of FIG. 130C can be used. By using these methods, in order to scan the same area as the inspection area shown in FIG. 130B, hexagonal areas B1 through B7 are scanned as shown in FIG. 130D, and therefore the number of scanning can be reduced.

FIG. 131 is a schematic view showing methods of automatically setting scanning conditions based on a reference pattern. As the methods of automatically setting scanning conditions, the following methods can be used:

1. A method of omitting scan area, in the case where no pattern to-be-inspected exists in a block like a block (D)
2. A method of setting scanning conditions depending on a line width of a pattern to-be-inspected A line width of patterns Pa to-be-inspected in a block (A) is a half of a line width of patterns Pb to-be-inspected in a block (B). In the case of inspecting a variation ratio of a line width of a pattern to-be-inspected, a magnification of scanning the block (A) is set to a double of a magnification of scanning the block (B).

3. A method of setting a scanning direction depending on directions of line segments of reference patterns Because patterns Pa to-be-inspected in the block (A) have the horizontal and the vertical line segments, the block (A) is scanned once in a scanning direction of 45 degrees, and because patterns Pc to-be-inspected in a block (C) have the 45 degrees and 135 degrees line segments, the block (C) is scanned twice in scanning directions of 45 degrees and 135 degrees.

According to this embodiment, the pattern to-be-inspected may be scanned with a minimum electron beam (charged particle beam), and therefore the image of the pattern to-be-inspected can be obtained in a minimum time. In addition, the scanning area can be wider in maximum, and therefore the number of scanning can be reduced. Further, for preventing edge detection accuracy, which depends on a scanning direction, from reducing, an optimal scanning direction can be set by using the reference patterns.

6.2 Scanning Paths of Electron Beam in Image Generation Device

FIGS. 132 and 133 show scanning paths for an electron beam. An oscillator 410, a counter 411, an X-deflection generating circuit 412, a Y-deflection generating circuit 413 are components of the deflection controller 318 as shown in the upper sides of FIGS. 132 and 133. The control computer 350 sets a start voltage, an end voltage, a step voltage to the X-deflection generating circuit 412, and the Y-deflection generating circuit 413. The control computer 350 sends a start signal to the oscillator 410.

In a conventional scanning, a pattern to-be-inspected is scanned stepwise in each pixel by deflection in the X direction and scanned stepwise in each line by deflection in the Y direction. According to such a conventional scanning process, edge detection accuracy is liable to be low because no information may be acquired between scanning lines. According to this embodiment, as shown in FIG. 132, in order to acquire information between scanning lines, a signal having amplitude, such as a sine-wave signal, is added to deflection in the Y direction for acquiring data between the scanning lines (see the lower left side of FIG. 132).

As shown in FIG. 132, data at four points are sampled (see the lower right side of FIG. 132). In this method, spread data for deflection in the Y direction can be acquired in one period of the sine wave. The data from the four points are added and transmitted as one-pixel information to the control computer 350.

As shown in the upper side of FIG. 132, the oscillator 410 having an internal frequency, which is four times an output frequency, is connected to a counter 411. The counter 411 is connected to the X-deflection generating circuit 412 and the Y-deflection generating circuit 413. The above circuit arrangement generates a stepwise waveform that increases in the rightward direction for deflection in the X direction, and a sine wave for deflection in the Y direction, based on the internal frequency. Data at the four points are sampled according to the internal frequency, and added into sampling data corresponding to a pixel.

As an alternative method, a method in which the waveform for deflection in the Y direction is generated by using the above method and a waveform for deflection in the X direction is generated as a stepwise waveform in order to obtain a zigzag scanning path can be used. FIG. 133 shows an example of the above method.

FIG. 134 schematically shows the filtering of a vertical scan. Pixels A are close to each other in the horizontal direction and are smoothed by a photomultiplier and an operational amplifier in the secondary electron detector 330. Pixels B are close to each other in the vertical direction, but are not smoothed. Therefore, the smoothing filter is applied vertically to reduce difference between image qualities in the horizontal and vertical directions. In FIG. 134, the simplest filtering coefficients are illustrated. However, optimal filtering coefficients may be selected to match horizontal frequency characteristics.

According to this embodiment, the difference between the image qualities in the X and Y directions can be reduced to the utmost by changing scanning paths in order to acquire information between scanning lines, or filtering.

6.3 Method of Scanning Only Neighboring Portion of Edges of Pattern To-Be-Inspected It is necessary to shorten image-acquisition time by using a method of scanning only a neighboring portion of edges of a pattern to-be-inspected. Further, it is necessary to improve edge detection accuracy by scanning an electron beam in direction perpendicular to direction of an edge of a pattern to-be-inspected.

FIG. 135 is a schematic view showing a method of scanning only a neighboring portion of edges of a pattern to-be-inspected, and FIG. 136 is a flowchart showing procedure in the method of scanning only a neighboring portion of edges of a pattern to-be-inspected. The circuit arrangement shown in FIG. 135 includes an auxiliary deflection generating circuit 450, a rotation circuit 451, an X main deflection circuit 452, and a Y main deflection circuit 453.

The method in which only a neighboring portion of edges of a pattern to-be-inspected is scanned is performed in the following procedure:

1. A profile acquisition section that is used for detecting the second edge is obtained from a reference pattern, and information with regard to the profile acquisition sections are registered beforehand. The information includes positions of the middle point, directions, and lengths of the profile acquisition section.

2. The control computer 350 reads the information with regard to the single profile acquisition section.

3. The control computer 350 sets the position of the middle point of the profile acquisition section to the X main deflection generating circuit 452 and the Y main deflection generating circuit 453, thereby moving a central position of a beam.

4. A scan rotation angle corresponding to the direction of the profile acquisition section is set to the rotation circuit 451, and amplitude corresponding to the length of the profile acquisition section is set to the auxiliary deflection generating circuit 450.

5. A start signal is sent to the oscillator 410, and the counter 411 connected to the oscillator 410 generates a scanning waveform in the X and Y directions. The outputs of the X main deflection generating circuit 452 and the Y main deflection generating circuit 453 are added in order to generate a scanning path shown in the upper central part of FIG. 135.

6. The scanning path is then sampled at seven points as shown in the upper right side of FIG. 135 in order to obtain sampling data.

FIGS. 137A and 137B are schematic views showing methods of sequencing acquisition of sampling data when only the neighboring portion of the edges of the pattern to-be-inspected is scanned. As the first method of sequencing the acquisition of the sampling data, a method in which the sampling points are sampled by skipping according to a skipping rate as shown in FIG. 137A can be used. As the second method of sequencing the acquisition of the sampling data, a method in which the sampling points are sampled randomly according to random numbers as shown in FIG. 137B can be used. According to the methods, deformation of the profiles due to the electrification phenomenon of a specimen can be effectively reduced, and therefore the methods are suitable for inspecting insulation. If the electrification phenomenon of a specimen can be ignored, the sampling points can be sampled successively in order to go around the reference pattern.

According to this embodiment, the scanning can be performed at high speed and edge detection accuracy can be improved. Moreover, the electrification phenomenon effect can be reduced.

6.4 Method of Scanning Only Neighboring Portions Corresponding to Region for Region Inspection Method In the case of using the above-mentioned 5.2 Region inspection method, by using a method of scanning only neighboring portions corresponding to a region for the region inspection, image-acquisition time can be shortened. Further, edge detection accuracy can be improved because a scanning direction and a direction of an edge of a pattern to-be-inspected are perpendicular to each other.

FIGS. 138A, 138B and 138C are schematic views showing a method of obtaining neighboring portions corresponding to regions for the line width inspection. By the following procedure, the neighboring portions corresponding to the regions for the region inspection shown in FIG. 138B or FIG. 138C is obtained, and the obtained portion are scanned.

1. Reference patterns K suitable for the line width inspection are obtained. The rectangles K are shown by solid lines and double lines in FIG. 138A, and are the same as the reference patterns A and the reference patterns B in FIG. 84.

2. The minimum rectangles including profile acquisition sections required for detecting all second edges based on the reference patterns K are obtained as scanning portions.

Specifically, the minimum rectangle R including the reference patterns K is obtained. The profile acquisition sections are set to a right line segment and a left line segment of the rectangle R, respectively.

In FIG. 138B, rectangles Sa and Sb, which are obtained by moving the right line segment and the left line segment of the rectangle R by a length L of the profile acquisition section in the outward direction of the reference patterns K, become the scanning portions. The scanning portions are shown by rectangles with four arrows, and the arrows show scanning directions.

In FIG. 138C, a rectangle Sc, which is obtained by dilating the rectangle R by the length L of the profile acquisition section, becomes a scanning portion. This method is advantageous in that although both of the right and left edges of the pattern to-be-inspected cannot be scanned from the inward to the outward of the pattern, the scanning region is single.

The scanning region in the space width inspection may be determined in the same manner.

According to this embodiment, image-acquisition time can be shortened. Further, the edge detection accuracy can be improved because the scanning direction and the direction of the edge of the pattern to-be-inspected are perpendicular to each other.

6.5 Method of Performing Interlace Scan and Image-Accumulation Scan Using Continuously Moving Stage In order to improve inspection speed, a method in which an image of a pattern to-be-inspected is acquired by using a continuously moving stage and a line-sensor is used. However, by using the method, an image of a pattern to-be-inspected cannot be acquired by performing interlace scan or image-accumulation scan. The image accumulation scan means scan, in which the same scanning line is scanned two or more times in order to acquire an accumulated image.

In order to solve this problem, a method of performing interlace scan and image-accumulation scan using a continuously moving stage and feedback of a stage position to deflectors, as shown in FIG. 139, is used. FIG. 139 is the same as FIG. 132 except for the following items:

1. In order to control continuous moving, the XY stage controller 322 monitors X and Y positions of the XY stage 321, and adjusts a speed of the XY stage 321.

2. The XY stage controller 322 gives feedbacks of the X and Y positions of the XY stage 321 to the X-deflection generating circuit 412 and the Y-deflection generating circuit 413.

3. Although in FIG. 132 the counter 411 outputs signals for generating a scanning waveform in the X and Y directions with regard to one field of view, in FIG. 139 the counter 411 outputs signals for generating a scanning waveform in the X and Y directions with regard to sequential fields of view.

4. The X-deflection generating circuit 412 and the Y-deflection generating circuit 413 subtract the X and Y positions of the XY stage 321, which are obtained from the XY stage controller 322, from the signals, which are outputted from the counter 411 for generating the scanning waveform in the X and Y directions with regard to sequential fields of view, and output the results of the above subtractions to the X deflector 313 and the Y deflector 314.

6.5.1 Method of Performing Interlace Scan Using Continuously Moving Stage

Interlace scan at 45 degrees in the lower left direction by using the configuration shown in FIG. 139, as shown in FIG. 140, will be considered. Here, the following symbols are used:

Sp: an interval between scanning lines

Ls: a length of a scanning line in the X direction

Ni: the number of scanning lines between a scanning line $L_1$ and a scanning line $L_2$. In this embodiment, the number of scanning lines Ni is two.

Nc: the number of scanning lines that have been scanned from the scanning line $L_1$ to the scanning line $L_5$, which is the next scanning line of the scanning line $L_1$. In this embodiment, the number Nc of scanning lines is four.

A parallelogram region is scanned by the scanning line from $L_1$ to $L_8$, and an image of a pattern to-be-inspected is acquired.

FIG. 141 is a schematic view showing scanning waveforms generated by the X deflector 313 and the Y deflector 314, the XY stage 321 continuously moving a specimen downward, in the case of performing the interlace scan shown in FIG. 140. The boundaries A, B, C, and F in FIG. 141 show positions represented by the coordinates describing the scanning waveforms.

In order to scan a scanning line $L_4$, the Y deflector 314 should scan the boundary F in the Y direction, in order to scan a scanning line $L_5$, the Y deflector 314 should scan the boundary B in the Y direction, and in order to scan at 45 degrees in the lower left direction, the Y deflector 314 should scan the boundary C in the Y direction. Here, movement of the specimen during scanning is ignored for simple drawing, therefore it is necessary to enlarge the boundary C by a movement amount Sp, which is the same as the interval Sp between scanning lines. Summing up the above amounts, the Y deflector 314 should scan a width $(2(Ni-1)(Nc-1)+1)Sp$ in the Y direction.

The image acquisition device 317 stores intensities of secondary electrons detected by the secondary electron detector 330 to a frame buffer shown in FIG. 142. Stored positions of the frame buffer correspond to the scanning lines shown in FIG. 141. When the detected intensities to be outputted as one image have been stored in the frame buffer, the image acquisition device 317 outputs the detected intensities to the inspection unit 12 through the control computer 350. Rectangles $I_1$ and $I_2$ in FIG. 142 show intensities to be outputted as one image.

6.5.2 Method of Performing Image-Accumulation Scan Using Continuously Moving Stage An image-accumulation scan at 45 degrees in the lower left direction by using the configuration shown in FIG. 139, as shown in FIG. 143, will be considered. Here, the following symbols are used:

Sp: an interval between scanning lines.

Ls: a length of a scanning line in the X direction.

Na: the number of image-accumulation. In this embodiment, the number Na of image-accumulation is two.

A parallelogram region is scanned by the scanning line from $L_1$ to $L_8$, and an image of a pattern to-be-inspected is acquired. The scanning lines $L_1$ and $L_5$ are the same scanning line; similarly the scanning lines $L_2$ and $L_6$, the scanning lines $L_3$ and $L_7$, and the scanning lines $L_4$ and $L_8$ are the same respectively.

FIG. 144 is a schematic view showing scanning waveforms generated by the X deflector 313 and the Y deflector 314, the XY stage 321 continuously moving a specimen downward, in the case of performing the image-accumulation scan shown in FIG. 143. The boundaries A, B, C, and F in FIG. 144 show positions represented by the coordinates describing the scanning waveforms.

In order to scan a scanning line $L_4$, the Y deflector 314 should scan the boundary F in the Y direction, in order to scan a scanning line $L_5$, the Y deflector 314 should scan the boundary B in the Y direction, and in order to scan at 45 degrees in the lower left direction, the Y deflector 314 should scan the boundary C in the Y direction. Here, movement of the specimen during scanning is ignored for simple drawing, and therefore it is necessary to enlarge the boundary C by the movement amount Sp, which is the same as the interval Sp between scanning lines. Summing up the above amounts, the Y deflector 314 should scan a width $(2 \cdot Nc/Na \cdot Sp)$ in the Y direction.

The image acquisition device 317 adds intensities of secondary electrons detected by the secondary electron detector 330 to a frame buffer shown in FIG. 145. Stored positions of the frame buffer correspond to the scanning lines shown in FIG. 144. A line $(L_1, L_5)$ in FIG. 145 shows positions of the frame buffer to which intensities of secondary electrons detected by scanning the scanning lines $L_1$ and $L_5$ are added, and a line $(L_2, L_6)$ shows positions of the frame buffer to which intensities of secondary electrons detected by scanning the scanning lines $L_2$ and $L_6$ are added.

When all the detected intensities to be outputted as one image have been added to the frame buffer, the image acquisition device 317 divides the added intensities by the number of image-accumulation Na and outputs the divided intensities to the inspection unit 12 through the control computer 350. A rectangle 13 in FIG. 145 shows intensities to be outputted as one image.

According to this embodiment, an image of a pattern to-be-inspected can be acquired by performing interlace scan and image-accumulation scan, using a continuously moving stage and feedback of XY stage positions to deflectors. Consequently, inspection speed can be improved.

7. Method of Correcting Image of Pattern To-Be-Inspected 7.1 Method of Correcting at Least One of Reference Pattern and Image of Pattern To-Be-Inspected by Detecting Distortion Quantities of Image of Pattern To-Be-Inspected A rotation of the specimen caused by stage moving or the like may cause a rotation of an image of a pattern to-be-inspected. Moreover, the electrification phenomenon of the specimen or the like may cause distortion of the image of the pattern to-be-inspected such as a rotation including a skew or a variation in magnification or the like. Because of the above distortion of the image of the pattern to-be-inspected, a fine defect smaller than the above distortion quantities of the image of the pattern to-be-inspected cannot be detected. The above distortion of the image of the pattern to-be-inspected occurs sporadically, and the above distortion cannot be predicted. Therefore, it is necessary to detect the above distortion quantities of the image of the pattern to-be-inspected, and correct the image of the pattern to-be-inspected every time when an image is acquired.

FIG. 146 is a schematic view showing an image of a pattern to-be-inspected having the above distortion. Line segments shown by dotted lines schematically show a reference pattern, and tips of vectors d(x,y) schematically show edges of an image of a pattern to-be-inspected. The matching between the reference pattern and the edges of the image of the pattern to-be-inspected is performed. However, in the matching using only translation, distortion such as a rotation, a variation in magnification or the like remains as matching errors.

First, these matching errors are summed up by using the affine transformation. The affine transformation means the linear transformation using the coefficients 'a' to 'f'.

$$X = ax + by + c$$

$$Y = dx + ey + f$$

In this transformation equation, (x,y) are coordinate values of a point on the reference pattern, and (X,Y) are coordinate values of an edge of an image of a pattern to-be-inspected corresponding to the above point. The coefficients 'a', 'b', 'd', and 'e' represent a rotation including a skew and a variation in magnification. If it is not necessary to correct the skew, the following matrix is restricted to be an orthogonal matrix:

$$\begin{pmatrix} a & b \\ d & e \end{pmatrix}$$

In addition, if it is not necessary to correct the variation in magnification, the matrix is restricted to be a rotational matrix.

In this transformation equation, the coefficients 'c' and 'f' represent shift quantities. In the example shown in FIG. 146, these shift quantities are zero.

The method in which the matching using a sub-inspection-unit-area is performed is shown in FIG. 147. The sub-inspection-unit-area is defined as an area made by dividing an inspection-unit-area. In the case where the inspection-unit-area is huge, the matching using the sub-inspection-unit-area is exceedingly faster than the matching using the inspection-unit-area. In this case, the coefficients 'c' and 'f' of other sub-inspection-unit-areas are not zero in general.

The coefficients 'a' to 'f' are calculated by the following procedure:

1. The vector d(x,y) which represents a summation of a pattern deformation quantity and the distortion quantity of the image of the pattern to-be-inspected (shown in FIG. 146) is obtained. The vector d(x,y) is the same as the vector d(x,y) between the two edges shown in FIG. 60.

2. The coefficients 'a' to 'f' are obtained from $(d_x(x_i,y_i), d_y(x_i,y_i))$ ('i' is a number from 1 to the number of data), which are components of the respective vectors d(x,y), by using the least square method. $(x_i,y_i)$ are coordinate values of the point of the reference pattern. $(x_i+d_x(x_i,y_i), y_i+d_y(x_i,y_i))$ are coordinate values of the edge of the image of the pattern to-be-inspected corresponding to the above point. Therefore, a summation E of square errors of data is calculated by the following equation:

$$E = \Sigma(x_i + d_x(x_i,y_i) - (ax_i + by_i + c))^2 + \Sigma(y_i + d_y(x_i,y_i) - (dx_i + ey_i + f))^2$$

where $\Sigma$ means summation for all 'i'.

The least square method requires that partial derivatives of the summation E of square errors of data with regard to the coefficients 'a', 'b', 'c', 'd', 'e', and 'f' are zero:

$$\frac{\partial E}{\partial a} = 0, \frac{\partial E}{\partial b} = 0, \frac{\partial E}{\partial c} = 0, \frac{\partial E}{\partial d} = 0, \frac{\partial E}{\partial e} = 0, \frac{\partial E}{\partial f} = 0$$

The following equations are obtained from these equations:

$$\begin{pmatrix} \sum a x_i x_i & \sum b y_i x_i & \sum c x_i & 0 & 0 & 0 \\ \sum a x_i y_i & \sum b y_i y_i & \sum c y_i & 0 & 0 & 0 \\ \sum a x_i & \sum b y_i & \sum c & 0 & 0 & 0 \\ 0 & 0 & 0 & \sum d x_i x_i & \sum e y_i x_i & \sum f x_i \\ 0 & 0 & 0 & \sum d x_i y_i & \sum e y_i y_i & \sum f y_i \\ 0 & 0 & 0 & \sum d x_i & \sum e y_i & \sum f \end{pmatrix} \begin{pmatrix} a \\ b \\ c \\ d \\ e \\ f \end{pmatrix} =$$

$$\begin{pmatrix} \sum (x_i + d_x(x_i, y_i)) x_i \\ \sum (x_i + d_x(x_i, y_i)) y_i \\ \sum (x_i + d_x(x_i, y_i)) \\ \sum (y_i + d_y(x_i, y_i)) x_i \\ \sum (y_i + d_y(x_i, y_i)) y_i \\ \sum (y_i + d_y(x_i, y_i)) \end{pmatrix}$$

The coefficients 'a', 'b', 'c', 'd', 'e', and 'f' are obtained by solving the above equations. The processing for obtaining the coefficients 'a' to 'f' is performed between the step S314 and the step S318 shown in the flowchart of FIGS. 25 through 27. Hereafter, this processing is called step S316.

The following three methods, in which the image of the pattern to-be-inspected is corrected by using the obtained coefficients 'a' to 'f' as shown in FIG. 148, can be performed:

1. Correction Method 1

The reference pattern is corrected by using the coefficients 'a' to 'f'. Then, the step S314 and later steps are performed. However, in this case, the step S316 is not performed.

2. Correction Method 2

The edges are detected again after correcting the image of pattern to-be-inspected by using the coefficients 'a' to 'f'. In this case, the invert transformation equations of the equations described in the affine transformation are used. Then, the step S310 and later steps are performed. However, in this case, the step S316 is not performed.

3. Correction Method 3

$(d_x(x_i,y_i), d_y(x_i,y_i))$ which are components of the respective vectors d(x,y) are corrected by the following equation using the coefficients 'a' to 'f':

$$(d_x(x_i,y_i) - (ax_i + by_i + c - x_i), d_y(x_i,y_i) - (dx_i + ey_i + f - y_i))$$

Next, the step S318 is skipped, and the step S320 and later steps are performed. In the step S320, the obtained corrected vectors d(x,y) are used as the vector d(x,y) between the two edges shown in FIG. 60.

The above-mentioned correction method 1 and the correction method 2 can correct the distortion quantities of the image of the pattern to-be-inspected accurately. However, they require huge calculating cost. On the other hand, in the above-mentioned correction method 3, although the vectors d(x,y) of corner portions cannot be corrected sufficiently accurately, calculating cost is low. This inaccuracy may be ignored practically.

Although this embodiment uses the affine transformation, other transformation can be used. For example, transformation equations using quadratic terms of $x_i$, $y_i$ can be used. However, complex transformation equations may ignore actual pattern deformation quantities, and therefore it is necessary to choose transformation equations carefully.

According to this embodiment, the distortion quantities of the image of the pattern to-be-inspected are detected as linear values, and the image of the pattern to-be-inspected is corrected. As a result, the distortion quantities, which should not be detected as a defect, can be ignored so that false defects can be prevented from being detected.

The above method that detects the rotation including the skew, and the variation in magnification can be used for rotation and magnification adjustments of the image generation device 7. The adjustments can be performed before the inspection or at an appropriate time during the inspection as needed. In this case, the affine transformation coefficients 'a', 'b', 'd', and 'e' are converted into adjustment values of rotation and magnification of the image generation device 7, and the adjustment values are set to the image generation device 7.

7.2 Method of Accumulating Images by Using Method of Correcting Images of Pattern To-Be-Inspected As a method of improving quality of an image of a pattern to-be-inspected, the image-accumulation method is well known. However, in the case where images of a pattern to-be-inspected on a specimen liable to cause the electrification phenomenon are acquired successively, a sharp accumulated image cannot be obtained by accumulating the acquired images simply, because the acquired images are distorted gradually.

In order to solve this problem, a method of accumulating images by using a method of correcting images of a pattern to-be-inspected is used. FIG. 149 is a schematic view showing the above method.

In FIG. 149, the above-mentioned Correction method 2 in 7.1 Method of correcting at least one of reference pattern and image of pattern to-be-inspected by detecting distortion quantities of image of pattern to-be-inspected is used for correcting the acquired images. Next, the corrected images are accumulated.

According to this embodiment, even if the acquired images, which are distorted gradually, are accumulated, the sharp accumulated image can be obtained.

7.3 Method of Obtaining Distortion Quantities of Image of Pattern To-Be-Inspected by Using Distribution of the First Edges of Image of Pattern To-Be-Inspected In the above-mentioned 7.1 Method of correcting at least one of reference pattern and image of pattern to-be-inspected by detecting distortion quantities of image of pattern to-be-inspected, the distortion quantities of the image of the pattern to-be-inspected are obtained by using the vectors d(x,y) between the reference pattern and the edges of the image of the pattern to-be-inspected. However, in the case of the large distortion quantities of the image of the pattern to-be-inspected, the vectors d(x,y) which exceed the allowable pattern deformation quantity cannot be obtained, and therefore the pattern deformation quantities may not be obtained correctly as shown in FIG. 150. In this case, a method of obtaining distortion quantities of the image of the pattern to-be-inspected by using distribution of the first edges of an image of a pattern to-be-inspected can be used.

In FIG. 150, reference patterns have mainly the vertical line segments, and the first edges of an image of a pattern to-be-inspected have mainly angles slightly different from 90 degrees. In this embodiment, the first edges detected from an image having bright edges and having no contrast between the inside of a pattern and the ground as described in 4.1.2 The first edge detection method 2 are used as edges (edge vectors). In this case, the edges have an angle from 0 to 180 degrees. An image having a contrast between the inside of the pattern and the ground as described in 4.1.1 The first edge detection method 1 can be used in the same manner.

First, rotation correction of the image of the pattern to-be-inspected is performed in the following procedure:

1. Here, the case where the X and Y components of the edges of the image of the pattern to-be-inspected have a value from 0 to 15 will be considered. In order to obtain an image rotation angle θx with regard to the edges of the image of the pattern to-be-inspected in the vertical direction, frequencies F(0,15), F(1,15), and F(−1,15), which correspond to the edges of the image of the pattern to-be-inspected having the X and Y components (0,15), (1,15), and (−1,15), are obtained. These frequencies are shown in FIG. 151.

2. Ratios R(1) and R(−1) are obtained from the frequencies F(0,15), F(1,15), and F(−1,15):

$$R(1)=F(1,15)/(F(0,15)+F(1,15)+F(-1,15))$$

$$R(-1)=F(-1,15)/(F(0,15)+F(1,15)+F(-1,15))$$

It is assumed that F(0,15), F(1,15), and F(−1,15) have the standard normal distribution. FIG. 151 is a schematic view showing a method of obtaining a center of the standard distribution. Positions X(1) and X(−1) of the standard normal distribution corresponding to the ratios R(1) and R(−1) are obtained as shown in FIG. 151. The positions X(1) and X(−1) are distances from the center of the standard normal distribution, and positive numbers. The following position Xc is a center of the distribution of the frequencies, because the positions X(1) and X(−1) correspond to the X component 0.5 and −0.5 of the edges of the image of the pattern to-be-inspected.

$$Xc=X(-1)/(X(1)+X(-1))-0.5$$

Therefore, the image rotation angle θx with regard to the edges of the image of the pattern to-be-inspected in the vertical direction is the following:

$$\theta x=\arctan(Xc/15)$$

3. In order to obtain an image rotation angle θy with regard to the edges of the image of the pattern to-be-inspected in the horizontal direction, calculations, which are the same in the above steps 1 and 2 with the X components and Y components being inverted, are performed. FIG. 152 is a view showing the image rotation angle θx and θy.

4. The coefficients 'a', 'b', 'd', and 'e' of the affine transfer are obtained from the image rotation angles θx and θy as follows:

$$\begin{pmatrix} a & b \\ d & e \end{pmatrix} = \begin{pmatrix} \cos\theta y & \sin\theta x \\ \sin\theta y & \cos\theta x \end{pmatrix}$$

Next, magnification correction of the image of the pattern to-be-inspected is performed in the following procedure:

5. In order to obtain a magnification Mx of the image of the pattern to-be-inspected in the horizontal direction, the vertical line segments that constitute the reference patterns are extracted. The extracted line segments are projected onto the horizontal axis (the X-axis) to produce one-dimensional data as shown in FIG. 153A. This one-dimensional data is in the form of array, and an index corresponds to an X coordinate value and an element corresponds to a length of the line segments. (see 4.2.3 Matching method in which projection data obtained by projecting edge on the horizontal and vertical axes are used)

6. Center points of the edges of the image of the pattern to-be-inspected having the X and Y components (0,15), (1,15), and (−1,15) are transformed by the coefficients 'a' to 'f' of the affine transfer obtained in the above step 4. The coefficients 'c' and 'f' are taken so that a center of the transferred image of the pattern to-be-inspected is equal to a center of the image of the pattern to-be-inspected before transformation. Then the transformed center points of the edges are projected onto the horizontal axis (the X-axis) to produce one-dimensional data as shown in FIG. 153B. This one-dimensional data is in the form of array. An index of the array corresponds to an X coordinate value, and an element of the array corresponds to a Y component of the edge vector corresponding to the transformed center point of the edge.

The distribution of the obtained projection data of the edges is separated clearly. However, in the case of performing no rotation correction, distribution of projection data of the edges are separated not clearly. Therefore, the order of the rotation correction and magnification correction is suitable.

7. In the above-mentioned 4.2.3 Matching method in which projection data obtained by projecting edge on the horizontal and vertical axes are used, while shifting the projection data of the upward (vertical) edges onto the horizontal axis within the range of the X direction shown in FIG. 46, the matching error values $E_{pm}$ in the X direction between the projection data of the upward (vertical) edges onto the horizontal axis and the projection data of upward (vertical) line segments onto the horizontal axis are calculated. In order to obtain a magnification Mx of the image of the pattern to-be-inspected in the horizontal direction, the above calculation is performed for the following plural projection data as shown in FIG. 153C.

Each of the plural projection data is obtained from the projection data of the upward (vertical) edges onto the horizontal axis by the linear approximation method in order to magnify magnification $Mx_{cand}$ times. The each magnification $Mx_{cand}$ is in a range, in which the magnification Mx is to be obtained, with an interval between the magnifications $Mx_{cand}$ corresponding to an accuracy of the magnification Mx. A matching error value $E_{pm}$ is obtained from the projection data magnified by each magnification $Mx_{cand}$. The smallest matching error value $E_{pm}$ is obtained from the obtained matching error values $E_{pm}$. A magnification $Mx_{cand}$ that corresponds to the smallest matching error value $E_{pm}$ is taken as the magnification Mx of the image of the pattern to-be-inspected in the horizontal direction.

8. In order to obtain a magnification My of the image of the pattern to-be-inspected in the vertical direction, calculations, which are the same in the above steps 5 through 7 with the X components and Y components being inverted, are performed.

9. The coefficients 'a', 'b', 'd', and 'e' of the affine transfer are obtained from the image rotation angles θx, θy and the magnifications Mx, My as follows:

$$\begin{pmatrix} a & b \\ d & e \end{pmatrix} = \begin{pmatrix} Mx\cos\theta y & Mx\sin\theta x \\ My\sin\theta y & My\cos\theta x \end{pmatrix}$$

10. The image of the pattern to-be-inspected is transformed by the coefficients 'a' to 'f' of the affine transfer. The coefficients 'c' and 'f' are taken so that a center of the transferred image of the pattern to-be-inspected is equal to a center of the image of the pattern to-be-inspected before transformation.

11. By using the obtained image, the above-mentioned correction method 2 in 7.1 Method of correcting at least one of reference pattern and image of pattern to-be-inspected by detecting distortion quantities of image of pattern to-be-inspected is performed. In this case, the image of pattern to-be-inspected, which is to be corrected, is not the transformed image of pattern to-be-inspected in the above step 10, but the image of pattern to-be-inspected before the transformation. Therefore, the coefficients of the affine transfer to be used in the correction method 2 are obtained by multiplying the coefficients of the affine transfer obtained in the above step 10 by the coefficients of the affine transfer obtained in the above-mentioned 7.1 Method of correcting at least one of reference pattern and image of pattern to-be-inspected by detecting distortion quantities of image of pattern to-be-inspected as matrix calculation. According to this manner, because the affine transformation is performed once, quality of an image of a pattern to-be-inspected deteriorates less noticeably.

In this embodiment, the case where the X and Y components of the edges of the image of the pattern to-be-inspected have a value from 0 to 15 has been considered. For requiring higher accuracy, the X and Y components of the edges of the image of the pattern to-be-inspected may have a larger value than 15. Further, in the case where the image rotation angle θx or θy has a large number, the edges of the image of the pattern to-be-inspected having other X and Y components, for example (2,15) and (−2,15), are used, besides the X and Y components (0,15), (1,15), and (−1,15).

According to this embodiment, even if the vectors between the reference pattern and the edges of the image of the pattern to-be-inspected may not be obtained necessarily due to large distortion quantities of the image of the pattern to-be-inspected, the distortion quantities of the image of the pattern to-be-inspected can be obtained, and then the image of the pattern to-be-inspected can be corrected. Especially, this embodiment is efficient for the case of inspecting a specimen liable to cause the electrification phenomenon drastically and the case of rotation and magnification adjustments of the image generation device 7.

7.3.1 Method of Obtaining Distribution of the First Edges of Line Part of Image of Pattern To-Be-Inspected In the above-mentioned 7.3 Method of obtaining distortion quantities of image of pattern to-be-inspected by using distribution of the first edges of image of pattern to-be-inspected, it is assumed that distribution of the first edges of corner parts of an image of a pattern to-be-inspected is symmetry. FIG. 154 is a schematic view showing an example in which distribution of the first edges of corner parts of an image of a pattern to-be-inspected is asymmetry. Distribution of the first edges in part A of FIG. 154 is symmetry, however, distribution of the first edges in part B of FIG. 154 is asymmetry and biased toward upper left direction. The asymmetry affects accuracy of obtaining the above distortion quantities of the image of the pattern to-be-inspected. In order to solve the problem, the distribution of the first edges from the first edges that exist in line parts of the image of the pattern to-be-inspected is obtained.

FIG. 155 is a schematic view showing a method of recognizing the first edges that exist in corner parts of an image of a pattern to-be-inspected. Open circles in FIG. 155 mean the first edges of an image of a pattern to-be-inspected. The first edges of the image of the pattern to-be-inspected are linked. As a method of linking, a method disclosed in the literature [reference 2]: Cartan Steger, "An unbiased detector of curvilinear structures," IEEE Trans. Pattern Anal. Machine Intell., Vol. 20, No. 2, February 1998, or the like can be used.

Next, the linked first edges are approximated by a polygon. As a polygon approximation method, Ramer's method is used. First, the first edge A that exists in the lower left-hand side and the first edge B that exists in the upper right-hand side are obtained. The obtained first edges A and B are registered as vertices of the polygon. Next, the first edge C, which has the longest distance Dc from a line segment AB in the first edges existing between the first edge A and the first edge B, is obtained. In the case where the distance Dc from the line segment AB to the first edge C is longer than the predetermined distance Dl, the first edge C is registered as a vertex of the polygon. In the same manner, the first edge D, which has the longest distance Dd from a line segment BA in the first edges existing between the first edge B and the first edge A, is registered as a vertex of the polygon. The above procedure is iterated until it becomes impossible to register a vertex. The predetermined distance Dl is determined in consideration of noise.

Next, the first edges corresponding to the obtained vertices, and the first edges that exist in the neighborhood of the first edges corresponding to the obtained vertices are recognized as the first edges existing in corner parts of the image of the pattern to-be-inspected. The number Nn of vertices, which exist in the neighborhood of the first edges corresponding to the obtained vertices, is determined in consideration of corner roundness. The first edges except for the first edges existing in corner parts are recognized as the first edges existing in line parts of the image of the pattern to-be-inspected. FIG. 156 is a schematic view showing a method of recognizing the first edges that exist in line parts of the image of the pattern to-be-inspected. In FIG. 156, the case where the number Nn of vertices, which exist in the neighborhood of the first edges corresponding to the obtained vertices, is one is shown. Vertices, which exist in the neighborhood of the first edges corresponding to the obtained vertices, is shown by solid circles (●). The distribution of the first edges is obtained from the first edges that exist in the line parts of the image of the pattern to-be-inspected.

According to this embodiment, because the distribution of the first edges is obtained from the first edges which exist in a line part of the image of the pattern to-be-inspected, even if distribution of the first edges of corner parts of the pattern to-be-inspected is asymmetry, it is possible to prevent deterioration of accuracy of obtaining the distortion quantities of the image of the pattern to-be-inspected that is caused by the asymmetry.

7.4 Method of Correcting Nonlinear Distortion of Image

The image generation device 7 with a large field of view may have distortions of an image of a pattern to-be-inspected that cannot be corrected by the affine transformation used in 7.3 Method of obtaining distortion quantities of image of pattern to-be-inspected by using distribution of the first edges of image of pattern to-be-inspected. The distortions of the image of the pattern to-be-inspected are caused by Seidet's five aberrations. One of the most important distortions of the image of the pattern to-be-inspected is a nonlinear distortion of the image. In order to correct the nonlinear distortion of the image, a method shown in FIGS. 157 through 162 can be used.

As shown in FIG. 157, the nonlinear distortion of the image can be ignored in a central part of an image of a pattern to-be-inspected, but cannot be ignored in a peripheral part of the image of the pattern to-be-inspected. In this method, distortion vectors are obtained from the image of the pattern to-be-inspected, the obtained distortion vectors are transformed into representative distortion vectors, and then a distortion correction vector of each scanning point is calculated by the obtained representative distortion vectors. The distortion correction vectors are used in the deflection controller 318 as shown in FIG. 158. FIG. 158 is the same as FIG. 132 except for adding a distortion correction vector calculation circuit 414. The control computer 350 sets the representative distortion vectors to the distortion correction vector calculation circuit 414. The distortion correction vector calculation circuit 414 calculates a distortion correction vector in synchronism with a signal from the counter 411. Then, the distortion correction vector calculation circuit 414 outputs X and Y components of the distortion correction vector to the X-deflection generating circuit 412 and the Y-deflection generating circuit 413.

In FIG. 159, a method in which the distortion correction vector calculation circuit 414 calculates the distortion correction vector using the representative distortion vectors is shown. FIG. 159 uses an X deflection voltage and a Y deflection voltage as the X and Y coordinates respectively. The representative distortion vectors are set to locations shown by solid circles (●) in FIG. 159 for every X directional interval and for every Y directional interval. These intervals are equal to the above-mentioned 3.3 Recipe data "12. The interval of representative distortion vectors held by the distortion correction vector calculation circuit". One interval corresponds to a step voltage between scanning points. Here, for simple explanation, a method in which the X and Y directional intervals are the same interval 8 will be described.

In order to calculate the distortion correction vector $C_d(x,y)$ of a scanning point shown in FIG. 159, the following bilinear interpolation equation that uses the representative distortion vectors $R_d^{[0,0]}$, $R_d^{[8,0]}$, $R_d^{[0,8]}$, and $R_d^{[8,8]}$ is used:

$$C_d(x,y)=[\{R_d^{[0,0]}(8-x)+R_d^{[8,0]}x\}(8-y)+\{R_d^{[0,8]}(8-x)+R_d^{[8,8]}x\}y]/8^2$$

where the (x,y) are scanning point coordinates determined by the counter 411. A variable having the suffixes $^{[x,y]}$ means a variable corresponding to the scanning point coordinates (x,y).

A method in which the representative distortion vectors are calculated from the distortion vectors will be described. First, matching between reference patterns and edges of an image of a pattern to-be-inspected is performed in the central part of the image. The reference patterns suitable for this method are simple patterns arranged periodically as shown by dotted lines in FIG. 157.

In FIG. 160A, a method in which representative distortion vectors located at vertices of a rectangle region are calculated from distortion vectors in the rectangle region is shown. In this case, the above bilinear interpolation method is used in the calculation. FIG. 160A is the same as FIG. 159, except that the distortion vectors d(x,y) are used instead of the distortion correction vectors of the scanning points. The distortion vector d(x,y) is defined as a vector whose start point is a point on a reference pattern, and whose end point is a point of an edge of the image of the pattern to-be-inspected corresponding to the point on the reference pattern. The distortion vector d(x,y) is the same as the vector d(x,y) between the two edges shown in FIG. 60.

This embodiment will use z(x,y) which is an X or Y component of the distortion vector d(x,y) because calculation procedure of the X component of the distortion vector d(x,y) and calculation procedure of the Y component of the distortion vector d(x,y) are the same. Similarly, $r_z^{[0,0]}$, $r_z^{[8,0]}$, $r_z^{[0,8]}$ and $r_z^{[8,8]}$ will be used as an X or Y component of the representative distortion vectors $R_d^{[0,0]}$, $R_d^{[8,0]}$, $R_d^{[0,8]}$, and $R_d^{[8,8]}$, respectively. Therefore, z(x,y) is expressed by the following equation:

$$z(x,y) \{r_z^{[0,0]}(8-x)(8-y)+r_z^{[8,0]}x(8-y)+r_z^{[0,8]}(8-x)y+r_z^{[8,8]}xy\}/8^2$$

In order to solve $r_z^{[0,0]}$, $r_z^{[8,0]}$, $r_z^{[0,8]}$, and $r_z^{[8,8]}$, the least square method is performed by using sufficient data $(x_i, y_i, z_i)$ which exist in the rectangle region. The $x_i$, $y_i$ mean the X, Y coordinates of the scanning point, and $z_i$ means an X or Y component of the distortion vector $d(x,y)$. Therefore, a summation E of square errors of data is calculated by the following equation:

$$E = \Sigma^{[0,0]} [z_i - \{r_z^{[0,0]}(8-x)(8-y) + r_z^{[8,0]}x(8-y) + r_z^{[0,8]}(8-x)y + r_z^{[8,8]}xy\}/8^2]^2$$

where $\Sigma^{[0,0]}$ means summation for all the data in the rectangular region ($P_s^{[0,0]}$, $P_s^{[8,0]}$, $P_s^{[0,8]}$, $P_s^{[8,8]}$). The suffix $^{[0,0]}$ means the suffix $^{[0,0]}$ held by the lower left point $P_s^{[0,0]}$ of the rectangle region.

The least square method requires that partial differentials for $r_z^{[0,0]}$, $r_z^{[8,0]}$, $r_z^{[0,8]}$, and $r_z^{[8,8]}$ of the summation E of square errors of data should be zero.

$$\frac{\partial E}{\partial r_z^{[0,0]}} = 0, \quad \frac{\partial E}{\partial r_z^{[8,0]}} = 0, \quad \frac{\partial E}{\partial r_z^{[0,8]}} = 0, \quad \frac{\partial E}{\partial r_z^{[8,8]}} = 0$$

Therefore, the following equations are established:

$$\begin{pmatrix} \sum^{[0,0]} k_{00i}k_{00i} & \sum^{[0,0]} k_{10i}k_{00i} & \sum^{[0,0]} k_{01i}k_{00i} & \sum^{[0,0]} k_{11i}k_{00i} \\ \sum^{[0,0]} k_{00i}k_{10i} & \sum^{[0,0]} k_{10i}k_{10i} & \sum^{[0,0]} k_{01i}k_{10i} & \sum^{[0,0]} k_{11i}k_{10i} \\ \sum^{[0,0]} k_{00i}k_{01i} & \sum^{[0,0]} k_{10i}k_{01i} & \sum^{[0,0]} k_{01i}k_{01i} & \sum^{[0,0]} k_{11i}k_{01i} \\ \sum^{[0,0]} k_{00i}k_{11i} & \sum^{[0,0]} k_{10i}k_{11i} & \sum^{[0,0]} k_{01i}k_{11i} & \sum^{[0,0]} k_{11i}k_{11i} \end{pmatrix} \begin{pmatrix} r_z^{[0,0]} \\ r_z^{[8,0]} \\ r_z^{[0,8]} \\ r_z^{[8,8]} \end{pmatrix} = \begin{pmatrix} \sum^{[0,0]} k_{00i}z_i \\ \sum^{[0,0]} k_{10i}z_i \\ \sum^{[0,0]} k_{01i}z_i \\ \sum^{[0,0]} k_{11i}z_i \end{pmatrix}$$

where the following symbols are used:

$k_{00i} = (8-x_i)(8-y_i)/8^2$ $k_{10i} = x_i(8-y_i)/8^2$ $k_{01i} = (8-x_i)y_i/8^2$ $k_{11i} = x_iy_i/8^2$

By solving the above equations, solutions can be obtained.

As shown in FIG. 160B, a composed distortion vector which is made from composition of the distortion vector $d(x,y)$ obtained by the X component and the distortion vector $d(x,y)$ obtained by the Y component is not perfectly consistent with a distortion vector at the position. In order to reduce the inconsistency, the above embodiment should be iterated. The above bilinear interpolation (described in the following equation again) is linear with regard to $r_z^{[0,0]}$, $r_z^{[8,0]}$, $r_z^{[0,8]}$, and $r_z^{[8,8]}$. Therefore, $r_z^{[0,0]}$, $r_z^{[8,0]}$, $r_z^{[0,8]}$, and $r_z^{[8,8]}$ calculated in the second and later calculations are added to $r_z^{[0,0]}$, $r_z^{[8,0]}$, $r_z^{[0,8]}$, and $r_z^{[8,8]}$, calculated in the preceding calculation. Then the obtained $r_z^{[0,0]}$, $r_z^{[8,0]}$, and $r_z^{[8,8]}$ are used for distortion correction.

$$z(x,y) = \{r_z^{[0,0]}(8-x)(8-y) + r_z^{[8,0]}x(8-y) + r_z^{[0,8]}(8-x)y + r_z^{[8,8]}xy\}/8^2$$

In order to expand this method into a method in which a plurality of rectangle regions is used, the above calculation is applied to a plurality of rectangular regions. This method will be described by using an example in which four rectangular regions $(P_s^{[0,0]}, P_s^{[8,0]}, P_s^{[16,0]}, P_s^{[0,8]}, P_s^{[8,8]}, P_s^{[16,8]}, P_s^{[8,16]}, P_s^{[16,16]})$ are used as shown in FIG. 161.

First, the above equations will be expressed for simplification as follows:

$$\begin{pmatrix} s_{00}^{00} & s_{10}^{00} & s_{20}^{00} & s_{30}^{00} \\ s_{01}^{00} & s_{11}^{00} & s_{21}^{00} & s_{31}^{00} \\ s_{02}^{00} & s_{12}^{00} & s_{22}^{00} & s_{32}^{00} \\ s_{03}^{00} & s_{13}^{00} & s_{23}^{00} & s_{33}^{00} \end{pmatrix} \begin{pmatrix} r_z^{[0,0]} \\ r_z^{[8,0]} \\ r_z^{[0,8]} \\ r_z^{[8,8]} \end{pmatrix} = \begin{pmatrix} s_0^{00} \\ s_1^{00} \\ s_2^{00} \\ s_3^{00} \end{pmatrix}$$

In this equation, the following symbols are used:

$s_{00}^{00} = \sum^{[0,0]} k_{00i}k_{00i} \quad s_{10}^{00} = \sum^{[0,0]} k_{10i}k_{00i} \quad s_{20}^{00} = \sum^{[0,0]} k_{01i}k_{00i} \quad s_{30}^{00} = \sum^{[0,0]} k_{11i}k_{00i}$ $s_{01}^{00} = \sum^{[0,0]} k_{00i}k_{01i} \quad s_{11}^{00} = \sum^{[0,0]} k_{10i}k_{01i} \quad s_{21}^{00} = \sum^{[0,0]} k_{01i}k_{01i} \quad s_{31}^{00} = \sum^{[0,0]} k_{11i}k_{10i}$ $s_{02}^{00} = \sum^{[0,0]} k_{00i}k_{10i} \quad s_{12}^{00} = \sum^{[0,0]} k_{10i}k_{10i} \quad s_{22}^{00} = \sum^{[0,0]} k_{01i}k_{10i} \quad s_{32}^{00} = \sum^{[0,0]} k_{11i}k_{01i}$ $s_{03}^{00} = \sum^{[0,0]} k_{00i}k_{10i} \quad s_{13}^{00} = \sum^{[0,0]} k_{10i}k_{11i} \quad s_{23}^{00} = \sum^{[0,0]} k_{01i}k_{11i} \quad s_{33}^{00} = \sum^{[0,0]} k_{11i}k_{11i}$ $s_0^{00} = \sum^{[0,0]} k_{00i}z_i$ $s_1^{00} = \sum^{[0,0]} k_{10i}z_i$ $s_2^{00} = \sum^{[0,0]} k_{01i}z_i$ $s_3^{00} = \sum^{[0,0]} k_{11i}z_i$ where the suffixes $^{00}$ means the suffix of $\Sigma^{[0,0]}$.

The summation E of square errors of data in the four rectangle regions is calculated by the following equation:

$$E = \sum^{[0,0]} [z_i - \{r_z^{[0,0]}(8-x)(8-y) + r_z^{[8,0]}x(8-y) + r_z^{[0,8]}(8-x)y + r_z^{[8,8]}xy\}/8^2]^2 +$$

$$\sum^{[8,0]} [z_i - \{r_z^{[8,0]}(8-x)(8-y) + r_z^{[16,0]}x(8-y) + r_z^{[8,8]}(8-x)y + r_z^{[16,8]}xy\}/8^2]^2 +$$

$$\sum^{[0,8]} [z_i - \{r_z^{[0,8]}(8-x)(8-y) + r_z^{[8,8]}x(8-y) + r_z^{[0,16]}(8-x)y + r_z^{[816]}xy\}/8^2]^2 +$$

$$\sum^{[8,8]} [z_i - \{r_z^{[8,8]}(8-x)(8-y) + r_z^{[16,8]}x(8-y) + r_z^{[8,16]}(8-x)y + r_z^{[16,16]}xy\}/8^2]^2$$

Therefore, the following equations are established:

$$MZ = S$$

$$M = \begin{pmatrix}
s_{00}^{00} & s_{10}^{00} & 0 & s_{20}^{00} & s_{30}^{00} & 0 & 0 & 0 & 0 \\
s_{01}^{00} & s_{11}^{00}+s_{00}^{80} & s_{10}^{80} & s_{21}^{00} & s_{31}^{00}+s_{20}^{80} & s_{30}^{80} & 0 & 0 & 0 \\
0 & s_{01}^{80} & s_{11}^{80} & 0 & s_{21}^{80} & s_{31}^{80} & 0 & 0 & 0 \\
s_{02}^{00} & s_{12}^{00} & 0 & s_{22}^{00}+s_{00}^{08} & s_{32}^{00}+s_{10}^{08} & 0 & s_{20}^{08} & s_{30}^{08} & 0 \\
s_{03}^{00} & s_{13}^{00}+s_{02}^{80} & s_{12}^{80} & s_{23}^{00}+s_{01}^{08} & s_{33}^{00}+s_{22}^{80}+s_{11}^{08}+s_{00}^{88} & s_{32}^{80}+s_{10}^{88} & s_{21}^{08} & s_{31}^{08}+s_{20}^{88} & s_{30}^{88} \\
0 & s_{03}^{80} & s_{13}^{80} & 0 & s_{23}^{80}+s_{01}^{88} & s_{33}^{80}+s_{11}^{88} & 0 & s_{21}^{88} & s_{31}^{88} \\
0 & 0 & 0 & s_{02}^{08} & s_{12}^{08} & 0 & s_{22}^{08} & s_{32}^{08} & \\
0 & 0 & 0 & s_{03}^{08} & s_{13}^{08}+s_{02}^{88} & s_{12}^{88} & s_{23}^{08} & s_{33}^{08}+s_{22}^{88} & s_{32}^{88} \\
0 & 0 & 0 & 0 & s_{03}^{88} & s_{13}^{88} & 0 & s_{23}^{88} & s_{33}^{88}
\end{pmatrix}$$

$$Z = \begin{pmatrix} r_z^{[0,0]} \\ r_z^{[8,0]} \\ r_z^{[16,0]} \\ r_z^{[0,8]} \\ r_z^{[8,8]} \\ r_z^{[16,8]} \\ r_z^{[0,16]} \\ r_z^{[8,16]} \\ r_z^{[16,16]} \end{pmatrix},$$

$$S = \begin{pmatrix} s_0^{00} \\ s_1^{00}+s_0^{80} \\ s_1^{80} \\ s_2^{00}+s_0^{08} \\ s_3^{00}+s_2^{80}+s_1^{08}+s_0^{88} \\ s_3^{80}+s_1^{88} \\ s_2^{08} \\ s_3^{08}+s_2^{88} \\ s_3^{88} \end{pmatrix}$$

By solving the above equations, solutions can be obtained.

Next, variations in magnification of the image of the pattern to-be-inspected in the X direction and the Y direction are obtained from the data $(x_i, y_i, z_i)$ located in the neighborhood of the representative distortion vector. In this embodiment, a method in which a variation quantity $a_{mag}$ of the magnification in the X direction is obtained will be described. A part having the variation quantity $a_{mag}$, which is equal to 1, is observed in the same magnification as the central part having no nonlinear distortion of the image. A part having the variation quantity $a_{mag}$, which is greater than 1, is observed at higher magnification than the central part having no nonlinear distortion of the image. $z_i$ is taken as the X component of the distortion vector $d(x,y)$, and $S_c$ is taken as a shift quantity. Therefore, the following equation is established:

$$x_i + z_i = a_{mag} x_i + S_c$$

In the case where the number of data is not less than three, this equation should be solved by the least square method. A summation E of square errors of data is:

$$E = \Sigma(x_i + z_i - a_{mag} x_i - S_c)^2$$

where $\Sigma$ means summation for all the data (xi, yi, zi), the least square method requires the following equations:

$$\frac{\partial E}{\partial a_{mag}} = 0, \quad \frac{\partial E}{\partial S_c} = 0$$

Then, the following equations are obtained by solving the above equations.

$$a_{mag}\sum_i x_i - S_c = \sum_i (x_i + z_i)$$

$$a_{mag}\sum_i x_i^2 - S_c\sum_i x_i = \sum_i (x_i + z_i)x_i$$

Therefore, the following equation is obtained:

$$a_{mag} = \frac{\sum_i (x_i + z_i)\sum_i x_i - N\sum_i (x_i + z_i)x_i}{\sum_i x_i \sum_i x_i - N\sum_i x_i^2}$$

where N means the total number of data. The representative distortion vectors are multiplied by the obtained variation quantity $a_{mag}$ in order to correct the variation in magnification.

FIGS. 162A and 162B show a method in which the distortion correction vector calculation circuit 414 converts the distortion correction vector into a deflection voltage. In FIGS. 162A and 162B, the vertical axis represents the X position scanned by an electron beam. The origin of the vertical axis means the center of the image of the pattern to-be-inspected. Upper part of the vertical axis means a peripheral part of the image. The horizontal axis is an X deflection voltage. Scale markings on the horizontal axis mean voltages that are set to scanning points. An interval between the scale markings is a step voltage $E_s$ for moving the electron beam by one scanning point in a part that has no nonlinear distortion of the image.

A stair-like waveform shown by a dotted line in FIG. 162A is an ideal scanning waveform. A stair-like waveform shown by a solid line is scanning waveform having nonlinear distortion of the image. A value of the X component $r_z^{[8,0]}$ of the representative distortion vector $R_d^{[8,0]}$ is a distance between a start point and an end point. The start point is a point on the ideal scanning waveform (shown by the stair-like waveform shown by the dotted line) corresponding to a scanning point. The end point is a point on the scanning waveform having nonlinear distortion of the image (the stair-like waveform shown by the solid line) corresponding to the above scanning point. In order to simplify the drawing, the representative distortion vector $R_d^{[0,0]}$ at the origin is set to zero.

In order to correct this nonlinear distortion of the image, an additional voltage $E_{dX}^{[8,0]}$ is added to a voltage, which is a multiple of the step voltage $E_s$, and is applied to a scanning point. The additional voltage $E_{dX}^{[8,0]}$ is calculated by the following equation:

$$E_{dX}^{[8,0]} = r_z^{[8,0]} a_{mag} E_s$$

where a coefficient $a_{mag}$ is the above variation quantity $a_{mag}$.

Although, in the above, the method of correcting nonlinear distortion of the image in the X direction is described, a method of correcting nonlinear distortion of the image in the Y direction can be also performed by using the Y component of the distortion vector $d(x_i,y_i)$ as $z_i$, and $y_i$ instead of $x_i$.

Instead of adding the distortion correction vector calculation circuit 414 to the image generation device 7, a method in which an image of a pattern to-be-inspected is transformed to cancel nonlinear distortion of the image may be used.

In this embodiment, the number 8 is used for the interval number. The smaller the interval number is, the more accurate the distortion correction vector is. However, representative distortion vector is more inaccurate. Therefore, the interval number should be selected empirically.

According to this embodiment, the method of correcting nonlinear distortion of the image held by the image generation device 7 with the large field of view can be performed automatically and accurately for a short time. Therefore, the field of view can be extended to the portion that is efficiently corrected by using the correction method.

7.5 Method of Correcting Variation in Line Widths Depending on Positions of Image of Pattern To-Be-Inspected Another one of the most important distortions of the image of the pattern to-be-inspected is a variation in deformation quantities of line widths depending on positions of an image of a pattern to-be-inspected. The deformation quantities of the line widths is caused by a variation in an electron beam spot size depending on the positions of the image of the pattern to-be-inspected. In order to correct deformation quantities of the line widths, a method of correcting variation in line widths depending on positions of an image of a pattern to-be-inspected can be used. In this method, distribution of deformation quantities of line widths is obtained from an image of a pattern to-be-inspected beforehand, and a line width in an image of a pattern to-be-inspected is corrected by using the obtained distribution of deformation quantities of line widths.

FIG. 163 is a schematic view showing the above method. As shown by circles in FIG. 163, an electron beam spot size in a peripheral portion is wider than an electron beam spot size in a central portion. As a result, an observed line width in the peripheral portion is wider than an observed line width in the central portion. In the case where the electron beam spot size is approximately uniform in each sub-inspection-unit-area, the following method can be used for correcting a variation in line widths depending on positions of an image of a pattern to-be-inspected. In this embodiment, a position of sub-inspection-unit-area is used for a position of an image of a pattern to-be-inspected 1. An image of a pattern to-be-inspected corresponding to an inspection area, which includes reference patterns having the same line width and having uniform pattern density is acquired beforehand. The part having periodical patterns such as part of a memory is suitable for the inspection area.

2. The deformation quantity of line widths with regard to each sub-inspection-unit-area is calculated from reference patterns and edges of the image of the pattern to-be-inspected. Distribution of deformation quantities of line widths for each sub-inspection-unit-area is obtained.

3. During inspection, a line width in each sub-inspection-unit-area is corrected by using the distribution of deformation quantities of line widths, which is obtained by the above-mentioned step 2. A sub-inspection-unit-area, to which the line width to be corrected belongs, corresponds to a sub-inspection-unit-area, to which the deformation quantity of line widths to be used belongs.

The calculation method and the correction method in the above-mentioned step 2 and step 3 are the same as the methods described in the above-mentioned 5.11 Method of separating pattern deformation quantities into global pattern deformation quantities and local pattern deformation quantities.

The above correction method may be applied to each group that has the same line width. In addition, the above correction method may be applied to areas obtained by dividing a sub-inspection-unit-area.

According to this embodiment, the method of correcting the variation in the line widths depending on the image positions held by the image generation device 7 with the large field of view can be performed automatically and accurately for a short time. Therefore, the field of view can be extended to the portion that is efficiently corrected by using the correction method.

8. Other Methods 8.1 Method of Extracting Region Suitable for Automatic Image Adjustments In a long-term inspection, automatic image adjustments, which include automatic contrast brightness adjustment, automatic focus adjustment, automatic astigmatism adjustment, and the like, are required. A region suitable for automatic contrast brightness adjustment and automatic focus adjustment corresponds to a region that includes many horizontal or vertical line segments or ends. If the region that meets the above requirement is obtained from design data, and then the obtained region is used for automatic contrast brightness adjustment and automatic focus adjustment, automatic contrast brightness adjustment and automatic focus adjustment can be efficiently performed. Therefore, it is necessary to provide a method of extracting a region suitable for the automatic contrast brightness adjustment and automatic focus adjustment.

The method is performed in the following procedure using geometrical information of line segments of design data and/or using relationship between line segments of design data that connect or are located closely:

FIG. 164 is a schematic view showing the above method.

1. A size of a rectangular region R used for automatic contrast brightness adjustment and automatic focus adjustment is determined. The size of the rectangular region R is empirically determined.

2. The region A used for automatic contrast brightness adjustment and automatic focus adjustment is determined. This region A is preferably near the inspection area. The region A is larger than the region R.

3. While moving the region R relative to the region A, the total length of the vertical line segments of design data corresponding to the region R is obtained. In the same manner, the total length of the horizontal line segments is obtained. The smaller one of the total length of the vertical line segments and the total length of the horizontal line segments is taken as an estimated value. In this example, the total length of the line segments is used as geometrical information.

4. The region R having the largest of the estimated values obtained in the above-mentioned step 3 is regarded as the optimal region (which includes many horizontal lines and vertical lines).

The above region R is set into the above-mentioned 3.3 Recipe data "11. The region suitable for automatic contrast brightness adjustment, automatic focus adjustment, and automatic astigmatism adjustment". Automatic contrast brightness adjustment and automatic focus adjustment can be performed timely during inspection using the above registered region R.

A region suitable for automatic astigmatism adjustment corresponds to a region that includes many line segments with the total length in direction of X direction, Y direction, 45 degree direction, and 135 degree direction being substantially the same. In this case, the procedure is performed in the same manner as the above except for using the total lengths of 45 degree direction and 135 degree direction in addition to the total lengths of X direction and Y direction. If the above region cannot be obtained, partial regions corresponding to ends or corners of design data may be used. In this case, automatic astigmatism adjustment is performed in the following procedure:

First, a region suitable for automatic astigmatism adjustment is obtained. As an example, this region is a region that includes partial regions including a left end and a right end as shown in FIG. 165. As another example, this region is a region that includes partial regions including an upper left corner, a lower left corner, an upper right corner, and a lower right corner as shown in FIG. 165. These regions may be replaced with other regions that include partial regions including an upper end and a lower end, for example. If the above regions are obtained, the regions contain omnidirectional edges, and therefore such regions are suitable for automatic astigmatism adjustment.

The following procedure that is similar to the procedure for obtaining the region suitable for the above automatic contrast brightness adjustment and automatic focus adjustment is performed. In this example, the procedure that uses upper left corners, lower left corners, upper right corners, and lower right corners will be described by using FIG. 166.

1'. A size of a rectangular region R' used for astigmatism adjustment is determined. The size of the rectangular region R' is empirically determined.

2'. The region A' used for astigmatism adjustment is determined. The region A' is larger than the region R'.

3'. While moving the region R' relative to the region A', the number of the upper left corners of design data corresponding to the region R' is obtained. In the same manner, the number of the lower left corners, the number of the upper right corners, and the number of the lower right corners are obtained. The smallest of the number of the upper left corners, the lower left corners, the number of the upper right corners, and the number of the lower right corners is taken as an estimated value. In this example, the number of corners is used as geometrical information.

4'. The region R' having the largest of the estimated values obtained in the above-mentioned step 3' is regarded as the optimal region (which includes many upper left corners, lower left corners, upper right corners, and lower right corners).

5'. Some corners are thinned out so that the number of the upper left corners, the number of the lower left corners, the number of the upper right corners, and the number of the lower right corners are almost the same.

The corners and their neighborhoods obtained in the above are used as partial regions P.

The rectangular region obtained by the above procedure is set into the above-mentioned 3.3 Recipe data "11. The region suitable for automatic contrast brightness adjustment, automatic focus adjustment, and automatic astigmatism adjustment". Automatic astigmatism adjustment can be performed timely during inspection using the above registered rectangular region. This automatic astigmatism adjustment is performed in the following procedure:

1. Automatic focus adjustment is performed.

2. The matching between an image of a pattern to-be-inspected and a reference pattern corresponding to the region R' suitable for automatic astigmatism adjustment is performed.

3. The evaluation value of astigmatism is obtained from partial images of the image of the pattern to-be-inspected corresponding to the partial regions P included in the region R'.

4. The above-mentioned step 2 and step 3 are performed while varying a value of astigmatism.

5. A value of astigmatism corresponding to an optimal evaluation value of astigmatism obtained in the above-mentioned step 4 is taken as an optimal astigmatism value.

According to this embodiment, the region suitable for automatic image adjustments can be extracted automatically and optimally. Further, in the case of using the partial regions of the image of the pattern to-be-inspected as the regions to-be-recognized, automatic image adjustments may be more accurately performed than in the case where the whole image of the pattern to-be-inspected is used.

8.2 Automatic Focus Adjustment Method in Which the Second Edge Detection Method is Used The conventional automatic focus adjustment used in a CD-SEM is performed by the following procedure:

1. An image of patterns to-be-inspected is acquired with a focus value. A focus evaluation value, which is a summation of square of the first differentials of the acquired image of the patterns to-be-inspected, is obtained. Another focus evaluation value can be used.

2. The same procedure as the step 1 is repeatedly performed while altering the focus value in a range in which an optimal focus value exists.

3. The largest focus evaluation value is taken from the obtained focus evaluation values. A focus value corresponding to an optimal focus evaluation value is taken as an optimal focus value.

In the case where the conventional automatic focus adjustment used in a CD-SEM is used for the image generation device 7 with a large field of view, it takes a long time to acquire images of a pattern to-be-inspected. In addition, because a large area is scanned, a specimen is drastically damaged by an electron beam scanning. In order to solve these problems, an automatic focus adjustment method in which the second edge detection is used is performed. In this method, edges of an image of a pattern to-be-inspected are selectively used.

FIG. 167 is a schematic view showing an automatic focus adjustment method in which the second edge detection method is used. On the upper left-hand side of FIG. 167, an image of patterns to-be-inspected is shown. The image of the patterns to-be-inspected is acquired while altering an excitation current of the objective lens 315, with the excitation current synchronizing to Y deflector 314. The excitation current means a focus value. A range of altering the focus value is a range in which an optimal focus value exists. On the right-hand side of FIG. 167, a focus evaluation value obtained from the second edge detection of the image of the patterns to-be-inspected is shown.

The automatic focus adjustment method in which the second edge detection is used is performed after processing an inspection-unit-area and in the time of requiring automatic focus adjustment. Procedure of the automatic focus adjustment method in which the second edge detection is the same as the steps S308 (the image generation device 7 outputs an image of a pattern to-be-inspected and a center position of the image to the inspection unit 12 for each inspection-unit-area) through S334 (the second edge detection) shown in FIG. 25 or FIG. 26 except for the following two items. The region registered in the above-mentioned 3.3 Recipe data "11. The region suitable automatic focus adjustment" is used as the inspection-unit-area in the step S308. The image of the patterns to-be-inspected shown on the left-hand side of FIG. 167 is used as the image of the pattern to-be-inspected in the step S308. Next, automatic focus adjustment is performed in the following procedure. After completing the automatic focus adjustment, the step S308 and later steps for the next inspection-unit-area are performed.

As described in the above-mentioned 4.11 The second edge detection, the second edges exist in the different positions from positions where the edges should be detected ideally. For example, in the case of using the coefficient k in FIG. 76 equal to 0.5, the detected edge exists in the position shifted from the ideal position by the half of the electron beam spot size in the outward direction of the pattern to-be-inspected. In the case of using 4.11 The second edge detection, the following two focus evaluation values can be used:

1. In the case where patterns to-be-inspected having the same width in the same direction occupy an image of patterns to-be-inspected, line widths of the patterns to-be-inspected are used as the first focus evaluation values. A line width $W_1$ of the pattern to-be-inspected and a line width $W_2$ of the pattern to-be-inspected are shown on the lower side of FIG. 167. The line width $W_1$ of the pattern to-be-inspected exists in a portion where a focus value is nearly equal to an optimal focus value, and the line width $W_2$ of the pattern to-be-inspected exists in a portion where a focus value is much different from the optimal focus value. Line widths of a reference pattern corresponding to both of the line widths $W_1$ and $W_2$ are the same.

In the case of an optimal focus value, an electron beam spot size is smallest. In this case, a line width is smallest. Therefore, a focus value corresponding to a smaller first focus evaluation value is more optimal focus value. According to this embodiment, a focus value corresponding to the line width $W_1$ of the pattern to-be-inspected is more optimal than a focus value corresponding to the line width $W_2$ of the pattern to-be-inspect, and therefore the result corresponds to the description of FIG. 167.

Because a slope of an edge of a pattern to-be-inspected having a large line width may be different from a slope of an edge of a pattern to-be-inspected having a small line width, it is desirable that the first focus evaluation values are obtained from patterns to-be-inspected having the same line width. In the case of using patterns to-be-inspected having different line widths, deformation quantities of line widths are used instead of using line widths.

2. FIG. 168 is a schematic view showing another automatic focus adjustment method in which the second edge detection method is used. An image of patterns to-be-inspected shown on the upper left-hand side of FIG. 168 is acquired by the same manner as the manner shown in FIG. 167. In the case of the images of the patterns to-be-inspected in FIG. 167 and FIG. 168, distances $V_1$ and $V_2$ between peak positions and bottom positions of profiles can be used as the second focus evaluation value. In this case; as with the first focus evaluation value, it is desirable that the second focus evaluation values are obtained from patterns to-be-inspected having the same line width as much as possible. In addition, a focus value corresponding to a smaller second focus evaluation value is more optimal focus value.

In the case of the images of the patterns to-be-inspected in FIG. 167 and FIG. 168, the automatic focus adjustment is performed by using the vertical edges. Therefore, accuracy of the automatic focus adjustment with regard to horizontal edges is relatively low. However, practically, the automatic focus adjustment, which is performed by using edges in one direction, is sufficient for automatic focus adjustment in a short period. In the case of FIG. 168, when scanning in the 45 degree direction is performed, accuracies of the automatic focus adjustment with regard to vertical and horizontal edges become high. Further, in this case, automatic astigmatism adjustment can be performed.

If the minimum focus evaluation value exists in a part where the focus evaluation values does not exist sufficiently in neighborhood, e.g. neighborhoods of parts λ of FIG. 167 and FIG. 168, the image of the patterns to-be-inspected is acquired again. In this case, the range of changing the focus value is adjusted so that the minimum focus evaluation value exists in a position except for the neighborhoods of the parts k.

According to this embodiment, the automatic focus adjustment can be performed by acquiring one or two images of the patterns to-be-inspected. Therefore, automatic focus adjustment can be performed at high speed. Moreover, a specimen is less damaged by an electron beam scanning. The conventional automatic focus adjustment is performed by calculating the focus evaluation values from the whole image of the patterns to-be-inspected. On the other hand, this embodiment is performed by calculating the focus evaluation values from the edge parts, which belong to the pattern to-be-inspected having the same width, of the image of the patterns to-be-inspected selectively. Therefore, the focus evaluation values are not affected by other parts, and an error rate of automatic focus adjustment can be reduced.

In addition, in the case where a focus value is much different from an optimal focus value so that matching cannot be performed, the second edges cannot be detected in this embodiment. In this case, coarse automatic focus adjustment is performed by the following procedure as a pretreatment, and then this embodiment is performed:

This embodiment is performed by using the conventional focus evaluation value. For example, a summation of squares of the first differentials of an image of pattern to-be-inspected is obtained, and a value obtained by multiplying the summation and (−1) is used as the focus evaluation value.

8.3 Method of Selecting the Most Suitable Sub-Inspection-Unit-Area for Matching

As described in FIG. 147, in the case where the inspection-unit-area is very large, the inspection-unit-area is divided into a plurality of the sub-inspection-unit-areas, and matching is performed by using one of the obtained sub-inspection-unit-areas. Therefore, it is necessary to provide a method of selecting the most suitable sub-inspection-unit-area for matching.

The most suitable sub-inspection-unit-area for matching is a sub-inspection-unit-area that has the largest of evaluation values of all sub-inspection-unit-areas. The evaluation value is obtained from the following calculation:

1. Unique patterns are obtained by the method shown in FIGS. 51A and 51B.

2. The total lengths of four directional line segments that are horizontal, vertical, inclined at 45 degrees, and inclined at 135 degrees are calculated by classifying the line segments constituting the unique patterns in the four directions.

3. The second largest one of the total lengths of the four directional line segments is taken as the evaluation value. The reason why the second largest total length is used is that at least two sets of line segments, which have the same direction and the sufficient number of line segments, are required.

In FIG. 169, two sub-inspection-unit-areas are shown. In FIG. 169, dotted lines represent reference patterns, and solid lines represent unique patterns. The sub-inspection-unit-area shown on the left-hand side of FIG. 169 has many vertical line segments, but does not have many horizontal line segments. On the other hand, the sub-inspection-unit-area shown on the right-hand side of FIG. 169 has many vertical line segments and relatively many horizontal line segments. The total length of line segments constituting unique patterns of the sub-inspection-unit-area shown on the left-hand side of FIG. 169 is larger than the total length of line segments constituting unique patterns of the sub-inspection-unit-area shown on the right-hand side of FIG. 169. However, the evaluation value of the sub-inspection-unit-area shown on the left-hand side of FIG. 169 is larger than the evaluation value of the sub-inspection-unit-area shown on the right-hand side of FIG. 169.

In the above description, calculation is performed by using two-dimensional unique patterns. However, this calculation requires a huge calculation time and is disadvantageous. Therefore, a method that requires a less calculation time even if calculation is not perfectly accurate has been necessary. This method will be described in FIG. 170.

The most suitable sub-inspection-unit-area for matching is a sub-inspection-unit-area that has the largest of evaluation values of all the sub-inspection-unit-areas. The evaluation value is obtained from the following calculation:

1. A one-dimensional data are obtained by classifying the line segments constituting the reference patterns into the four directional line segments that are horizontal, vertical, inclined at 45 degrees, and inclined at 135 degrees.

2. Unique patterns in the one-dimensional data are obtained by the same method as the method shown in FIGS. 51A and 51B. Solid lines shown in the one-dimensional data of the horizontal line segment and the vertical line segment in FIG. 170 means unique patterns.

3. The total length of line segments of the unique patterns in one-dimensional data of the horizontal line segment is calculated. In the same manner, the total lengths with regard to the vertical line segment, the 45 degree inclined line segment, and the 135 degree inclined line segment are calculated.

4. The second largest one of the total lengths of the four directional line segments is taken as the evaluation value.

According to this embodiment, matching can be performed by using the sub-inspection-unit-area that is the most suitable for matching, in the case where the inspection-unit-area is divided into the sub-inspection-unit-areas. Therefore, the matching using the sub-inspection-unit-area is faster than the matching using the whole inspection-unit-area.

8.4 Inspection Method in Which High-Magnification Image and Low-Magnification Image are Used In the case of an SEM with a function that enables a part of a low-magnification image of a pattern to-be-inspected to be acquired at high magnification electromagnetically, an image of a pattern to-be-inspected that cannot be acquired in a full view at high magnification can also be inspected. In this case, an edge position of an image of a pattern to-be-inspected detected from a high magnification image can be converted correctly into an edge position of an image of a pattern to-be-inspected of a low-magnification image. The conversion can be performed by using a high-precision stage. For example, in FIG. 171, if edge positions 182 and 183 of images of a pattern 181 to-be-inspected are detected from high-magnification images 184 and 185 of the pattern 181 to-be-inspected, respectively. These edge positions are converted into positions of a low-magnification image 187. A width 186 of the pattern 181 to-be-inspected is obtained from converted edge positions. The obtained width 186 can be inspected more accurately than line widths that are inspected by using the low-magnification image 187.

8.5 Display Method of Superimposing Defect Information on Information Corresponding to the Defect When defect information, which includes a defect feature and defect image, is displayed together with at least one of design data, mask data (data created by adding an OPC pattern to the design data), a feature obtained from a lithography simulator using the design data, and data related to the design data which correspond to the defect information, it becomes easy to recognize tendencies for defects to be caused. Therefore, it is necessary to provide a method of displaying the related information and the inspection result together.

The followings are examples of tendencies for defects to be caused:

1. Many defects are detected in dense patterns in the design data.
2. Many defects are detected in the specific OPC pattern.
3. Many defects are detected in shrunken parts of a simulation pattern obtained by a lithography simulator.

In the case of wafer inspection, it is effective to use a photomask image corresponding to the defect. By comparing the defect image to the photomask image, whether this defect has been caused by the photomask can be easily recognized.

In order to realize the above display, the above data related to the design data corresponds to the defect information. The above correspondence is performed in the following procedure:

1. An edge of a reference pattern is added to information of the design data. As the above additional information, a cell name of a polygon in the design data to which the edge belongs, a line segment number of a polygon to which the edge belongs, coordinate values of an initial point and a terminal point of a line segment to which the edge belongs, and coordinate values of the edge can be used.
2. When a defect is detected, information of the design data added to the edge of the reference pattern used in the detection is attached to an inspection result.
3. By using the attached information of the design data, the above data related to the design data is retrieved. Even if the above data related to the design data is described by the different coordinate from the design data, the correspondence can be performed by using the cell name of the polygon, which constitutes design data, and the line segment number.

Figure 173:
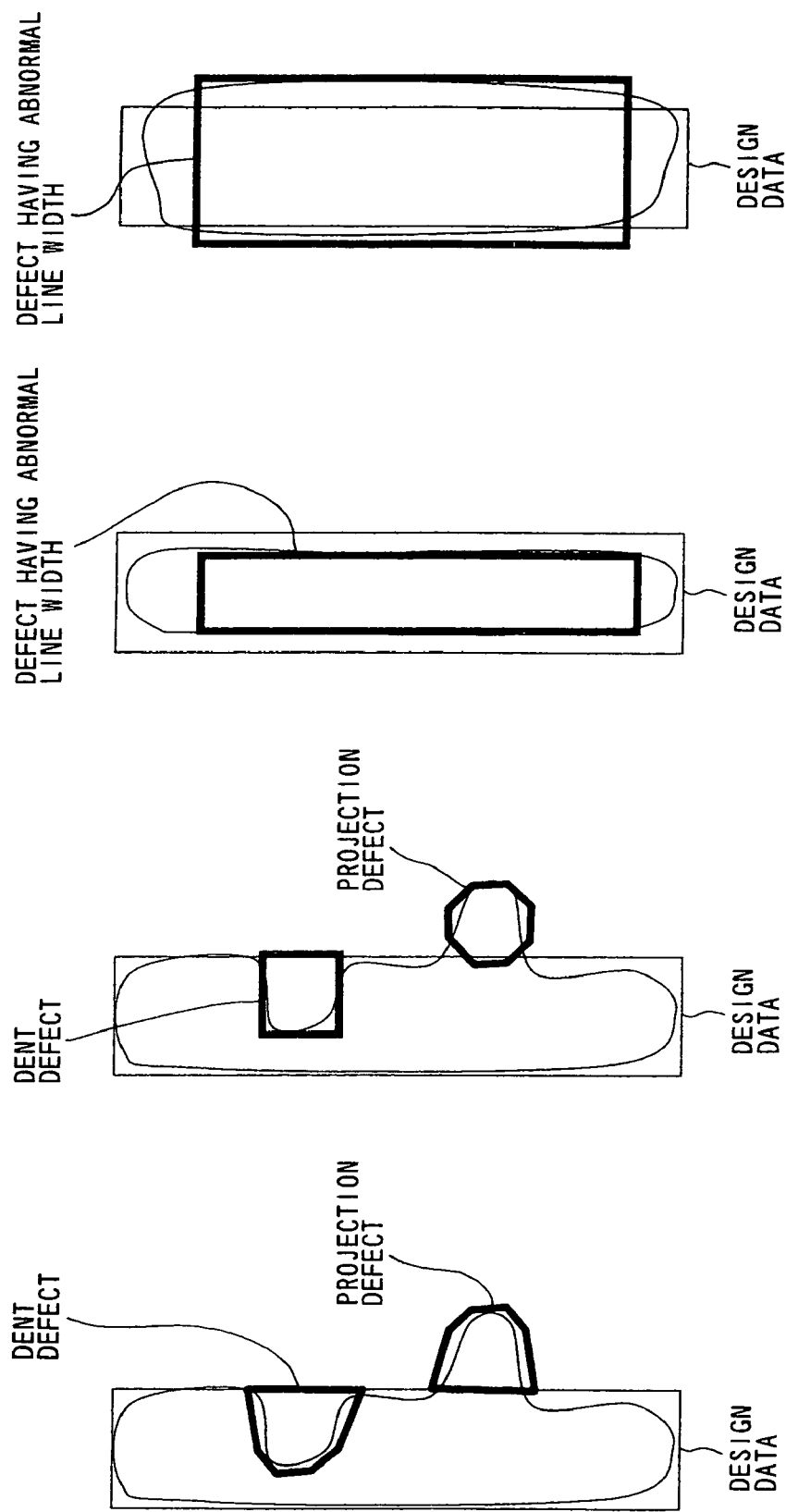

FIG. 172 shows an example of a display of superimposing design data and mask data on a defect image, and FIGS. 173A, 173B, 173C, and 173D show examples of displaying detected defects as diagrams. In these example, the following methods are used:

1. A method of displaying a polygon which is an outline of a defect as shown in FIG. 173A.
2. A method of displaying a rectangle which represents the minimum bounding rectangles of dent defects and projection defects as shown in FIG. 173B. In the case of the projection defects, it is possible to add short line segments at corners of the rectangle in order to distinguish the projection defects from the dent defects.
3. A method of displaying rectangles whose sides represent line widths of defects having abnormal line widths as shown in FIGS. 173C and 173D.

In the above methods, the inspection result is directly used for displaying. However, a method in which a defect is converted into additional information of the design data and is displayed as shown in FIG. 174 can be used. This method is performed in the following procedure:

1. The polygons obtained by FIGS. 173A, 173B, 173C, and 173D are converted into additional information of design data, and are stored into the design data.
2. In the case where the design data have a layer for describing an actual pattern and a layer for describing a pattern that does not exist, the polygons obtained by FIGS. 173A, 173B, 173C, and 173D are stored into the layer for describing a pattern that does not exist.
3. In the case where the design data have a plurality of layers for describing a pattern that does not exist, the polygons can be stored into the specified layers for every dent defect, projection defect, and defect having the abnormal line width. In FIG. 174, design data is stored into the layer 1, the dent defects and the projection defects are stored into the layer 12, and the defects having the abnormal line widths are stored into the layer 13.

This embodiment is suitable for modification of design because inspection result can be reviewed by using an apparatus that handles the design data.

The superimposition display described in the above can be replaced with a parallel display. The parallel display is performed in the same manner.

According to this embodiment, a cause of defects can be easily specified and design can be easily modified, because it becomes easy to recognize tendencies for defects to be caused.

8.6 Method of Measuring FEM Wafer

A region of a focus condition and an exposure dose condition is called a process window. In order to obtain the process window, an FEM (Focus Exposure Matrix) wafer is used. The FEM wafer is a wafer forming a matrix of semiconductor devices, which are fabricated by exposure under the focus condition continuously altered in the horizontal direction and the exposure dose condition continuously altered in the vertical direction. A manner, in which focus condition is continuously altered in the vertical direction and the exposure dose condition is continuously altered in the horizontal direction, can be used. An example of the FEM wafer is shown in FIG. 175. Large squares in FIG. 175 are semiconductor devices fabricated by exposure under sets of a different focus condition and a different exposure dose condition.

In order to measure an FEM wafer, several points in all semiconductor devices on the FEM wafer are measured by a CD-SEM conventionally. The points to be measured are points suitable for measuring line widths of line parts of patterns to-be-inspected. A tendency for pattern deformation quantities is obtained from results of the measurements. Further, a region of a focus condition and an exposure dose condition, which corresponds to a region of semiconductor devices having deformation quantities less than an allowable pattern deformation quantity of a line width of a line part, is obtained as a process window.

However, the tendency for the pattern deformation quantities with regard to the line widths of the line parts of the patterns to-be-inspected and a tendency for pattern deformation quantities with regard to space widths of the line parts of the patterns to-be-inspected or a tendency for edge placement errors of ends of the patterns to-be-inspected may be different. In such case, if a process window is obtained from results of measurements with regard to the line widths of the line parts of the patterns to-be-inspected, a semiconductor fabricated by exposure under conditions in the process window may have a defect.

In order to solve the problem, the process window is obtained by using the pattern deformation quantities with regard to the line widths of the line parts of the patterns to-be-inspected, the pattern deformation quantities with regard to the space widths of the line parts of the patterns to-be-inspected, and the edge placement errors of the ends of the patterns to-be-inspected. This method is performed by the following procedure:

1. Semiconductor devices are fabricated by exposure under the focus condition continuously altered in the horizontal direction and the exposure dose condition continuously altered in the vertical direction. The optimal focus condition and the exposure dose condition are used in fabrication of a semiconductor device near the center of a FEM wafer. In a region of the focus condition and the exposure dose condition, most patterns to-be-inspected are formed, though pattern deformation quantities exceed an allowable pattern deformation quantity.

2. An area, where patterns to-be-inspected suitable for inspecting line widths of line parts exist in plenty, is obtained as an inspection area. The inspection area is made small in order to shorten inspection time. All the line widths of the line parts of the patterns to-be-inspected, which exist in the inspection area of each semiconductor device on the FEM wafer, are obtained. An average value of the obtained line widths is obtained for each semiconductor device.

3. A region of a focus condition and an exposure dose condition, which corresponds to the semiconductor devices having deformation quantities less than an allowable pattern deformation quantity of an average line width of a line part, is obtained as a process window with regard to an average line width of a line part. A region of a focus condition and an exposure dose condition, which corresponds to squares (semiconductor devices) with a grid pattern shown in FIG. 175, is a process window with regard to an average line width of a line part. The obtained process window with regard to an average line width of a line part is equivalent to a process window obtained by the conventional method.

4. Semiconductor devices existing in the boundary of the process window with regard to an average line width of a line part are obtained as semiconductor devices to-be-inspected. Squares having Ω's in FIG. 175 are examples of the semiconductor devices to-be-inspected.

5. All line widths of line parts, space widths of line parts, and edge placement errors of ends of patterns to-be-inspected in the obtained semiconductor devices to-be-inspected are inspected to obtain defect distribution diagrams. The obtained defect distribution diagrams are superimposed to obtain a superimposed defect distribution diagram as shown in FIG. 176. An area, which contains defects in plenty, is obtained from the superimposed defect distribution diagram as an inspection area. It is desirable that the number of the defects detected from the line widths of line parts, the number of the defects detected from the space widths of line parts, and the number of the defects detected from the edge placement errors of the ends of the patterns to-be-inspected are almost the same. The obtained inspection area is called a critical area. The critical area is made small in order to shorten inspection time. A rectangle in FIG. 176 is an example of the critical area.

6. The critical areas in all the semiconductor devices on the FEM wafer are inspected. FIG. 177 is a schematic view showing examples of the results of the inspection. FIG. 177 is identical to FIG. 175 except for displaying the results of inspecting the critical areas. A square containing a small square, a cross, or a triangle shown in FIG. 177 shows the semiconductor device which does not contain the defect detected from the line widths of the line parts, the defect detected from the space widths of the line parts, or the defect detected from the edge placement errors of the ends of the patterns to-be-inspected, respectively. In this embodiment, the process window is obtained by using the pattern deformation quantities with regard to the line widths of the line parts, the pattern deformation quantities with regard to the space widths of the line parts, and the edge placement errors of the ends of the patterns to-be-inspected. Therefore, a region of the focus condition and the exposure dose condition, which corresponds to a region of squares (semiconductor devices) with a grid pattern shown in FIG. 177, is a process window.

Conventionally, the process window is determined by results of inspecting line widths of line parts of patterns to-be-inspected. The squares with a grid pattern in FIG. 175 correspond to the process window determined by the conventional method. However, the process window is determined from the squares with a grid pattern in FIG. 177, which is the results of inspecting the line widths of the line parts, the space widths of the line parts, and the edge placement errors of the ends of the patterns to-be-inspected, in this embodiment. Therefore, the process window obtained by this embodiment is smaller than the process window obtained by the conventional method. The semiconductor devices, which correspond to the squares with a grid pattern in FIG. 175 and do not correspond to the squares with a grid pattern in FIG. 177 means semiconductor devices, which may have a defect.

In the case where the critical area is given by a lithography simulator or the like, the above-mentioned step 6 is performed for the critical area.

In this embodiment, the process window is obtained by using the pattern deformation quantities with regard to the line widths of the line parts, the pattern deformation quantities with regard to the space widths of the line parts, and the edge placement errors of the ends of the patterns to-be-inspected. However, other pattern deformation quantities for detecting other defects can be used. As the other defects, the following defects can be used:

A defect of a line part or a corner having edge placement errors;

An isolated pattern having placement error

A defect of a corner having abnormal curvature

A defect detected by inspecting correction pattern that should not be formed on wafer A defect detected by inspecting an average line width or an average space width of a line-shaped pattern A defect detected by inspecting a line width, an average line width, a space width, or an average space width of a curvilinear-shaped pattern A defect detected by inspecting a gate line width According to this embodiment, the process window is obtained by using various pattern deformation quantities besides the pattern deformation quantities with regard to the line widths of the line parts of the patterns to-be-inspected. Therefore, more optimal process window can be obtained. Further, more optimal critical area can be obtained than in the case of using a result of a lithography simulator, because the critical area is obtained by inspecting the pattern to-be-inspected actually formed on the FEM wafer.

9. Setting Values 9.1 Setting Values of Parameters of Image Generation Device

Image acquisition methods used in the image generation device 7 in the pattern inspection apparatus according to the embodiment of the present invention include a high throughput image acquisition method and a high precision image acquisition method:

1. High throughput image acquisition method

The high throughput image acquisition method is a method in which throughput is more important than edge detection accuracy. The method is used in inspection of an entire die. In this case, a primary electron current applied to a surface of the wafer W is higher than in the case of using the high precision image acquisition method in order to acquire sufficient secondary electrons at one time scanning. As a result, an electron beam spot size becomes bigger, and therefore it is necessary for a pixel interval to be wider than in the case of using the high precision image acquisition method.

From a viewpoint of the second edge detection, it is necessary to cover a minimum line width of a pattern to-be-inspected by five pixel intervals or more. The following setting values, which satisfy the above conditions, can be used.

Values in parentheses described in the right-hand side of the setting values are recommended values, in the case where a minimum line width of a pattern to-be-inspected is 90 nm.

| Primary electron current | 1 nA to 10 nA | (3 nA) |
|---|---|---|
| Landing energy | 1500 eV to 2800 eV | (2000 eV) |
| Secondary electron sampling rate | 50 MHz to 200 MHz | (100 MHz) |
| Number of times of image accumulation | 1 time to 4 times | (1 time) |
| Pixel interval | 3 nm to 25 nm | (12 nm) |
| Field of view | 20 μm to 300 μm | (200 μm) |

The primary electron current and landing energy mean values of a current and energy of primary electrons applied to a surface of the wafer W. The primary electrons are described in 2.1 Basic arrangement of image generation device. The primary electron current is also called by a probe current. The secondary electron sampling rate means the number of times of acquiring intensity of the secondary electrons by the secondary electron detector 330 in a second. Image accumulation scan means scan, in which the same scanning line is scanned two or more times in order to acquire an accumulated image, as described in 6.5 Method of performing interlace scan and image-accumulation scan using continuously moving stage. The number of times of image accumulation means the above number of times, which is two or more times.

In the case where effect of the electrification phenomenon can be ignored, intensity of secondary electrons can be higher by increasing a landing energy. In a CD-SEM, 800 eV is used as the landing energy. In this case, a contrast image caused by the electrification phenomenon during image accumulation is acquired. On the other hand, in the high throughput image acquisition method, a contrast image caused by the electrification phenomenon cannot be acquired, because one time is used as the number of times of image accumulation. Therefore, intensity of secondary electrons is made higher by increasing the landing energy.

Generally, in the case where the secondary electron sampling rate is made higher, it is necessary to increase the number of times of image accumulation so that accumulated intensity of secondary electrons is identical to intensity before the secondary electron sampling rate is made higher. For example, in the case where the secondary electron sampling rate is 100 MHz, one time is enough as the number of times of image accumulation in many cases. (This example may depend on other conditions and a secondary electron generation rate.) In the case where the same setting values of parameters are used except for making the secondary electron sampling rate 200 MHz, it is necessary to make the number of times of image accumulation two times.

A pixel interval is multiplied by the number of pixels, and the obtained product is a field of view, as described in 3.3 Recipe data. It is desirable to make the field of view wide in order to reduce a ratio of time for moving a stage and waiting at start of scan to time for detecting secondary electrons. However, due to restriction of precision of DA converters in the deflection controller 318, the maximum number of the pixel number is restricted as 16384, 32768, or the like. Further, the field of view is restricted by aberration of the objective lens 315. The restriction of the field of view in the high throughput image acquisition method is looser than the restriction of the field of view in a high precision image acquisition method described later, because the pixel interval used in the high throughput image acquisition method is wider than the pixel interval used in the high precision image acquisition method.

2. High Precision Image Acquisition Method

A high precision image acquisition method is a method in which edge detection accuracy is more important than throughput. In this case, it is necessary for a pixel interval to be narrower in order to improve a resolution of an image of a pattern to-be-inspected. Namely, it is necessary to make an electron beam spot size smaller. Therefore, it is necessary to increase the number of times of image accumulation. The following setting values, which satisfy the above conditions, can be used. Values in parentheses described in the right-hand side of the setting values are recommended values, in the case where a minimum line width of a pattern to-be-inspected is 90 nm.

| Primary electron current | 100 pA to 2 nA | (1 nA) |
|---|---|---|
| Landing energy | 500 eV to 2800 eV | (1000 eV) |
| Secondary electron sampling rate | 50 MHz to 200 MHz | (100 MHz) |
| Number of times of image accumulation | 2 times to 32 times | (4 times) |
| Pixel interval | 2 nm to 6 nm | (3 nm) |
| Field of view | 12 μm to 100 μm | (20 μm) |

The landing energy is determined in consideration of effect of the electrification phenomenon. In the case where 1000 eV is set as the landing energy, an image of a pattern to-be-inspected having bright edges and having no contrast between the inside of the pattern and the ground is acquired. The acquired image of the pattern to-be-inspected is similar to an image acquired by a CD-SEM (see FIG. 30). The landing energy 1000 eV is near to a landing energy 800 eV, which is commonly used in a CD-SEM. The landing energy 1000 eV is one of the most optimal setting values. In the case where intensity of secondary electrons is weak with the landing energy 1000 eV being used, 2300 eV can be used as another one of the most optimal setting values. In this case, intensity of secondary electrons is made higher by increasing the landing energy as described in the high throughput image acquisition method.

3. Electrification Phenomenon Measure

In the case where the electrification phenomenon is caused, interlace scan is efficient. In the interlace scan, the number of lines from two to 128 are suitable for using as the number of scanning lines between a scanning line and the following scanning line. In addition, in the case where effect of the electrification phenomenon cannot be ignored, it is necessary to apply metal coating, such as platinum palladium, gold, and tungsten, or carbon coating.

9.2 Setting Values of Pixel Interval

A detectable edge placement error or a detectable deformation quantity of a line width and the pixel interval, which is described in 9.1 Setting values of parameters of image generation device, have the following relationships:

In the case of an edge placement error of a line part, an edge placement error, which is around 1.5 times the pixel interval, can be detected. In the case of a deformation quantity of a line width of a line part, a deformation quantity, which is around 0.5 times the pixel interval, can be detected.

It is necessary to determine the pixel interval in consideration of the above relations and the above-mentioned 3.3 Recipe data "2. The limit values of the negative side and the positive side of the allowable pattern deformation quantities"

10. Modifications of Embodiments of Present Invention

While the embodiments of the present invention have been described above, various modifications can be used. For example, while a scanning electron microscope is used in the embodiments as the image generation device 7 for scanning a pattern to-be-inspected with an electron beam (charged particle beam) to acquire an image of a pattern to-be-inspected, the present invention is also applicable to any of various other scanning microscopes including a scanning focus ion beam microscope, a scanning laser microscope, and a scanning probe microscope. The scanning directions are not limited to those at 0 degree and 90 degrees, but may be those with desired small angles added, e.g., 5 degrees and 95 degrees.

It is possible to modify this embodiment into an off-line input processing system in which an image of a pattern to-be-inspected is inputted through an external input device such as a magneto-optical disk and a magnetic tape or through an LAN (Local Area Network) such as the Ethernet.

The image generation method may be replaced by any method other than the method described in this embodiment, and the reference pattern may be transferred from other type of data. The reference pattern can be generated during inspecting, instead of being registered with the recipe database 22.

Moreover, in this embodiment, the defect information and the like are outputted to the display device 5 and the printer 6, but may be outputted to an image database, a simulator, a recording medium, and the like, or may be transmitted (outputted) to other computers through a network.

Furthermore, it is possible to construct a hybrid method in which a typical die, which means a semiconductor device, in a wafer is inspected by the method according to the present invention, and other dies are inspected by the conventional die-to-die comparison method.

As described above, the present invention offers the following advantages:

1. In the case where patterns of design data having the same OPC pattern can be distinguished by a cell name of the design data, repeated defects caused by an OPC pattern can be recognized by inspecting one semiconductor device. Consequently, inspection time can be shortened.

Moreover, in the case where repeated defects are recognized from a plurality of semiconductor devices fabricated based on a photomask having a plurality of the same photomask patterns fabricated based on design data, more inspection time can be shortened than in the case where the entirety of a plurality of semiconductor devices is inspected. In addition, defects can be classified into repeated defects caused by an error of the design data, repeated defects caused by a defect on the photomask, and random defects.

2. An end except for an end-cap of a wiring pattern and an end to be connected to a contact hole/via hole may not be corrected by an OPC pattern correctly. Even if the end is shrunken by more than an allowable pattern deformation quantity for an end-cap of a wiring pattern and an end to be connected to a contact hole/via hole, it is not necessary to recognize the shrunken end as a defect. Such shrunken end, which is shrunken by more than the allowable pattern deformation quantity, can be ignored.

3. An overlay error distribution over the entire semiconductor device can be obtained. Therefore, the local overlay errors caused by a stepper aberration or the like can be controlled.

4. A die-to-die comparison inspection, in which contours of patterns to be-inspected are used, can be performed with sub pixel accuracy, and can be performed by using a contour of one image of a pattern to-be-inspected, whose pixel interval is different from a pixel interval of an image of another pattern to-be-inspected, or a contour obtained by a simulator, or the like. Further, a process controlling method in which a contour of a semiconductor device having good quality at the starting time of fabrication is used can be realized. Furthermore, because correction of the contour or reduction of spike noise on the contour can be performed by shifting edges, deterioration of the image of the pattern to-be-inspected caused by the image filter is not caused. As an alternative method, in the case where noise on the contour is reduced by using distances between edges of reference pattern and edges of the image of the pattern to-be-inspected, variation in curvature of corners can be minimized.

5. An inspection method that can be used in combination with an alternative method, which performs in slower processing, can be realized. In addition, in the case where a contour is outputted by using additional information of design data, relationship between the contour and the design data becomes clear.

6. An optimal allowable pattern deformation quantity can be automatically obtained by inspecting a standard specimen.

7. For improving quality of a semiconductor device, it can be realized that all gate widths in a semiconductor device are measured, the measured gate widths are classified based on gate lengths, the minimum distances to the nearest pattern, or the like, and the gate widths are analyzed.

8. In the case where images of a pattern to-be-inspected on a specimen liable to cause the electrification phenomenon are acquired successively, the images are distorted gradually. Even if such acquired images, which are distorted gradually, are accumulated, a sharp accumulated image can be obtained.

9. Even if the vectors between the reference pattern and the edges of the image of the pattern to-be-inspected may not be obtained necessarily due to large distortion quantities of the image of the pattern to-be-inspected, the distortion quantities of the image of the pattern to-be-inspected can be obtained, and then the image of the pattern to-be-inspected can be corrected. Further, in the case of obtaining the distribution of the edges from the edges which exist in a line part of the image of the pattern to-be-inspected, even if distribution of edges of corner parts of the pattern to-be-inspected is asymmetry, it is possible to prevent deterioration of accuracy of obtaining the distortion quantities of the image of the pattern to-be-inspected that is caused by the asymmetry.

10. An image of a pattern to-be-inspected can be acquired by performing interlace scan and image-accumulation scan, using a continuously moving stage and feedback of a stage position to deflectors. The image accumulation scan means scan, in which the same scanning line is scanned two or more times in order to acquire an accumulated image. Consequently, inspection speed can be improved.

11. Automatic focus adjustment can be performed by acquiring one or two images of the patterns to-be-inspected. Therefore, automatic focus adjustment can be performed at high speed. Moreover, a specimen is less damaged by an electron beam scanning.

12. The process window is obtained by using various pattern deformation quantities besides the pattern deformation quantities with regard to the line widths of the line parts of the patterns to-be-inspected. Therefore, more optimal process window can be obtained. Further, more optimal critical area can be obtained than in the case of using a result of a lithography simulator, because the critical area is obtained by inspecting the pattern to-be-inspected actually formed on the wafer.

13. An electron beam mask writer can be evaluated and controlled by obtaining a deformation quantity of exposed patterns fabricated by patterns used in a writer.

What is claimed is:

1. A pattern inspection apparatus for inspecting a pattern to-be-inspected by using an image of said pattern to-be-inspected and data for fabricating said pattern to-be-inspected, said pattern inspection apparatus comprising:
   an image generation device configured to generate said image of said pattern to-be-inspected; and
   a memory storing a plurality of machine readable instructions that when executed perform the steps of:
   (a) storing in said memory a reference pattern represented by one or both of (i) one or more line segments, and (ii) one or more curves, said reference pattern generated from said data;
   (b) storing in said memory detected edges of said image;
   (c) inspecting said pattern to-be-inspected by comparing said detected edge with at least one of said line segment and said curve of said reference pattern to generate defect information; and
   (d) recognizing repeated defects, relating to same geometric information of said data, from said defect information.

2. A pattern inspection apparatus for inspecting a pattern to-be-inspected by using an image of said pattern to-be-inspected and data for fabricating said pattern to-be-inspected, said pattern inspection apparatus comprising:
   an image generation device configured to generate said image of said pattern to-be-inspected; and
   a memory storing a plurality of machine readable instructions that when executed perform the steps of:
   (a) storing in said memory a reference pattern represented by one or both of (i) one or more line segments, and (ii) one or more curves, said reference pattern generated from said data;
   (b) storing in said memory detected edges of said image;
   (c) inspecting said pattern to-be-inspected by comparing said detected edge with at least one of said line segment and said curve of said reference pattern to generate defect information;
   (d) generating said defect information from a plurality of patterns to-be-inspected that are fabricated by one time exposure of exposure patterns that include multiple sets of patterns;
   (e) recognizing repeated defects within said defect information of said plurality of patterns to-be-inspected;
   (f) recognizing an unrepeated defect by removing said repeated defects from said defect information; and
   (g) determining whether a defect, which exists in the same location of said unrepeated defect and its neighborhood, exists in defect information generated for semiconductor devices fabricated by another one time exposure.

3. A pattern inspection apparatus for inspecting a pattern to-be-inspected by using an image of said pattern to-be-inspected and data for fabricating said pattern to-be-inspected, said pattern inspection apparatus comprising:
   an image generation device configured to generate said image of said pattern to-be-inspected; and
   a memory storing a plurality of machine readable instructions that when executed perform the steps of:
   (a) storing in said memory a reference pattern represented by one or both of (i) one or more line segments, and (ii) one or more curves, said reference pattern generated from said data;
   (b) storing in said memory detected edges of said image;
   (c) inspecting said pattern to-be-inspected by comparing said detected edge with at least one of said line segment and said curve of said reference pattern to generate defect information; and
   (d) inspecting said pattern to-be-inspected using inspection results generated from a pattern to-be-inspected of a good quality specimen.

4. A pattern inspection apparatus for inspecting a pattern to-be-inspected by using an image of said pattern to-be-inspected and data for fabricating said pattern to-be-inspected, said pattern inspection apparatus comprising:
   an image generation device configured to generate said image of said pattern to-be-inspected; and
   a memory storing a plurality of machine readable instructions that when executed perform the steps of:
   (a) storing in said memory a reference pattern represented by one or both of (i) one or more line segments, and (ii) one or more curves, said reference pattern generated from said data;
   (b) storing in said memory detected edges of said image;
   (c) inspecting said pattern to-be-inspected by comparing said detected edge with at least one of said line segment and said curve of said reference pattern to generate defect information; and
   (d) inspecting at least one relationship between a location of a pattern formed in a process at the time of said inspection and a location of a pattern formed in a preceding occurrence of said process at the time of said inspection, by performing matching between said image and said reference pattern with regard to said process at the time of said inspection, and performing matching between said image and said reference pattern with regard to said preceding occurrence of said process at the time of said inspection.

5. A pattern inspection apparatus for inspecting a pattern to-be-inspected by using an image of said pattern to-be-inspected and data for fabricating said pattern to-be-inspected, said pattern inspection apparatus comprising:
   an image generation device configured to generate said image of said pattern to-be-inspected; and
   a memory storing a plurality of machine readable instructions that when executed perform the steps of:
   (a) storing in said memory a reference pattern represented by one or both of (i) one or more line segments, and (ii) one or more curves, said reference pattern generated from said data;
   (b) storing in said memory detected edges of said image; and
   (c) inspecting said pattern to-be-inspected by comparing said detected edge with at least one of said line segment and said curve of said reference pattern to generate defect information;
   (d) extracting a contour based upon said detected edge and said line segment or said curve of said reference pattern; and
   (e) inspecting said pattern to-be-inspected by comparing said contour and one of (a) a contour extracted from an image of another pattern to-be-inspected fabricated from said data, and (b) a contour determined by a simulator using said data.

6. The pattern inspection apparatus according to claim 5, wherein said machine readable instruction, when executed, shift said detected edge to achieve at least one of (a) correction of said contour, and (b) reduction of noise on said contour.

7. The pattern inspection apparatus according to claim 5, wherein said machine readable instruction, when executed, reduce noise on said contour based upon distances between (a) said line segment and said curve of said reference pattern and (b) said detected edge.

8. The pattern inspection apparatus according to claim 5, further comprising an output device configured to output said contour, said pattern inspection apparatus utilizing said outputted contour to inspect said pattern to-be-inspected.

9. The pattern inspection apparatus according to claim 8, said output device using additional information of said data to output said contour.

10. A pattern inspection apparatus for inspecting a pattern to-be-inspected by using an image of said pattern to-be-inspected and data for fabricating said pattern to-be-inspected, said pattern inspection apparatus comprising:
   an image generation device configured to generate said image of said pattern to-be-inspected; and
   a memory storing a plurality of machine readable instructions that when executed perform the steps of:
   (a) storing in said memory a reference pattern represented by one or both of (i) one or more line segments, and (ii) one or more curves, said reference pattern generated from said data;
   (b) storing in said memory detected edges of said image;
   (c) inspecting said pattern to-be-inspected by comparing said detected edge with at least one of said line segment and said curve of said reference pattern to generate defect information; and
   (d) determining inspection results by repeatedly inspecting the same pattern to-be-inspected of a good quality specimen while successively altering an allowable pattern deformation quantity, to determine optimal quantity of said allowable pattern deformation quantity.

11. A pattern inspection apparatus for inspecting a pattern to-be-inspected by using an image of said pattern to-be-inspected and data for fabricating said pattern to-be-inspected, said pattern inspection apparatus comprising:
   an image generation device configured to generate said image of said pattern to-be-inspected; and
   a memory storing a plurality of machine readable instructions that when executed perform the steps of:
   (a) storing in said memory a reference pattern represented by one or both of (i) one or more line segments, and (ii) one or more curves, said reference pattern generated from said data;
   (b) storing in said memory detected edges of said image;
   (c) inspecting said pattern to-be-inspected by comparing said detected edge with at least one of said line segment and said curve of said reference pattern to generate defect information; and
   classifying said defect information based on at least one of (a) geometrical information of said reference pattern, (b) information of said data, and (c) information of data related to said data.

12. A pattern inspection apparatus for inspecting a pattern to-be-inspected by using an image of said pattern to-be-inspected and data for fabricating said pattern to-be-inspected, said pattern inspection apparatus comprising:
   an image generation device configured to generate said image of said pattern to-be-inspected; and
   a memory storing a plurality of machine readable instructions that when executed perform the steps of:
   (a) storing in said memory a reference pattern represented by one or both of (i) one or more line segments, and (ii) one or more curves, said reference pattern generated from said data;
   (b) storing in said memory detected edges of said image;
   (c) inspecting said pattern to-be-inspected by comparing said detected edge with at least one of said line segment and said curve of said reference pattern to generate defect information; and
   (d) determining a critical area by inspecting said pattern to-be-inspected in semiconductor devices fabricated by exposure under a focus condition and an altered exposure dose condition, by detecting at least one of:
      a defect of at least one of (a) a line part, (b) a corner, and (c) an end, having edge placement errors;
      an isolated pattern having placement error;
      a defect of a corner having abnormal curvature;
      a defect detected by inspecting correction pattern that should not be formed on wafer;
      a defect detected by inspecting at least one of (d) a line width, (e) an average line width, (f) a space width, and (g) an average space width of a line-shaped pattern;
      a defect detected by inspecting at least one of (h) a line width, (i) an average line width, (j) a space width, and (k) an average space width of a curvilinear-shaped pattern; and
      a defect detected by inspecting a gate line width.

13. A pattern inspection apparatus for inspecting a pattern to-be-inspected by using an image of said pattern to-be-inspected and data for fabricating said pattern to-be-inspected, said pattern inspection apparatus comprising:
   an image generation device configured to generate said image of said pattern to-be-inspected; and
   a memory storing a plurality of machine readable instructions that when executed perform the steps of:
   (a) storing in said memory a reference pattern represented by one or both of (i) one or more line segments, and (ii) one or more curves, said reference pattern generated from said data;
   (b) storing in said memory detected edges of said image;
   (c) inspecting said pattern to-be-inspected by comparing said detected edge with at least one of said line segment and said curve of said reference pattern to generate defect information; and
   (d) determining a process window by inspecting said pattern to-be-inspected in semiconductor devices that are fabricated by exposure under an altered focus condition and an altered exposure dose condition by detecting at least one of:
      a defect of at least one of (a) a line part, (b) a corner, and (c) an end, having edge placement errors;
      an isolated pattern having placement error;
      a defect of a corner having abnormal curvature;
      a defect detected by inspecting correction pattern that should not be formed on wafer;
      a defect detected by inspecting at least one of (d) a line width, (e) an average line width, (f) a space width, and (g) an average space width of a line-shaped pattern;
      a defect detected by inspecting at least one of (h) a line width, (i) an average line width, (j) a space width, and (k) an average space width of a curvilinear-shaped pattern; and
      a defect detected by inspecting a gate line width.

14. A method of evaluating a fabrication process by inspecting a pattern to-be-inspected formed by said fabrication process based upon fabrication data, said pattern inspection method comprising:
   generating, within a pattern inspection apparatus, a reference pattern, from said data, represented by one or both of (a) one or more line segments and (b) one or more curves;
   detecting, within said pattern inspection apparatus, an edge of an image of said pattern to-be-inspected; and inspecting said pattern to-be-inspected by comparing, within said pattern inspection apparatus, said detected edge with at least one of said line segment and said curve of said reference pattern;

wherein a relationship between a location of a pattern formed in a process at the time of said inspection and a location of said pattern formed in a preceding occurrence of said process at the time of said inspection is evaluated by matching said image and said reference pattern of said process at the time of said inspection, and matching said image and said reference pattern of said preceding occurrence of said process at the time of said inspection.

15. A method of evaluating a fabrication process by inspecting a pattern to-be-inspected formed by said fabrication process based upon fabrication data, said pattern inspection method comprising:

generating, within a pattern inspection apparatus, a reference pattern, from said data, represented by one or both of (a) one or more line segments and (b) one or more curves;

detecting, within said pattern inspection apparatus, an edge of an image of said pattern to-be-inspected;

inspecting said pattern to-be-inspected by comparing, within said pattern inspection apparatus, said detected edge with at least one of said line segment and said curve of said reference pattern; and prior to said step of inspecting, extracting a contour by determining a correspondence between said detected edge and said line segment or said curve of said reference pattern, said step of inspecting comprising comparing said contour and one of (a) a contour extracted from an image of another pattern to-be-inspected fabricated by said data, and (b) a contour determined by a simulator using said data.

16. A method of evaluating a fabrication process by inspecting a pattern to-be-inspected formed by said fabrication process based upon fabrication data, said pattern inspection method comprising:

generating, within a pattern inspection apparatus, a reference pattern, from said data, represented by one or both of (a) one or more line segments and (b) one or more curves;

detecting, within said pattern inspection apparatus, an edge of an image of said pattern to-be-inspected;

inspecting said pattern to-be-inspected by comparing, within said pattern inspection apparatus, said detected edge with at least one of said line segment and said curve of said reference pattern; and determining a critical area by inspecting said pattern to-be-inspected in semiconductor devices that are fabricated by exposure under an altered focus condition and an altered exposure dose condition, by detecting at least one of:

a defect of at least one of (a) a line part, (b) a corner, and (c) an end, having edge placement errors;

an isolated pattern having placement error;

a defect of a corner having abnormal curvature;

a defect detected by inspecting correction pattern that should not be formed on wafer;

a defect detected by inspecting at least one of (d) a line width, (e) an average line width, (f) a space width, and (g) an average space width of a line-shaped pattern;

a defect detected by inspecting at least one of (h) a line width, (i) an average line width, (j) a space width, and (k) an average space width of a curvilinear-shaped pattern; and a defect detected by inspecting a gate line width.

17. A method of evaluating a fabrication process by inspecting a pattern to-be-inspected formed by said fabrication process based upon fabrication data, said pattern inspection method comprising:

generating, within a pattern inspection apparatus, a reference pattern, from said data, represented by one or both of (a) one or more line segments and (b) one or more curves;

detecting, within said pattern inspection apparatus, an edge of an image of said pattern to-be-inspected;

inspecting said pattern to-be-inspected by comparing, within said pattern inspection apparatus, said detected edge with at least one of said line segment and said curve of said reference pattern; and determining a process window by inspecting said pattern to-be-inspected in semiconductor devices that are fabricated by exposure under an altered focus condition and an altered exposure dose condition, by detecting at least one of:

a defect of at least one of (a) a line part, (b) a corner, and (c) an end, having edge placement errors;

an isolated pattern having placement error;

a defect of a corner having abnormal curvature;

a defect detected by inspecting correction pattern that should not be formed on wafer;

a defect detected by inspecting at least one of (d) a line width, (e) an average line width, (f) a space width, and (g) an average space width of a line-shaped pattern;

a defect detected by inspecting at least one of (h) a line width, (i) an average line width, (j) a space width, and (k) an average space width of a curvilinear-shaped pattern; and a defect detected by inspecting a gate line width.

18. The pattern inspection apparatus of claim 1, wherein said edges are detected by an inspection unit configurable to locate edges at a zero-crossings of a second derivative of intensity in the image.

* * * * *